(12) United States Patent
Louie et al.

(10) Patent No.: US 11,100,994 B2
(45) Date of Patent: *Aug. 24, 2021

(54) CONTENT ADDRESSABLE MEMORY DEVICE HAVING ELECTRICALLY FLOATING BODY TRANSISTOR

(71) Applicant: Zeno Semiconductor, Inc., Sunnyvale, CA (US)

(72) Inventors: Benjamin S. Louie, Fremont, CA (US); Jin-Woo Han, San Jose, CA (US); Yuniarto Widjaja, Cupertino, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/077,177

(22) Filed: Oct. 22, 2020

(65) Prior Publication Data

US 2021/0057027 A1 Feb. 25, 2021

Related U.S. Application Data

(63) Continuation of application No. 16/449,820, filed on Jun. 24, 2019, now Pat. No. 10,839,905, which is a continuation of application No. 16/013,646, filed on Jun. 20, 2018, now Pat. No. 10,373,685, which is a continuation of application No. 14/867,308, filed on Sep. 28, 2015, now Pat. No. 10,026,479, which is a continuation of application No. 14/154,138, filed on Jan. 13, 2014, now Pat. No. 9,208,880.

(60) Provisional application No. 61/781,865, filed on Mar. 14, 2013, provisional application No. 61/752,096, (Continued)

(51) Int. Cl.
*G11C 15/04* (2006.01)
*H01L 27/108* (2006.01)
*G11C 11/404* (2006.01)
*G11C 16/04* (2006.01)

(52) U.S. Cl.
CPC ............ *G11C 15/04* (2013.01); *G11C 15/046* (2013.01); *H01L 27/10802* (2013.01); *G11C 11/404* (2013.01); *G11C 16/0458* (2013.01); *G11C 16/0475* (2013.01); *G11C 2211/4013* (2013.01); *G11C 2211/4016* (2013.01)

(58) Field of Classification Search
CPC ..................................................... G11C 15/04
USPC ...................................................... 365/49.17
See application file for complete search history.

(56) References Cited

U.S. PATENT DOCUMENTS

| 4,300,212 A | 11/1981 | Simko |
| 4,385,308 A | 5/1983 | Uchida |
| 4,959,812 A | 9/1990 | Momodomi et al. |

(Continued)

OTHER PUBLICATIONS

Kim, et al. "Investigation of 1T DRAM cell with non-overlap structure and recessed channel." Silicon Nanoelectronics Workshop (SNW), 2010. IEEE, 2010, pp. 1-2.*

(Continued)

*Primary Examiner* — Muna A Techane
(74) *Attorney, Agent, or Firm* — Law Office of Alan W Cannon

(57) ABSTRACT

A content addressable memory cell includes a first floating body transistor and a second floating body transistor. The first floating body transistor and the second floating body transistor are electrically connected in series through a common node. The first floating body transistor and the second floating body transistor store complementary data.

18 Claims, 103 Drawing Sheets

Related U.S. Application Data filed on Jan. 14, 2013, provisional application No. 61/800,199, filed on Mar. 15, 2013.

(56) References Cited

U.S. PATENT DOCUMENTS

| | | | |
|---|---|---|---|
| 4,965,767 A | 10/1990 | Kinoshita et al. | |
| 5,519,831 A | 5/1996 | Holzhammer | |
| 5,581,504 A | 12/1996 | Chang et al. | |
| 5,767,549 A | 6/1998 | Chen et al. | |
| 5,999,444 A | 12/1999 | Fujiwara et al. | |
| 6,005,818 A | 12/1999 | Ferrant et al. | |
| 6,064,100 A | 5/2000 | Wen | |
| 6,141,248 A | 10/2000 | Forbes et al. | |
| 6,163,048 A | 12/2000 | Hirose et al. | |
| 6,166,407 A | 12/2000 | Ohta | |
| 6,320,777 B1 | 11/2001 | Lines et al. | |
| 6,341,087 B1 | 1/2002 | Kunikiyo et al. | |
| 6,356,485 B1 | 3/2002 | Proebsting | |
| 6,376,876 B1 | 4/2002 | Shin et al. | |
| 6,542,411 B2 | 4/2003 | Tanikawa et al. | |
| 6,614,684 B1 | 9/2003 | Shukuri et al. | |
| 6,661,042 B2 | 12/2003 | Hsu | |
| 6,686,624 B2 | 2/2004 | Hsu | |
| 6,724,657 B2 | 4/2004 | Shukuri et al. | |
| 6,791,882 B2 | 9/2004 | Seki et al. | |
| 6,801,452 B2 | 10/2004 | Miwa et al. | |
| 6,849,501 B2 | 2/2005 | Rudeck | |
| 6,870,751 B2 | 3/2005 | van Brocklin et al. | |
| 6,885,581 B2 | 4/2005 | Nemati et al. | |
| 6,913,964 B2 | 7/2005 | Hsu | |
| 6,925,006 B2 | 8/2005 | Fazan et al. | |
| 6,954,377 B2 | 10/2005 | Choi et al. | |
| 6,969,662 B2 | 11/2005 | Fazan et al. | |
| 7,085,156 B2 | 8/2006 | Ferrant et al. | |
| 7,085,174 B2 | 8/2006 | Hidaka | |
| 7,118,986 B2 | 10/2006 | Steigerwalt et al. | |
| 7,170,807 B2 | 1/2007 | Fazan et al. | |
| 7,224,019 B2 | 5/2007 | Hieda et al. | |
| 7,259,420 B2 | 8/2007 | Anderson et al. | |
| 7,259,992 B2 | 8/2007 | Shirota | |
| 7,285,820 B2 | 10/2007 | Park et al. | |
| 7,301,803 B2 | 11/2007 | Okhonin et al. | |
| 7,329,580 B2 | 2/2008 | Cho et al. | |
| 7,440,333 B2 | 10/2008 | Hsia et al. | |
| 7,447,068 B2 | 11/2008 | Tsai et al. | |
| 7,450,423 B2 | 11/2008 | Lai et al. | |
| 7,473,611 B2 | 1/2009 | Cho et al. | |
| 7,504,302 B2 | 3/2009 | Matthew et al. | |
| 7,541,636 B2 | 6/2009 | Ranica et al. | |
| 7,542,345 B2 | 6/2009 | Okhonin et al. | |
| 7,579,241 B2 | 8/2009 | Hieda et al. | |
| 7,609,551 B2 | 10/2009 | Shino et al. | |
| 7,622,761 B2 | 11/2009 | Park et al. | |
| 7,701,763 B2 | 4/2010 | Roohparvar | |
| 7,733,693 B2 | 6/2010 | Ferrant et al. | |
| 7,759,715 B2 | 7/2010 | Bhattacharyya | |
| 7,760,548 B2 | 7/2010 | Widjaja | |
| 7,847,338 B2 | 12/2010 | Widjaja | |
| 7,924,630 B2 | 4/2011 | Carman | |
| 7,933,140 B2 | 4/2011 | Wang et al. | |
| 8,014,200 B2 | 9/2011 | Widjaja | |
| 8,036,033 B2 | 10/2011 | Widjaja | |
| 8,059,459 B2 | 11/2011 | Widjaja | |
| 8,077,536 B2 | 12/2011 | Widjaja | |
| 8,130,547 B2 | 3/2012 | Widjaja et al. | |
| 8,130,548 B2 | 3/2012 | Widjaja et al. | |
| 8,159,878 B2 | 4/2012 | Widjaja | |
| 8,174,886 B2 | 5/2012 | Widjaja et al. | |
| 8,194,451 B2 | 6/2012 | Widjaja | |
| 8,208,302 B2 | 6/2012 | Widjaja et al. | |
| 8,243,499 B2 | 8/2012 | Widjaja | |
| 8,294,193 B2 | 10/2012 | Widjaja | |
| 8,493,787 B2 * | 7/2013 | Pasotti | G11C 16/045 365/185.18 |
| 8,514,623 B2 | 8/2013 | Widjaja et al. | |
| 8,559,257 B2 | 10/2013 | Widjaja | |
| 8,570,803 B2 | 10/2013 | Widjaja | |
| 8,582,359 B2 | 11/2013 | Widjaja | |
| 8,654,583 B2 | 2/2014 | Widjaja | |
| 8,711,622 B2 | 4/2014 | Widjaja | |
| 8,767,458 B2 | 7/2014 | Widjaja | |
| 8,787,085 B2 | 7/2014 | Widjaja | |
| 8,817,548 B2 | 8/2014 | Widjaja et al. | |
| 8,837,247 B2 | 9/2014 | Widjaja | |
| 8,902,663 B1 | 12/2014 | Or-Bach et al. | |
| 8,923,052 B2 | 12/2014 | Widjaja | |
| 8,934,296 B2 | 1/2015 | Widjaja | |
| 8,937,834 B2 | 1/2015 | Widjaja et al. | |
| 8,957,458 B2 | 2/2015 | Widjaja | |
| 8,995,186 B2 | 3/2015 | Widjaja | |
| 9,001,581 B2 | 4/2015 | Widjaja | |
| 9,025,358 B2 | 5/2015 | Widjaja | |
| 9,030,872 B2 | 5/2015 | Widjaja et al. | |
| 9,087,580 B2 | 7/2015 | Widjaja | |
| 9,153,309 B2 | 10/2015 | Widjaja et al. | |
| 9,153,333 B2 | 10/2015 | Widjaja | |
| 9,208,840 B2 | 12/2015 | Widjaja et al. | |
| 9,208,880 B2 | 12/2015 | Louie et al. | |
| 9,209,188 B2 | 12/2015 | Widjaja | |
| 9,230,651 B2 | 1/2016 | Widjaja et al. | |
| 9,230,965 B2 | 1/2016 | Widjaja | |
| 9,236,382 B2 | 1/2016 | Widjaja et al. | |
| 9,257,179 B2 | 2/2016 | Widjaja | |
| 9,391,079 B2 | 7/2016 | Widjaja | |
| 9,401,206 B2 | 7/2016 | Widjaja | |
| 9,455,262 B2 | 9/2016 | Widjaja | |
| 9,460,790 B2 | 10/2016 | Widjaja | |
| 9,484,082 B2 | 11/2016 | Widjaja | |
| 9,490,012 B2 | 11/2016 | Widjaja | |
| 9,514,803 B2 | 12/2016 | Widjaja et al. | |
| 9,524,970 B2 | 12/2016 | Widjaja | |
| 9,576,962 B2 | 2/2017 | Widjaja et al. | |
| 9,589,963 B2 | 3/2017 | Widjaja | |
| 9,601,493 B2 | 3/2017 | Widjaja | |
| 9,614,080 B2 | 4/2017 | Widjaja | |
| 9,646,693 B2 | 5/2017 | Widjaja | |
| 9,653,467 B2 | 5/2017 | Widjaja et al. | |
| 9,666,275 B2 | 5/2017 | Widjaja | |
| 9,679,648 B2 | 6/2017 | Widjaja | |
| 9,704,869 B2 | 7/2017 | Widjaja et al. | |
| 9,704,870 B2 | 7/2017 | Widjaja | |
| 9,715,932 B2 | 7/2017 | Widjaja | |
| 9,747,983 B2 | 8/2017 | Widjaja | |
| 9,761,311 B2 | 9/2017 | Widjaja | |
| 9,761,589 B2 | 9/2017 | Widjaja | |
| 9,793,277 B2 | 10/2017 | Widjaja et al. | |
| 9,812,203 B2 | 11/2017 | Widjaja | |
| 9,812,456 B2 | 11/2017 | Widjaja | |
| 9,847,131 B2 | 12/2017 | Widjaja | |
| 9,893,067 B2 | 2/2018 | Widjaja et al. | |
| 9,905,564 B2 | 2/2018 | Widjaja et al. | |
| 9,922,711 B2 | 3/2018 | Widjaja | |
| 9,922,981 B2 | 3/2018 | Widjaja | |
| 9,928,910 B2 | 3/2018 | Widjaja | |
| 9,960,166 B2 | 5/2018 | Widjaja | |
| 9,978,450 B2 | 5/2018 | Widjaja | |
| 10,008,266 B1 | 6/2018 | Widjaja | |
| 10,026,479 B2 | 7/2018 | Louie et al. | |
| 10,032,514 B2 | 7/2018 | Widjaja | |
| 10,032,776 B2 | 7/2018 | Widjaja et al. | |
| 10,056,387 B2 | 8/2018 | Widjaja | |
| 10,074,653 B2 | 9/2018 | Widjaja | |
| 10,079,236 B2 | 9/2018 | Widjaja | |
| 10,109,349 B2 | 10/2018 | Widjaja | |
| 10,141,315 B2 | 11/2018 | Widjaja et al. | |
| 10,163,907 B2 | 12/2018 | Widjaja et al. | |
| 10,181,471 B2 | 1/2019 | Widjaja et al. | |
| 10,192,872 B2 | 1/2019 | Widjaja et al. | |
| 10,204,684 B2 | 2/2019 | Widjaja | |
| 10,204,908 B2 | 2/2019 | Widjaja | |
| 10,210,934 B2 | 2/2019 | Widjaja | |
| 10,211,209 B2 | 2/2019 | Widjaja | |
| 10,242,739 B2 | 3/2019 | Widjaja | |
| 10,249,368 B2 | 4/2019 | Widjaja | |

(56) References Cited

U.S. PATENT DOCUMENTS

| | | | |
|---|---|---|---|
| 10,340,006 B2 | 7/2019 | Widjaja | |
| 10,340,276 B2 | 7/2019 | Widjaja et al. | |
| 10,347,636 B2 | 7/2019 | Widjaja | |
| 10,373,685 B2 | 8/2019 | Louie et al. | |
| 10,388,378 B2 | 8/2019 | Widjaja | |
| 10,403,361 B2 | 9/2019 | Widjaja | |
| 10,453,847 B2 | 10/2019 | Widjaja et al. | |
| 10,461,084 B2 | 10/2019 | Widjaja | |
| 10,468,102 B2 | 11/2019 | Widjaja | |
| 10,497,443 B2 | 12/2019 | Widjaja | |
| 10,515,968 B2 | 12/2019 | Widjaja | |
| 10,529,424 B2 | 1/2020 | Widjaja | |
| 10,553,281 B2 | 2/2020 | Widjaja | |
| 10,593,675 B2 | 3/2020 | Widjaja et al. | |
| 10,615,163 B2 | 4/2020 | Widjaja | |
| 10,622,069 B2 | 4/2020 | Widjaja | |
| 10,629,599 B2 | 4/2020 | Widjaja et al. | |
| 10,644,001 B2 | 5/2020 | Widjaja et al. | |
| 10,644,002 B2 | 5/2020 | Widjaja | |
| 10,707,209 B2 | 7/2020 | Widjaja | |
| 10,734,076 B2 | 8/2020 | Widjaja | |
| 10,748,904 B2 | 8/2020 | Widjaja et al. | |
| 10,797,055 B2 | 10/2020 | Widjaja et al. | |
| 10,804,276 B2 | 10/2020 | Widjaja | |
| 10,818,354 B2 | 10/2020 | Widjaja | |
| 10,825,520 B2 | 11/2020 | Widjaja | |
| 10,839,905 B2 * | 11/2020 | Louie | G11C 15/046 |
| 2002/0018366 A1 | 2/2002 | von Schwerin et al. | |
| 2002/0048193 A1 | 4/2002 | Tanikawa et al. | |
| 2002/0054514 A1 | 5/2002 | Kajigaya et al. | |
| 2003/0168680 A1 | 9/2003 | Hsu | |
| 2004/0104407 A1 | 6/2004 | Hsu et al. | |
| 2004/0228168 A1 | 11/2004 | Ferrant et al. | |
| 2005/0024968 A1 | 2/2005 | Lee et al. | |
| 2005/0032313 A1 | 2/2005 | Forbes | |
| 2005/0124120 A1 | 6/2005 | Du et al. | |
| 2006/0044915 A1 | 3/2006 | Park et al. | |
| 2006/0046408 A1 | 3/2006 | Ohsawa | |
| 2006/0056234 A1 | 3/2006 | Lowrey | |
| 2006/0091462 A1 | 5/2006 | Okhonin et al. | |
| 2006/0125010 A1 | 6/2006 | Bhattacharyya | |
| 2006/0146606 A1 | 7/2006 | Bhattacharyya et al. | |
| 2006/0157679 A1 | 7/2006 | Scheuerlein | |
| 2006/0193174 A1 | 8/2006 | Choi et al. | |
| 2006/0227601 A1 | 10/2006 | Bhattacharyya | |
| 2006/0237770 A1 | 10/2006 | Huang et al. | |
| 2006/0256611 A1 | 11/2006 | Bednorz et al. | |
| 2006/0278915 A1 | 12/2006 | Lee et al. | |
| 2007/0004149 A1 | 1/2007 | Tews | |
| 2007/0090443 A1 | 4/2007 | Choi et al. | |
| 2007/0164351 A1 | 7/2007 | Hamamoto | |
| 2007/0164352 A1 | 7/2007 | Padilla | |
| 2007/0210338 A1 | 9/2007 | Orlowski | |
| 2007/0215954 A1 | 9/2007 | Mouli | |
| 2007/0284648 A1 | 12/2007 | Park et al. | |
| 2008/0048239 A1 | 2/2008 | Huo et al. | |
| 2008/0080248 A1 | 4/2008 | Lue et al. | |
| 2008/0111154 A1 | 5/2008 | Voldman | |
| 2008/0123418 A1 | 5/2008 | Widjaja | |
| 2008/0224202 A1 | 9/2008 | Young et al. | |
| 2008/0265305 A1 | 10/2008 | He et al. | |
| 2008/0303079 A1 | 12/2008 | Cho et al. | |
| 2009/0020754 A1 | 1/2009 | Suryagandh et al. | |
| 2009/0034320 A1 | 2/2009 | Ueda | |
| 2009/0065853 A1 | 3/2009 | Hanafi | |
| 2009/0081835 A1 | 3/2009 | Kim et al. | |
| 2009/0085089 A1 | 4/2009 | Chang et al. | |
| 2009/0108322 A1 | 4/2009 | Widjaja | |
| 2009/0108351 A1 | 4/2009 | Yang et al. | |
| 2009/0109750 A1 | 4/2009 | Widjaja | |
| 2009/0173983 A1 | 7/2009 | Kusunoki et al. | |
| 2009/0173985 A1 | 7/2009 | Lee et al. | |
| 2009/0190402 A1 | 7/2009 | Hsu et al. | |
| 2009/0230447 A1 | 9/2009 | Hwang | |
| 2009/0242996 A1 | 10/2009 | van Bentrum et al. | |
| 2009/0251966 A1 | 10/2009 | Widjaja | |
| 2009/0316492 A1 | 12/2009 | Widjaja | |
| 2010/0008139 A1 | 1/2010 | Bae | |
| 2010/0034041 A1 | 2/2010 | Widjaja | |
| 2010/0046287 A1 | 2/2010 | Widjaja | |
| 2010/0096701 A1 | 4/2010 | Yoo | |
| 2010/0157664 A1 | 6/2010 | Chung | |
| 2010/0202202 A1 | 8/2010 | Roohparvar | |
| 2010/0246277 A1 | 9/2010 | Widjaja et al. | |
| 2010/0246284 A1 | 9/2010 | Widjaja | |
| 2010/0329043 A1 * | 12/2010 | Fossum | H01L 27/10802 365/189.011 |
| 2011/0007578 A1 | 1/2011 | Okhonin et al. | |
| 2011/0032756 A1 | 2/2011 | Widjaja | |
| 2011/0042736 A1 | 2/2011 | Widjaja | |
| 2011/0044110 A1 | 2/2011 | Widjaja | |
| 2011/0222337 A1 * | 9/2011 | Fossum | H01L 27/10802 365/175 |
| 2011/0305085 A1 | 12/2011 | Widjaja | |
| 2012/0012915 A1 | 1/2012 | Widjaja et al. | |
| 2012/0014180 A1 | 1/2012 | Widjaja | |
| 2012/0014188 A1 | 1/2012 | Widjaja et al. | |
| 2012/0069652 A1 | 3/2012 | Widjaja | |
| 2012/0106234 A1 | 5/2012 | Widjaja | |
| 2012/0113712 A1 | 5/2012 | Widjaja | |
| 2012/0120752 A1 | 5/2012 | Widjaja | |
| 2012/0217549 A1 | 8/2012 | Widjaja | |
| 2012/0230123 A1 | 9/2012 | Widjaja et al. | |
| 2013/0015517 A1 | 1/2013 | Widjaja et al. | |
| 2013/0094280 A1 | 4/2013 | Widjaja | |
| 2013/0148422 A1 | 6/2013 | Widjaja | |
| 2013/0250685 A1 | 9/2013 | Widjaja | |
| 2013/0264656 A1 | 10/2013 | Widjaja et al. | |
| 2013/0292635 A1 | 11/2013 | Widjaja | |
| 2013/0301349 A1 | 11/2013 | Widjaja | |
| 2014/0021549 A1 | 1/2014 | Widjaja | |
| 2014/0036577 A1 | 2/2014 | Widjaja | |
| 2014/0159156 A1 | 6/2014 | Widjaja | |
| 2014/0160868 A1 | 6/2014 | Widjaja et al. | |
| 2014/0198551 A1 * | 7/2014 | Louie | H01L 27/10802 365/49.1 |
| 2014/0332899 A1 | 11/2014 | Widjaja | |
| 2014/0340972 A1 | 11/2014 | Widjaja et al. | |
| 2014/0355343 A1 | 12/2014 | Widjaja | |
| 2015/0023105 A1 | 1/2015 | Widjaja et al. | |
| 2015/0092486 A1 | 4/2015 | Widjaja | |
| 2015/0109860 A1 | 4/2015 | Widjaja | |
| 2015/0155284 A1 | 6/2015 | Widjaja | |
| 2015/0170743 A1 | 6/2015 | Widjaja | |
| 2015/0187776 A1 | 7/2015 | Widjaja | |
| 2015/0213892 A1 | 7/2015 | Widjaja | |
| 2015/0221650 A1 | 8/2015 | Widjaja et al. | |
| 2015/0310917 A1 | 10/2015 | Widjaja | |
| 2015/0371707 A1 | 12/2015 | Widjaja | |
| 2016/0005741 A1 | 1/2016 | Widjaja | |
| 2016/0005750 A1 | 1/2016 | Widjaja | |
| 2016/0078921 A1 | 3/2016 | Widjaja et al. | |
| 2016/0086655 A1 | 3/2016 | Widjaja | |
| 2016/0086954 A1 | 3/2016 | Widjaja et al. | |
| 2016/0111158 A1 | 4/2016 | Widjaja | |
| 2016/0211381 A1 * | 7/2016 | Kurokawa | H01L 27/0207 |
| 2016/0300613 A1 | 10/2016 | Widjaja | |
| 2016/0300841 A1 | 10/2016 | Widjaja | |
| 2016/0365444 A1 | 12/2016 | Widjaja | |
| 2017/0025534 A1 | 1/2017 | Widjaja | |
| 2017/0032842 A1 | 2/2017 | Widjaja | |
| 2017/0040326 A1 | 2/2017 | Widjaja | |
| 2017/0053919 A1 | 2/2017 | Widjaja et al. | |
| 2017/0092359 A1 | 3/2017 | Louie et al. | |
| 2017/0092648 A1 | 3/2017 | Widjaja | |
| 2017/0125421 A1 | 5/2017 | Widjaja et al. | |
| 2017/0133091 A1 | 5/2017 | Widjaja | |
| 2017/0133382 A1 | 5/2017 | Widjaja | |
| 2017/0154888 A1 | 6/2017 | Widjaja | |
| 2017/0169887 A1 | 6/2017 | Widjaja | |
| 2017/0213593 A1 | 7/2017 | Widjaja | |
| 2017/0221900 A1 | 8/2017 | Widjaja et al. | |
| 2017/0229178 A1 | 8/2017 | Widjaja | |
| 2017/0229466 A1 | 8/2017 | Widjaja et al. | |

(56) References Cited

U.S. PATENT DOCUMENTS

| | | |
|---|---|---|
| 2017/0271339 A1 | 9/2017 | Widjaja |
| 2017/0294230 A1 | 10/2017 | Widjaja |
| 2017/0365340 A1 | 12/2017 | Widjaja |
| 2017/0365607 A1 | 12/2017 | Widjaja |
| 2018/0012893 A1 | 1/2018 | Widjaja et al. |
| 2018/0025780 A1 | 1/2018 | Widjaja |
| 2018/0047731 A1 | 2/2018 | Widjaja |
| 2018/0075907 A1 | 3/2018 | Widjaja |
| 2018/0158825 A1 | 6/2018 | Widjaja et al. |
| 2018/0166446 A1 | 6/2018 | Widjaja |
| 2018/0174654 A1 | 6/2018 | Widjaja |
| 2018/0182458 A1 | 6/2018 | Widjaja |
| 2018/0182460 A1 | 6/2018 | Widjaja |
| 2018/0219013 A1 | 8/2018 | Widjaja |
| 2018/0233199 A1 | 8/2018 | Widjaja |
| 2018/0301191 A1 | 10/2018 | Widjaja |
| 2018/0301192 A1 | 10/2018 | Louie et al. |
| 2018/0308848 A1 | 10/2018 | Widjaja et al. |
| 2018/0330790 A1 | 11/2018 | Widjaja |
| 2018/0331109 A1 | 11/2018 | Widjaja |
| 2018/0374854 A1 | 12/2018 | Widjaja |
| 2019/0006367 A1 | 1/2019 | Widjaja |
| 2019/0027220 A1 | 1/2019 | Widjaja |
| 2019/0067289 A1 | 2/2019 | Widjaja et al. |
| 2019/0096889 A1 | 3/2019 | Widjaja et al. |
| 2019/0131305 A1 | 5/2019 | Widjaja et al. |
| 2019/0139962 A1 | 5/2019 | Widjaja |
| 2019/0148381 A1 | 5/2019 | Widjaja et al. |
| 2019/0156889 A1 | 5/2019 | Widjaja |
| 2019/0156890 A1 | 5/2019 | Widjaja |
| 2019/0164974 A1 | 5/2019 | Widjaja |
| 2019/0180820 A1 | 6/2019 | Widjaja |
| 2019/0189212 A1 | 6/2019 | Widjaja |
| 2019/0259763 A1 | 8/2019 | Widjaja et al. |
| 2019/0267089 A1 | 8/2019 | Widjaja |
| 2019/0267382 A1 | 8/2019 | Widjaja |
| 2019/0295646 A1 | 9/2019 | Widjaja |
| 2019/0311769 A1 | 10/2019 | Louie et al. |
| 2019/0355419 A1 | 11/2019 | Widjaja |
| 2020/0013780 A1 | 1/2020 | Widjaja |
| 2020/0013781 A1 | 1/2020 | Widjaja et al. |
| 2020/0051633 A1 | 2/2020 | Widjaja |
| 2020/0091155 A1 | 3/2020 | Widjaja |
| 2020/0118627 A1 | 4/2020 | Widjaja |
| 2020/0118628 A1 | 4/2020 | Widjaja |
| 2020/0168609 A1 | 5/2020 | Widjaja et al. |
| 2020/0203346 A1 | 6/2020 | Widjaja |
| 2020/0227415 A1 | 7/2020 | Widjaja et al. |
| 2020/0243529 A1 | 7/2020 | Widjaja et al. |
| 2020/0243530 A1 | 7/2020 | Widjaja |
| 2020/0312855 A1 | 10/2020 | Widjaja |
| 2020/0335503 A1 | 10/2020 | Widjaja et al. |
| 2020/0342939 A1 | 10/2020 | Widjaja |

OTHER PUBLICATIONS

Lee, et al. "A Novel Capacitorless IT DRAM Cell for Data Retention Time Improvement." Nanotechnology, IEEE Transactions on, vol. 10, No. 3, 2011, p. 462-466.*

Lu, et al., "A Floating-Body/Gate DRAM Cell Upgraded for Long Retention Time", IEEE Elec. Dev. Letters, vol. 32, No. 3, pp. 731-733, Jun. 2011.*

Liu, Xuelian, et al. "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.*

Chatterjee, et al. "Taper isolated dynamic gain RAM cell." Electron Devices Meeting, 1978 International. vol. 24. IEEE, 1978, pp. 698-699.

Chatterjee, et al. Circuit Optimization of the Paper Isolated Dynamic Gain RAM Cell for VLSI Memories, pp. 22-23, 1979.

Chatterjee, et al. "A survey of high-density dynamic Ram cell concepts." Electron Devices, IEEE Transactions on 26.6 (1979): 827-839.

Erb, D. "Stratified charge memory." Solid-State Circuits Conference. Digest of Technical Papers. 1978 IEEE International. vol. 21. IEEE, 1978, pp. 24-25.

Leiss, et al, "dRAM Design Using the Taper-Isolated Dynamic RAM Cell." Solid-State Circuits, IEEE Journal of 17.2 (1982): 337-344.

Lin, et al., a new 1T DRAM Cell with enhanced Floating Body Effect, pp. 1-5, Proceeding of the 2006 IEEE International Workshop on Memory Technology.

Lanyon, et al., "Bandgap Narrowing in Moderately to Heavily Doped Silicon", pp. 1014-1018, No. 7, vol. ED-26, IEEE, 1979.

Ohsawa, et al. Autonomous refresh of floating body cell (FBC), IEEE 2008, pp. 801-804.

Oh, et al., A 4-Bit Double SONOS memory (DSM) with 4 Storage Nodes Per Cell for Ultimate Multi-Bit Operation, pp. 1-2, 2006, Symposium on VLSI Technology Digest of Technical Papers.

Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.

Reisch, "On bistable behavior and open-base breakdown of bipolar transistors in the avalanche regime-modeling and applications." Electron Devices IEEE Transactions on 39.6 (1992): 1398-1409.

Sakui, K., et al. "A new static memory cell based on the reverse base current effect of bipolar transistors." Electron Devices, IEEE Transactions on 36.6 (1989): 1215-1217.

Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.

Sze, et al. Physics of Semiconductor Devices, Wiley-Interscience, 2007, pp. 104.

Terada, et al. "A new VLSI memory cell using capacitance coupling (CC cell)." Electron Devices, IEEE Transactions on 31.9 (1984): pp. 1319-1324.

Villaret, et al. "Further insight into the physics and modeling of floating-body capacitorless DRAMs." Electron Devices, IEEE Transactions on 52.11 (2005): pp. 2447-2454.

Campardo, G. et al., VLSI Design of Non-Volatile Memories, Springer Berlin Heidelberg New York, 2005, pp. 94-95.

Han et al., Programming/Erasing Characteristics of 45 nm NOR-Type Flash Memory Based on SOI FinFET Structure. J. Korean Physical Society, vol. 47, Nov. 2005, pp. S564-S567.

Headland, Hot electron injection, Feb. 19, 2004, pp. 1-2.

Ohsawa et al., Memory Design Using One-Transistor Gain Cell on SOI, Tech.. Digest IEEE International Solid-State4 Circuits, vol. 37, No. 11, 2002, pp. 1510-1522.

Ohsawa et al., An 18.5ns, 128Mb SOI DRAM with a Floating Body Cell, IEEE International Solid-State Circuits Conference, 2005, pp. 458-459, 609.

Okhonin et al., A Capacitor-less 1T-DRAM Cell, IEEE Electron Device Letters, vol. 23, No. 2, Feb. 2002, pp. 85-87.

Okhonin et al., A SOI Capacitor-less 1T-DRAM Concept, IEEE International SOI Conference, 2001, pp. 153-154.

Okhonin et al., Principles of Transient Charge Pumping on Partially Depleted SOI MOSFETs, IEEE Electron Device Letters, vol. 23, No. 5, May 2002, pp. 279-281.

Pellizzer et al., A 90nm Phase Change Memory Technology fro Stand-Alone Non-Volatile Memory Applications, 2006 Symposium on VLSI Tech. Digest of Tech. Papers, pp. 1-2, 2006.

Ranica et al., Scaled 1T-Bulk devices built with CMOS 90nm technology for low-cost eDRAM applications, 2005 Symposium on VLSI Tech. Digest of Tech. Papers, pp. 38-39, 2005.

Pierret, Semiconductor Device Fundamentals, ISBN: 0-201-54393-1, Addison-Wesley Publishing Co., Inc., PNPN Devices 463-476, 1996.

Tack et al., The Multistable Charge-Controlled Memory Effect in SOI Transistors at Low Temperatures, IEEE Transactions on Electron Devices, vol. 37, May 1990, pp. 1373-1382.

Yoshida et al., A Design of Capacitorless 1T-DRAM Cell Using Gate-Induced Drain Leakage (GIDL) Current for Low-power and High-speed Embedded Memory, International Electron Device Meeting, 2003, pp. 1-4.

(56) References Cited

OTHER PUBLICATIONS

Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.
Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.
Aoulaiche, et al. "Junction Field Effect on the Retention Time for One-Transistor Floating-Body RAM." Electron Devices, IEEE Transactions on, vol. 59, No. 8, 2012, pp. 2167-2172.
Aoulaiche, et al. "Hot hole induced damage in 1T-FBRAM on bulk FinFET." Reliability Physics Symposium (IRPS), 2011 IEEE International. IEEE, 2011, pp. 99-104.
Avci, et al. "Floating-Body Diode—A Novel DRAM Device." Electron Device Letters, IEEE, vol. 33, No. 2, 2012, pp. 161-163.
Bawedin, et al., "Floating-Body SOI Memory: Concepts, Physics, and Challenges", ECS Transactions 19.4 (2009), pp. 243-256.
Ban, et al. "Integration of Back-Gate doping for 15-nm node floating body cell (FBC) memory." VLSI Technology (VLSIT), 2010 Symposium on. IEEE, 2010, pp. 159-160.
Cho, et al. "Variation-aware study of BJT-based capacitorless DRAM cell scaling limit." Silicon Nanoelectronics Norkshop (SNW), 2012 IEEE. IEEE, 2012, pp. 1-2.
Cho, et al. "Variation Study and Implications for BJT-Based Thin-Body Capacitorless DRAM." Electron Device Letters, IEEE, vol. 33, No. 3, 2012, pp. 312-314.
Chiu, et al. "Characteristics of a new trench-oxide thin-film transistor and its 1T-DRAM applications." Solid-State and ntegrated Circuit Technology (ICSICT), 2010 10th IEEE International Conference on. IEEE, 2010, pp. 1106-1108.
Chiu, et al. "A simple process of thin-film transistor using the trench-oxide layer for improving 1T-DRAM performance." Next-Generation Electronics (ISNE), 2010 International Symposium on. IEEE, 2010, pp. 254-257.
Chun, et al. "A 1.1 V, 667MHz random cycle, asymmetric 2T gain cell embedded DRAM with a 99.9 percentile retention time of 110μsec." VLSI Circuits (VLSIC), 2010 IEEE Symposium on. IEEE, 2010, pp. 191-192.
Chun, et al. "A 667 MHz Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.
Cao, et al. "A Novel 1T-1D DRAM Cell for Embedded Application." Electron Devices, IEEE Transactions on, vol. 59, No. 5, 2012, pp. 1304-1310.
Collaert, et al. "Substrate bias dependency of sense margin and retention in bulk FinFET 1T-DRAM cells." Solid-State Electronics 65 (2011, pp. 205-210.
Collaert, et al. "A low-voltage biasing scheme for aggressively scaled bulk FinFET 1T-DRAM featuring 10s retention at 85 C." VLSI Technology (VLSIT), 2010 Symposium on. IEEE, 2010, pp. 161-162.
Galeti, M., et al. "BJT effect analysis in p-and n-SOI MuGFETs with high-k gate dielectrics and TiN metal gate electrode for a 1T-DRAM application." SOI Conference (SOI), 2011 IEEE International. IEEE, 2011, pp. 1-2.
Gamiz, et al. "3D Trigate 1T-DRAM Memory Cell for 2x nm Nodes." Memory Workshop (IMW), 2012 4th IEEE International. IEEE, 2012, pp. 1-4.
Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.
Giusi, et al. "Bipolar mode operation and scalability of double-gate capacitorless 1T-DRAM cells." Electron Devices, IEEE Transactions on, vol. 57, No. 8 (2010), pp. 1743-1750.
Gupta, et al. "32nm high-density high-speed T-RAM embedded memory technology." Electron Devices Meeting (IEDM), 2010 IEEE International. IEEE, 2010, pp. 12-1.

Han, et al. "Bistable resistor (biristor)-gateless silicon nanowire memory." VLSI Technology (VLSIT), 2010 Symposium on. IEEE, 2010, pp. 171-172.
Han, et al. "Biristor—Bistable resistor based on a silicon nanowire." Electron Device Letters, IEEE 31.8 (2010): 797-799.
Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.
Hwang, et al. "Offset buried metal gate vertical floating body memory technology with excellent retention time for DRAM application." VLSI Technology (VLSIT), 2011 Symposium on. IEEE, 2011, pp. 172-173.
Kim, et al. "Investigation of 1T DRAM cell with non-overlap structure and recessed channel." Silicon Nanoelectronics Workshop (SNW), 2010. IEEE, 2010, pp. 1-2.
Kim, et al. "Optical charge-pumping: A universal trap characterization technique for nanoscale floating body devices." VLSI Technology (VLSIT), 2011 Symposium on. IEEE, 2011, pp. 190-191.
Lee, et al."A Novel Capacitorless 1T DRAM Cell for Data Retention Time Improvement." Nanotechnology, IEEE Transactions on, vol. 10, No. 3, 2011, pp. 462-466.
Lu, et al., "A Simplified Superior Floating-Body/Gate DRAM Cell", IEEE Elec. Dev. Letters, vol. 30, No. 3, Mar. 2009, pp. 282-284.
Mahatme, et al. "Total ionizing dose effects on ultra thin buried oxide floating body memories." Reliability Physics Symposium (IRPS), 2012 IEEE International, 2012, pp. 1-5.
Moon, et al. "Fin-width dependence of BJT-based 1T-DRAM implemented on FinFET." Electron Device Letters, vol. 31, No. 9(2010): 909-911.
Moon, et al. "An optically assisted program method for capacitorless 1T-DRAM" Electron Devices, IEEE Transactions on, vol. 57, No. 7, 2010, pp. 1714-1718.
Moon, et al. "Multi-functional universal device using a band-engineered vertical structure." Electron Devices Meeting (IEDM), 2011 IEEE International. IEEE, 2011, pp. 24-26.
Moon, et al. "Ultimately scaled 20nm unified-RAM." Electron Devices Meeting (IEDM), 2010 IEEE International. IEEE, 2010, pp. 12.2.1-12.2.4.
Nicoletti, et al. "The Dependence of Retention Time on Gate Length in UTBOX FBRAM With Different Source/Drain Junction Engineering." Electron Device Letters, vol. 33, No. 7, 2012, pp. 940-942.
Ohsawa, et al, "A Novel Capacitor-less DRAM Cell: Floating Body Cell", CRC Press, Taylor & Francis Group, 2012, pp. 1-7.
Ohsawa, et al. Autonomous refresh of floating-body cell due to Current Anomaly of Impact Ionization, IEEE Transactions on Electron Devices, vol. 56 No. 10, 2009, pp. 2302-2311.
Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 366-969.
Kim, et al. "Vertical double gate Z-RAM technology with remarkable low voltage operation for DRAM application." VLSI Technology (VLSIT), 2010 Symposium on, 2010, pp. 163-164.
Kim, et al. "Silicon on replacement insulator (SRI) floating body cell (FBC) memory." VLSI Technology (VLSIT), 2010 Symposium on. IEEE, 2010, pp. 165-166.
Ohsawa, et al. "Autonomous refresh of floating body cell (FBC)." Electron Devices Meeting, 2008. IEDM 2008. IEEE International. IEEE, 2008.
Rodriguez, et al. "A-RAM: Novel capacitor-less DRAM memory." In SOI Conference, 2009 IEEE International, pp. 1-2. IEEE, 2009.
Rodriguez, et al. "Novel capacitorless 1T-DRAM cell for 22-nm node compatible with bulk and SOI substrates." Electron Devices, IEEE Transactions on, vol. 58, No. 8 (2011), pp. 2371-2377.
Rodriguez, et al. "A-RAM memory cell: concept and operation." Electron Device Letters, IEEE, vol. 31, No. 9 (2010), pp. 972-974.
Romanjek, et al., "Compact (Wg/Lg=80/85nm) FDSOI 1T-DRAM programmed by Meta Stable Dip", Ultimate Integration on Silicon (ULIS), 2012 13th International Conference on, Mar. 6, 2012, pp. 199-202.

(56) References Cited

OTHER PUBLICATIONS

Rothemund, et al., The importance of being modular, Nature, vol. 485, May 2012 pp. 584-585.

Shim, Kyung-Suk, In-Young Chung, and Young Jun. Park. "A BJT-Based Heterostructure 1T-DRAM for Low-Voltage Dperation." Electron Device Letters, vol. 33, No. 1, 2012, pp. 14-16.

Shin, et al. "Vertical-Gate Si/SiGe Double-HBT-Based Capacitorless 1T DRAM Cell for Extended Retention Time at Low Latch Voltage." Electron Device Letters, vol. 33, No. 2, 2012, pp. 134-136.

Shin, et al. "A novel double HBT-based capacitorless 1T DRAM cell with Si/SiGe heterojunctions." Electron Device Letters, vol. 32, No. 7, 2011, pp. 850-852.

Ventrice, et al. "Analytical model of deeply-scaled thyristors for memory applications." Microelectronics and Electron Devices (WMED), 2012 IEEE Workshop on. IEEE, 2012, pp. 1-4.

Wu, et al. "Experimental Demonstration of the High-Performance Floating-Body/Gate DRAM Cell for Embedded Memories", IEEE Elec. Dev. Letter, vol. 33, No. 6, Jun. 2012, pp. 743-745.

Zhang, et al. "Total Ionizing Dose Effects on FinFET-Based Capacitor-Less 1T-DRAMs." Nuclear Science, IEEE Transactions on, vol. 57, No. 6, 2010, pp. 3298-3304.

Ban et al., A Scaled Floating Body Cell (FBC) Memory with High-k+Metal Gate on Thin-Silicon and Thin-Box for 16-nm Technology Node and Beyond, Symposium on VLSI Technology, 2008, pp. 92-93.

Ohsawa, et al. Autonomous refresh of floating-body cell due to Current Anomaly of Impact Ionization, IEEE Transactions on Electron Devices, vol. 56, No. 10, pp. 2301-2311, Oct. 2009.

Villaret et al., "Mechanisms of charge modulation in teh floating body of triple-well nMOSFET capacitor-less DRAMs", Microelectronic Engineering 72 (2004) 434-439.

Terada, et al. "A new VLSI memory cell using capacitance coupling (CC cell)." Electron Devices, IEEE Transactions on 51.9 (1984): pp. 1319-1324.

Ohsawa et al., Memory Design Using One-Transitor Gain Cell on SOI, Tech. Digest IEEE International Solid-State circuits, vol. 37, No. 11, 2002, p. 1510-1522.

* cited by examiner

| Search Data | Terminal 74 | Terminal 75 | CAM Data | State of 50 | State of 51 | Node 60 | Node 71a | Node 71b |
|---|---|---|---|---|---|---|---|---|
| 0 | 0V | 1.2V | 0 | State 0 | State 1 | 1.2V-Vt | 1.2V | 1.2V-2Vt |
| 0 | 0V | 1.2V | 1 | State 1 | State 0 | 0 | 1.2V | 0V |
| 1 | 1.2V | 0V | 0 | State 0 | State 1 | 0V | 1.2V | 0V |
| 1 | 1.2V | 0V | 1 | State 1 | State 0 | 1.2V-Vt | 1.2V | 1.2V-2Vt |

FIG. 16A

| Search Data | Terminal 74 | Terminal 75 | CAM Data | State of 50 | State of 51 | Node 60 | Node 71a | Node 71b |
|---|---|---|---|---|---|---|---|---|
| 0 | 0V | 1.2V | 0 | State 0 | State 1 | 1.2V | 1.2V | 1.2V-Vt |
| 0 | 0V | 1.2V | 1 | State 1 | State 0 | 0 | 1.2V | 0V |
| 1 | 1.2V | 0V | 0 | State 0 | State 1 | 0V | 1.2V | 0V |
| 1 | 1.2V | 0V | 1 | State 1 | State 0 | 1.2V | 1.2V | 1.2V-Vt |

FIG. 16B

| Search Data | Terminal 74 | Terminal 75 | CAM Data | State of 50 | State of 51 | Node 61 | Node 62 | Node 71a | Node 71b |
|---|---|---|---|---|---|---|---|---|---|
| 0 | 0V | 1.2V | 0 | State 0 | State 1 | 0V | 1.2V-Vt | 1.2V | 1.2V-2Vt |
| 0 | 0V | 1.2V | 1 | State 1 | State 0 | 0V | 0V | 1.2V | 0V |
| 1 | 1.2V | 0V | 0 | State 0 | State 1 | 0V | 0V | 1.2V | 0V |
| 1 | 1.2V | 0V | 1 | State 1 | State 0 | 1.2V-Vt | 0V | 1.2V | 1.2V-2Vt |

FIG. 25

| Search Data | Terminal 74 | Terminal 75 | CAM Data | State of 50 | State of 51 | Node 61 | Node 62 | Node 71a | Node 71b |
|---|---|---|---|---|---|---|---|---|---|
| 0 | 0V | 1.2V | 0 | State 0 | State 1 | 0V | 1.2V-Vt | 1.2V | 1.2V-2Vt |
| 0 | 0V | 1.2V | 1 | State 1 | State 0 | 0V | 0V | 1.2V | 0V |
| 1 | 1.2V | 0V | 0 | State 0 | State 1 | 0V | 0V | 1.2V | 0V |
| 1 | 1.2V | 0V | 1 | State 1 | State 0 | 1.2V-Vt | 0V | 1.2V | 1.2V-2Vt |
| 0 | 0V | 1.2V | X "Don't Care" | State 1 "Don't Care" | State 1 "Don't Care" | 1.2V-Vt | 1.2V-Vt | 1.2V | 1.2V-2Vt |
| 1 | 0V | 1.2V | X "Don't Care" | State 1 "Don't Care" | State 1 "Don't Care" | 1.2V-Vt | 0V | 1.2V | 1.2V-2Vt |
| X "Don't Care" | 1.2V | 1.2V | 1 | State 1 | State 0 | 0V | 1.2V-Vt | 1.2V | 1.2V-2Vt |
| X "Don't Care" | 1.2V | 1.2V | 0 | State 0 | State 1 | 0V | 0V | 1.2V | 1.2V-2Vt |

FIG. 26

| Search Data | Terminal 74 | Terminal 75 | CAM Data | State of 50 | State of 51 | Node 60 | Node 71 |
|---|---|---|---|---|---|---|---|
| 0 | 0V | 1.2V | 0 | State 0 | State 1 | 1.2V-Vt | 0V |
| 0 | 0V | 1.2V | 1 | State 1 | State 0 | 0V | 1.2V |
| 1 | 1.2V | 0V | 0 | State 0 | State 1 | 0V | 1.2V |
| 1 | 1.2V | 0V | 1 | State 1 | State 0 | 1.2V-Vt | 0V |

FIG. 30

| Search Data | Terminal 74 | Terminal 75 | CAM Data | State of 50 | State of 51 | Node 61 | Node 62 | Node 71 |
|---|---|---|---|---|---|---|---|---|
| 0 | 0V | 1.2V | 0 | State 0 | State 1 | 1.2V-Vt | 1.2V-Vt | 0V |
| 0 | 0V | 1.2V | 1 | State 1 | State 0 | 0V | 1.2V-Vt | 1.2V |
| 1 | 1.2V | 0V | 0 | State 0 | State 1 | 1.2V-Vt | 0V | 1.2V |
| 1 | 1.2V | 0V | 1 | State 1 | State 0 | 1.2V-Vt | 1.2V-Vt | 0V |
| 0 | 0V | 1.2V | X "Don't Care" | State 0 "Don't Care" | State 0 "Don't Care" | 1.2V-Vt | 1.2V-Vt | 0V |
| 1 | 1.2V | 0V | X "Don't Care" | State 0 "Don't Care" | State 0 "Don't Care" | 1.2V-Vt | 1.2V-Vt | 0V |
| X "Don't Care" | 1.2V | 1.2V | 0 | State 0 | State 1 | 1.2V-Vt | 1.2V-Vt | 0V |
| X "Don't Care" | 1.2V | 1.2V | 1 | State 1 | State 0 | 1.2V-Vt | 1.2V-Vt | 0V |

FIG. 32

| Search Data | Terminal 74 | Terminal 75 | CAM Data | State of 50 | State of 51 | State of 200 | Node 60 | Node 63 | Node 80 | Node 71a | Node 71b |
|---|---|---|---|---|---|---|---|---|---|---|---|
| 0 | 0V | 1.2V | 0 | State 0 | State 1 | State 0 | 1.2V-Vt | 0 | 1.2V | 1.2V | 1.2V-Vt |
| 0 | 0V | 1.2V | 1 | State 1 | State 0 | State 0 | 0 | 0 | 1.2V | 1.2V | 0V |
| 1 | 1.2V | 0V | 0 | State 0 | State 1 | State 0 | 0V | 0 | 1.2V | 1.2V | 0V |
| 1 | 1.2V | 0V | 1 | State 1 | State 0 | State 0 | 1.2V-Vt | 0 | 1.2V | 1.2V | 1.2V-Vt |
| Don't Care | 1.2V | 1.2V | 0 | State 0 | State 1 | State 0 | 1.2V-Vt | 0 | 1.2V | 1.2V | 1.2V-Vt |
| Don't Care | 1.2V | 1.2V | 1 | State 1 | State 0 | State 0 | 1.2V-Vt | 0 | 1.2V | 1.2V | 1.2V-Vt |
| 0 | 0V | 1.2V | Don't Care | Don't Care | Don't Care | State 1 | Don't Care | 1.2V-Vt | 1.2V | 1.2V | 1.2V-Vt |
| 1 | 1.2V | 0V | Don't Care | Don't Care | Don't Care | State 1 | Don't Care | 1.2V-Vt | 1.2V | 1.2V | 1.2V-Vt |

FIG. 38

| Search Data | Terminal 74 | Terminal 75 | CAM Data | State of 50 | State of 51 | State of 200 | Node 61 | Node 62 | Node 63 | Node 80 | Node 71a | Node 71b |
|---|---|---|---|---|---|---|---|---|---|---|---|---|
| 0 | 0V | 1.2V | 0 | State 0 | State 1 | State 0 | 0V | 1.2V-Vt | 0 | 1.2V | 1.2V | 1.2V-2Vt |
| 0 | 0V | 1.2V | 1 | State 1 | State 0 | State 0 | 0 | 0V | 0 | 1.2V | 1.2V | 0V |
| 1 | 1.2V | 0V | 0 | State 0 | State 1 | State 0 | 0V | 0V | 0 | 1.2V | 1.2V | 0V |
| 1 | 1.2V | 0V | 1 | State 1 | State 0 | State 0 | 1.2V-Vt | 0V | 0 | 1.2V | 1.2V | 1.2V-2Vt |
| Don't Care | 1.2V | 1.2V | 0 | State 0 | State 1 | State 0 | 0V | 1.2V-Vt | 0 | 1.2V | 1.2V | 1.2V-2Vt |
| Don't Care | 1.2V | 1.2V | 1 | State 1 | State 0 | State 0 | 1.2V-Vt | 0V | 0 | 1.2V | 1.2V | 1.2V-2Vt |
| Don't Care | 1.2V | 1.2V | Don't Care | Don't Care | Don't Care | State 1 | Don't Care | Don't Care | 1.2V-Vt | 1.2V | 1.2V | 1.2V-2Vt |
| 0 | 0V | 1.2V | Don't Care | Don't Care | Don't Care | State 1 | Don't Care | Don't Care | 1.2V-Vt | 1.2V | 1.2V | 1.2V-2Vt |
| 1 | 1.2V | 0V | Don't Care | Don't Care | Don't Care | State 1 | Don't Care | Don't Care | 1.2V-Vt | 1.2V | 1.2V | 1.2V-2Vt |

FIG. 43

| Search Data | Terminal 74 | Terminal 75 | CAM Data | State of 50 | State of 51 | State of 200 | Node 60 | Node 63 | Node 71 |
|---|---|---|---|---|---|---|---|---|---|
| 0 | 0V | 1.2V | 0 | State 0 | State 1 | State 0 | 1.2V-Vt | 0V | 0V |
| 0 | 0V | 1.2V | 1 | State 1 | State 0 | State 0 | 0V | 0V | 1.2V |
| 1 | 1.2V | 0V | 0 | State 0 | State 1 | State 0 | 0V | 0V | 1.2V |
| 1 | 1.2V | 0V | 1 | State 1 | State 0 | State 0 | 1.2V-Vt | 0V | 0V |
| Don't Care | 1.2V | 1.2V | 0 | State 0 | State 1 | State 0 | 1.2V-Vt | 0V | 0V |
| Don't Care | 1.2V | 1.2V | 1 | State 1 | State 0 | State 0 | 1.2V-Vt | 0V | 0V |
| Don't Care | 1.2V | 1.2V | Don't Care | Don't Care | Don't Care | State 1 | 1.2V-Vt | 1.2V-Vt | 0V |
| 0 | 0V | 1.2V | Don't Care | Don't Care | Don't Care | State 1 | Don't Care | 1.2V-Vt | 0V |
| 1 | 1.2V | 0V | Don't Care | Don't Care | Don't Care | State 1 | Don't Care | 1.2V-Vt | 0V |

FIG. 46

| Search Data | Terminal 74 | Terminal 75 | CAM Data | State of 50 | State of 51 | State of 200 | Node 61 | Node 62 | Node 63 | Node 71 |
|---|---|---|---|---|---|---|---|---|---|---|
| 0 | 0V | 1.2V | 0 | State 0 | State 1 | State 0 | 1.2V-Vt | 1.2V-Vt | 0V | 0V |
| 0 | 0V | 1.2V | 1 | State 1 | State 0 | State 0 | 0V | 1.2V-Vt | 0V | 1.2V |
| 1 | 1.2V | 0V | 0 | State 0 | State 1 | State 0 | 1.2V-Vt | 0V | 0V | 1.2V |
| 1 | 1.2V | 0V | 1 | State 1 | State 0 | State 0 | 1.2V-Vt | 1.2V-Vt | 0V | 0V |
| Don't Care | 1.2V | 1.2V | 0 | State 0 | State 1 | State 0 | 1.2V-Vt | 1.2V-Vt | 0V | 0V |
| Don't Care | 1.2V | 1.2V | 1 | State 1 | State 0 | State 0 | 1.2V-Vt | 1.2V-Vt | 0V | 0V |
| Don't Care | 1.2V | 1.2V | Don't Care | Don't Care | Don't Care | State 1 | 1.2V-Vt | 1.2V-Vt | 1.2V-Vt | 0V |
| 0 | 0V | 1.2V | Don't Care | Don't Care | Don't Care | State 1 | Don't Care | Don't Care | 1.2V-Vt | 0V |
| 1 | 1.2V | 0V | Don't Care | Don't Care | Don't Care | State 1 | Don't Care | Don't Care | 1.2V-Vt | 0V |

FIG. 49

| Search Data | Terminal 74 | Terminal 75 | CAM Data | State of 50 | State of 51 | Node 60 | Node 71a | Node 71b |
|---|---|---|---|---|---|---|---|---|
| 0 | 0V | 1.2V | 0 | State 1 | State 0 | 0V | 1.2V | 1.2V |
| 0 | 0V | 1.2V | 1 | State 0 | State 1 | 1.2V-Vt | 1.2V | 0V |
| 1 | 1.2V | 0V | 0 | State 1 | State 0 | 1.2V-Vt | 1.2V | 0V |
| 1 | 1.2V | 0V | 1 | State 0 | State 1 | 0V | 1.2V | 1.2V |

FIG. 55

| Search Data | Terminal 74 | Terminal 75 | CAM Data | State of 50 | State of 51 | Node 60 | Node 71a | Node 71b |
|---|---|---|---|---|---|---|---|---|
| 0 | 1.2V | 0V | 0 | State 0 | State 1 | 0V | 1.2V | 1.2V |
| 0 | 1.2V | 0V | 1 | State 1 | State 0 | 1.2V-Vt | 1.2V | 0V |
| 1 | 0V | 1.2V | 0 | State 0 | State 1 | 1.2V-Vt | 1.2V | 0V |
| 1 | 0V | 1.2V | 1 | State 1 | State 0 | 0V | 1.2V | 1.2V |

FIG. 56

| Search Data | Terminal 74 | Terminal 75 | CAM Data | State of 50 | State of 51 | Node 60 | Node 71 |
|---|---|---|---|---|---|---|---|
| 0 | 0V | 1.2V | 0 | State 0 | State 1 | 1.2V-Vt | 1.2V-Vt-Vd or High Current |
| 0 | 0V | 1.2V | 1 | State 1 | State 0 | 0 | 0V or Low Current |
| 1 | 1.2V | 0V | 0 | State 0 | State 1 | 0V | 0V or Low Current |
| 1 | 1.2V | 0V | 1 | State 1 | State 0 | 1.2V-Vt | 1.2V-Vt-Vd or High Current |

FIG. 58

| Search Data | Terminal 74 | Terminal 75 | CAM Data | State of 50 | State of 51 | Node 60 | Node 72 |
|---|---|---|---|---|---|---|---|
| 0 | 0V | 1.2V | 0 | State 0 | State 1 | 1.2V-Vt | Low Current |
| 0 | 0V | 1.2V | 1 | State 1 | State 0 | 0 | High Current |
| 1 | 1.2V | 0V | 0 | State 0 | State 1 | 0V | High Current |
| 1 | 1.2V | 0V | 1 | State 1 | State 0 | 1.2V-Vt | Low Current |

FIG. 60

| | Match conditions | | | |
|---|---|---|---|---|
| | Source | Channel (data) | Drain (input) | Event |
| Data '1' and Input '1' | 1.2V | On | 1.8V | No floating body current due to small $V_D$-$V_S$ to cause impact ionization |
| Data '0' and Input '0' | 1.2V | Off | 0V | No floating body current due to small $V_S$ to cause BTBT near source |
| | Mismatch conditions | | | |
| | Source | Channel (data) | Drain (input) | Event |
| Data '1' Input '0' | 1.2V | On | 0V | Floating body current due to impact ionization near source |
| Data '0' Input '1' | 1.2V | Off | 1.8V | Floating body current due to high $V_D$ to cause BTBT near drain |

FIG. 71E

| | Match conditions | | | |
|---|---|---|---|---|
| | Source | Channel (data) | Drain (input) | Event |
| Data '1' Input '1' | 1.2V | On | 1.2V | No floating body current due to $V_S - V_D = 0V$ |
| Data '0' Input '0' | 1.2V | Off | 0V | No floating body current due to small junction overlap to cause BTBT near source |

| | Mismatch conditions | | | |
|---|---|---|---|---|
| | Source | Channel (data) | Drain (input) | Event |
| Data '1' Input '0' | 1.2V | On | 0V | Floating body current due to impact ionization near source |
| Data '0' Input '1' | 1.2V | Off | 1.2V | Floating body current due to large junction overlap to cause BTBT near drain |

FIG. 72E

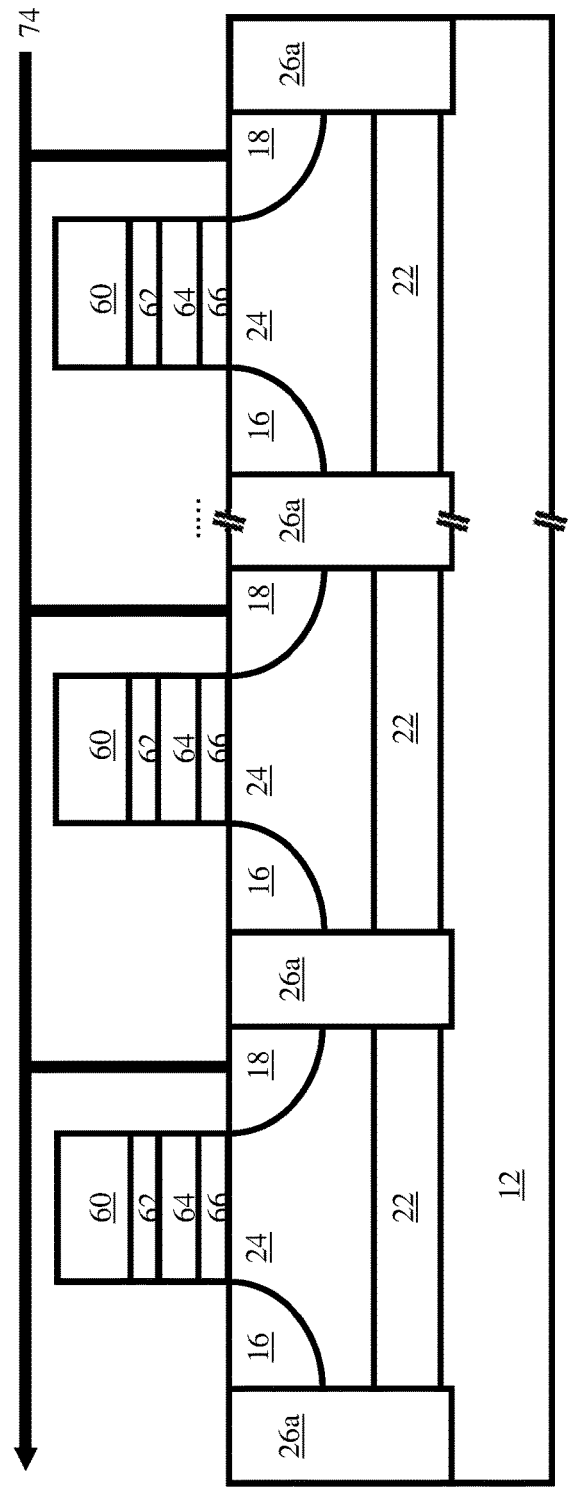
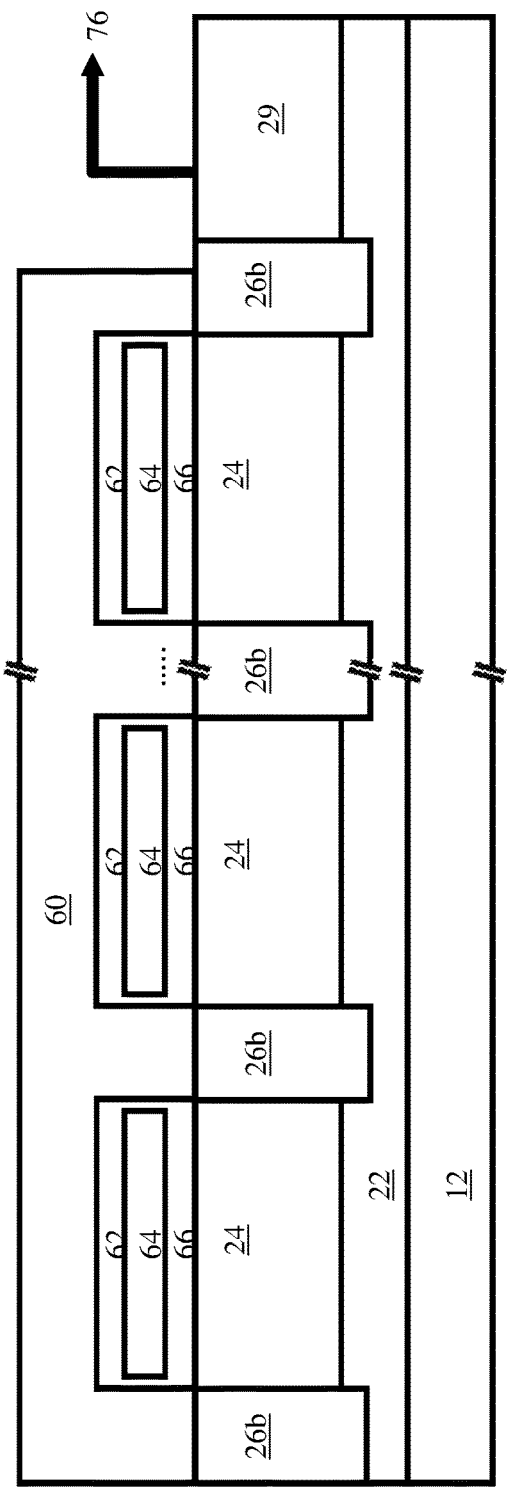
FIG. 78A
FIG. 78B

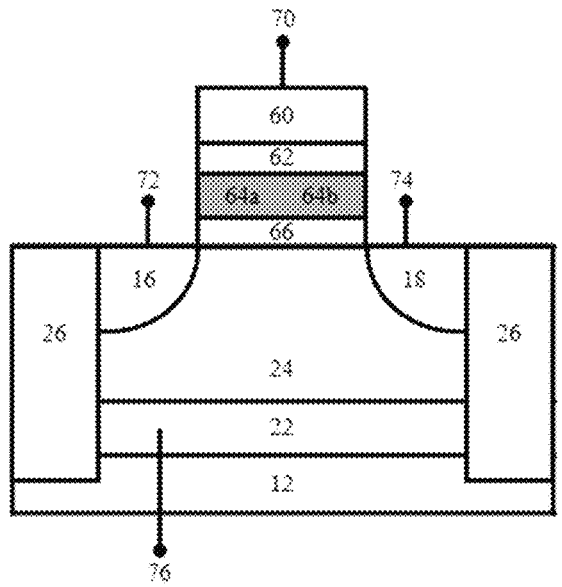
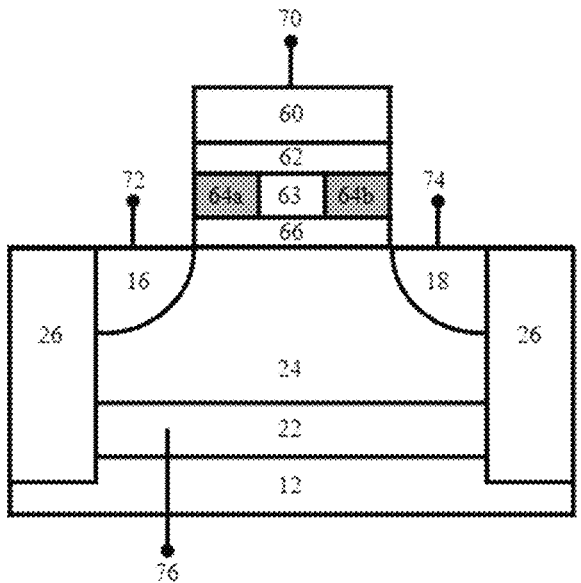
FIG. 82A  FIG. 82B
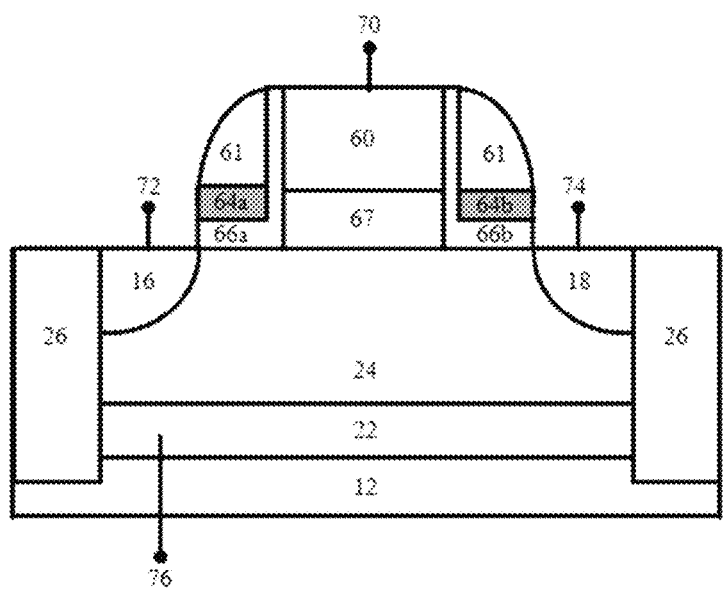
FIG. 82C

| Stored data state | Data bit logic value |
|---|---|
| D(0,0) | X |
| D(0,1) | 0 |
| D(1,0) | 1 |
| D(1,1) | Don't allow |

FIG. 83A

| Search input state | Search bit logic value |
|---|---|
| S(0,0) | M |
| S(0,1) | 0 |
| S(1,0) | 1 |
| S(1,1) | Don't allow |

FIG. 83B

Data bit 'X'
Search bit '0'

Data bit 'X'
Search bit '1'

Data bit '0'
Search bit '0'

Data bit '0'
Search bit '1'

Data bit '1'
Search bit '0'

Data bit '1'
Search bit '1'

Data bit '0'
Search bit 'M'

Data bit '1'
Search bit 'M'

No excess holes in floating body

Excess holes in the floating body

US 11,100,994 B2

CONTENT ADDRESSABLE MEMORY DEVICE HAVING ELECTRICALLY FLOATING BODY TRANSISTOR

CROSS-REFERENCE

This application is a continuation application of co-pending application Ser. No. 16/449,820, filed Jun. 24, 2019, which is a continuation of application Ser. No. 16/013,646, filed Jun. 20, 2018, now U.S. Pat. No. 10,373,685, which is a continuation application of application Ser. No. 14/867,308, filed Sep. 28, 2015, now U.S. Pat. No. 10,026,479; which is a continuation application of application Ser. No. 14/154,138, filed Jan. 13, 2014, now U.S. Pat. No. 9,208,880, each of which applications and patents is hereby incorporated herein by reference in its entirety and to which applications we claim priority under 35 USC § 120. application Ser. No. 14/154,138 claims the benefit of U.S. Provisional Application No. 61/752,096, filed Jan. 14, 2013, which application is hereby incorporated herein, in its entirety, by reference thereto.

Application Ser. No. 14/154,138 claims the benefit of U.S. Provisional Application No. 61/781,865, filed Mar. 14, 2013, which application is hereby incorporated herein, in its entirety, by reference thereto.

Application Ser. No. 14/154,138 claims the benefit of U.S. Provisional Application No. 61/800,199, filed Mar. 15, 2013, which application is hereby incorporated herein, in its entirety, by reference thereto.

FIELD OF THE INVENTION

The present invention relates to semiconductor memory technology. More specifically, the present invention relates to a semiconductor memory device having an electrically floating body transistor.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

A DRAM cell without a capacitor has been investigated previously. Such memory eliminates the capacitor used in the conventional 1T/1C memory cell, and thus is easier to scale to smaller feature size. In addition, such memory allows for a smaller cell size compared to the conventional 1T/1C memory cell. Chatterjee et al. have proposed a Taper Isolated DRAM cell concept in "Taper Isolated Dynamic Gain RAM Cell", P. K. Chatterjee et al., pp. 698-699, International Electron Devices Meeting, 1978 ("Chatterjee-1"), "Circuit Optimization of the Taper Isolated Dynamic Gain RAM Cell for VLSI Memories", P. K. Chatterjee et al., pp. 22-23, IEEE International Solid-State Circuits Conference, February 1979 ("Chatterjee-2"), and "dRAM Design Using the Taper-Isolated Dynamic RAM Cell", J. E. Leiss et al., pp. 337-344, IEEE Journal of Solid-State Circuits, vol. SC-17, no. 2, April 1982 ("Leiss"), all of which are hereby incorporated herein, in their entireties, by reference thereto. The holes are stored in a local potential minimum, which looks like a bowling alley, where a potential barrier for stored holes is provided. The channel region of the Taper Isolated DRAM cell contains a deep n-type implant and a shallow p-type implant. As shown in "A Survey of High-Density Dynamic RAM Cell Concepts", P. K. Chatterjee et al., pp. 827-839, IEEE Transactions on Electron Devices, vol. ED-26, no. 6, June 1979 ("Chatterjee-3"), which is hereby incorporated herein, in its entirety, by reference thereto, the deep n-type implant isolates the shallow p-type implant and connects the n-type source and drain regions.

Terada et al. have proposed a Capacitance Coupling (CC) cell in "A New VLSI Memory Cell Using Capacitance Coupling (CC) Cell", K. Terada et al., pp. 1319-1324, IEEE Transactions on Electron Devices, vol. ED-31, no. 9, September 1984 ("Terada"), while Erb has proposed Stratified Charge Memory in "Stratified Charge Memory", D. M. Erb, pp. 24-25, IEEE International Solid-State Circuits Conference, February 1978 ("Erb"), both of which are hereby incorporated herein, in their entireties, by reference thereto.

DRAM based on the electrically floating body effect has been proposed both in silicon-on-insulator (SOI) substrate (see for example "The Multistable Charge-Controlled Memory Effect in SOI Transistors at Low Temperatures", Tack et al., pp. 1373-1382, IEEE Transactions on Electron Devices, vol. 37, May 1990 ("Tack"), "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002, all of which are hereby incorporated herein, in their entireties, by reference thereto) and in bulk silicon (see for example "A one transistor cell on bulk substrate (1T-Bulk) for low-cost and high density eDRAM", R. Ranica et al., pp. 128-129, Digest of Technical Papers, 2004 Symposium on VLSI Technology, June 2004 ("Ranica-1"), "Scaled 1T-Bulk Devices Built with CMOS 90 nm Technology for Low-Cost eDRAM Applications", R. Ranica et al., 2005 Symposium on VLSI Technology, Digest of Technical Papers ("Ranica-2"), "Further Insight Into the Physics and Modeling of Floating-Body Capacitorless DRAMs", A. Villaret et al, pp. 2447-2454, IEEE Transactions on Electron Devices, vol. 52, no. 11, November 2005 ("Villaret"), "Simulation of intrinsic bipolar transistor mechanisms for future capacitor-less eDRAM on bulk substrate", R. Pulicani et al., pp. 966-969, 2010 17th IEEE International Conference on Electronics, Circuits, and Systems (ICECS) ("Pulicani"), which are hereby incorporated herein, in their entireties, by reference thereto).

Widjaja and Or-Bach describes a bi-stable SRAM cell incorporating a floating body transistor, where more than one stable state exists for each memory cell (for example as described in U.S. Pat. No. 8,130,548 to Widjaja et al., titled "Semiconductor Memory Having Floating Body Transistor and Method of Operating" ("Widjaja-1"), U.S. Pat. No. 8,077,536, "Method of Operating Semiconductor Memory Device with Floating Body Transistor Using Silicon Controlled Rectifier Principle" ("Widjaja-2"), U.S. Patent Application Publication No. 2013/0264656 A1, "Memory Device Having Electrically Floating Body Transistor" ("Widjaja-3"), all of which are hereby incorporated herein, in their entireties, by reference thereto). This bi-stability is achieved due to the applied back bias which causes impact ionization and generates holes to compensate for the charge leakage current and recombination.

Content addressable memories (CAMs) are used in high speed search applications and typically require significant number s of transistors and resources to implement. CAMs are different from typical memory devices in which the user typically supplies an address and the memory device will return the data stored at that address. In a CAM, the user or system will provide the memory device a set of data. The CAM will then search through its contents to see if any data matches the data being provided by the user/system. If matching data can be found, the CAM returns the address(es) upon which the matching data was found.

A CAM typically may consume a significant amount of area since it is a traditional SRAM memory with logic added to implement high speed searching capabilities. A typical CAM cell will include a SRAM memory bit in addition to matching logic required to indicate whether or not this cell has matched the provided data.

A Ternary Content Addressable Memory (TCAM) is a modified Content Addressable Memory which allows it to support an additional "don't care" or "x" state beyond traditional "1" and "0" states supported in other memories including normal CAMs. The "x" state is used as a "don't care." If this state is selected for a data bit, the compare logic of the TCAM bit should ignore any matching data and always allow this single bit to pass. In addition to storing a "don't care" state within the TCAM memory, the user or system should also have the ability to mask or apply a "don't care" state when applying match data to the TCAM memory. This function is typically implemented by using a normally illegal state of non-complementary data such as "11" or "00" instead of the typically complementary data of "10" or "01". TCAMs are typically significantly larger that CAM memories since the don't care state is usually stored in a second SRAM cell per TCAM bit. Thus each TCAM cell usually includes 2 SRAM bits, and additional matching logic typically costing a footprint of 16-24 transistors per TCAM cell.

This function is typically implemented by using a normally illegal state of non-complementary data such as "11" or "00" instead of the typically complementary data of "10" or "01". TCAMs are typically significantly larger that CAM memories since the don't care state is usually stored in a second SRAM cell per TCAM bit. Thus each TCAM cell usually includes 2 SRAM bits, and additional matching logic typically costing a footprint of 16-24 transistors per TCAM cell.

There is a need for content addressable memory that significantly reduces the amount of resources consumed by currently available content addressable memory.

There is a need for content addressable memory that occupies a smaller footprint than currently available content addressable memories.

SUMMARY OF THE INVENTION

According to one aspect of the present invention, a content addressable memory cell comprising is provided, including: a first floating body transistor; and a second floating body transistor; wherein the first floating body transistor and said second floating body transistor are electrically connected in series through a common node; and wherein the first floating body transistor and the second floating body transistor store complementary data.

In at least one embodiment, the first floating body transistor and the second floating body transistor comprise a buried well region.

In at least one embodiment, the first floating body transistor and the second floating body transistor comprise a buried insulator region.

In at least one embodiment, the first floating body transistor comprises a first gate region and the second floating body transistor comprises a second gate region.

In at least one embodiment, the content addressable memory includes a third transistor.

In at least one embodiment, the first floating body transistor comprises a first conductivity type and the third transistor comprises the first conductivity type.

In at least one embodiment, the first floating body transistor comprises a first conductivity type and the third transistor comprises a second conductivity type different from the first conductivity type.

In at least one embodiment, the content addressable memory further includes a third floating body transistor.

In another aspect of the present invention, a content addressable memory includes: a first bi-stable floating body transistor; and a second bi-stable floating body transistor; wherein the first bi-stable floating body transistor and the second bi-stable floating body transistor are electrically connected in series through a common node; and wherein the first floating body transistor and the second floating body transistor store complementary data.

In at least one embodiment, the first bi-stable floating body transistor and the second bi-stable floating body transistor comprise a buried well region.

In at least one embodiment, the first bi-stable floating body transistor and the second bi-stable floating body transistor comprise a buried insulator region.

In at least one embodiment, the first bi-stable floating body transistor comprises a first gate region and the second bi-stable floating body transistor comprises a second gate region.

In at least one embodiment, the content addressable memory includes an additional transistor.

In at least one embodiment, the first floating body comprises a first conductivity type and the additional transistor comprises the first conductivity type.

In at least one embodiment, the first floating body transistor comprises a first conductivity type and the additional transistor comprises a second conductivity type different from the first conductivity type.

In at least one embodiment, the content addressable memory of further includes a third bi-stable floating body transistor.

In another aspect of the present invention, a content addressable memory cell includes: a first transistor having a first floating body; a second transistor having a second floating body; a first drain region contacting the first floating body; a second drain region contacting the second floating body; a first source region contacting the first floating body, spaced apart from the first drain region; and a second source region contacting the second floating body, spaced apart from the second drain region; wherein the first and second drain regions are electrically connected to each other; and wherein the first floating body and the second floating body stores complementary charge states.

In at least one embodiment, the first transistor and the second transistor comprise a buried well region.

In at least one embodiment, the first transistor and the second transistor comprise a buried insulator region.

In at least one embodiment, the first transistor comprises a first gate region and the second transistor comprises a second gate region.

In at least one embodiment, the content addressable memory further includes a third transistor.

In at least one embodiment, the first transistor comprises a first conductivity type and the third transistor comprises the first conductivity type.

In at least one embodiment, the first transistor comprises a first conductivity type and the third transistor comprises a second conductivity type different from the first conductivity type.

In at least one embodiment, the content addressable memory further includes a fourth transistor, having a third floating body.

These and other features of the present invention will become apparent to those persons skilled in the art upon reading the details of the memory cells, arrays and methods as more fully described below.

BRIEF DESCRIPTION OF THE DRAWINGS

FIGS. 16A and 16B illustrate various voltage states applied to terminals of a memory cell or plurality of memory cells, to carry out match operations according to various embodiments of the present invention.

FIG. 25 illustrates exemplary bias conditions applied to a CAM cell illustrated in any one of FIGS. 21-23.

FIG. 26 illustrates exemplary bias conditions applied to the TCAM cell illustrated in FIG. 24.

FIG. 30 shows a set of exemplary bias conditions for FIG. 28.

FIG. 32 shows a set of exemplary bias conditions for FIG. 31.

FIG. 38 shows a set of exemplary bias conditions for FIG. 37.

FIG. 43 shows a set of exemplary bias conditions for the cell of FIG. 42.

FIG. 46 shows a set of exemplary bias conditions for the cell of FIG. 45.

FIG. 49 shows a set of exemplary bias conditions for the cell of FIG. 48.

FIG. 55 shows a set of exemplary bias conditions for the cell of FIG. 54 indicating an inversion being applied to the writing of the floating boy (FB) CAM bit.

FIG. 56 shows a set of exemplary bias conditions for the cell of FIG. 54, indicating an inversion being applied to the search data being input to the FB CAM bit.

FIG. 58 shows a set of exemplary bias conditions for the cell of FIG. 57.

FIG. 60 shows a set of exemplary bias conditions for the cell of FIG. 59.

FIG. 71E summarizes the matching and mismatch conditions described in FIGS. 71A-71D, according to an embodiment of the present invention.

FIG. 72E summarizes the matching and mismatch conditions described in FIGS. 72A-72D, according to an embodiment of the present invention.

FIGS. 78A and 78B schematically illustrate cross-sectional views of memory cells joined to make a memory array, according to an embodiment of the present invention.

FIGS. 82A-82E are schematic illustrations of content addressable memory cells according to various embodiment of the present invention.

FIG. 83A illustrates the data states and the corresponding data bit logic values of a content addressable memory cell according to an embodiment of the present invention.

FIG. 83B illustrates the input states and the corresponding search bit logic values of a content addressable memory cell according to an embodiment of the present invention.

DETAILED DESCRIPTION OF THE INVENTION

Figure 1:
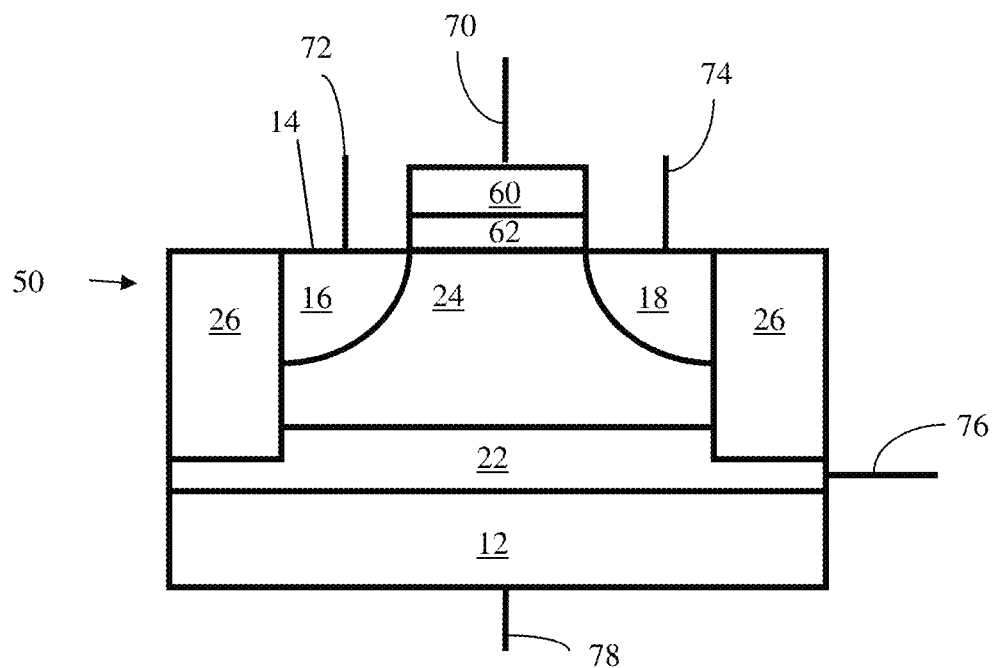
FIG. 1 is a schematic, cross-sectional illustration of a memory cell according to an embodiment of the present invention.

Before the present memory cells, arrays and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a substrate terminal" includes a plurality of such substrate terminals and reference to "the region" includes reference to one or more regions and equivalents thereof known to those skilled in the art, and so forth.

The publications discussed herein are provided solely for their disclosure prior to the filing date of the present application. Nothing herein is to be construed as an admission that the present invention is not entitled to antedate such publication. For example, the dates of publication provided may be different from the actual publication dates which may need to be independently confirmed.

DEFINITIONS

"Content addressable memories" (CAMs) are memories used in high speed search applications. CAMs are different from typical memory devices in which the user typically supplies an address and the memory device will return the data stored at that address. In a CAM, the user or system will provide the memory device a set of data. The CAM will then search through its contents to see if any data matches the data being provided by the user/system. If matching data can be found, the CAM returns the address(es) upon which the matching data was found.

A Ternary Content Addressable Memory (TCAM) is a modified content addressable memory (CAM) which allows it to support an additional "don't care" or "x" state beyond traditional "1" and "0" states supported in other memories including normal CAMs. The "x" state is used as a "don't care." If this state is selected for a data bit, the compare logic of the TCAM bit ignores any matching data and always allows this single bit to pass. In addition to storing a "don't care" state within the TCAM memory, the user or system should also have the ability to mask or apply a "don't care" state when applying match data to the TCAM memory.

A "pass operation" also known as a "match operation" is the operation where the data applied by the user matches the data stored within the CAM or TCAM cell. User data is typically applied in a complementary manner, "10" for data "1" or "01" for data"0". If user data is not applied in a complementary manner, it can be easily converted by use of an inverter.

A "match string" refers to a method and construct by which the CAM or TCAM memory cell communicates with other CAM or TCAM cells in order to determine whether a plurality of CAM or TCAM cells has collectively matched or passed the users applied data. Common approaches which will be easily understood by those versed in the art include but are not limited to wide fan OR and wide fan AND gates.

DETAILED DESCRIPTION

The present invention describes content addressable memories (CAMs) comprising floating body memory cells. Content addressable memories are used in high speed search applications and typically require significant number s of transistors and resources to implement. CAMs are different from typical memory devices in which the user typically supplies an address and the memory device will return the data stored at that address. In a CAM, the user or system will provide the memory device a set of data. The CAM will then search through its contents to see if any data matches the data being provided by the user/system. If matching data can be found, the CAM returns the address(es) upon which the matching data was found.

A CAM typically may consume a significant amount of area since it is a traditional SRAM memory with logic added to implement high speed searching capabilities. A typical CAM cell will include a SRAM memory bit in addition to matching logic required to indicate whether or not this cell has matched the provided data.

A Ternary Content Addressable Memory (TCAM) is a modified Content Addressable Memory which allows it to support an additional "don't care" or "x" state beyond traditional "1" and "0" states supported in other memories including normal CAMs. The "x" state is used as a "don't care." If this state is selected for a data bit, the compare logic of the TCAM bit should ignore any matching data and always allow this single bit to pass. In addition to storing a "don't care" state within the TCAM memory, the user or system should also have the ability to mask or apply a "don't care" state when applying match data to the TCAM memory. This function is typically implemented by using a normally illegal state of non-complementary data such as "11" or "00" instead of the typically complementary data of "10" or "01".

TCAMs are typically significantly larger that CAM memories since the don't care state is usually stored in a second SRAM cell per TCAM bit. Thus each TCAM cell usually includes 2 SRAM bits, and additional matching logic typically costing a footprint of 16-24 transistors per TCAM cell.

According to one aspect of the present invention, floating body transistors are utilized to implement a content addressable memory (CAM) bit with significantly lower resources consumed. Additionally, a ternary content addressable memory (TCAM) bit having electrically floating body transistors is also described.

Referring to FIG. 1, a memory cell 50 having an electrically floating body is shown. Memory cell 50 includes a substrate 12 of a first conductivity type such as p-type, for example. Substrate 12 is typically made of silicon, but may also comprise, for example, germanium, silicon germanium, gallium arsenide, carbon nanotubes, and/or other semiconductor materials. In some embodiments of the invention, substrate 12 can be the bulk material of the semiconductor wafer. In another embodiment shown in FIG. 2, substrate 12A of a first conductivity type (for example, p-type) can be a well of the first conductivity type embedded in a well 29 of the second conductivity type, such as n-type. The well 29 in turn can be another well inside substrate 12B of the first conductivity type (for example, p-type). In another embodiment, well 12A can be embedded inside the bulk of the semiconductor wafer of the second conductivity type (for example, n-type). These arrangements allow for segmentation of the substrate terminal, which is connected to region 12A. To simplify the description, the substrate 12 will usually be drawn as the semiconductor bulk material as it is in FIG. 1.

Memory cell 50 also includes a buried layer region 22 of a second conductivity type, such as n-type, for example; a floating body region 24 of the first conductivity type, such as p-type, for example; and source/drain regions 16 and 18 of the second conductivity type, such as n-type, for example.

Buried layer 22 may be formed by an ion implantation process on the material of substrate 12. Alternatively, buried layer 22 can be grown epitaxially on top of substrate 12 or formed through a solid state diffusion process.

The floating body region 24 of the first conductivity type is bounded on top by source line region 16, drain region 18, and insulating layer 62 (or by surface 14 in general), on the sides by insulating layer 26, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

A source line region 16 having a second conductivity type, such as n-type, for example, is provided in floating body region 24, so as to bound a portion of the top of the floating body region in a manner discussed above, and is exposed at surface 14. Source line region 16 may be formed by an implantation process on the material making up substrate 12, according to any implantation process known and typically used in the art. Alternatively, a solid state diffusion or a selective epitaxial growth process could be used to form source line region 16.

A bit line region 18, also referred to as drain region 18, having a second conductivity type, such as n-type, for example, is also provided in floating body region 24, so as to bound a portion of the top of the floating body region in a manner discussed above, and is exposed at cell surface 14.

Bit line region 18 may be formed by an implantation process on the material making up substrate 12, according to any implantation process known and typically used in the art. Alternatively, a solid state diffusion or a selective epitaxial growth process could be used to form bit line region 18.

A gate 60 is positioned in between the source line region 16 and the drain region 18, above the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Figure 2:
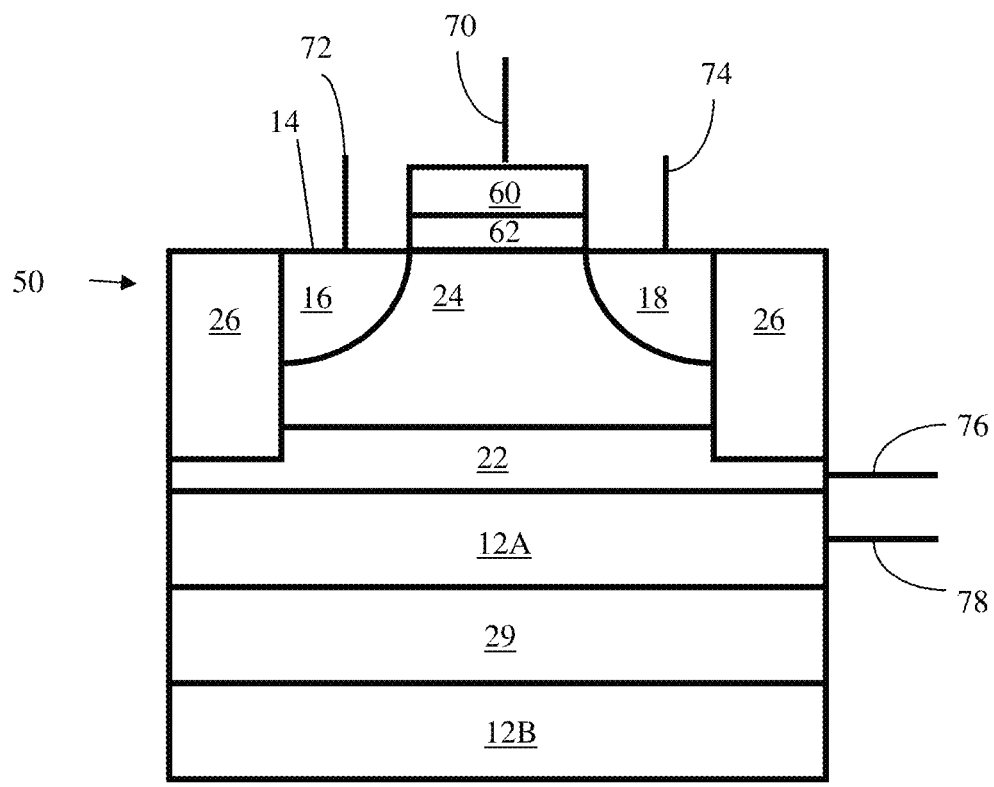
FIG. 2 is a schematic, cross-sectional illustration of a memory cell according to another embodiment of the present invention.
Figure 3A:
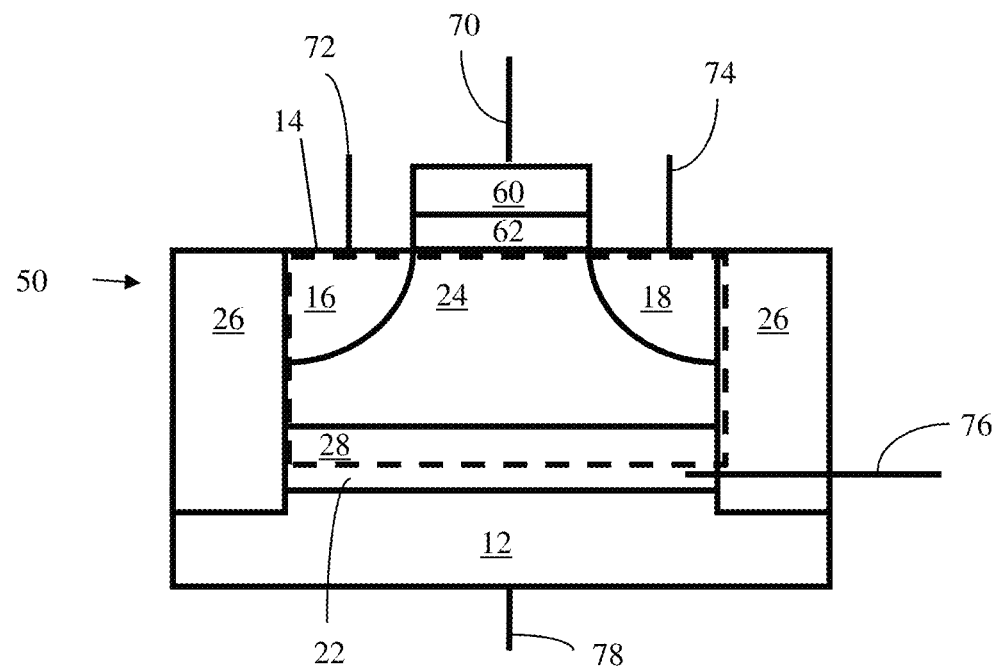
FIG. 3A is a schematic, cross-sectional illustration of a memory cell according to another embodiment of the present invention.
Figure 3B:
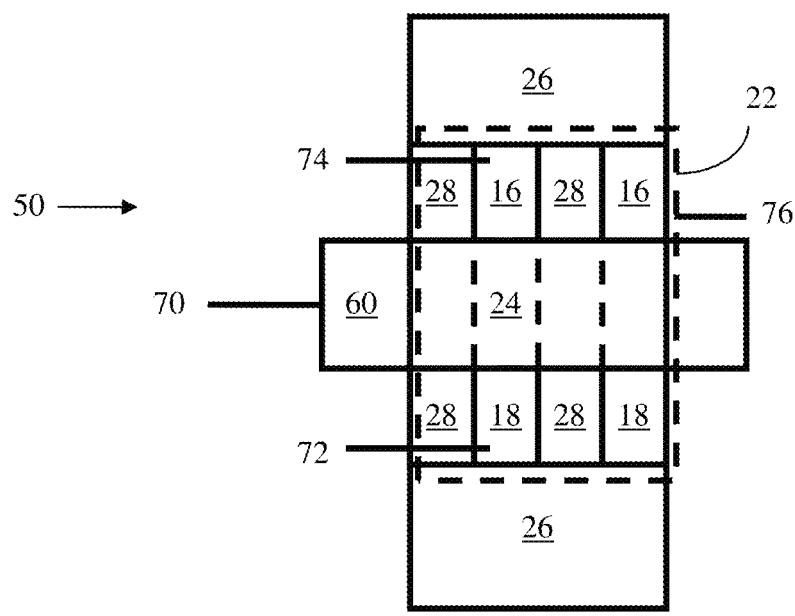
FIG. 3B is a schematic, top-view illustration of the memory cell shown in FIG. 3A.

Insulating layers 26 (like, for example, shallow trench isolation (STI)), may be made of silicon oxide, for example, though other insulating materials may be used. Insulating layers 26 insulate memory cell 50 from adjacent memory cell 50. The bottom of insulating layer 26 may reside inside the buried region 22 allowing buried region 22 to be continuous as shown in FIGS. 1 and 2. Alternatively, the bottom of insulating layer 26 may reside below the buried region 22 as in FIGS. 3A and 3B (shown better in FIG. 3A). This requires a shallower insulating layer 28, which insulates the floating body region 24, but allows the buried layer 22 to be continuous in the perpendicular direction of the cross-sectional view shown in FIG. 3A. For simplicity, only memory cell 50 with continuous buried region 22 in all directions will be shown from hereon.

Cell 50 includes several terminals: word line (WL) terminal 70 electrically connected to gate 60, bit line (BL) terminal 74 electrically connected to bit line region 18, source line (SL) terminal 72 electrically connected to source line region 16, buried well (BW) terminal 76 electrically connected to buried layer 22, and substrate terminal 78 electrically connected to the substrate 12. Alternatively, the SL terminal 72 may be electrically connected to region 18 and BL terminal 74 may be electrically connected to region 16.

Figure 4:
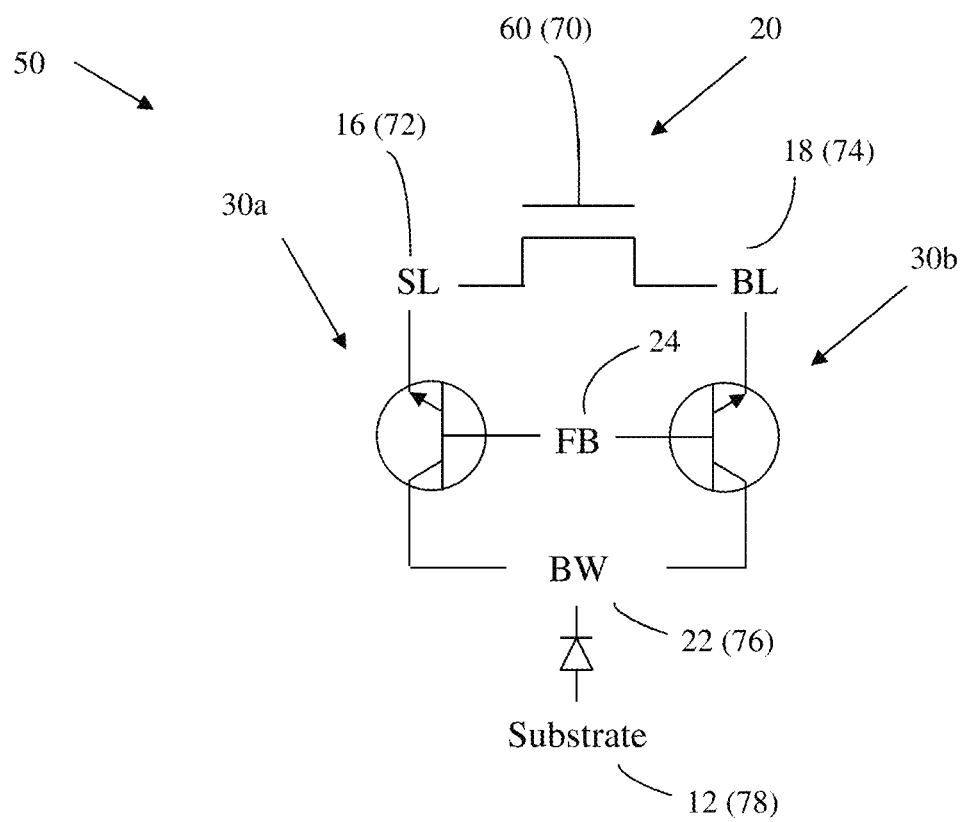
FIG. 4 schematically illustrates an equivalent circuit representation of the memory cells shown in FIGS. 1-3.

FIG. 4 illustrates an equivalent circuit representation of memory cell 50 according to an embodiment of the present invention. Inherent in memory cell 50 are metal-oxide-semiconductor (MOS) transistor 20, formed by source line region 16, gate 60, bit line region 18, and floating body region 24, and bipolar devices 30a and 30b, formed by buried well region 22, floating body region 24, and source line region 16 or bit line region 18, respectively.

Figure 5:
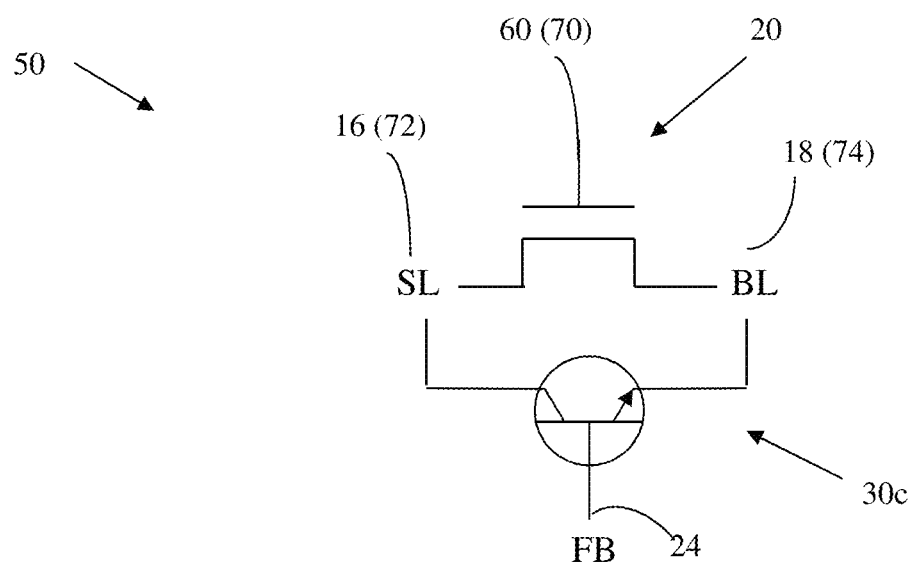
FIG. 5 schematically illustrates a bipolar device inherent in memory devices of any one of FIGS. 1-3.

Also inherent in memory device 50 is bipolar device 30c, formed by source line region 16, floating body 24, and bit line region 18. For drawings clarity, bipolar device 30c is shown separately in FIG. 5.

Figure 6:
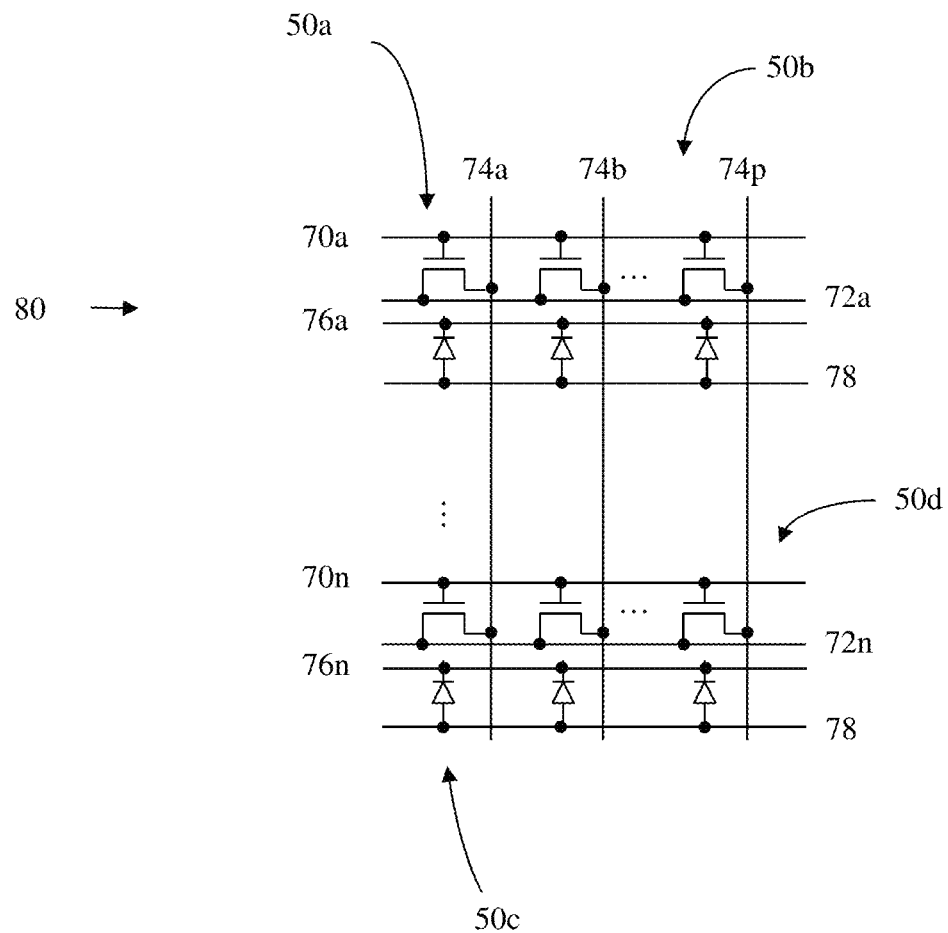
FIG. 6 schematically illustrates multiple cells of the type shown in any one of FIGS. 1-3 joined to make a memory array.

FIG. 6 schematically illustrates an exemplary embodiment of a memory array 80 of memory cells 50 (four exemplary instances of memory cell 50 being labeled as 50a, 50b, 50c and 50d) arranged in rows and columns, according to an embodiment of the present invention. In many, but not all, of the figures where array 80 appears, representative memory cell 50a will be representative of a "selected" memory cell 50 when the operation being described has one (or more in some embodiments) selected memory cell(s) 50. In such figures, representative memory cell 50b will be representative of an unselected memory cell 50 sharing the same row as selected representative memory cell 50a, representative memory cell 50c will be representative of an unselected memory cell 50 sharing the same column as selected representative memory cell 50a, and representative memory cell 50d will be representative of an unselected memory cell 50 sharing neither a row nor a column with selected representative memory cell 50a.

Present in FIG. 6 are word lines 70a through 70n, source lines 72a through 72n, bit lines 74a through 74p, buried well terminals 76a through 76n, and substrate terminal 78. Representation of the lines/terminal with letters a-n or a through p, includes not only embodiments which include literally twelve lines/terminals (i.e., a,b,c,d,e,f,g,h,i,j,k,l,m,n,o,p) or fourteen lines/terminals (i.e., a,b,c,d,e,f,g,h,i,j,k,l,m,n,o,p), but is meant to more generically represent a plurality of such line terminals, which can be less than twelve (i.e., as low as one given that there is a plurality of cells and at least one row and at least one column) or greater than twelve, thirteen or fourteen (much greater than fourteen up to any positive integer practical)).

Each of the source lines 72a through 72n is associated with a single row of memory cells 50 and is coupled to the source line region 18 of each memory cell 50 in that row. Each of the bit lines 74a through 74p is associated with a single column of memory cells 50 and is coupled to the bit line region 16 of each memory cell 50 in that column.

Substrate 12 is present at all locations under array 80. Persons of ordinary skill in the art will appreciate that one or more substrate terminals 78 may be present in one or more locations. Such skilled persons will also appreciate that although array 80 is shown in FIG. 6 as a single continuous array, many other organizations and layouts are possible. For example, word lines may be segmented or buffered, bit lines may be segmented or buffered, source lines may be segmented or buffered, the array 80 may be broken into two or more sub-arrays, control circuits such as word decoders, column decoders, segmentation devices, sense amplifiers, write amplifiers may be arrayed around array 80 or inserted between sub-arrays of array 80. Thus the present invention is not limited to the exemplary embodiments, features, design options, etc., shown and described.

Several operations can be performed by memory cell 50 such as holding, read, write logic-1 and write logic-0 operations, and have been described in U.S. Pat. No. 8,130,548 to Widjaja et al., titled "Semiconductor Memory Having Floating Body Transistor and Method of Operating" ("Widjaja-1") and U.S. Pat. No. 8,077,536, "Method of Operating Semiconductor Memory Device with Floating Body Transistor Using Silicon Controlled Rectifier Principle" ("Widjaja-2"), which are both hereby incorporated herein, in their entireties, by reference thereto.

Figure 7:
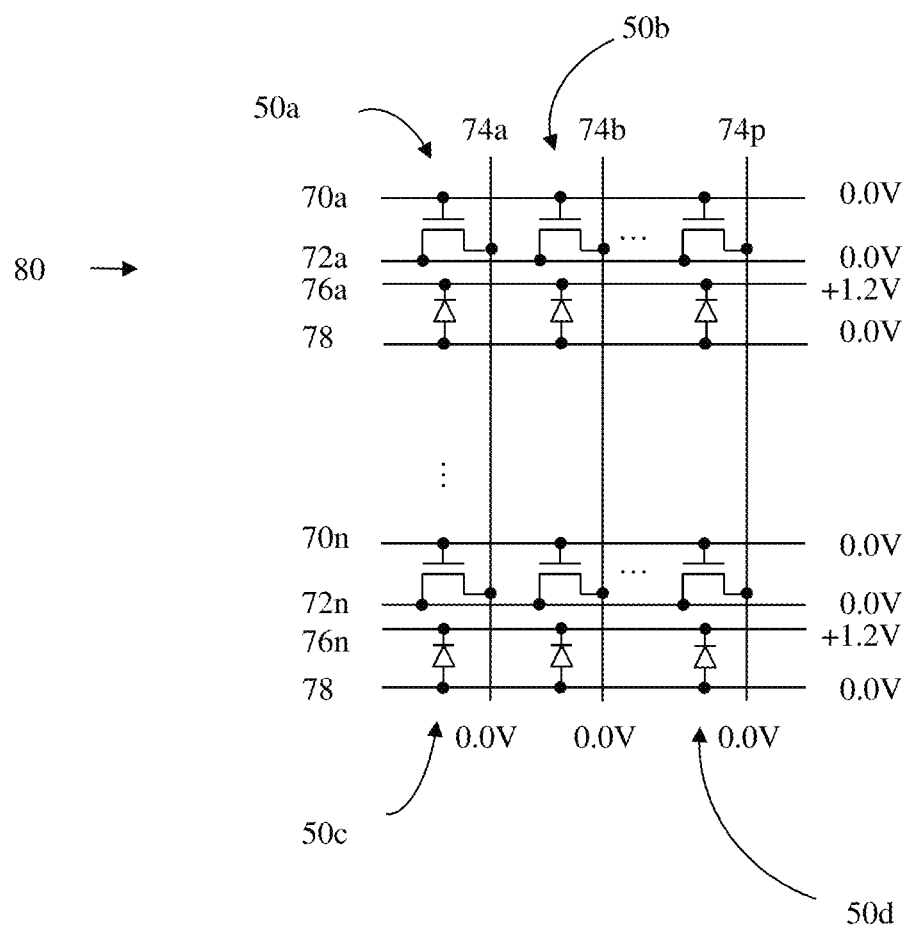
FIG. 7 schematically illustrates a holding operation performed on a memory array according to an embodiment of the present invention.
Figure 8:
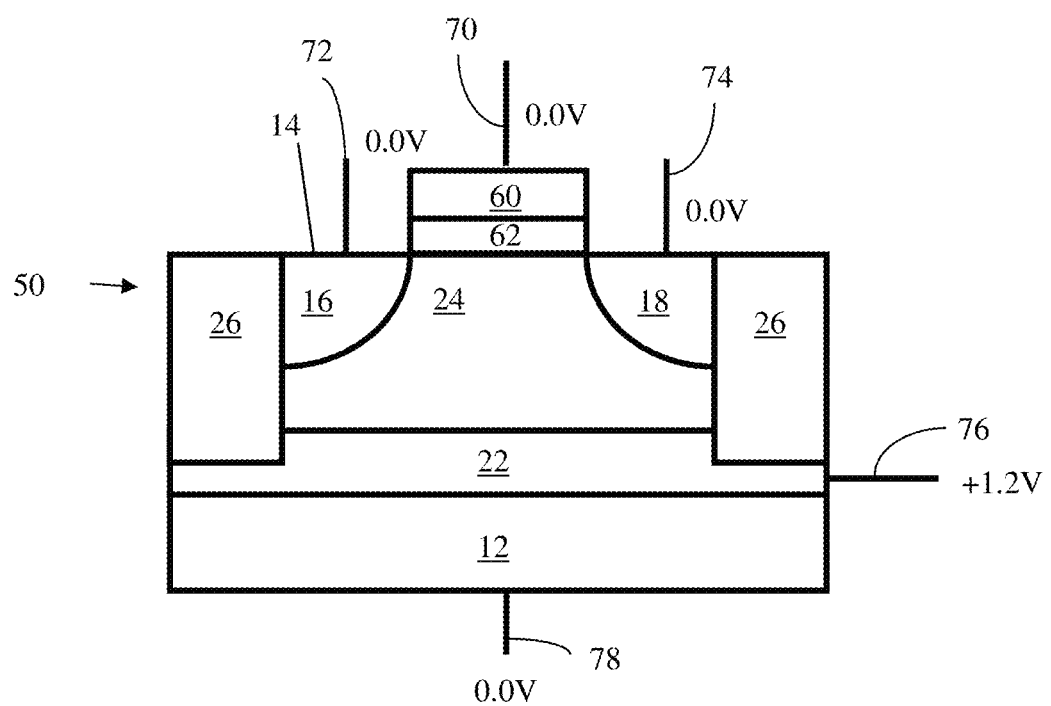
FIG. 8 illustrates exemplary bias conditions applied on the terminals of a memory cell of the array of FIG. 7.

FIG. 7 schematically illustrates performance of a holding operation on memory array 80, while FIG. 8 shows the bias applied on the terminals of a memory cell 50 during the holding operation, according to an exemplary, non-limiting embodiment. The holding operation is performed by applying a positive back bias to the BW terminal 76, zero or negative bias on the WL terminal 70, zero bias on the BL terminal 74, SL terminal 72, and substrate terminal 78. Alternatively, the substrate terminal 78 may be left floating. In another embodiment, one of the SL terminal 72 or BL terminal 74 may be left floating. The positive back bias applied to the buried layer region 22 connected to the BW terminal 76 will maintain the state of the memory cell 50 that it is connected to. The positive bias applied to the BW terminal 76 needs to generate an electric field sufficient to trigger an impact ionization mechanism when the floating body region 24 is positively charged, as will be described with reference to the band diagram shown in FIGS. 9A and 9B. The impact ionization rate as a function of the electric field is for example described in "Physics of Semiconductor Devices", Sze S. M. and Ng K. K., which is hereby incorporated herein, in its entirety, by reference thereto.

In one embodiment the bias conditions for the holding operation on memory cell 50 are: 0 volts is applied to WL terminal 70, 0 volts is applied to BL terminal 74, 0 volts is applied to SL terminal 72, a positive voltage, for example, +1.2 volts is applied to BW terminal 76, and 0 volts is applied to the substrate terminal 78. In other embodiments, different voltages may be applied to the various terminals of memory cell 50 and the exemplary voltages described are not limiting.

Figure 9A:
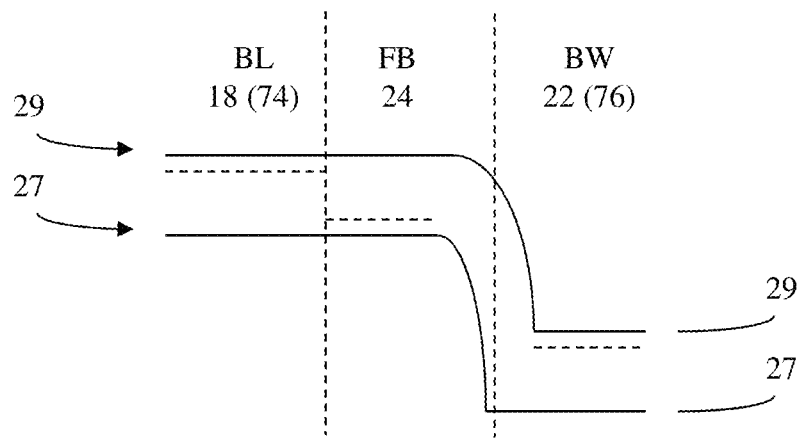
FIG. 9A shows an energy band diagram characterizing an intrinsic bipolar device when a floating body region is positively charged and a positive bias is applied to a buried well region of a memory cell according to an embodiment of the present invention.

FIG. 9A shows an energy band diagram characterizing the intrinsic n-p-n bipolar device 30b when the floating body region 24 is positively charged and a positive bias voltage is applied to the buried well region 22. The vertical dashed lines mark the different regions of the bipolar device 30b. The energy band diagram of the intrinsic n-p-n bipolar device 30a can be constructed in a similar manner, with the source line region 16 (connected to the SL terminal 72) in place of the bit line region 18 (connected to the BL terminal 74). The horizontal dashed lines indicate the Fermi levels in the various regions of the n-p-n transistor 30b. The Fermi level is located in the band gap between the solid line 27 indicating the top of the valence band (the bottom of the band gap) and the solid line 29 indicating the bottom of the conduction band (the top of the band gap) as is well known in the art. If floating body 24 is positively charged, a state corresponding to logic "1", the bipolar transistors 30a and 30b will be turned on as the positive charge in the floating body region lowers the energy barrier of electron flow (from the source line region 16 or bit line region 18) into the base region (floating body region 24). Once injected into the floating body region 24, the electrons will be swept into the buried well region 22 (connected to BW terminal 76) due to the positive bias applied to the buried well region 22. As a result of the positive bias, the electrons are accelerated and create additional hot carriers (hot hole and hot electron pairs) through an impact ionization mechanism. The resulting hot electrons flow into the BW terminal 76 while the resulting hot holes will subsequently flow into the floating body region 24.

When the charge stored in floating body 24 is higher than $V_{TS}$ (see FIG. 10), the amount of holes injected into the floating body region 24 can compensate for the charge lost due to p-n junction forward bias current between the floating body region 24 and the source line region 16 or bit line region 18 and due to holes recombination. This process maintains the charge (i.e. holes) stored in the floating body region 24 which will keep the n-p-n bipolar transistors 30a and 30b on for as long as a positive bias is applied to the buried well region 22 through BW terminal 76.

For open-base bipolar transistors, when the following condition is met: $\beta \times (M-1) \approx 1$—where $\beta$ is the forward common-emitter current gain of the bipolar transistors and M is the impact ionization coefficient—the positive feedback mechanism is initiated. The collector voltage satisfying the condition $\beta \times (M-1) \approx 1$ may be referred to as the trigger voltage. Once the positive feedback is activated and a collector voltage greater than the holding voltage is applied, the hole current move into the base region of a bipolar transistor, which is sometimes referred to as the reverse base current region and has been described for example in "A New Static Memory Cell Based on Reverse Base Current (RBC) Effect of Bipolar Transistor", K. Sakui et al., pp. 44-47, International Electron Devices Meeting, 1988 ("Sakui-1"), "A New Static Memory Cell Based on the Reverse Base Current Effect of Bipolar Transistors", K. Sakui et al., pp. 1215-1217, IEEE Transactions on Electron Devices, vol. 36, no. 6, June 1989 ("Sakui-2"), "On Bistable Behavior and Open-Base Breakdown of Bipolar Transistors in the Avalanche Regime—Modeling and Applications", M. Reisch, pp. 1398-1409, IEEE Transactions on Electron Devices, vol. 39, no. 6, June 1992 ("Reisch"), all of which are hereby incorporated herein, in their entireties, by reference thereto. This positive feedback mechanism is maintained even if the collector voltage falls below the holding voltage.

The latching behavior based on the reverse base current region has also been described in a biristor (i.e. bi-stable resistor) for example in "Bistable resistor (Biristor)—Gateless Silicon Nanowire Memory", J.-W. Han and Y.-K. Choi, pp. 171-172, 2010 Symposium on VLSI Technology, Digest of Technical Papers, 2010 ("J.-W. Han"), which is hereby incorporated herein, in its entirety, by reference thereto. In a two-terminal biristor device, a refresh operation is still required. J.-W. Han describes a 200 ms data retention for the silicon nanowire biristor memory. In memory cell 50, the state of the memory cell is maintained due to the vertical bipolar transistors 30a and 30b, while the remaining cell operations (i.e. read and write operations) are governed by the lateral bipolar transistor 30c and MOS transistor 20. Hence, the holding operation does not require any interruptions to the memory cell 50 access.

If floating body 24 is neutrally charged (the voltage on floating body 24 being equal to the voltage on grounded bit line region 18), a state corresponding to logic-0, no (or low) current will flow through the n-p-n bipolar devices 30a and 30b. The bipolar devices 30a and 30b will remain off and no impact ionization occurs. Consequently memory cells in the logic-0 state will remain in the logic-0 state.

Figure 9B:
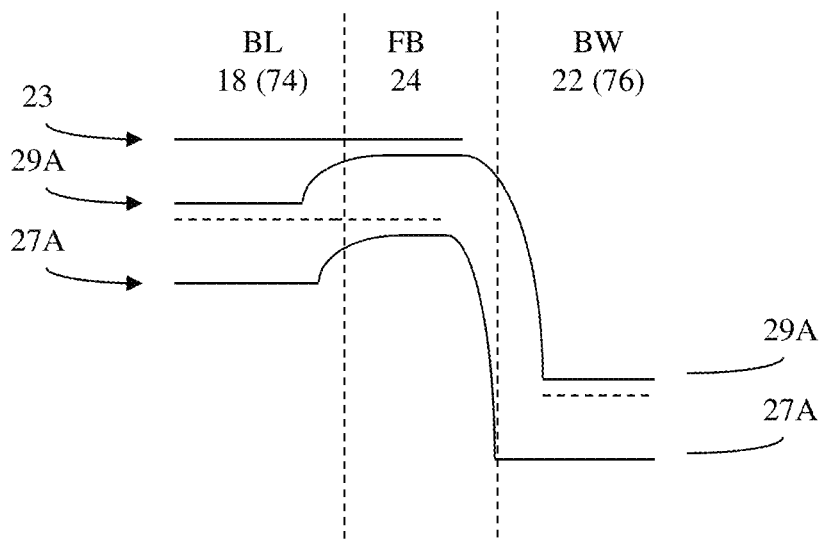
FIG. 9B shows an energy band diagram of an intrinsic bipolar device when a floating body region is neutrally charged and a positive bias is applied to a buried well region of a memory cell according to an embodiment of the present invention.

FIG. 9B shows an energy band diagram of the intrinsic bipolar device 30a when the floating body region 24 is neutrally charged and a bias voltage is applied to the buried well region 22. In this state the energy level of the band gap bounded by solid lines 27A and 29A is different in the various regions of n-p-n bipolar device 30a. Because the potentials of the floating body region 24 and the bit line region 18 are equal, the Fermi levels are constant, resulting in an energy barrier between the bit line region 18 and the floating body region 24. Solid line 23 indicates, for reference purposes, the energy barrier between the bit line region 18 and the floating body region 24. The energy barrier prevents electron flow from the bit line region 18 (connected to BL terminal 74) to the floating body region 24. Thus the n-p-n bipolar devices 30a and 30b will remain off.

Sakui-1 and Sakui-2 describe a memory cell based on the reverse base current effect, where the base of a n-p-n bipolar transistor is connected to a p-type MOS transistor. Reisch describes the challenges with the memory cell described in Sakui-1 and Sakui-2, which includes the requirement for the current of the p-type MOS transistor. Because the collector terminal of the bipolar transistor also serves as the channel of the p-type MOS transistor, any changes in operating conditions or process conditions will affect both the bipolar transistor and the p-type MOS transistor. For example, increasing the doping level of the collector region will improve the impact ionization efficiency. However, it will also increase the doping level of the p-type MOS transistor channel region, and reduce the drive current of the p-type MOS transistor.

An autonomous refresh for a floating body memory, without requiring to first read the memory cell state, has been described for example in "Autonomous Refresh of Floating Body Cell (FBC)", Ohsawa et al., pp. 801-804, International Electron Device Meeting, 2008 ("Ohsawa"), U.S. Pat. No. 7,170,807 "Data Storage Device and Refreshing Method for Use with Such Device", Fazan et al. ("Fazan"), both of which are hereby incorporated herein, in their entireties, by reference thereto. Ohsawa and Fazan teach an autonomous refresh method by applying a periodic gate and drain voltage pulses, which interrupts access to the memory cells being refreshed. In memory cell 50, more than one stable state is achieved because of the vertical bipolar transistors 30a and 30b. The read and write operations of the memory cell 50 are governed by the lateral bipolar transistor 30c and MOS transistor 20. Hence, the holding operation does not require any interruptions to the memory cell 50 access.

In the holding operation described with regard to FIG. 7, there is no individually selected memory cell. Rather the holding operation will be performed at all cells connected to the same buried well terminal 76. In addition, the holding operation does not interrupt read or write access to the memory cell 50.

Figure 10:
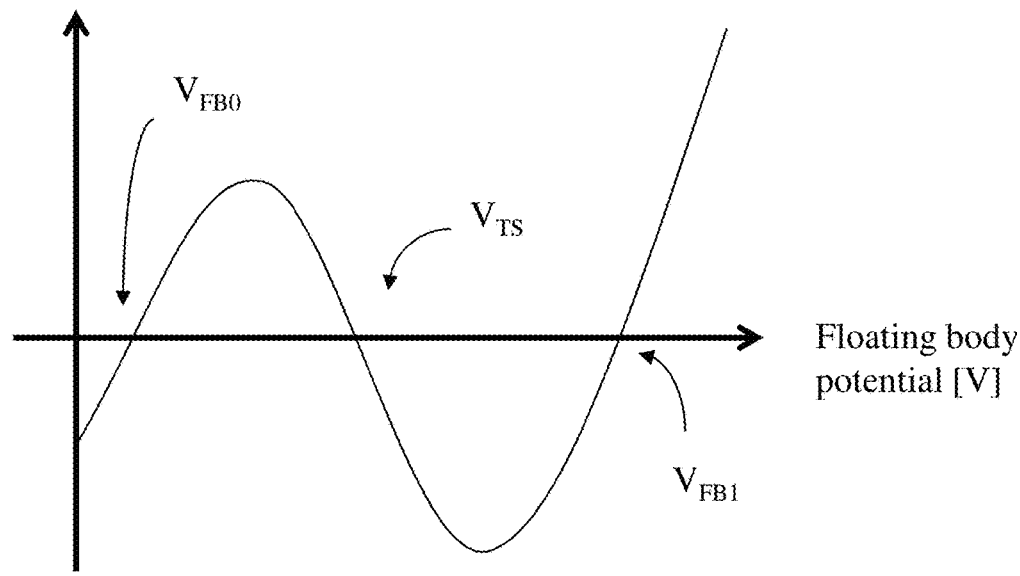
FIG. 10 shows a graph of the net current "I" flowing into or out of a floating body region as a function of the potential "V" of the floating body, according to an embodiment of the present invention.

FIG. 10 shows a graph of the net current I flowing into or out of the floating body region 24 as a function of the potential V of the floating body 24 (not drawn to scale). A negative current indicates a net current flowing into the floating body region 24, while a positive current indicates a net current flowing out of the floating body region 24. At low floating body 24 potential, between 0V and $V_{FB0}$ indicated in FIG. 10, the net current is flowing into the floating body region 24 as a result of the p-n diode formed by the floating body region 24 and the buried well region 22 being reverse biased. If the value of the floating body 24 potential is between $V_{FB0}$ and $V_{TS}$, the current will switch direction, resulting in a net current flowing out of the floating body region 24. This is because of the p-n diode, formed by the floating body region 24 and the buried well region 22, being forward biased as the floating body region 24 becomes increasingly more positive. As a result, if the potential of the floating body region 24 is less than $V_{TS}$, then at steady state the floating body region 24 will reach $V_{FB0}$. If the potential of the floating body region 24 is higher than $V_{TS}$, the current will switch direction, resulting in a net current flowing into the floating body region 24. This is as a result of the base current flowing into the floating body region 24 being greater than the p-n diode leakage current. When the floating body 24 potential is higher than $V_{FB1}$, the net current will be out of the floating body region 24. This is because the p-n diode leakage current is once again greater than the base current of the bipolar devices 30a and 30b.

Figure 11:
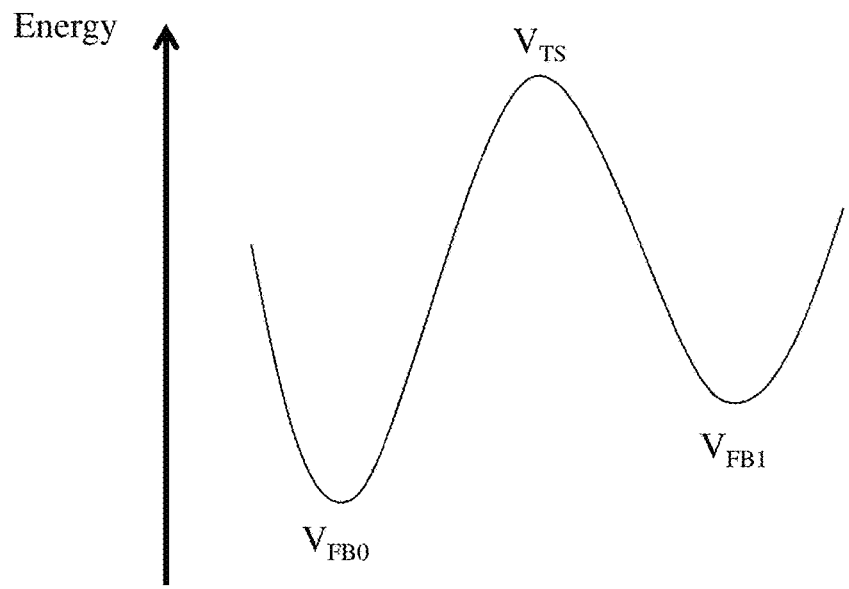
FIG. 11 shows a schematic curve of a potential energy surface (PES) of a memory cell according to an embodiment of the present invention.

The holding operation results in the floating body memory cell having two stable states: the logic-0 state and the logic-1 state separated by an energy barrier, which are represented by $V_{FB0}$, $V_{FB1}$, and $V_{TS}$, respectively. FIG. 11 shows a schematic curve of a potential energy surface (PES) of the memory cell 50, which shows another representation of the two stable states resulting from applying a back bias to the BW terminal 76 (connected to the buried well region 22).

The values of the floating body 24 potential where the current changes direction, i.e. $V_{FB0}$, $V_{FB1}$, and $V_{TS}$, can be modulated by the potential applied to the BW terminal 76. These values are also temperature dependent.

Figure 12:
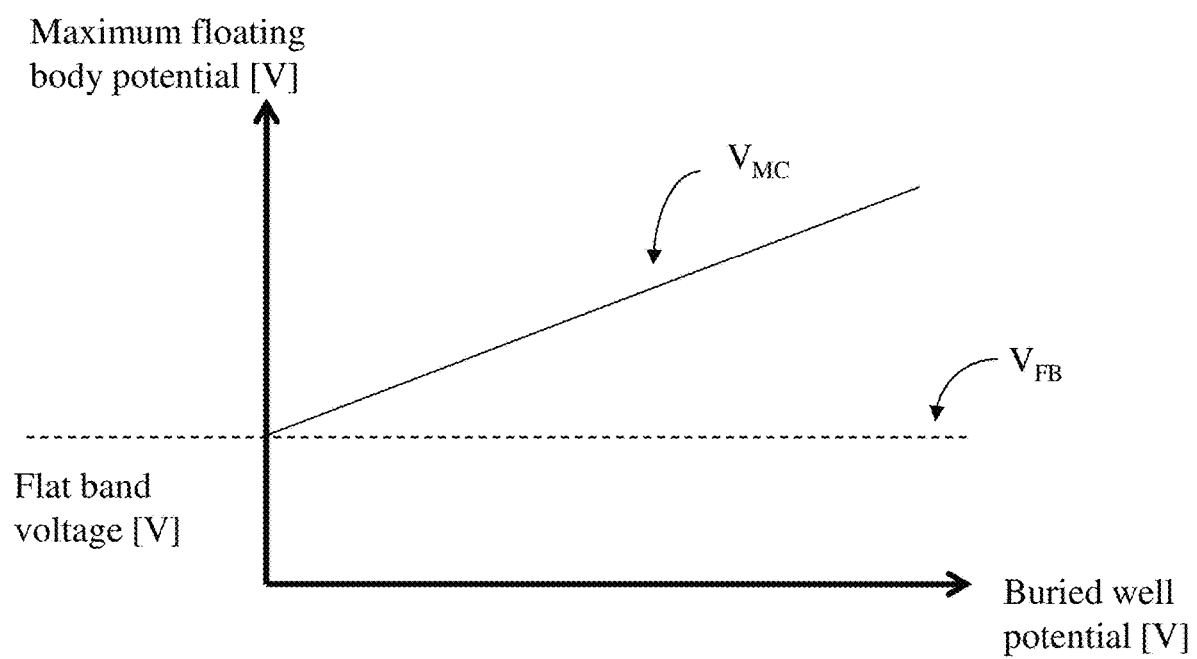
FIG. 12 illustrates a charge stored in a floating body region of a memory cell as a function of a potential applied to a buried well region, connected to a BW terminal, according to an embodiment of the present invention.

The holding/standby operation also results in a larger memory window by increasing the amount of charge that can be stored in the floating body 24. Without the holding/standby operation, the maximum potential that can be stored in the floating body 24 is limited to the flat band voltage $V_{FB}$ as the junction leakage current to regions 16 and 18 increases exponentially at floating body potential greater than $V_{FB}$. However, by applying a positive voltage to substrate terminal 78, the bipolar action results in a hole current flowing into the floating body 24, compensating for the junction leakage current between floating body 24 and regions 16 and 18. As a result, the maximum charge $V_{MC}$ stored in floating body 24 can be increased by applying a positive bias to the substrate terminal 78 as shown in FIG. 12. The increase in the maximum charge stored in the floating body 24 results in a larger memory window.

Floating body DRAM cells described in Ranica-1, Ranica-2, Villaret, and Pulicani only exhibit one stable state, which is often assigned as logic-0 state. Villaret describes the intrinsic bipolar transistors enhance the data retention of logic-1 state, by drawing the electrons which otherwise would recombine with the holes stored in the floating body region. However, only one stable state is observed because there is no hole injection into the floating body region to compensate for the charge leakage and recombination.

The operation range to satisfy the trigger operation condition for self-latching (or positive feedback) mechanism $\beta \times (M-1) \approx 1$ is low $\beta$ and high M to high $\beta$ and low M. The low $\beta$, high M condition is preferred as it results in a lower power for the holding operation since the current flow (from the collector (BW terminal 76) to the emitter (source line region 16 or bit line region 18) is proportional to $\beta$. Therefore, the lower the common-emitter gain $\beta$ (i.e. the closer $\beta$ is to 1), the lower the current consumed during the holding operation is (a common value of $\beta$ would be between 20 and 500).

The read and write operations of the memory cell have been described, for example, in Widjaja-1, Widjaja-2 and Widjaja-3.

Figure 13:
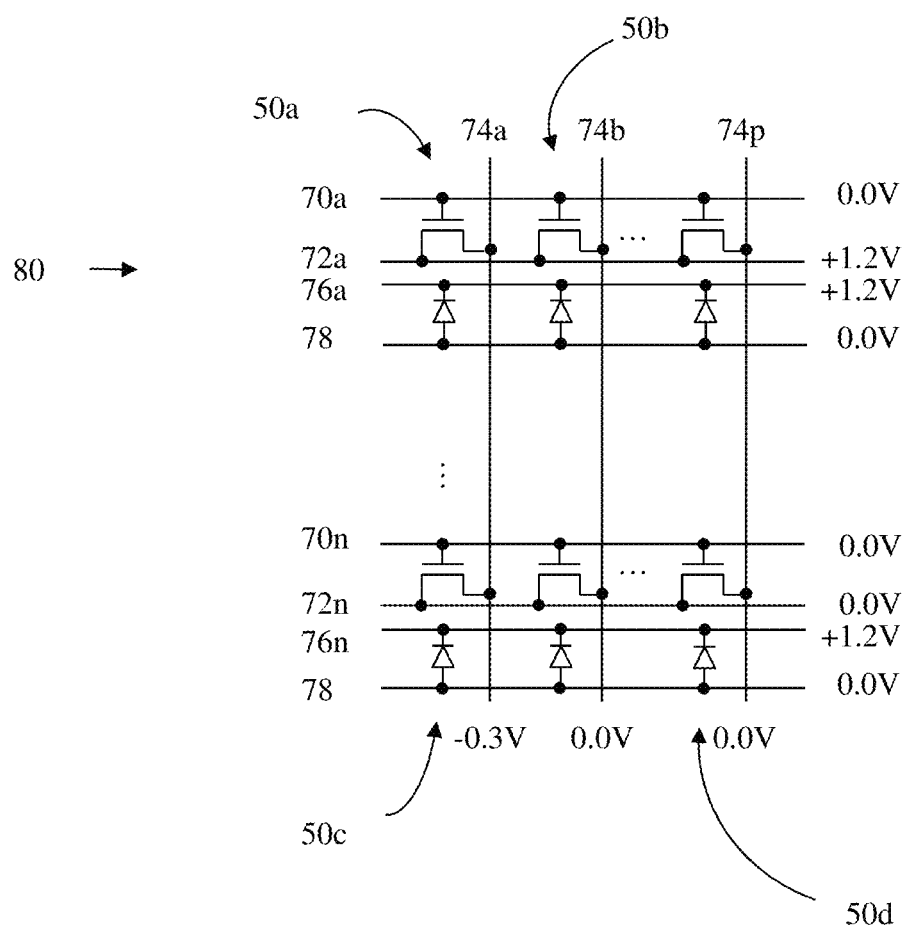
FIG. 13 schematically illustrates a write logic-0 operation performed on a memory array according to an embodiment of the present invention.
Figure 14:
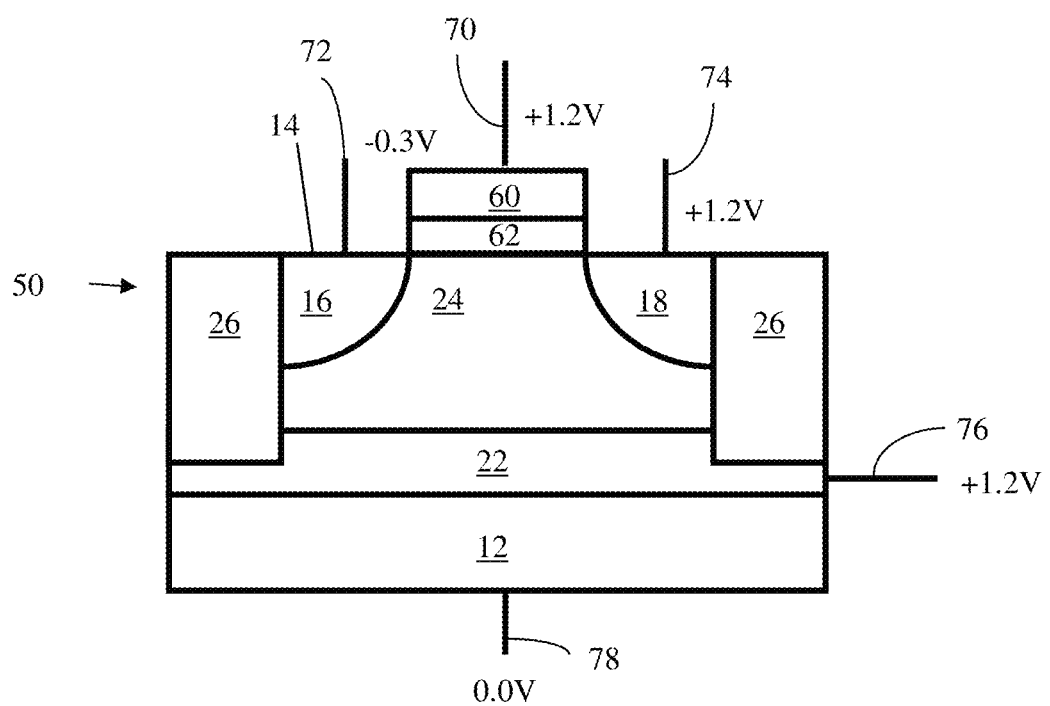
FIG. 14 illustrates bias conditions applied on the terminals of a memory cell to perform a write logic-0 operation according to an embodiment of the present invention.

A write logic-0 operation may be performed by applying the following bias conditions as shown in FIGS. 13 and 14: a negative voltage is applied to the selected BL terminal 74a, a positive voltage is applied to the selected SL terminal 72a, zero or negative voltage is applied to the selected WL terminal 70a, zero or positive voltage is applied to the BW terminal 76, and zero voltage is applied to the substrate terminal 78; while zero voltage is applied to the unselected BL terminal 74, zero voltage is applied to the unselected SL terminal 72, zero or negative voltage is applied to the unselected WL terminal 70, zero or positive voltage is applied to the unselected BW terminal 76.

In one particular non-limiting embodiment, about −0.3 volts is applied to the selected BL terminal 74a, about +1.2 volts is applied to selected SL terminal 72a, about 0.0 volts is applied to WL terminal 70a, about 0.0 volts or +1.2 volts is applied to BW terminal 76a, and about 0.0 volts is applied to substrate terminal 78a. These voltage levels are exemplary only may vary from embodiment to embodiment.

Under these conditions, the vertical n-p-n bipolar transistor formed by the buried well 22, the floating body region 24, and the source line junction 16 of the selected memory cell 50a is now turned off. The p-n junction between the floating body 24 and selected BL junction 18 of the selected cell 50 is forward-biased. As a result, holes stored in the floating body region 24 are now evacuated.

For the unselected cells sharing the same SL terminal 72a as the selected cell 50a, for example memory cell 50b, the vertical n-p-n bipolar transistor formed by the buried well 22, the floating body region 24, and the bit line region 18 will maintain the data stored in the unselected cells.

For the unselected cells sharing the same BL terminal 74a as the selected cell 50a, for example memory cell 50c, the vertical n-p-n bipolar transistor formed by the buried well 22, the floating body region 24, and the source line region 16 will maintain the data stored in the unselected cells.

Figure 15A:
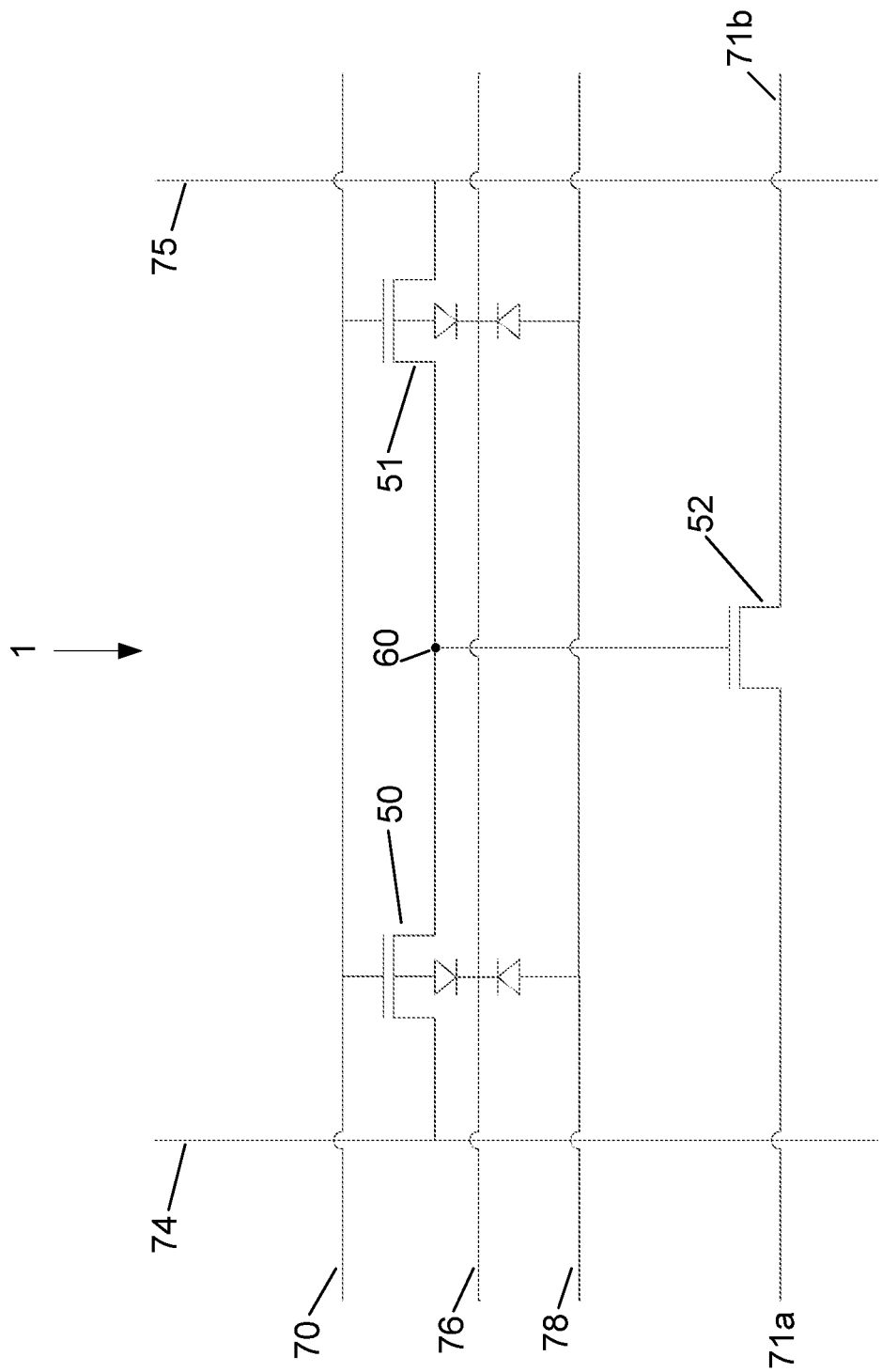
FIGS. 15A and 15B illustrate an equivalent circuit representation and a schematic cross-sectional view, respectively, of a content addressable memory (CAM) cell according to an embodiment of the present invention.
Figure 15B:
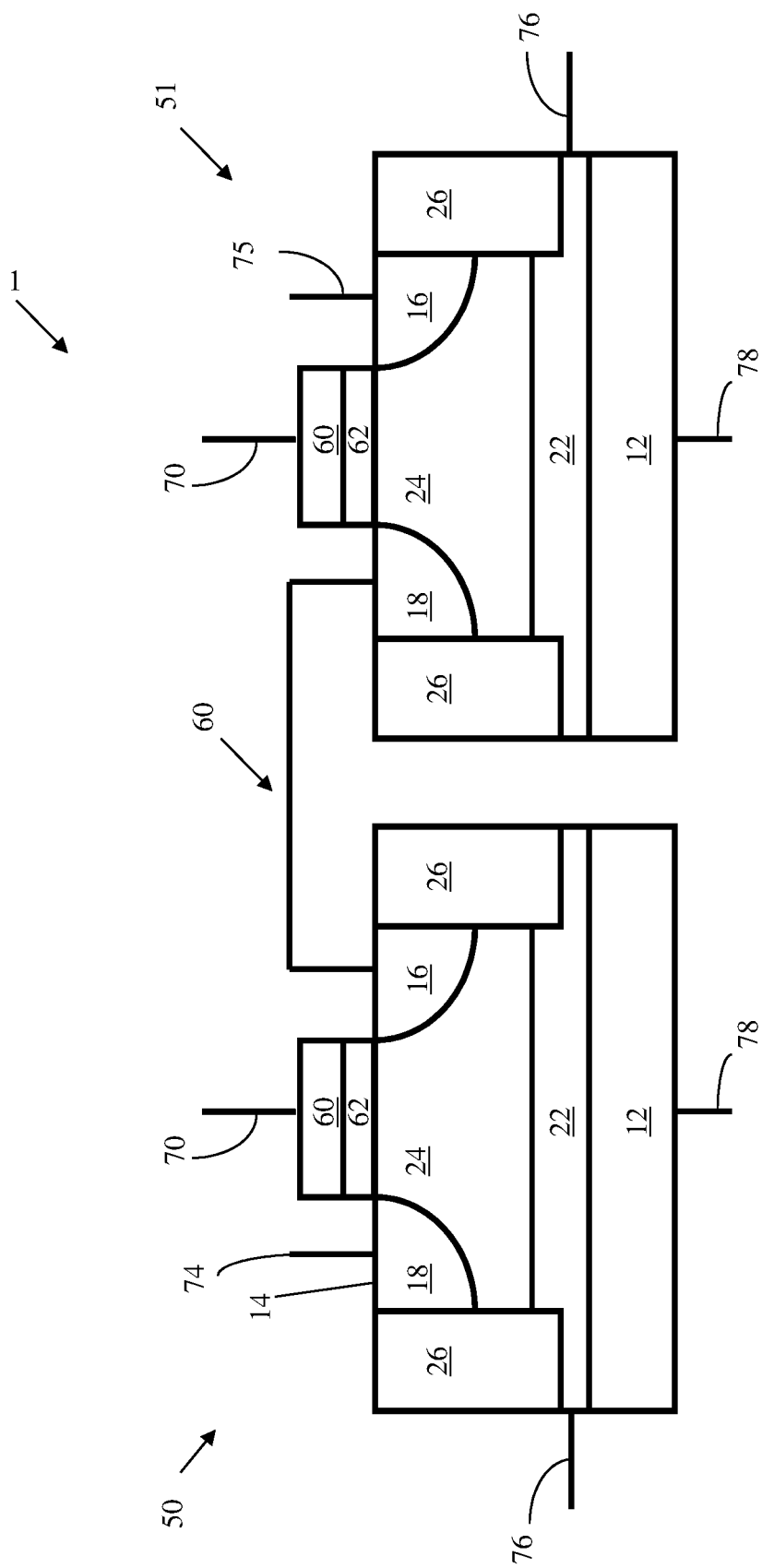

FIGS. 15A and 15B illustrate a Content Addressable Memory (CAM) cell 1 having an electrically floating body transistor according to an embodiment of the present invention. Two memory cells 50 and 51 are configured with one n-type transistor (NMOS) 52 to form CAM cell 1. In FIG. 15A, the memory cells 50 and 51 having electrically floating body transistors are represented by a transistor and two diodes, while FIG. 15B illustrates a schematic, cross-sectional view of memory cells 50 and 51 electrically connected to each other to node 60 (which subsequently drives the gate of transistor 52) to form CAM cell 1. The numerals in FIG. 15B follow the numerals shown in FIG. 1. Memory cells 50 and 51 and their method of operation have been described above as well as in, for example, Widjaja-1, Widjaja-2, and Widjaja-3. Each of the memory cells 50 and 51 has two distinct stable states, which are referred to as logic-0 state and logic-1 state. Logic-1 state is defined as the stable state where a positive charge, such as for example +0.6V, is stored in the floating body region and logic-0 state is defined as a stable state where the floating body potential is low, such as for example +0.1V. As described above, memory cell 50 in logic-1 state will have a higher conductance than that in logic-0 state.

Figure 17:
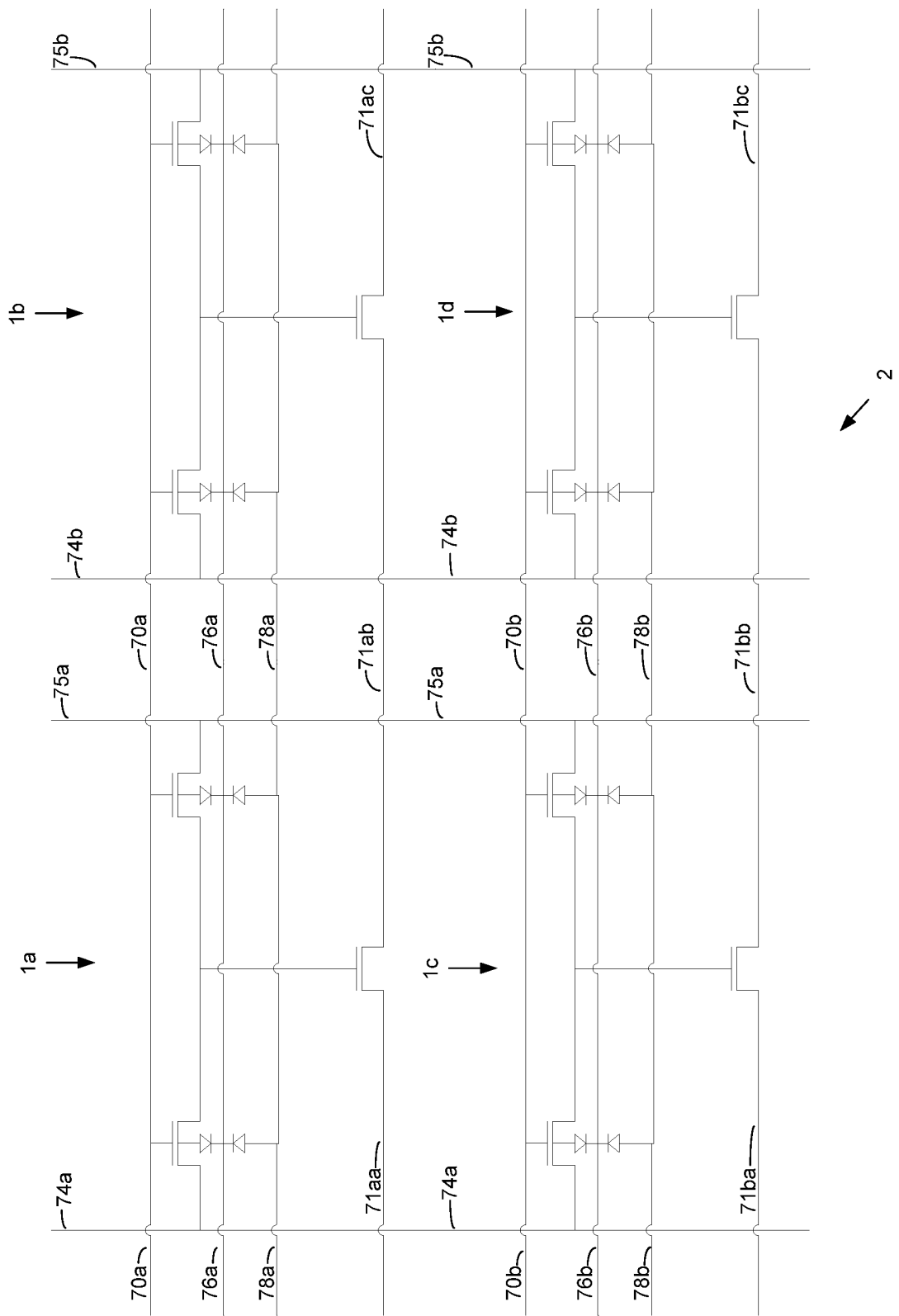
FIG. 17 illustrates multiple cells of the type shown by the equivalent circuit representation in FIG. 15A joined to make a memory array.

Referring to FIG. 15, terminal 70 represents the word line (WL) terminal of the memory cell 1, and as shown in FIG. 17, typically connects a plurality of memory cells 1 in the same row in a memory array 2. The WL terminal is connected to the gates of the memory cells 50 and 51. DNWL terminal 76 represents the connection to the buried well region 22 of the memory cells 50 and 51. Substrate terminal 78 is connected to the substrate region 12 of the memory cells 50 and 51. Search terminals (SL) 74 and 75 are connected to the drain junction (18 in FIG. 1) of the memory cells 50 and 51, while the source junction 16 is connected together to form match node 60. Match node 60 is then connected to the gate of the NMOS transistor 52. The NMOS transistor 52 is used as a wide fan gate in a NAND configuration.

The operation of the CAM cell 1 is as follows: complementary data will be stored in the memory cells 50 and 51. For example, if memory cell 50 stores a logic-0 data, then memory cell 51 will store a logic-1 data. Data for the CAM searches will then be applied to SL 74 and 75. Search data may come in as a complementary pair, or the user/system may choose to provide a single bit of data for searching and complementary data may be generated with additional logic, which will be understood by those skilled in the art. If CAM cell 1 is selected, a positive voltage is applied to the WL terminal to turn on memory cell 50 that is in logic-1 state. Once a positive voltage is applied to the selected WL terminal and search data is applied to the SL terminal 74 and 75, the potential of the match node 60 will be driven to the corresponding value. The floating body memory cell 50 that is in logic-1 state will couple the potential of its drain junction (i.e. the search data).

An example of a match situation is SL terminal 74 at a positive voltage, for example +1.2V and floating body memory cell 50 is in logic-1 state. Match node 60 will then be driven to a have a positive potential, e.g. +1.2V minus the transistor threshold voltage (Vt). Floating body memory cell 51 is not conducting since it is in logic-0 state.

An example of a mismatch situation is SL terminal 74 at a low potential, for example about 0.0V, and floating body memory cell 50 is in logic-1 state. In this case, floating body memory cell 50 will pass 0.0V to the match node 60.

Match node 60 then provides the match or mismatch status. Based on the potential of the match node 60, the NMOS transistor 52 will either pass the data from node 71a to node 71b. If there is match condition, match node 60 will be high (at a positive voltage), turning on the NMOS transistor 52 and pass the data from node 71a to node 71b. If there is a mismatch condition, match node 60 will be low (at about zero potential), turning off NMOS device 52, and effectively blocking the data between node 71a and node 71b. Terminals 71a and 71b are the method by which the match data is passed from one CAM cell 1 to another and will be called the match line or string.

FIG. 16A illustrates an example of the bias conditions described above. The bias conditions shown in FIG. 16A assume a preconditioning of match node 60 to low potential, for example about 0.0 volts. Alternatively, match node 60 may be preconditioned to a high potential, for example about +1.2 volts, prior to a match operation. FIG. 16B illustrates an example of the bias conditions of the CAM cell 1 with the match node 60 being preconditioned to a high potential.

FIG. 17 illustrates a memory array 2 comprising a plurality of memory cells 1 arranged in a plurality of rows and columns.

Figure 18:
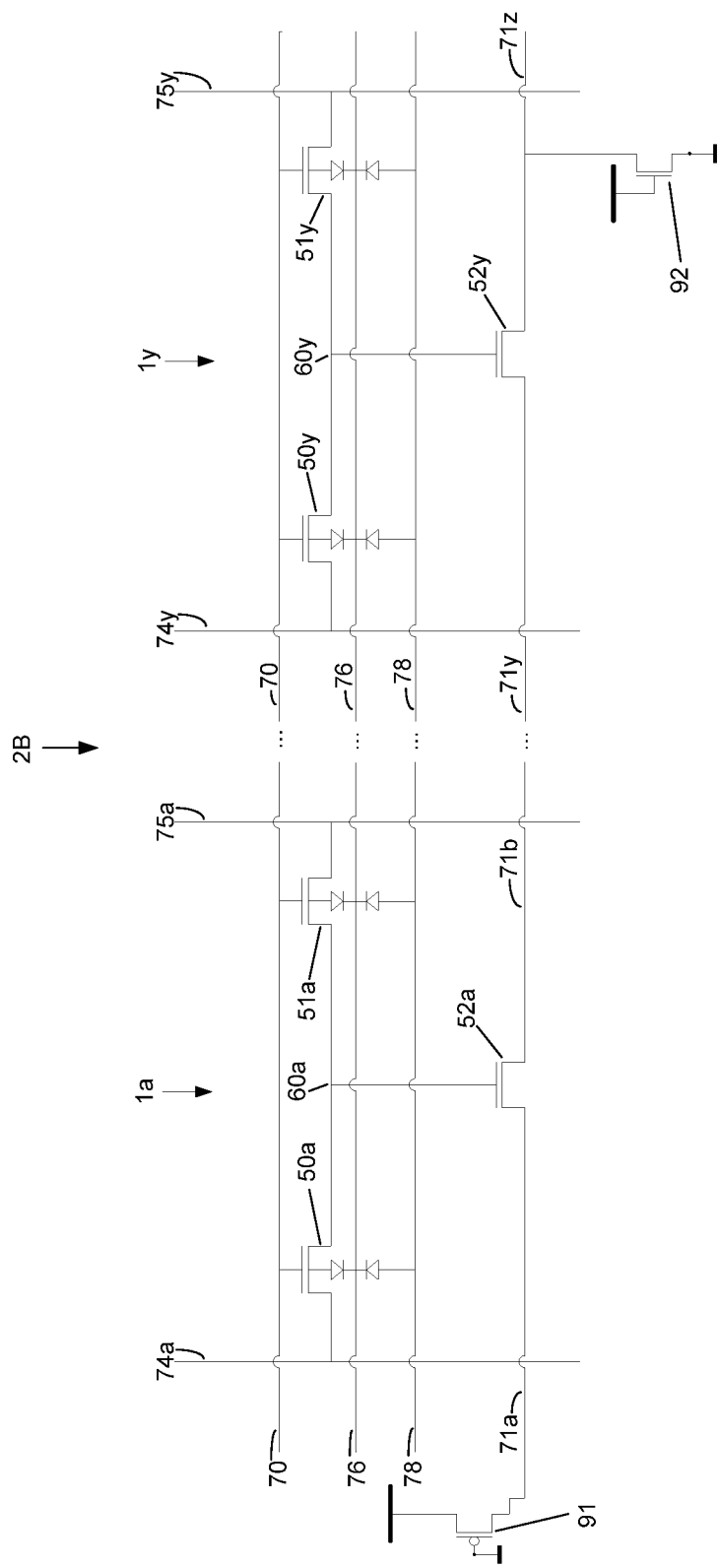
FIG. 18 illustrates multiple cells of the type shown by the equivalent circuit representation in FIG. 15A joined to make a memory array comprising a pull-up and a pull-down device.

The first CAM cell 1 in each row may have a pull up device 91 or power source attached to its respective terminal 71a as shown in FIG. 18. FIG. 18 is an example of a possible memory array 2 comprising a pull up device 91 and a pull down device 92. Terminal 71z at the end of the row will be the match detection node. This node may be preconditioned low or a weak passive pull down device 92 may also be employed.

Figure 19:
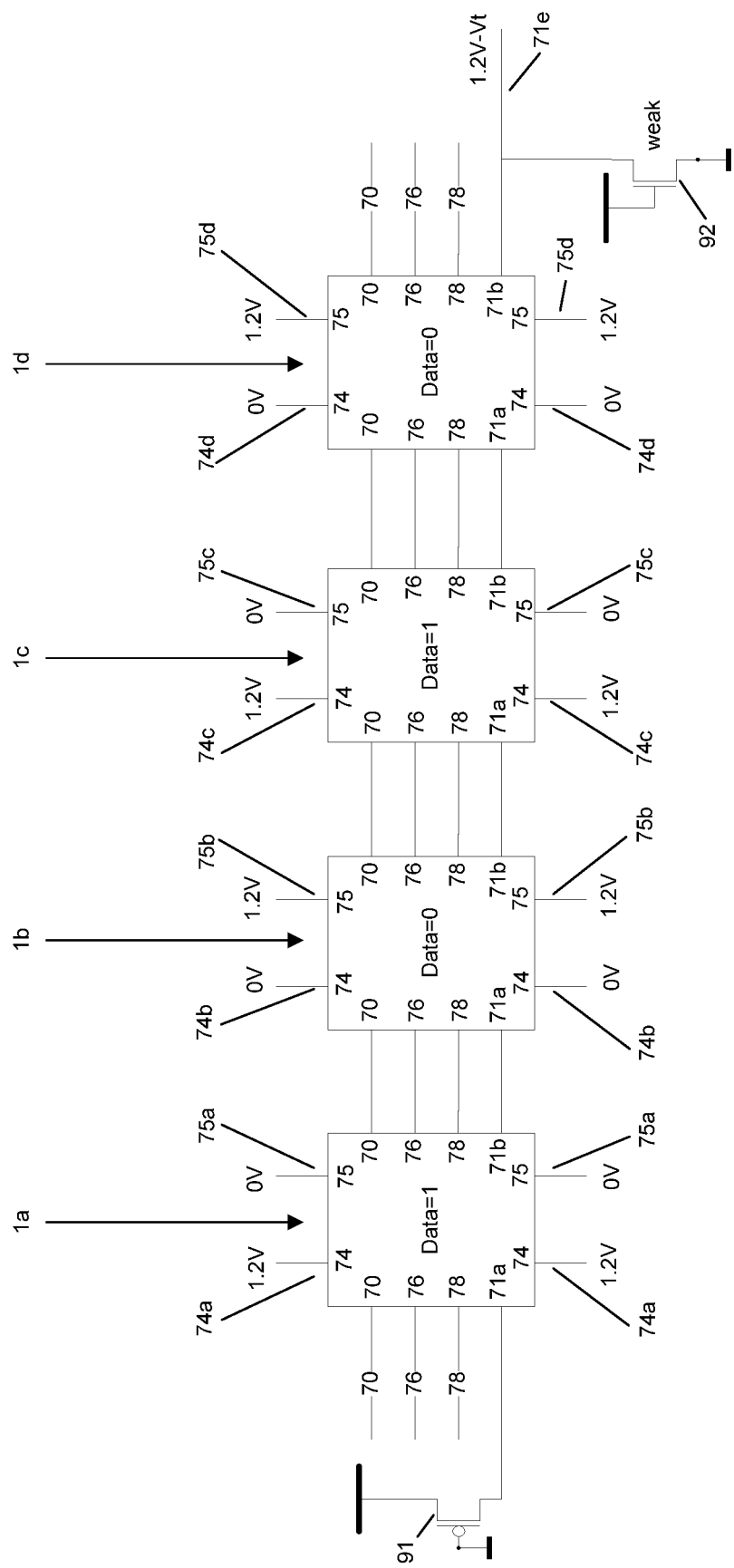
FIG. 19 illustrates exemplary bias conditions applied to a plurality of content addressable memory cells according to an embodiment of the present invention, resulting in a match condition.
Figure 20:
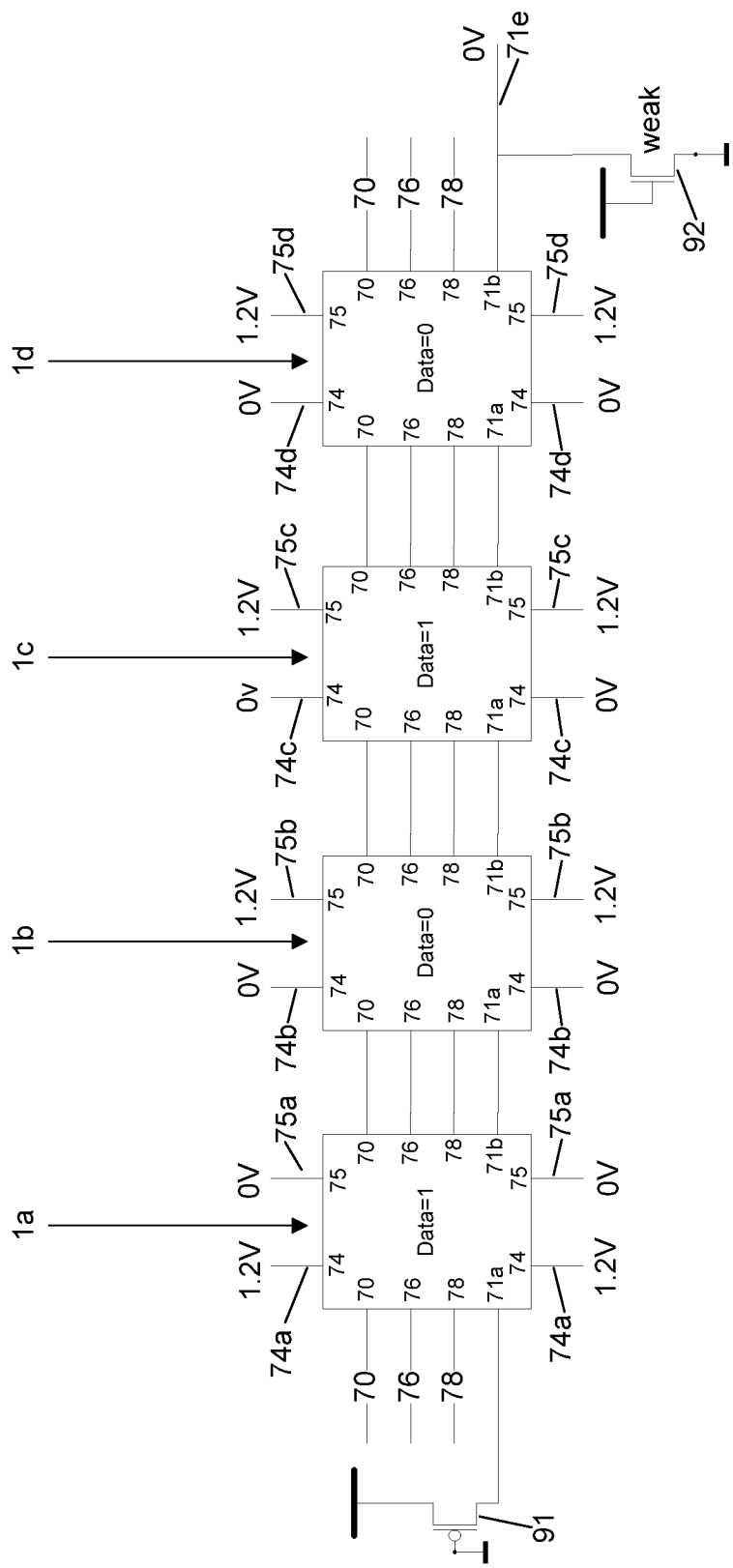
FIG. 20 illustrates exemplary bias conditions applied to a plurality of content addressable memory cells according to an embodiment of the present invention, resulting in a mismatch condition.

During match or search operation, the data in the CAM cell 1 is compared to the search data being provided by the user on the SL 74 and 75. The results of the comparison is stored on to node 60, which in turn will cause transistor 52 to turn on or off based on the results of the CAM bit comparison. If a match occurs, match node 60 will be driven high causing transistor 52 to turn on, which in turn causes the contents of terminal 71a to propagate to terminal 71b. This repeats for every CAM cell 1 within the row. If all CAM cell 1 within a row match the contents of the data being applied (on the SL 74 and 75), the pull up device attached to the first CAM cell 1 in the row will propagate to the terminal 71b of the last CAM cell 1 within the row. A schematic illustration of the matching operation performed within a row of memory array 2 resulting in a match condition is shown in FIG. 19, while a schematic illustration of the compare operation resulting in a mismatch condition is provided on FIG. 20. The third bit stored in CAM cell 1c in this row stores a logic-1 state while the data being searched for by the user or system is logic-0 as represented by the "01" input to the SL 74c and 75c terminals. The status of the match line output 71e can be detected with various means including but not limited to voltage detection, current detection, edge detection, etc.

To erase/reset the CAM cell 1, both memory cells 50 and 51 are written to logic-0 state. This can be achieved by setting search lines (SL) 74 and 75 to a negative voltage such as about −0.5 volts. This causes the p-n junction between the floating body region 24 and the drain junction 18 to be forward biased, extracting holes stored in the floating body region 24, and thus setting the memory cells 50 and 51 to logic-0 state. All memory cells connected to the selected SLs will be written to logic-0 state. This bias condition may be repeated for all columns within a CAM array 2 to perform a chip erase/reset operation.

Alternatively, a selective erase/reset operation may be performed. This is achieved by setting search lines (SL) 74 and 75 to a slightly negative voltage, for example about −0.3 volts, that will not allow the p-n junction between the floating body region 24 and the drain junction 18 to be forward biased. The potential applied to the WL 70 will be raised from a low voltage, such as about 0.0 volts, to a high positive voltage, such as about +1.2 volts. This will couple the floating body positively. This coupling will allow for the p-n junction between the floating body region 24 and the drain junction 18 to forward bias, thus evacuating holes from only the selected memory cell 50, thus placing the selected memory cell 50 to the logic-0 state.

To write data to the CAM cell 1, one of the two memory cells having floating body transistors 50 or 51 must be set to a logic-1 state, thus resulting in a complementary data state between memory cells 50 and 51. To achieve this, a positive voltage, such as about +1.2 volts, is applied to one of the SL, for example SL 74. The other SL, SL 75 in this example, is set to a low voltage, such as about 0.0 volts. The WL terminal 70 is then set to a positive voltage, such as +1.2 volts. This will cause impact ionization at memory cell 50 in the vicinity of the drain junction (18 in FIG. 1) where the positive voltage is applied to. The impact ionization results in holes injection to the floating body region 24 of the memory cell 50, and thus placing it to a logic-1 state. The memory cell 51 will not be written to because the source and drain junctions of the memory cell 51 are at low potential, and no sufficient electric field is present to result in impact ionization. This effectively sets the memory cells 50 and 51 to be in logic-1 and logic-0 states, respectively (or will also be referred to as having logic-10 state), which can be defined as the logic-1 state of the CAM cell 1. The opposite operation can be performed where a write logic-1 operation can be performed to memory cell 51, which will set the memory cells 50 and 51 to logic-01 state, which is defined as the logic-0 state of the CAM cell 1.

In one particular non-limiting embodiment, about +1.2 volts is applied to the SL 74, about 0.0 volts is applied to the SL 75, about +1.2 volts is applied to the WL terminal 70, about +1.2 volts is applied to the BW terminal 76, and about 0.0 volts is applied to the substrate terminal 78.

An alternate method to setting of the memory cells 50 or 51 is by using a band-to-band tunneling mechanism, which is also referred to as the Gate Induced Drain Leakage (GIDL). The write operation can be performed by applying the following bias conditions: a positive potential is applied to one of the SL terminal (for example, SL 74) and zero potential is applied to the other SL terminal (for example SL 75). The WL terminal 70 is then driven from about 0.0 volts to a negative voltage such as about −1.2 volts. The combination of the positive voltage applied to the drain junction and the negative voltage applied to the gate electrode will cause band-to-band tunneling and inject holes into the floating body region 24 of this device. In one particular non-limiting embodiment, about +1.2 volts is applied to the SL 74, about 0.0 volts is applied to the SL 75, about −1.2 volts is applied to the WL terminal 70, about +1.2 volts is applied to the BW terminal 76, and about 0.0 volts is applied to the substrate terminal 78.

The above methods to program the CAM cell 1 are meant as examples and are not meant to limit the scope of the invention being discussed here. Alternatively, both memory cells 50 and 51 may be initially set to logic-1 states, and then one of the memory cells 50 or 51 may be selectively set to logic-0 state to arrive at a complementary data state within CAM cell 1.

Before the CAM search operation, two steps should be completed to ensure proper preconditioning of the CAM cell 1. The first step is to clear any charge that may be stored within the NAND match string by passing a low voltage such as ground or about 0.0 volts through the entire match string. In order to achieve this, both SL terminals 74 and 75 are set to a positive voltage, for example about +1.2 volts. Care must be taken to ensure that the voltage conditions used on the CAM cell 1 do not result in unintended over write or disturb of the state of the memory cells 50 or 51. The WL terminals are then driven to a read voltage which would then pass a positive voltage, such as about +1.2 volts, minus a transistor threshold voltage drop (Vt-drop) onto the match node 60. This voltage will then turn on transistor 52 allowing node 71a to pass to node 71b. A preconditioning voltage such as about 0.0 volts may be applied to either node 71a or 71b. In a long string of CAM cells, a preconditioning voltage such as about 0.0 volts may be simultaneously driven from the node 71a or the first CAM cell 1 within the row and the terminal 71b of the last CAM cell 1 within the row in order to speed up the preconditioning process.

A further step of preconditioning the CAM cell 1 involves removing the charge stored on the match node 60, for example as a result of the previous search operation. The WL terminals may be held or driven to a positive potential, for example about +1.2 volts, and then the SL terminals 74 and 75 may be driven to low potential, for example about 0.0 volts. This operation will set the match node to about 0.0 volts. The level used in the preconditioning step is meant as an example. A positive voltage may also be used as the preconditioning value. The step of preconditioning is meant to arrive at a consistent bias point prior to any operation to provide a common starting point for all cells being evaluated. It is also possible with appropriate margins of cell operation that the preconditioning steps may be skipped for performance purposes.

Device 52 is shown in FIG. 15 as an NMOS device but is not meant to limit the scope of this invention. For example, a p-channel MOS (PMOS) device may be used in replacement of NMOS device 52.

To perform a CAM search operation, the complementary search data provided by the user or system is driven to SL terminals 74 and 75. The complementary match data may be written into memory cells 50 and 51 prior to any search operation. The WL terminal 70 of the CAM cell 1 is set to a read voltage that will allow memory cell 50 set at logic-1 state to conduct strongly while minimizing the sub-threshold or off current of memory cell 50 in logic-0 state. The read voltage will also need to be low enough to prevent unintended writing or disturb of the memory cells 50 and 51. A match occurs when the search data on the SL terminal matches the data stored in the memory cell 50 connected to that SL terminal. For example, a positive potential is applied to SL terminal 74 connected to memory cell 50 that stores logic-1 state. The memory cell 50 or 51 in logic-1 state will allow the potential of the SL terminal 74 or 75 connected thereto to pass through to the match node 60.

A mismatch occurs when a memory cell 50 in logic-1 state is connected to a SL terminal at low potential, for example about 0.0 volts. This will set the match node 60 to low potential, for example ground potential or about 0.0 volts. There is a sub-threshold leakage current flowing through memory cell 50 in logic-0 state, when connected to a SL terminal having a positive potential. This may cause the match node 60 to move higher above the ground potential and may cause some current consumption.

The CAM search operation may also be performed by utilizing the lateral bipolar current of the memory cells 50 to charge the match node 60. In one particular non-limiting embodiment, about +1.2 volts is applied to one of the SL terminal 74 and about 0.0 volts is applied to the other SL terminal 75, about 0.0 volts is applied to the WL terminal 70, about +1.2 volts is applied to the BW terminal 76, and about 0.0 volts is applied to the substrate terminal 78. The floating body region 24 acts as an open base region of the lateral bipolar device. If the floating body region 24 is positively charged, this will turn on the lateral bipolar device and charge the match node 60 to a positive potential.

The match condition is similar when the search data on the SL terminal 74 matches the data stored in the memory cell 50 connected to SL terminal 74.

An example of a CAM cell 1 match condition where the search operation utilizes the bipolar method is when memory cell 50 is in logic-1 state and memory cell 51 is in logic-0 state. The user then applies a search data of logic-1 or logic-10 to the CAM cell 1 by applying a positive potential, such as about +1.2 volts, to SL terminal 74 and low potential, such as about 0.0 volts, to SL terminal 75. In this case, the memory cell 50 is in logic-1 state having a positively charged floating body region 24, which will turn on the lateral n-p-n bipolar device between the SL terminal 74 and match node 60. This will pass the voltage of the SL terminal 74 to match node 60 which will in response turn on transistor 52 indicating a match condition.

An example of a mismatch condition is as follows: if the user applies a search data of logic-0 state or logic-01 state, SL terminal 74 would be at a low potential such as about 0.0 volts and SL terminal 75 would be at a positive potential such as about +1.2 volts. In this case memory cell 50 would be off since the collector of the lateral n-p-n is at a low potential. Memory cell 51 would also be off since it has a logic-0 state stored. In this case, match node 60 will remain at about 0.0 volts which would leave transistor 52 off indicating a mismatch.

Figure 21:
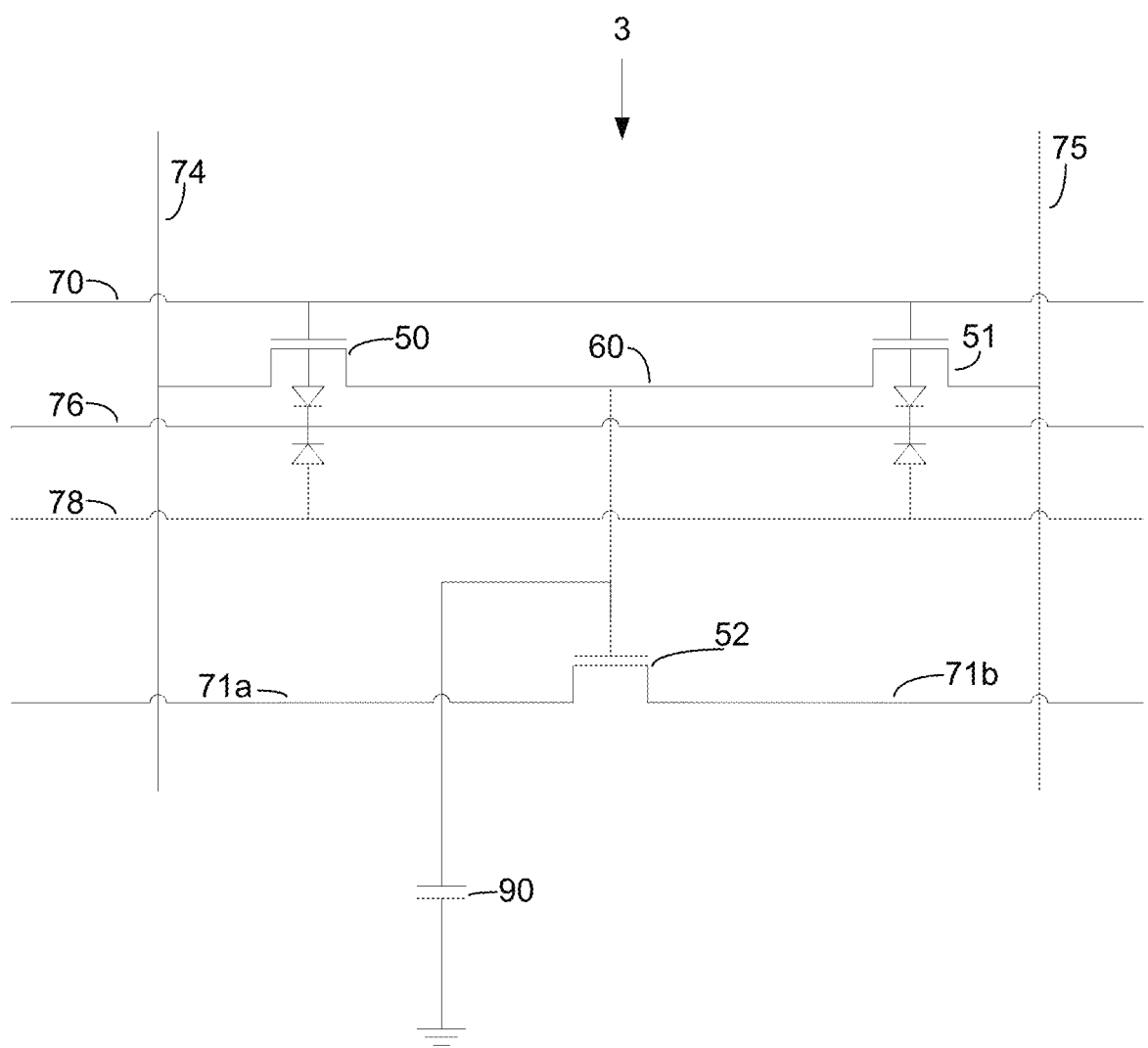
FIG. 21 illustrates an equivalent circuit representation of a content addressable memory cell comprising a capacitor, according to an embodiment of the present invention.

A capacitor 90 may be added to the match node 60 as shown in FIG. 21. This allows for the match node 60 to hold its contents for a longer period of time to conserve power. Power may be consumed when a positive potential is applied to the SL terminals, depending on the magnitude of the sub-threshold leakage current of the memory cell in logic-0 state. By using a capacitor 90, the time required to actively drive SL terminals 74 and 75 may be reduced. Alternatively, to increase the capacitance on the match node 60, the width and length of device 52 may also be increased to add additional capacitance to match node 60. Capacitor 90 may also be implemented using floating body capacitor devices.

Figure 22:
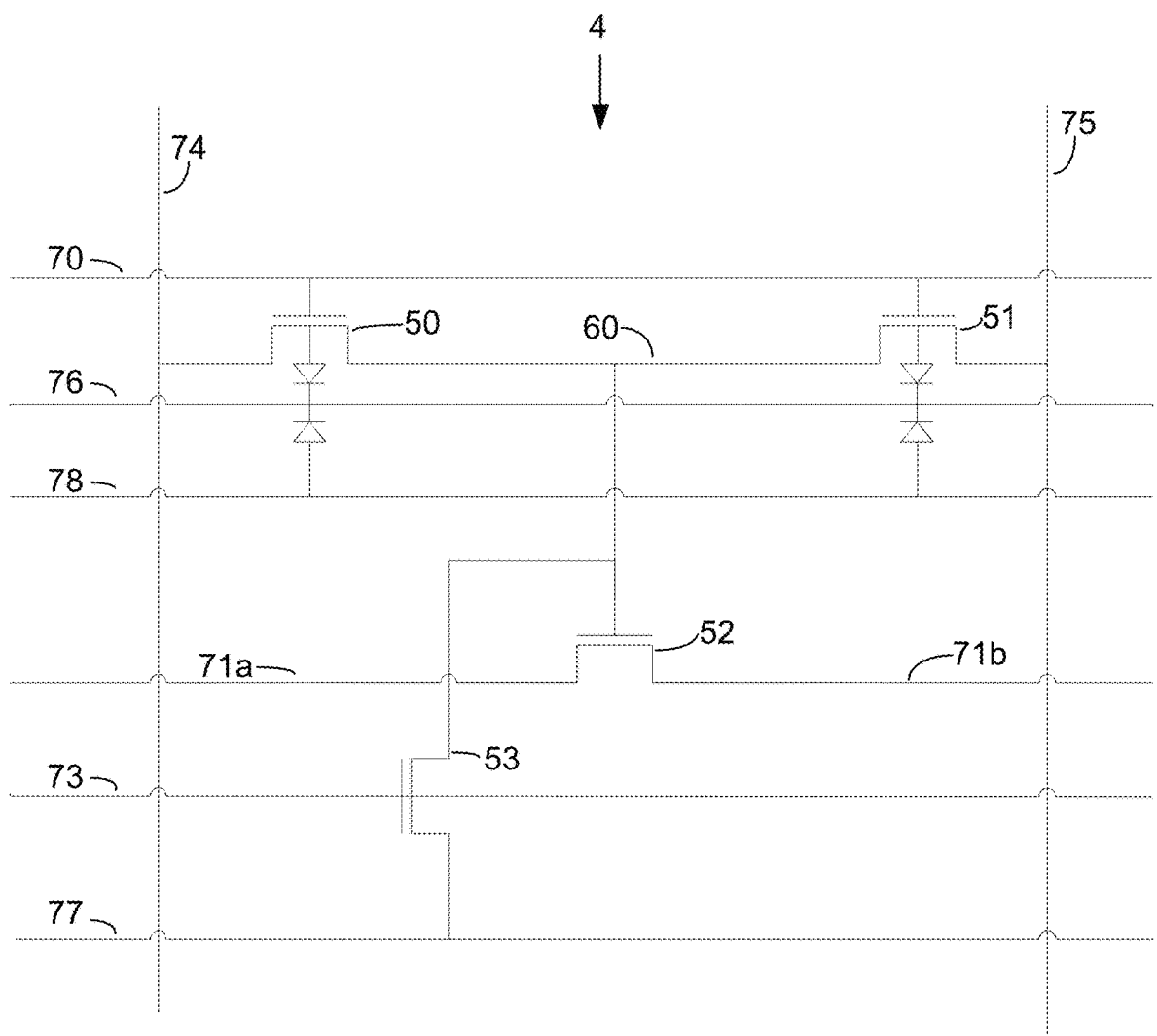
FIG. 22 illustrates an equivalent circuit representation of a content addressable memory cell comprising a transistor to precondition the match node, according to an embodiment of the present invention.

To improve performance and/or to avoid the possibility of unintentional disturb to the states of the CAM cells 1 during preconditioning, a transistor 53 may be added to precondition the match node as shown in FIG. 22. This may reduce the time and steps necessary to precondition the match node 60 and NAND match string (from node 71a to node 71b) at the cost of an added transistor. The gate of the transistor 53 is connected to node 73 and may be driven to a positive potential and node 77 may be driven to a positive potential to precondition the NAND match string (from node 71a to node 71b) to ground or about 0.0 volts. Afterwards, node 77 may be driven to a low potential to precondition the match node 60. Transistor 53 is shown to be an NMOS device, however this may also be realized by other devices such as a PMOS or a transmission gate. Additionally, a capacitor 90 may also be added to hold the charge at the match node 60 as shown in FIG. 23.

Figure 24:
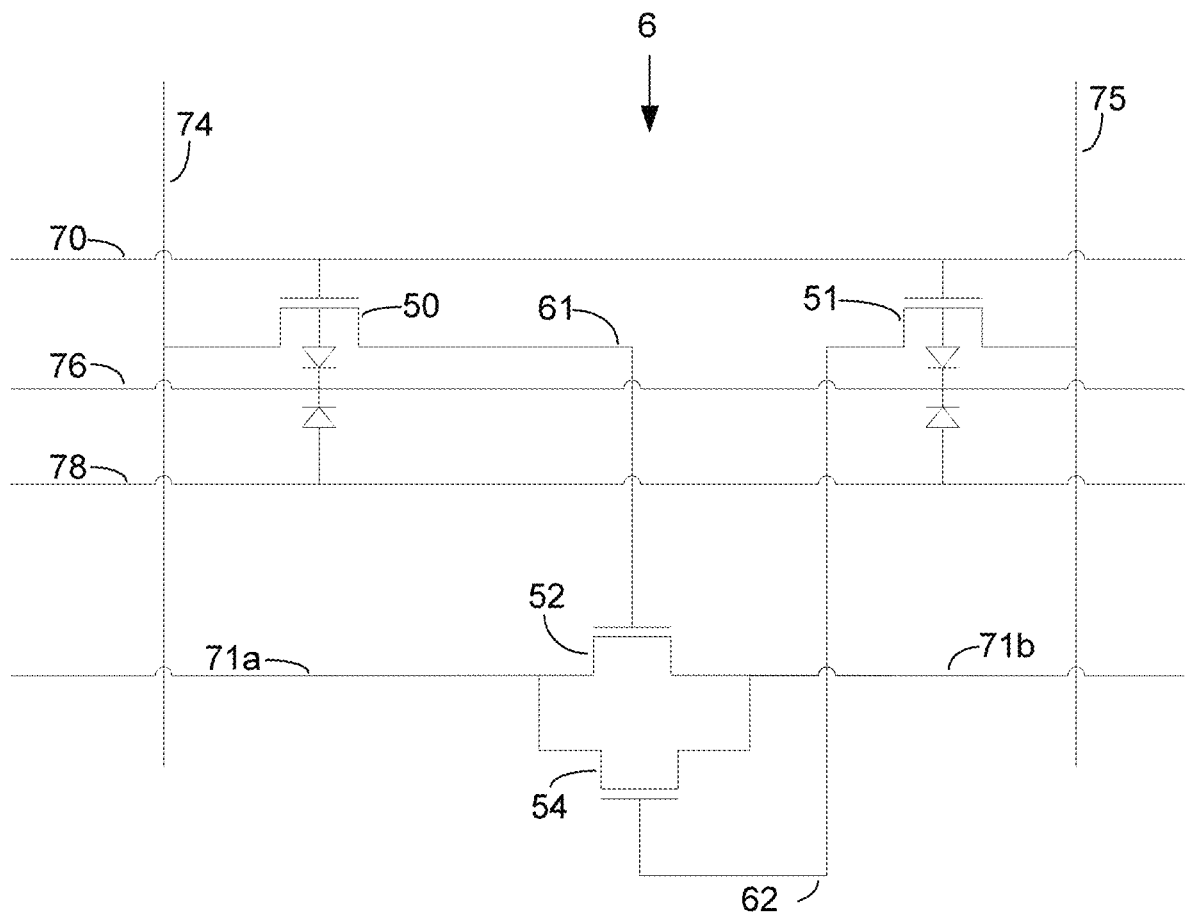
FIG. 24 illustrates an equivalent circuit representation of a ternary content addressable memory (TCAM) cell according to an embodiment of the present invention.

To avoid any potential leakage or current between search line (SL) terminals 74 and 75, the match node may be split as shown in FIG. 24. The match node is now split into two separate nodes: nodes 61 and 62. In order to support separate match nodes, an additional match transistor 54 is added. The operation of the CAM cell 6 is similar to the previous embodiments, in that in the case of a match operation, a positive SL terminal is adjacent to the memory cell 50 storing a logic-1 state and in turn will charge the corresponding match node (node 61 or 62) to Vcc-Vt. The memory cell 50 storing logic-0 state is connected to a SL terminal biased at low potential, such as ground, so the memory cell 50 storing logic-0 state will not turn on and the corresponding match node will remain at low potential ensuring the other match transistor (transistor 52 or 54) remains off.

Figure 27:
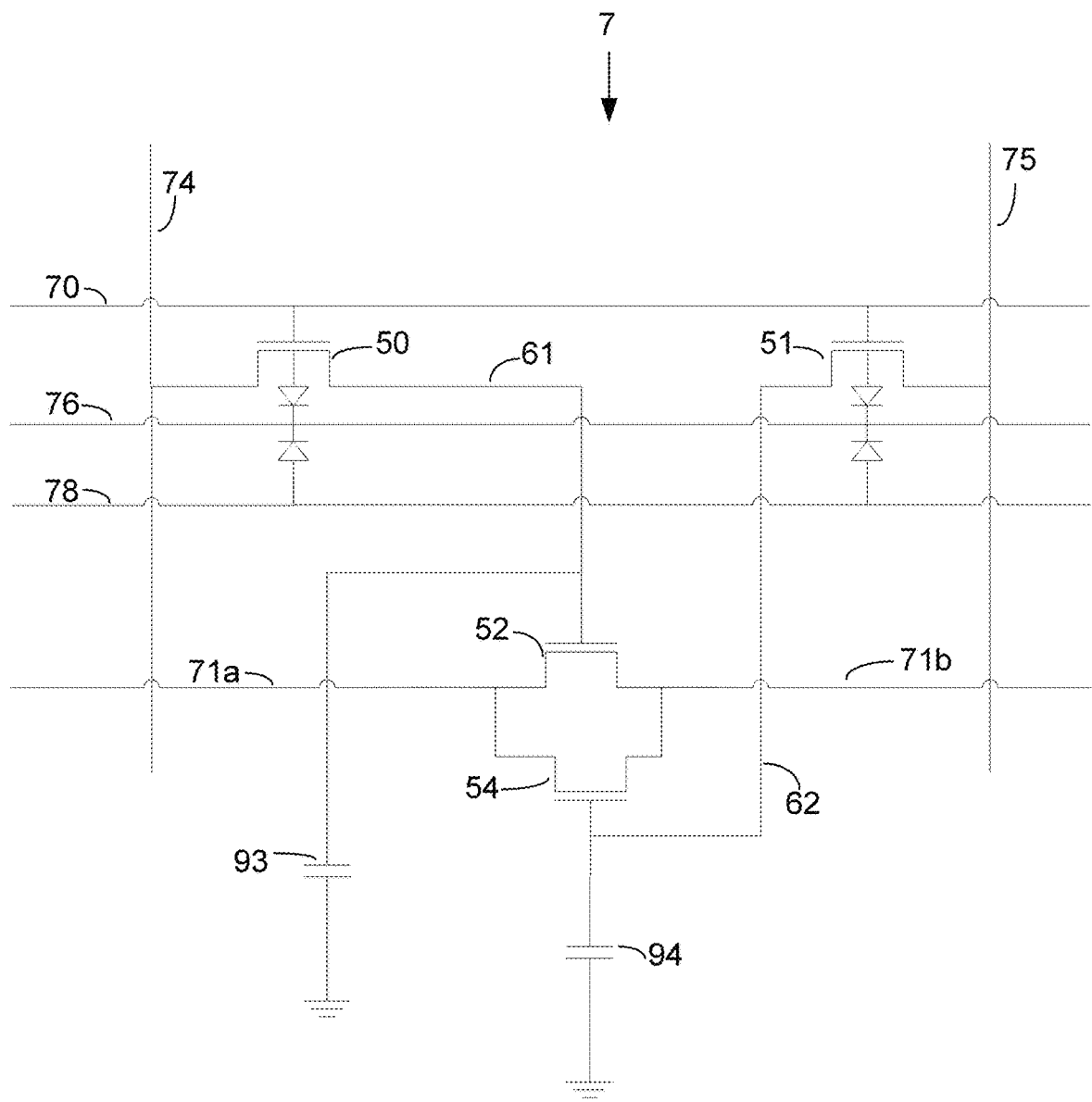
FIG. 27 is a schematic illustration of a floating body content addressable memory cell according to another embodiment of the present invention. The cell of FIG. 27 includes a split match node and capacitors to hold charge on the match nodes. This embodiment may also be used as a ternary content addressable memory.

In a mismatch state or condition, the memory cell 50 storing logic-1 state is connected to the SL terminal 74 or 75 with a low voltage, such as about 0.0 volts. In this case, the memory cell 50 will drive the low voltage to its respective match node 61 or 62. The NMOS match line transistor 52 or 54 will not turn on. On the opposite side of the mismatch condition, the memory cell 50 storing logic-0 state will be connected to a SL terminal being driven to a positive voltage, such as about +1.2 volts. In this case, the precharged match node 61 or 62 will be charged to low potential, such as 0.0 volts, although it will slowly charge up due to the sub-threshold leakage current of the memory cell storing logic-0 state. Therefore, the search/match operations need to be completed before the sub-threshold leakage discharges either match nodes 61 or 62, to ensure the results will remain intact. Additionally, capacitors may be added (capacitors 93 and 94) as shown in FIG. 27. Transistors 52 and 54 may also have their width and length increased in order to maximize capacitance of the match nodes 61 and 62. Preconditioning transistors are not shown, but may also be added to nodes 61 and 62 in order to improve performance or to avoid any potential undesired write, similar to the descriptions in FIGS. 21-23. The source of each preconditioning transistor can be either separate signals or holding capacitors may also be used, but these are not shown in FIG. 27.

Figure 23:
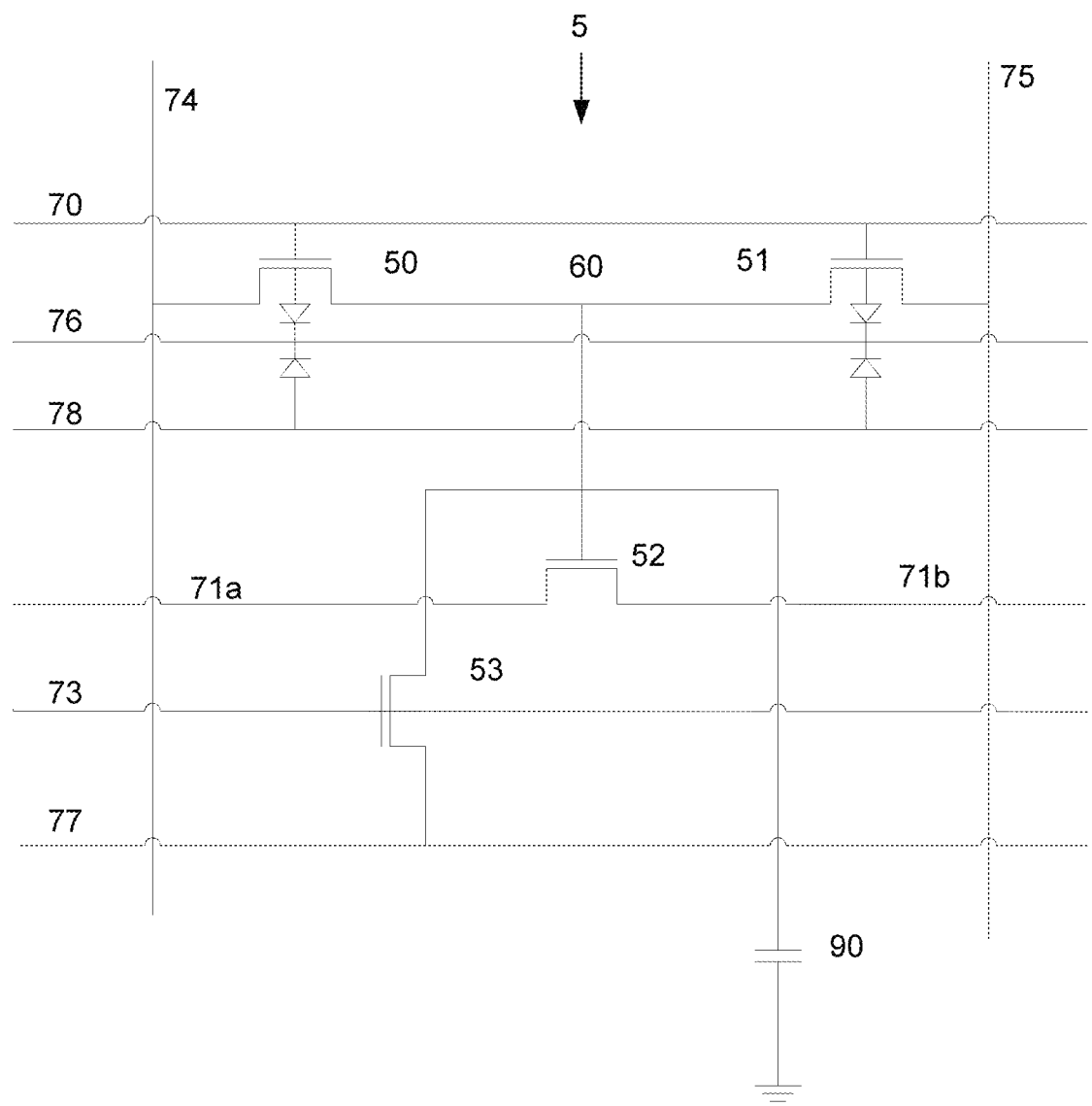
FIG. 23 illustrates an equivalent circuit representation of content addressable memory cell comprising a holding capacitor and a transistor to precondition the match node, according to an embodiment of the present invention.

FIG. 25 illustrates exemplary bias conditions on the CAM cells illustrated in FIGS. 21-23.

The CAM cell 6 illustrated in FIG. 24 may also be utilized as a Ternary Content Addressable Memory (TCAM). A TCAM memory cell provides the same functionality as a CAM (or sometimes referred to as Binary CAM) and also allows for an additional "don't care" state. In the TCAM cell 6 illustrated in FIG. 24, the "don't care" state may be stored by setting both memory cells 50 and 51 to logic-1 state. When complementary search data is applied to SL terminal 74 and /SL terminal 75, respectively, the TCAM cell 6 is guaranteed to match (since it will always have a memory cell 50 connected to a SL terminal 74 or /SL terminal 75 having a positive voltage applied to it).

In operation, the user or system may also input a "don't care" state in the search data. To apply a "don't care" in the search data input for the TCAM cell 6 having electrically floating body transistor, the user or system may apply a positive voltage, such as about +1.2 volts, to both SL terminal 74 and /SL terminal 75. Since one or both of the memory cells 50 and 51 store(s) a logic-1 state (memory cells 50 and 51 will store complementary data or both will store logic-1 states if storing "don't care"), one of the match nodes 61 or 62 will thus be positive, passing the TCAM cell 6 regardless of the state of the TCAM cell 6.

FIG. 26 illustrates exemplary bias conditions on the TCAM cell 6 illustrated in FIG. 24.

Figure 28:
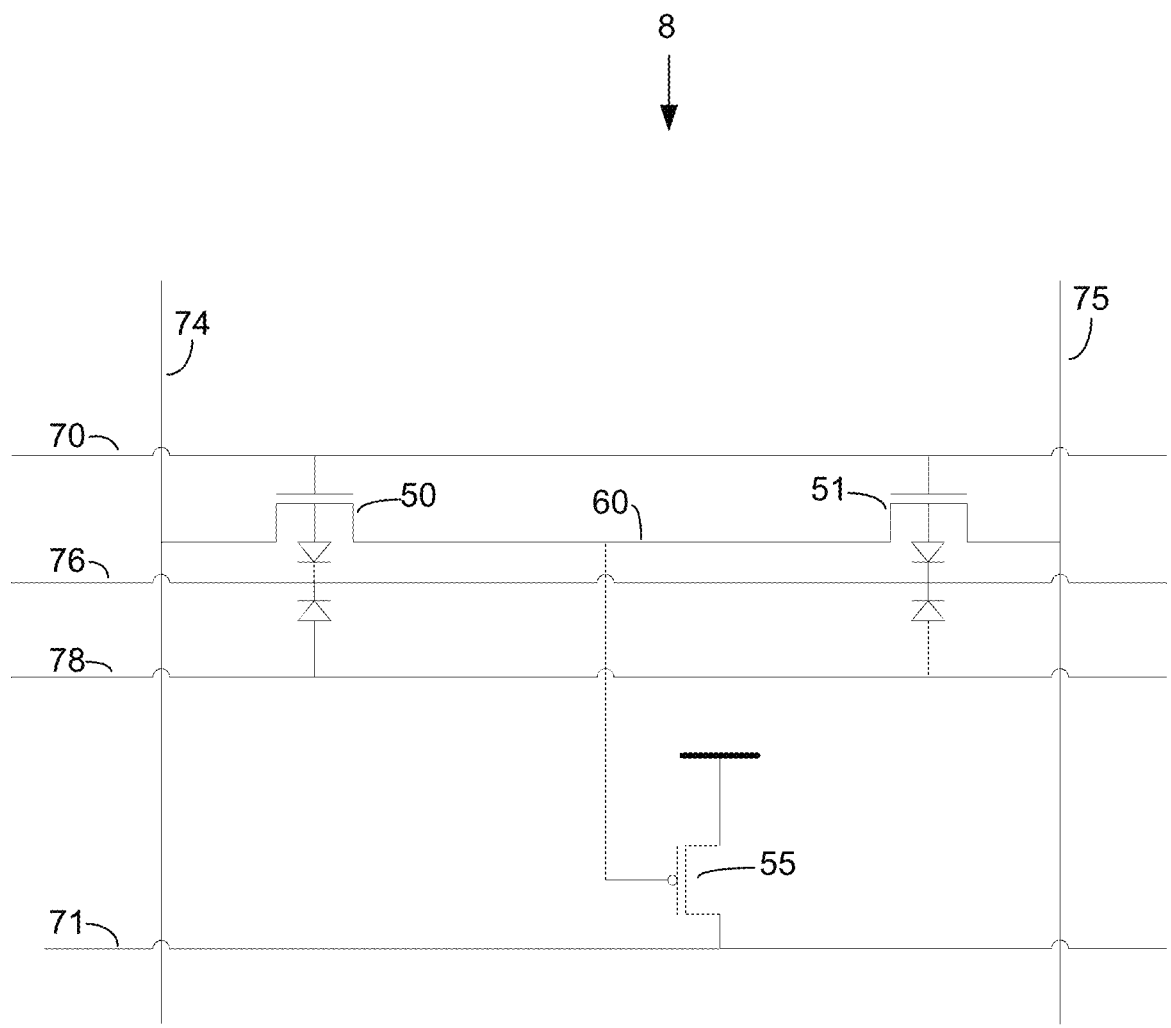
FIG. 28 is a schematic illustration of a floating body content addressable memory cell with a wide fan OR match string, according to another embodiment of the present invention.

FIG. 28 illustrates a CAM cell 8 according to another embodiment of the present invention. In CAM cell 8, the match string is now in a wide-fan OR configuration with a pull up PMOS device 55. This simplifies the preconditioning of the match node 71 by removing the serial string of NMOS devices. It also improves the performance of the match string by avoiding the Vt drop associated with passing through NMOS transistors, in addition to avoiding the serial propagation delay required when passing data through each of the CAM cells 8 within the string.

The operation of CAM cell 8 is slightly different with match node 71 requiring either a passive pull down device or a method to measure current or voltage after the external search data has been applied to SL terminal 74 and /SL terminal 75. A low voltage or current on match node 71 indicates a successful match condition, where a positive voltage or current state will indicate a mismatch condition. The match node 60 will be driven high (i.e. to a positive voltage) if there is a match between the search data and the data stored in the CAM cell 8. If match node 60 is high (i.e. positive voltage, such as about +1.2 volts), it will turn off the PMOS device 55 and prevent this CAM cell 8 from acting upon the match line 71. If the contents of the entire row of CAM cells 8 match the data being applied to the search lines, there will be no active pull up on node 71 and node 71 can be easily driven to ground.

In a mismatch condition, the match node will be driven to a low voltage due to the memory cell 50 storing a logic-1 state being connected to the SL terminal having a low voltage, such as about 0.0 volts, thus causing the PMOS device 55 to turn on and indicating a mismatch has occurred. Voltage or current sensing methods may be used to detect the match or mismatch status. If the voltage or current on match line (ML) 71 is low, for example about 0.0 volts, it indicates a matching condition. A capacitor 93 may be added to the TCAM cell 8 to extend the length of time for which the match data can be held, for example as illustrated by TCAM cell 9 in FIG. 29. In another alternative embodiment, the match node 60 may be preconditioned high to a positive voltage such as +1.2 volts, shutting of all the PMOS devices in the string. Mismatched bits will cause the match node 60 to go low, for example to about 0.0 volts, which will turn on PMOS device 55 and cause ML line 71 to go high.

Figure 29:
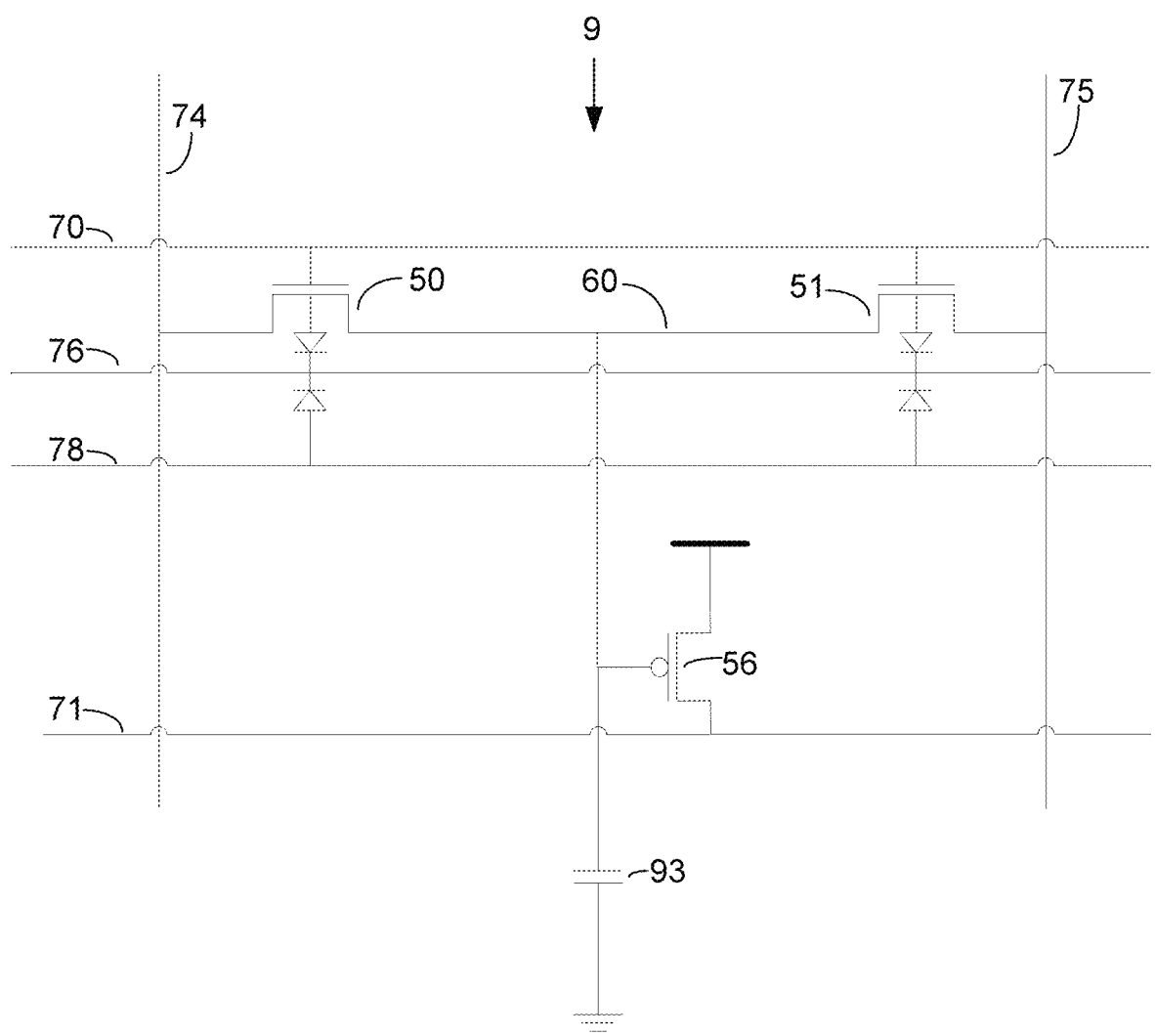
FIG. 29 is a schematic illustration of a floating body content addressable memory cell with a wide fan OR match string and a capacitor to hold charge on the match node, according to another embodiment of the present invention.

FIG. 30 illustrates exemplary bias conditions on the CAM cells 8,9 illustrated in FIGS. 28-29.

Figure 31:
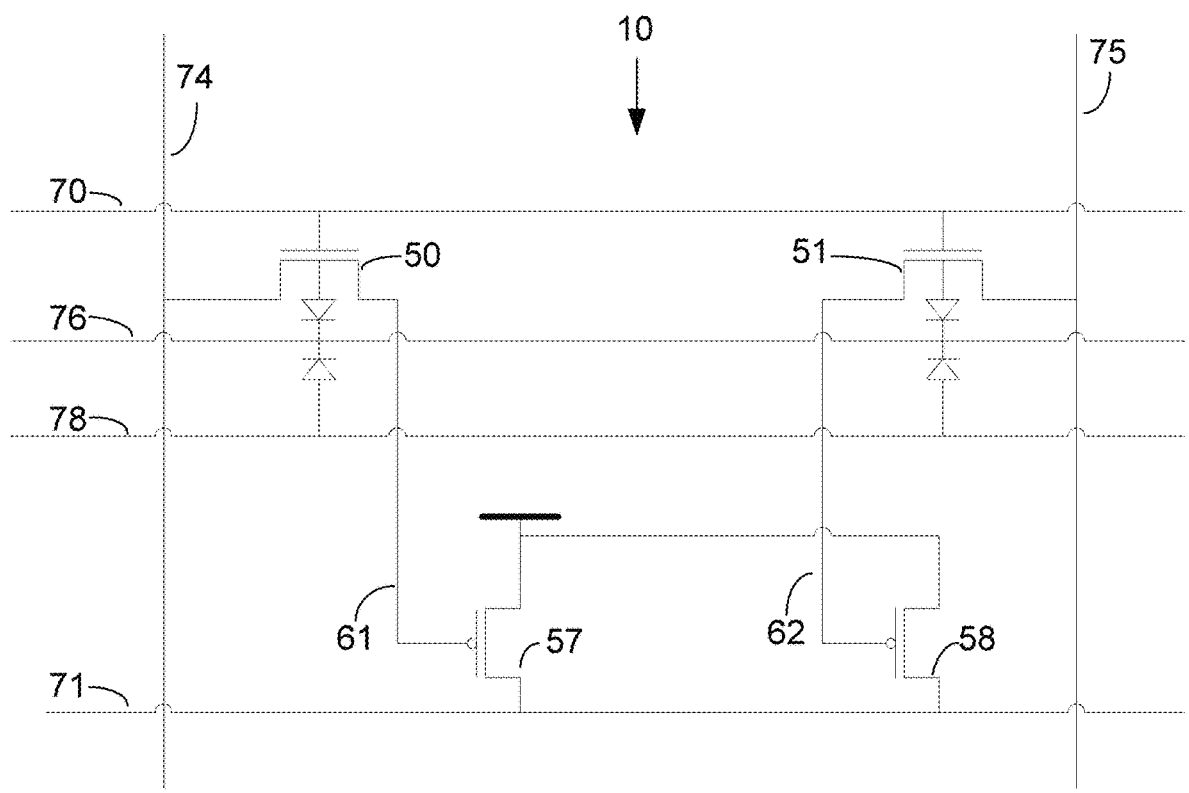
FIG. 31 is a schematic illustration of a floating body content addressable memory cell containing a split match node and a wide fan OR match string, according to another embodiment of the present invention. This embodiment may also be used as a ternary content addressable memory

FIG. 31 illustrates CAM cell 10 according to another embodiment of the present invention, where an OR match string may be used with split match nodes. The CAM cell 10 may function as both CAM and TCAM. The circuit design and the memory cell structure is the same in both cases. The data that is written to the cell determines whether it functions as a TCAM cell or a CAM cell. For a CAM cell, the 0,0 data instance (where both cells 50 and 51 store logic-0 states) is an illegal instance. For a TCAM cell, the 0,0 data instance is a "don't care" instance. Match nodes 61 and 62 are preconditioned high to a positive voltage, such as about +1.2 volts, to initially turn off PMOS devices 57 and 58. In a match condition, the match nodes 61 and 62 will remain high since one of the match nodes will directly drive to Vcc-Vt, while the opposite match node will float or slowly leak down to low voltage, such as about 0.0 volts, due to the subthreshold leakage current. Match line 71 will initially be at low potential, such as about 0.0 volts. The ML 71 needs to be measured or sensed before the subthreshold leakage can turn on one of the PMOS devices 57 or 58 and pull up the ML 71 high to a positive voltage, resulting in an incorrect search/match result.

In a mismatch condition, one of the match nodes 61 or 62 will be driven to low voltage, such as ground or about 0.0 volts, since the low voltage on the SL 74 or /SL 75 terminal will be connected to a memory cell 50 storing a logic-1 state. This will cause one of the PMOS devices 57 or 58 to turn on and pull ML 71 high, indicating a mismatch result.

FIG. 32 illustrates exemplary bias conditions on the CAM or TCAM cell 10 illustrated in FIG. 31.

The "don't care" state for the TCAM cell 10 may be implemented by storing logic-0 states in both memory cells 50 and 51. The match nodes 61 and 62 will be preconditioned high to turn off the PMOS devices 57 and 58 prior to a search/match operation. By setting both memory cells 50 and 51 to logic-0 state, memory cells 50 and 51 are effectively turned off for all CAM searches. This will cause both PMOS devices 57 and 58 to remain off and ML 71 will stay low, indicating a match condition for the TCAM cell 10 regardless of the data applied to the SL 74 and 75.

A "don't care" search data may also be applied to the TCAM cell 10 by applying a positive voltage to both SL terminal 74 and /SL terminal 75. Since nodes 61 and 62 are initially high, the applied bias to the SL 74 and /SL 75 terminals will ensure that match nodes 61 and 62 are high, turning off PMOS devices 57 and 58, regardless of the states of the memory cells 50 and 51.

Figure 33:
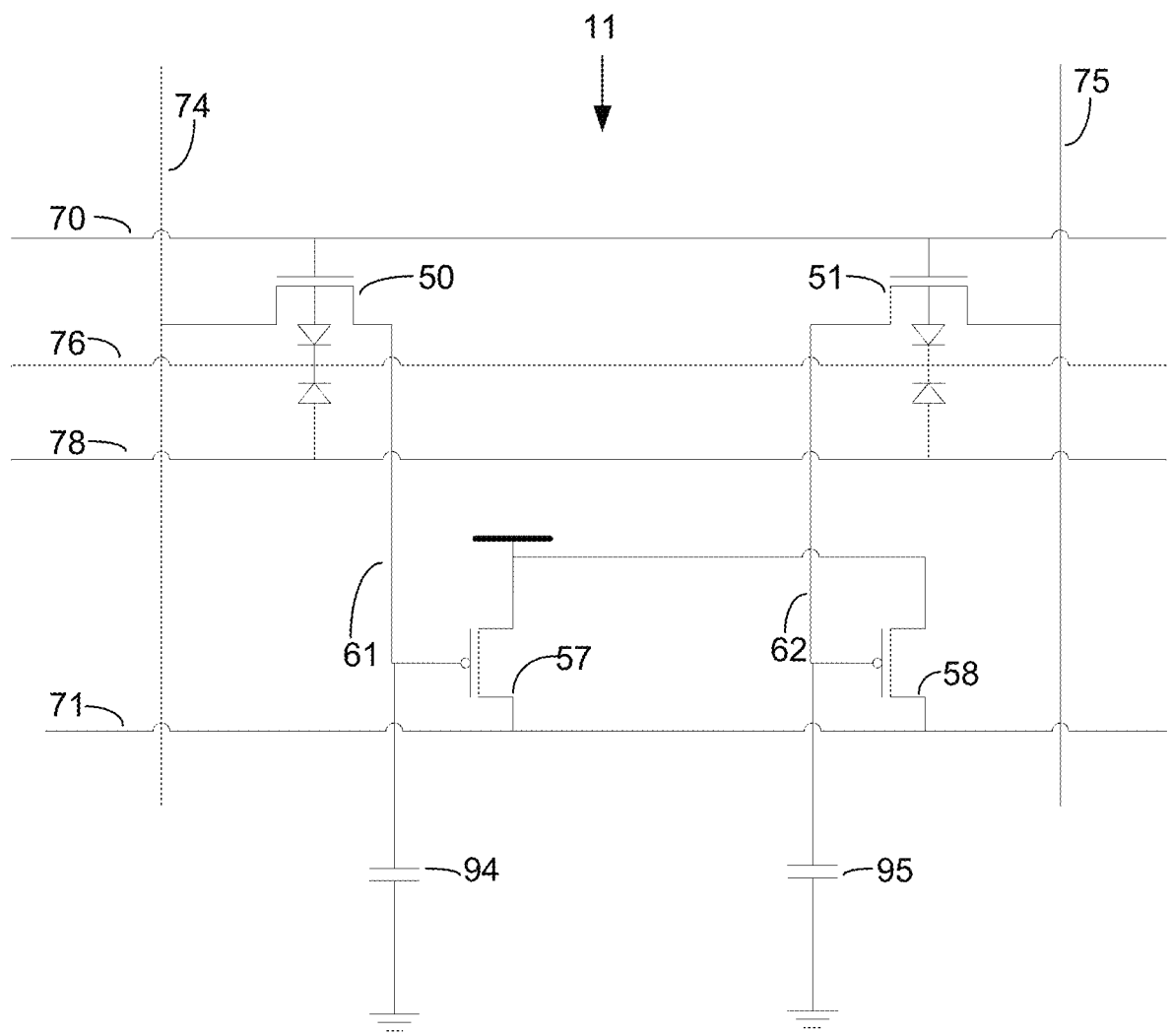
FIG. 33 is a schematic illustration of a floating body content addressable memory cell utilizing a split match node, wide fan OR match string and capacitors to hold charge, according to another embodiment of the present invention. This embodiment may also be used as a ternary content addressable memory.

FIG. 33 illustrates a CAM or TCAM cell 11 according to another embodiment of the present invention, where holding capacitors 94 and 95 are added. Preconditioning transistors may also be added to match nodes 61 and 62 to improve performance and to prevent potential disturb conditions.

Figure 34:
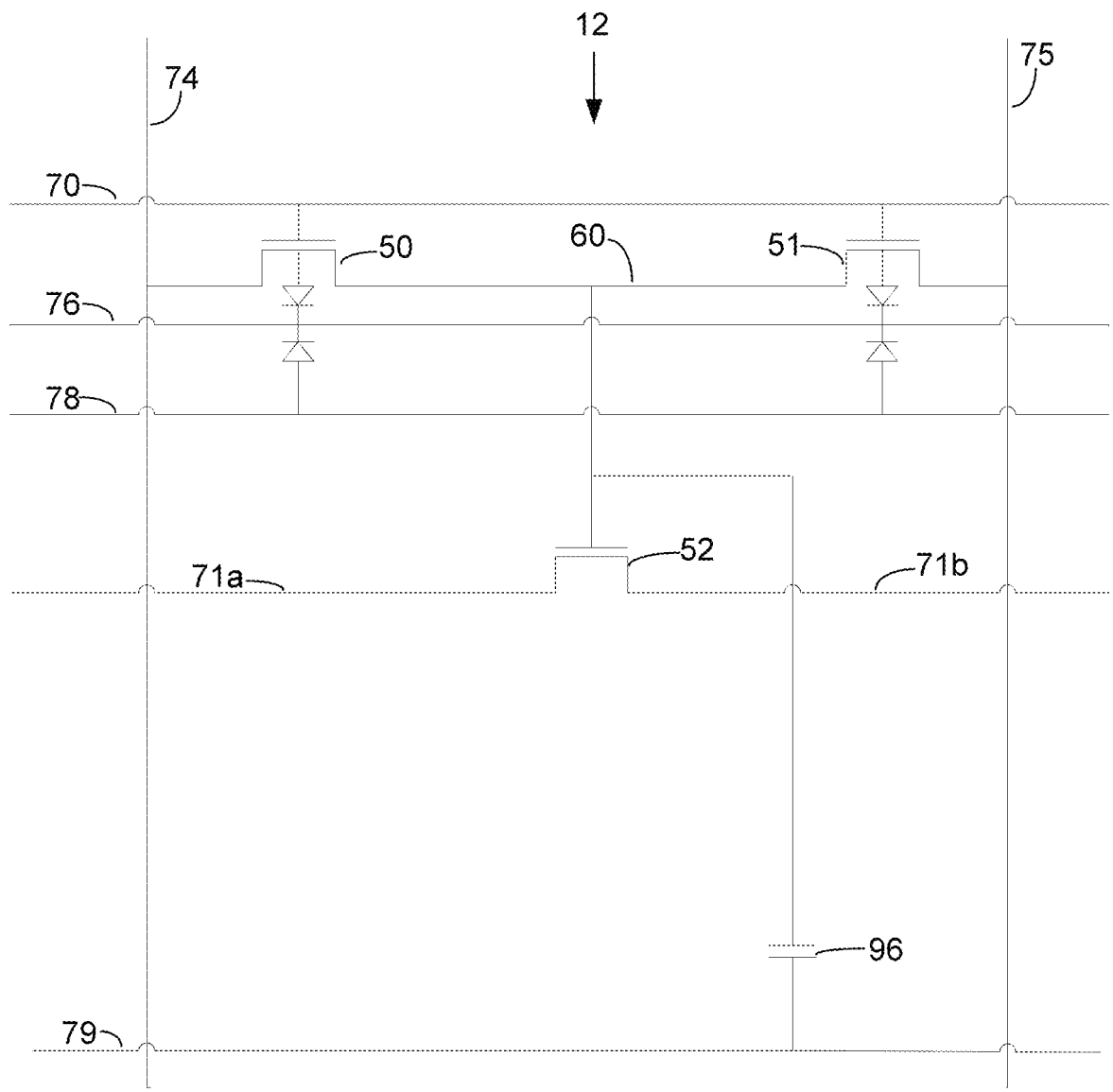
FIG. 34 is a schematic illustration of a floating body content addressable memory cell utilizing a boost capacitor to increase the pass voltage on the NAND match string, according to another embodiment of the present invention. This embodiment also includes a transistor to precondition the match node.

FIG. 34 illustrates a CAM cell 12 according to another embodiment of the present invention, which adds a boost capacitor 96. Node 79 may be clocked or quickly transitioned from a low voltage such as about 0.0 volts to a positive voltage such as about +0.3 volts after the search data has been applied to SL and /SL terminals 74 and 75. The potential change on node 79 will cause match node 60 to be boosted by a proportional amount, in this example, by approximately 0.3 volts. This coupling effect can be used to restore the voltage drop due to the Vt drop of the n-type memory cells 50 or 51. The maximum voltage allowed on node 79 must be limited so that it does not inadvertently turn on match transistor 52 in a non-matching data condition. For example, if the voltage on node 79 pumps from 0V to 1.0V, the match node will either be at 0V+1.0V or Vcc−Vt+1.0V. In this example, the minimum voltage on the match node is above the turn on point for transistor 52. Transistor 52 cannot be turned off which prevents proper operation of this CAM cell. Instead a low voltage such as 0.3V should be used. In this case the match node would either be at 0V+0.3V or Vcc−Vt+0.3V. Assuming the 0V+0.3V bias is low enough to keep transistor 52 off, this CAM cell 12 would work properly but now with the boosted voltage, when node 60 is high, indicating a match condition the voltage on this node will be higher than in the original embodiment and provide for a smaller Vt drop between nodes 71a and 71b during a match condition.

Figure 35:
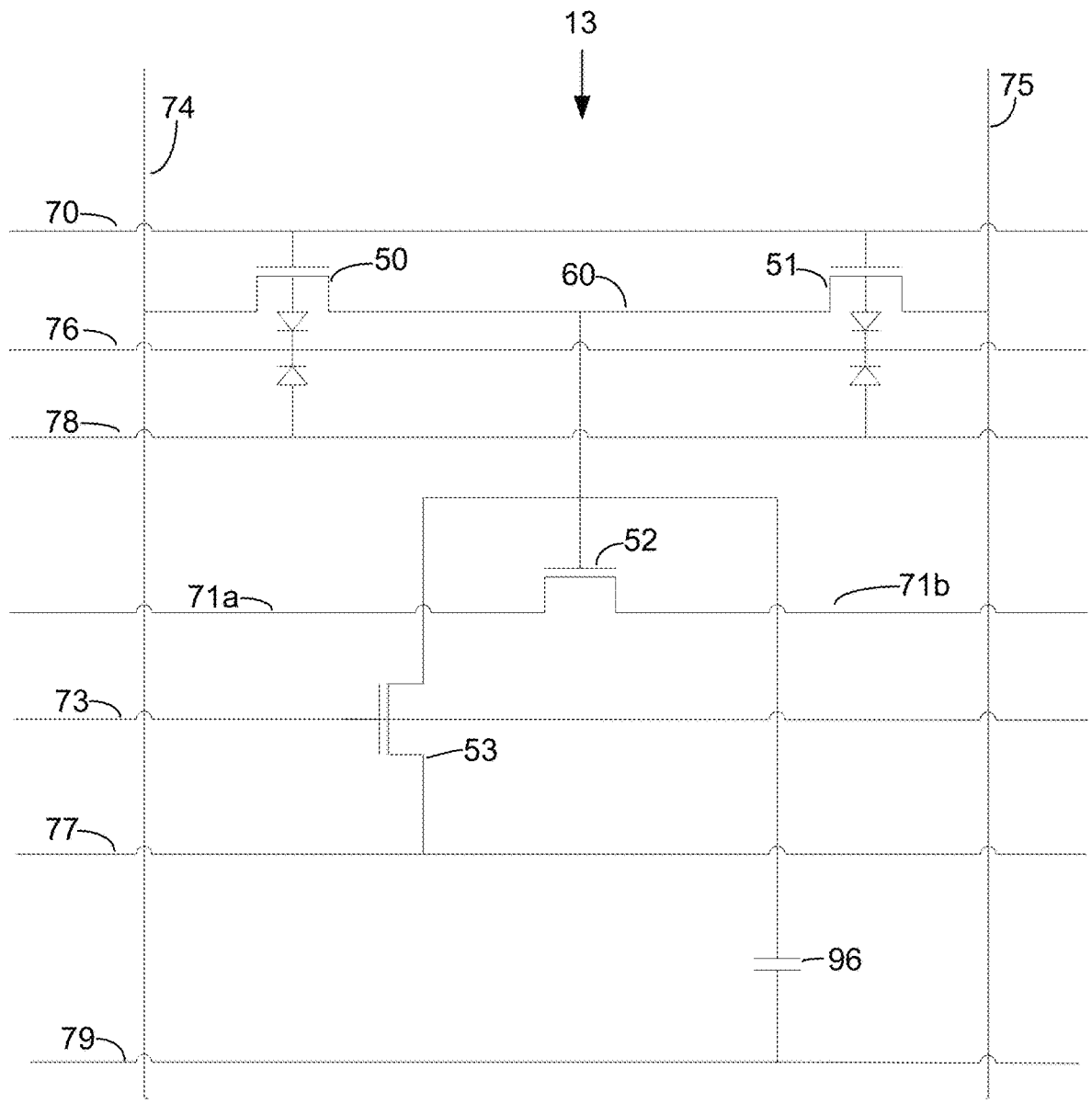
FIG. 35 is a schematic illustration of a floating body content addressable memory cell utilizing a boost capacitor to increase the pass voltage on the NAND match string, according to another embodiment of the present invention.
Figure 36:
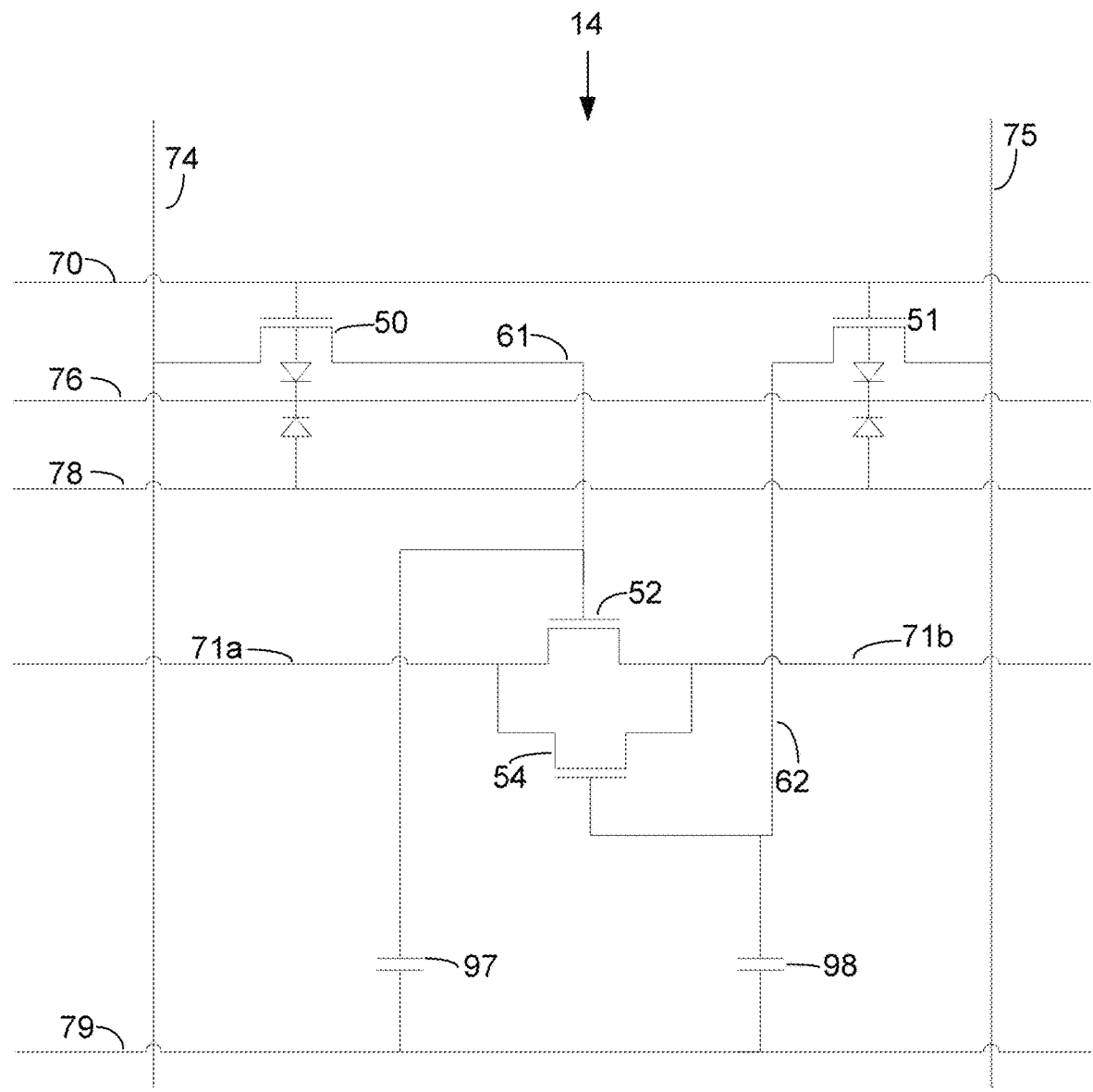
FIG. 36 is a schematic illustration of a floating body content addressable memory cell including a split match node, and match node boost capacitors, according to another embodiment of the present invention. This embodiment may also be used for a ternary content addressable memory.

FIG. 35 adds an additional preconditioning transistor 53 to cell 12, shown as CAM cell 13 in this embodiment, to improve the time required to precondition the match node or avoid potential disturb conditions. FIG. 36 indicates a CAM or TCAM cell 14 according to another embodiment of the present invention having a split match node 61, 62. Boost capacitors 97 and 98 are added to respective nodes 61 and 62. Boost node 79 is then driven from a low potential such as ground to a higher potential such as 0.3V. This will allow for at least partial recovery of any voltage lost due to a threshold drop passing across the NMOS transistors 52 and/or 54. Care must be taken when boosting node 79 to ensure that the value that is boosted does not inadvertently turn on match transistors 52 and 54 when they are meant to be off. Preconditioning transistors for each match node can also be used in FIG. 36 to improve performance or avoid disturb conditions but are not shown here.

Figure 37:
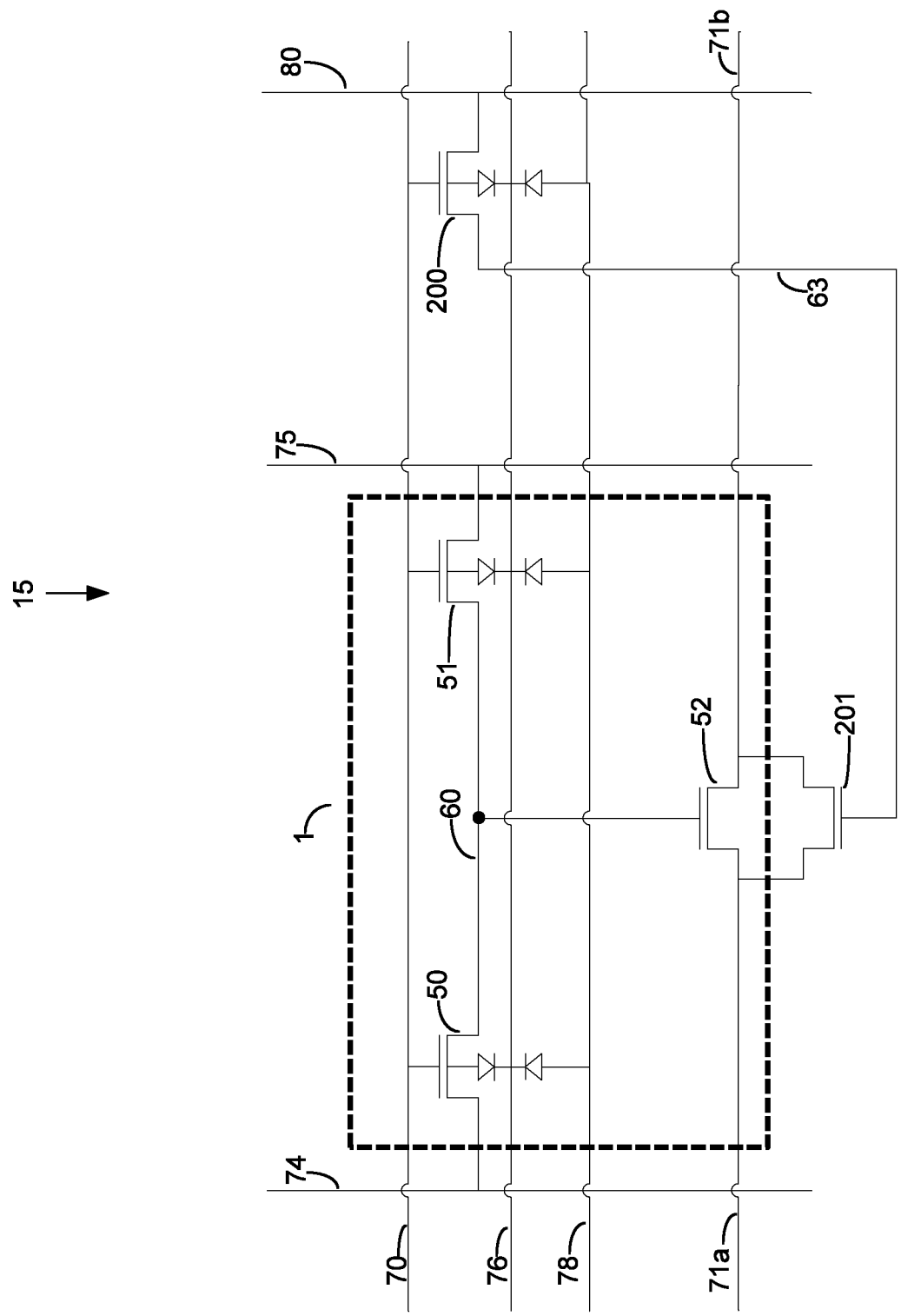
FIG. 37 is a schematic illustration of a floating body ternary content addressable memory according to another embodiment of the present invention, where the don't care node is separated from the match node.

FIG. 37 shows a ternary content addressable memory (TCAM) 15 according to another embodiment of the present invention. An additional memory cell having electrically floating body 200 and NMOS pass gate 201 are added to the CAM memory cell 1 shown in FIG. 15 (shown inside dotted line). The memory cell 200 will store the "don't care" state. During normal search operations, the "don't care" node 63 is pre-charged to a low voltage such as 0V before every operation. During search operations, the don't care search line 80 is set to a high voltage such as 1.2V or Vdd. If memory cell 200 is set to state "1", memory cell 200 will pass the contents of search line 80 which will turn on pass gate 201 allowing the match string data to propagate regardless of the contents of the original CAM cell 1. If the memory cell 200 is set to state "0", the "don't care" node 63 will be remain low, turning off transistor 201 and making the behavior of TCAM cell 15 similar to the CAM memory cell 1 listed in FIG. 15. Care must be taken to ensure that the match line measure occurs before the sub-threshold leakage of the memory cell 200 at state "0" has time to leak into the match line 63 to incorrectly turn on transistor 201.

The user or system can also apply a "don't care" state when applying their search data, thereby ignoring or masking the contents of memory cells 50 and 51. To implement this, the user or system can apply a high search data such as 1.2V to both search lines 74 and 75. Since memory cells 50 and 51 contain complementary data, it is guaranteed that at least one memory cell 50, 51 will turn on to drive match node 60 to a high potential. This turns on match transistor 52 to pass node 71a to node 71b. A table of the exemplary conditions mentioned above is provided in FIG. 38. Those skilled in the art will appreciate that this table is for exemplary purposes only and not meant to limit the scope or range of this invention.

Optionally the user or system can bypass or disable the "don't care" operation by setting the search line 80 to a low voltage, such as 0V. Setting search line 80 to a low voltage will ensure that node 63 will always be at a low potential regardless of the condition of memory cell 200. This ensures that transistor 201 will always be off making the behavior now similar to the CAM cell 1. This provides the user the option to disable the "don't care" functionality at any given time.

Write logic-0 and logic-1 operating conditions for the "don't care" memory cell 200 are identical to the writing conditions of those of memory cells 50 and 51. Either impact ionization or GIDL can be used as methods to program memory cell 200 based on the status of search line 80. The system or user can either directly drive search line 80 or additional logic can be provided when writing to the TCAM cell 16 to translate a non-complementary input or a tri-state input to correctly program memory cell 200.

Figure 39:
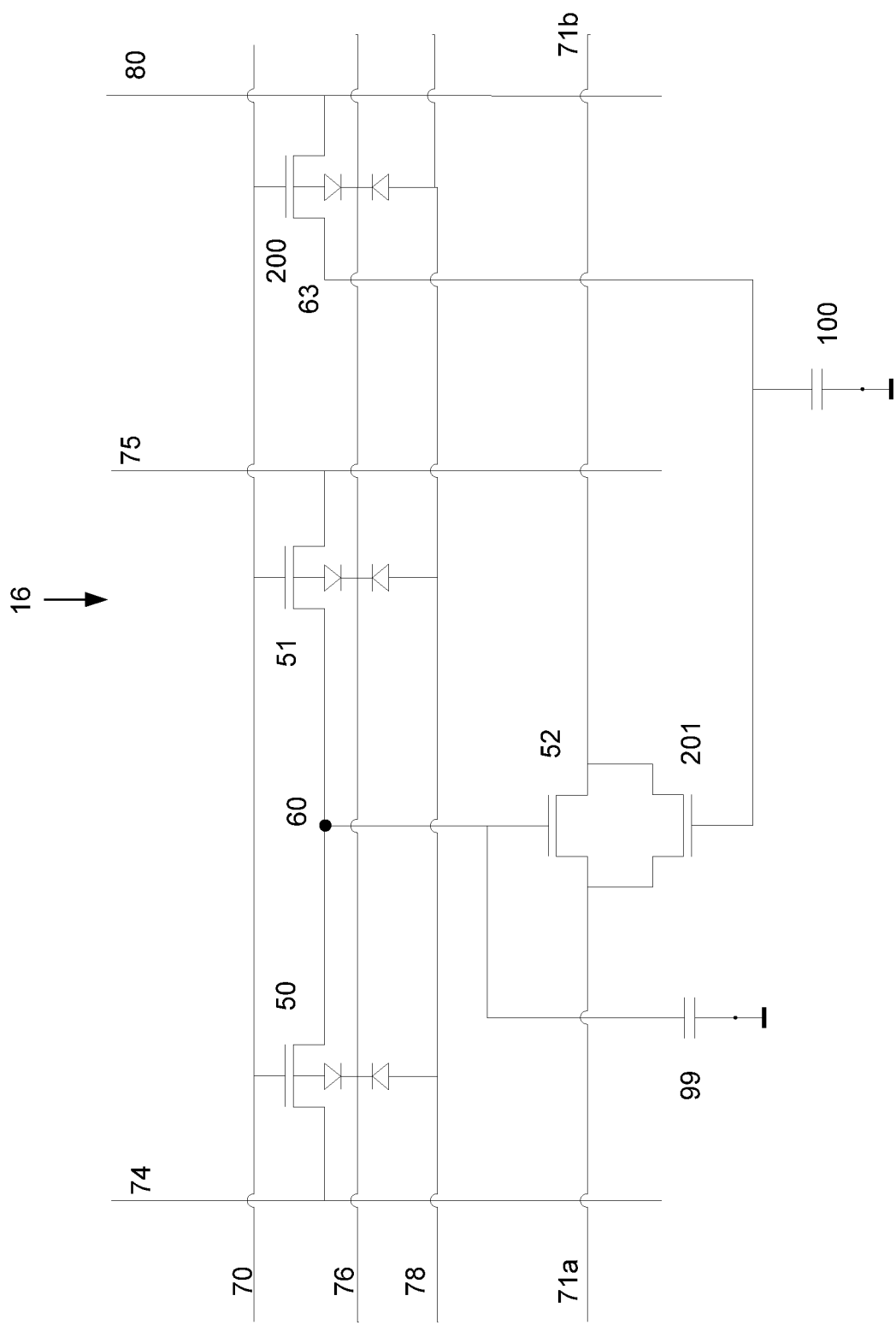
FIG. 39 is a schematic illustration of a floating body ternary content addressable memory cell with holding capacitors on the match node and don't care node.

FIG. 39 illustrates a TCAM cell 16 according to another embodiment of the present invention, which extends TCAM cell 15 by adding holding capacitors 99 and 100 to hold the match node and "don't care" node data to reduce the power consumed when search lines are actively being driven.

Figure 40:
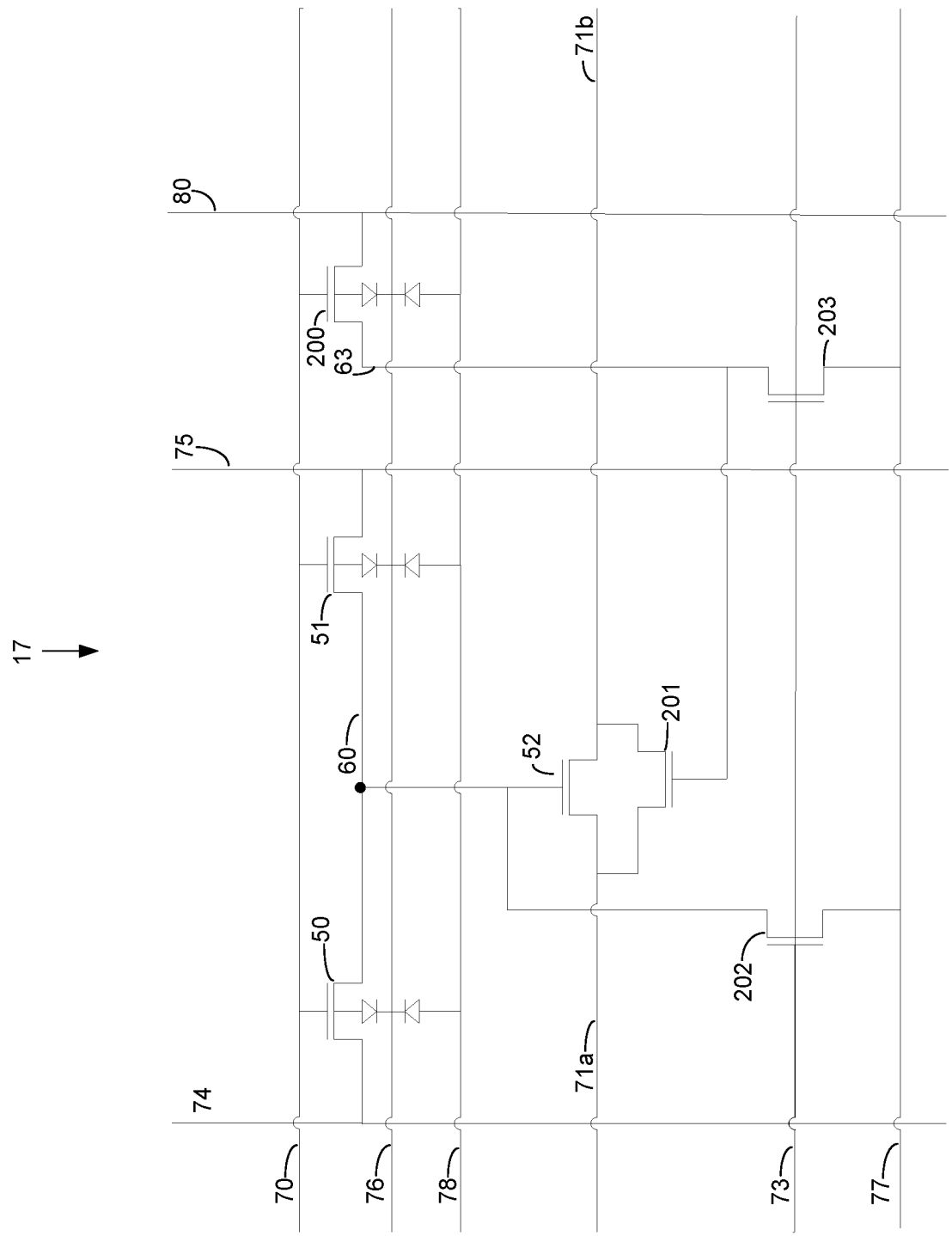
FIG. 40 is a schematic illustration of a floating body ternary content addressable memory cell with preconditioning transistors attached to the match and don't care nodes, according to another embodiment of the present invention.

FIG. 40 illustrates a TCAM cell 17 according to another embodiment of the present invention, which adds preconditioning transistors 202 and 203. The operation of TCAM cell 17 is identical to that of CAM cell 4 illustrated in FIG. 22, with the addition of "don't care" memory cell 200. Both the match node 60 and the "don't care" node 63 are required to have their separate preconditioning transistors (202 and 203) so that the nodes remain independent.

Figure 41:
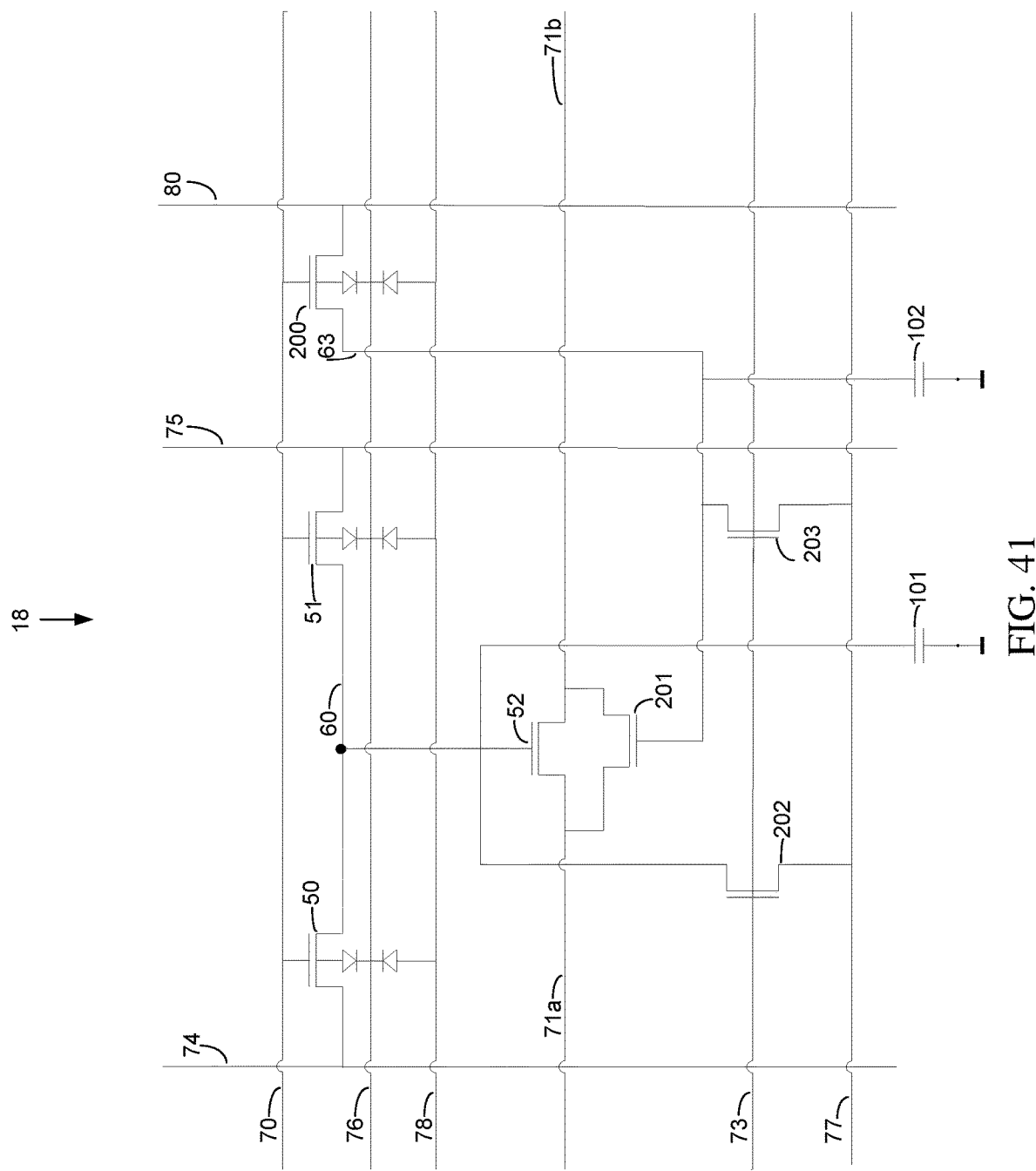
FIG. 41 is a schematic illustration of a floating body ternary content addressable memory cell with preconditioning transistors attached to the match node and don't care nodes, according to another embodiment of the present invention. Additionally, this embodiment includes capacitors attached to the match node and don't care node.

FIG. 41 shows TCAM cell 18 according to another embodiment of the present invention, which includes preconditioning transistors 202 and 203 in addition to holding capacitors 101 and 102. The behavior of this TCAM cell 18 is identical to that of CAM cell 5 found in FIG. 23 with the addition of the "don't care" cell 200.

Figure 42:
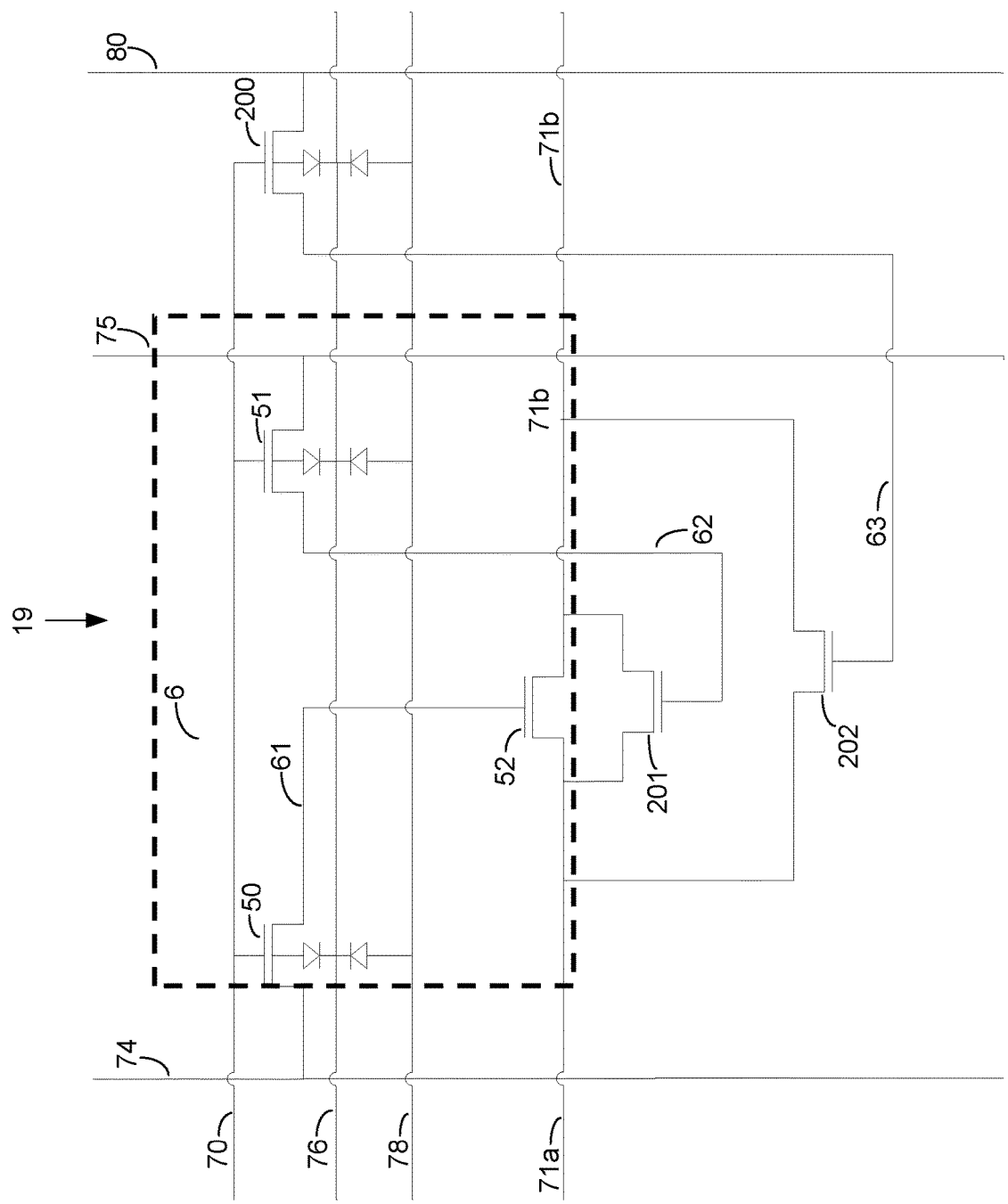
FIG. 42 is a schematic illustration of a floating body ternary content addressable memory cell with a split match node, according to another embodiment of the present invention.

FIG. 42 shows a CAM/TCAM cell 19 according to another embodiment of the present invention. CAM/TCAM cell 19 adds a memory cell having electrically floating body 200 and match transistor 202 to the CAM cell 6 illustrated in FIG. 24. The operation of the CAM/TCAM cell 19 is similar to that of CAM cell 6 with the addition of the "don't care" cell 200. The "don't care" transistor works independently from CAM/TCAM cell 6 but has the option to override the contents of CAM/TCAM cell 6 which matches the expected "don't care" behavior. A detailed example of potential bias conditions is provided in FIG. 43. Those versed in the art will understand that this table is meant for exemplary purposes only and not meant to limit the scope or range of this invention.

Figure 44:
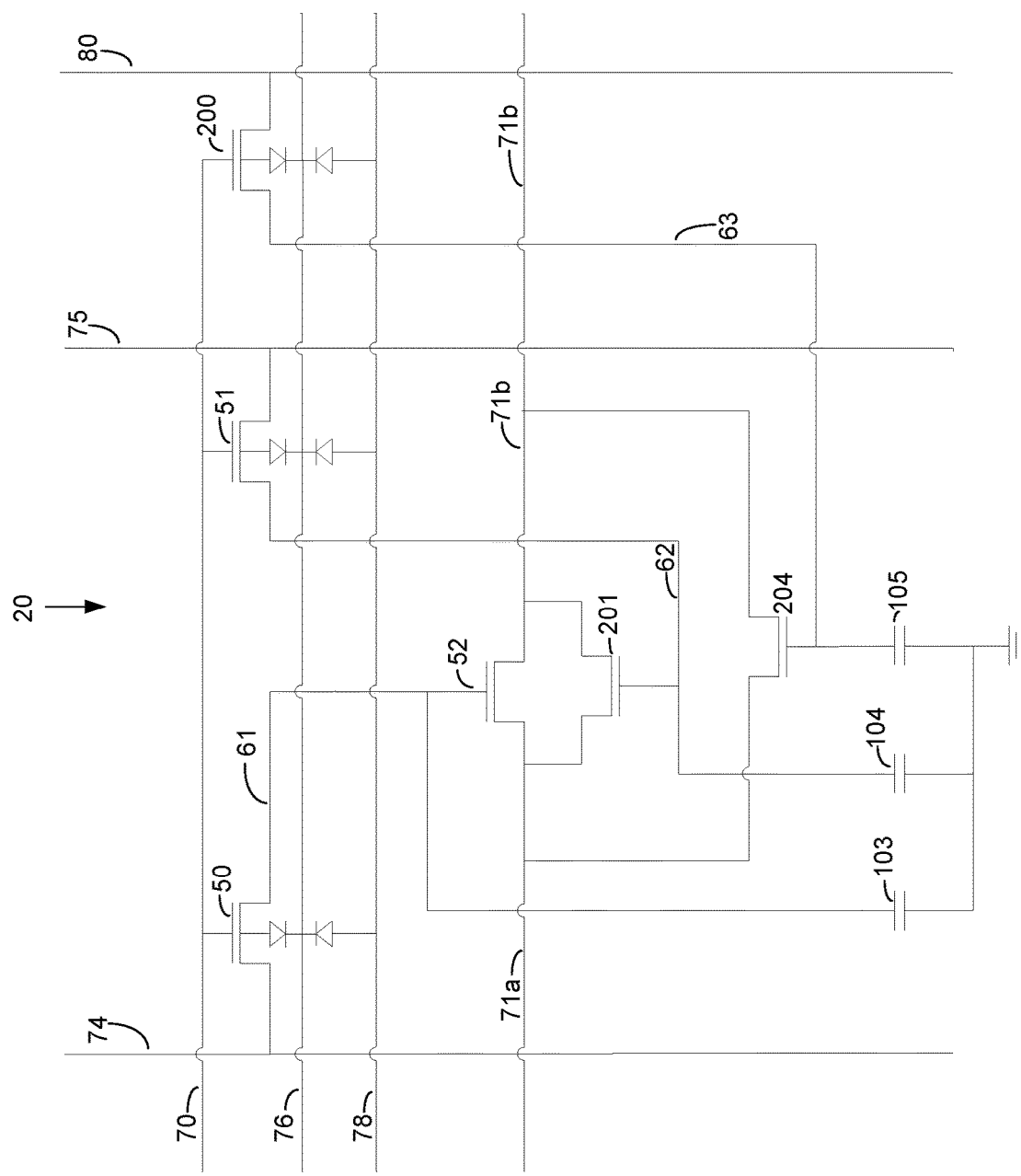
FIG. 44 is a schematic illustration of a floating body ternary content addressable memory cell with a split match node and capacitors attached to each individual match node, according to another embodiment of the present invention. A capacitor is also attached to the don't care storage node.

FIG. 44 shows a TCAM cell 20 according to another embodiment of the present invention, which adds holding capacitors 103, 104 and 105 to the TCAM cell 19. Operation of these memory cells 19 and 20 matches the operation of the CAM cells 6 and 7 with the addition of the "don't care" memory cell 200. Preconditioning transistors can also be employed at nodes 62, 64 and 66 to improve performance or avoid potential floating body memory cell disturb issues. These preconditioning transistors are not shown in FIG. 44, but have been shown and described previously.

Figure 45:
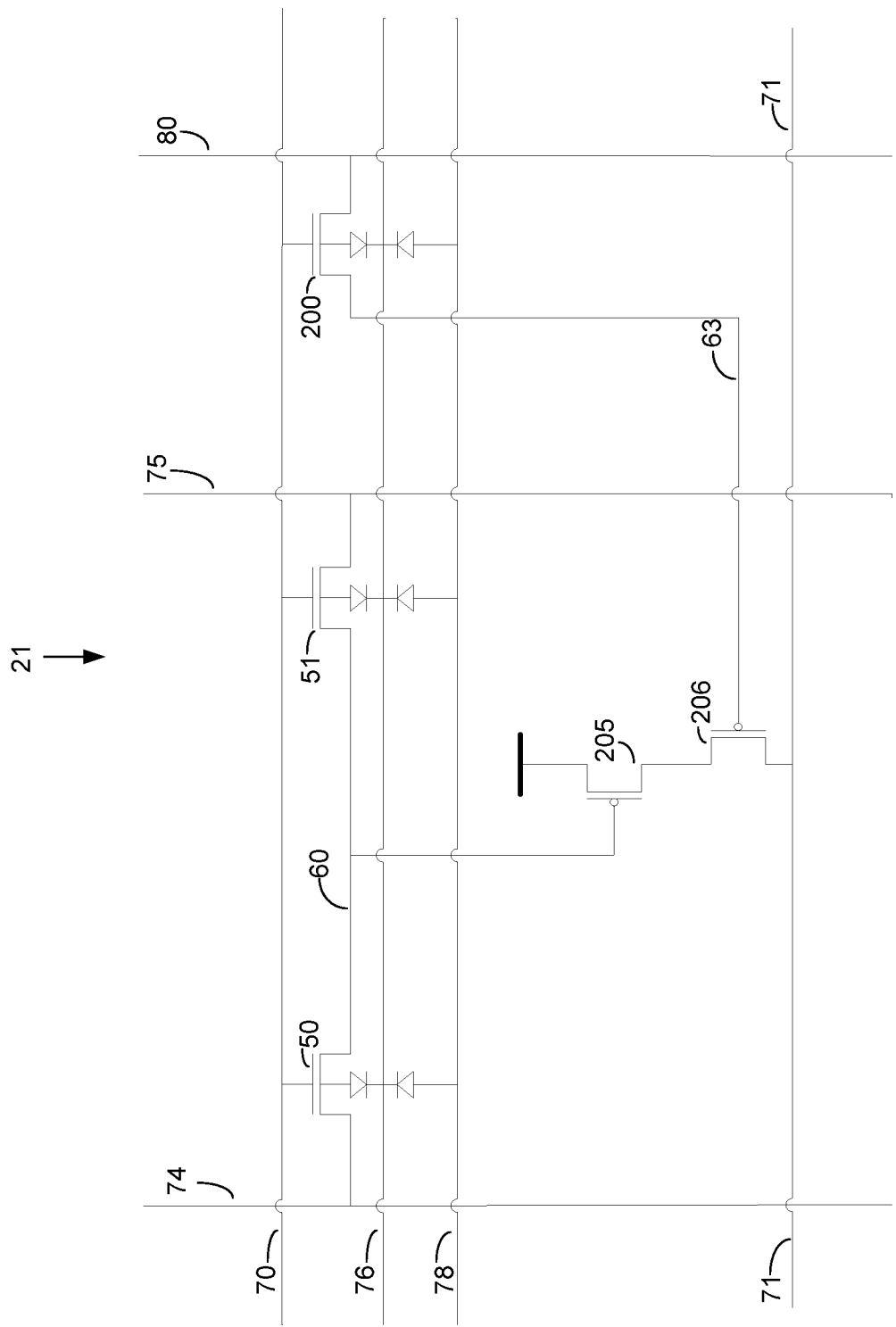
FIG. 45 is a schematic illustration of a floating body ternary content addressable memory cell with a wide fan OR match string, according to another embodiment of the present invention.

FIG. 45 shows a TCAM cell 21 with an OR match line. The behavior of the TCAM cell 21 is similar to that of CAM cell 8 with the addition of the "don't care" memory cell 200 and a serial PMOS device 206. Prior to every search operation, search line 80 is set to high and the match line 71 is preconditioned to ground and should also contain either a passive pull down or a pull down activated during evaluation of the match line. If memory cell 200 is set to state "1", it will pass a high voltage to node 63 thus turning off PMOS 206 and blocking any potential current from Vcc preventing this bit from participating in the match operation and effectively causing this bit to always pass. Care must be taken if memory cell 200 is at state "0" to ensure that the evaluation time of match line 71 occurs before the match node 63 has a chance to charge up from ground due to sub threshold leakage from search line 80 and inadvertently turn off PMOS 206. FIG. 46 illustrates a possible set of bias conditions for the TCAM 21 and is provided for exemplary purposes. Those versed in the art will appreciate that this table is meant for exemplary purposes only and not meant to limit the scope or range of this invention.

Figure 47:
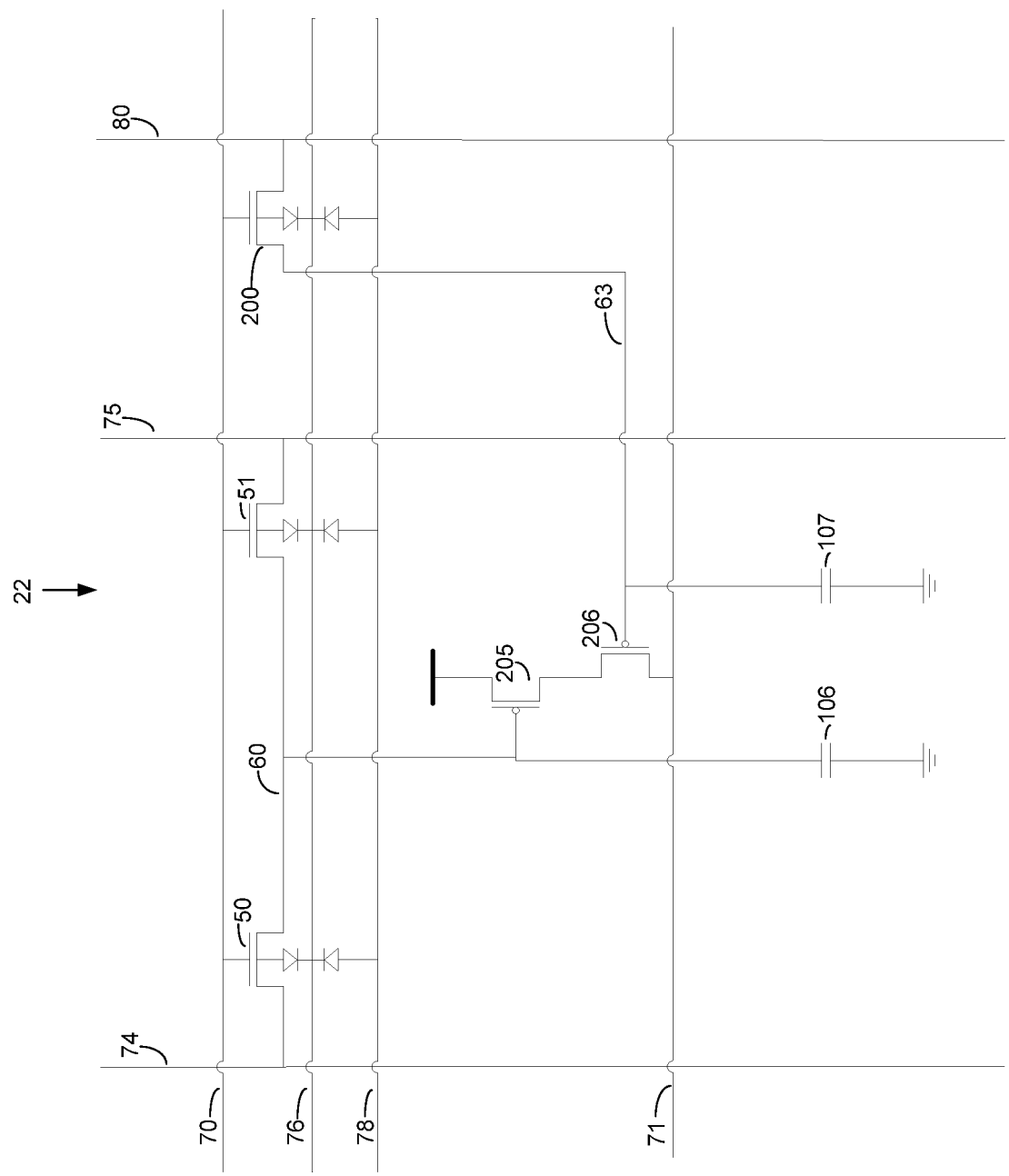
FIG. 47 is a schematic illustration of a floating body ternary content addressable memory cell with a wide fan OR match string and capacitors attached to the match and don't care nodes, according to another embodiment of the present invention.

FIG. 47 shows a TCAM cell 22 according to another embodiment of the present invention, which adds holding capacitors 106 and 107 to the TCAM cell 21 illustrated in FIG. 45. Preconditioning transistors for nodes 60 and 63 are not shown but can also be provided to improve preconditioning performance or to avoid potential disturb issues with the memory cells having electrically floating body transistors as exemplified in previous embodiments.

Figure 48:
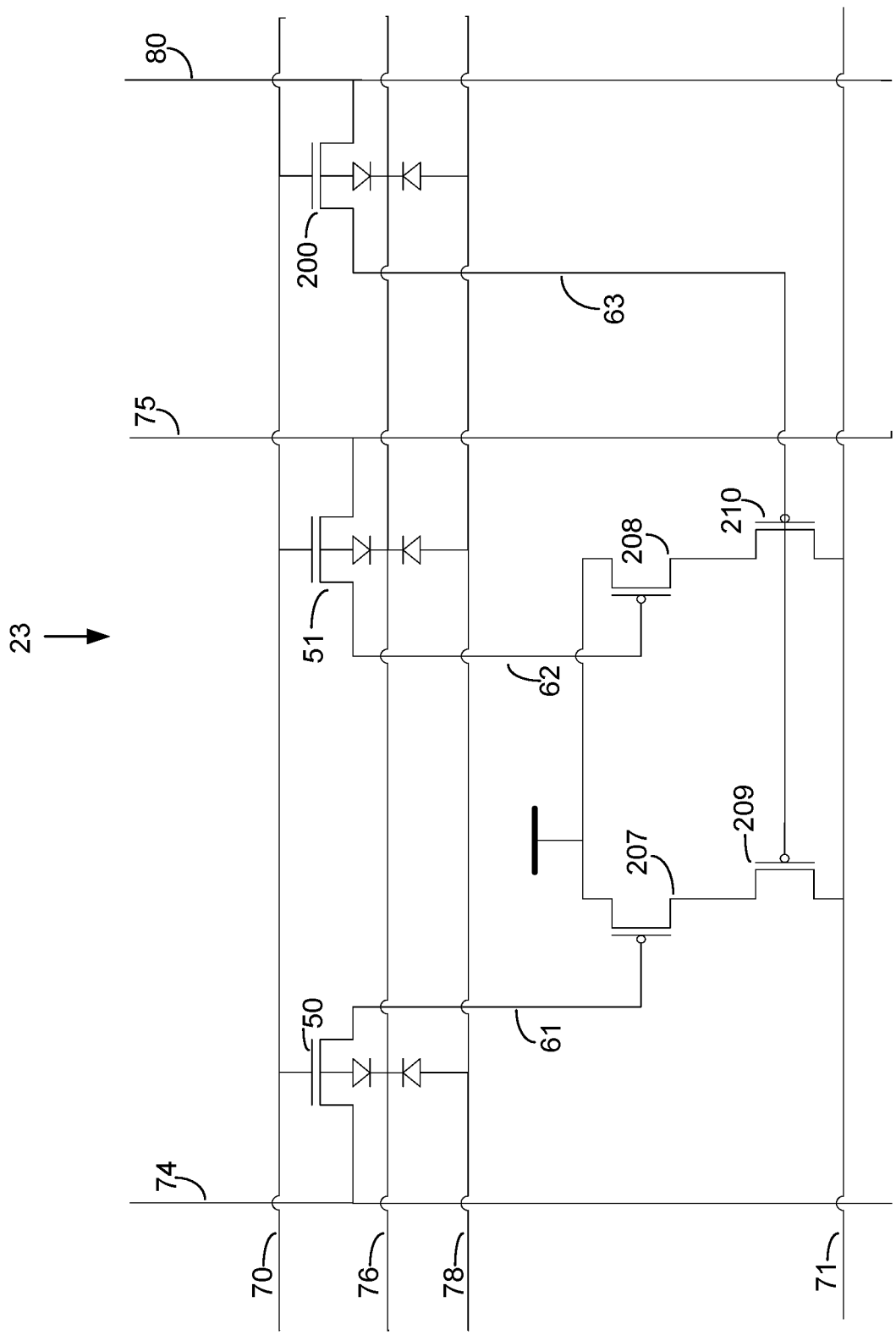
FIG. 48 is a schematic illustration of a floating body ternary content addressable memory cell with split match nodes and a wide fan OR match string, according to another embodiment of the present invention.
Figure 50:
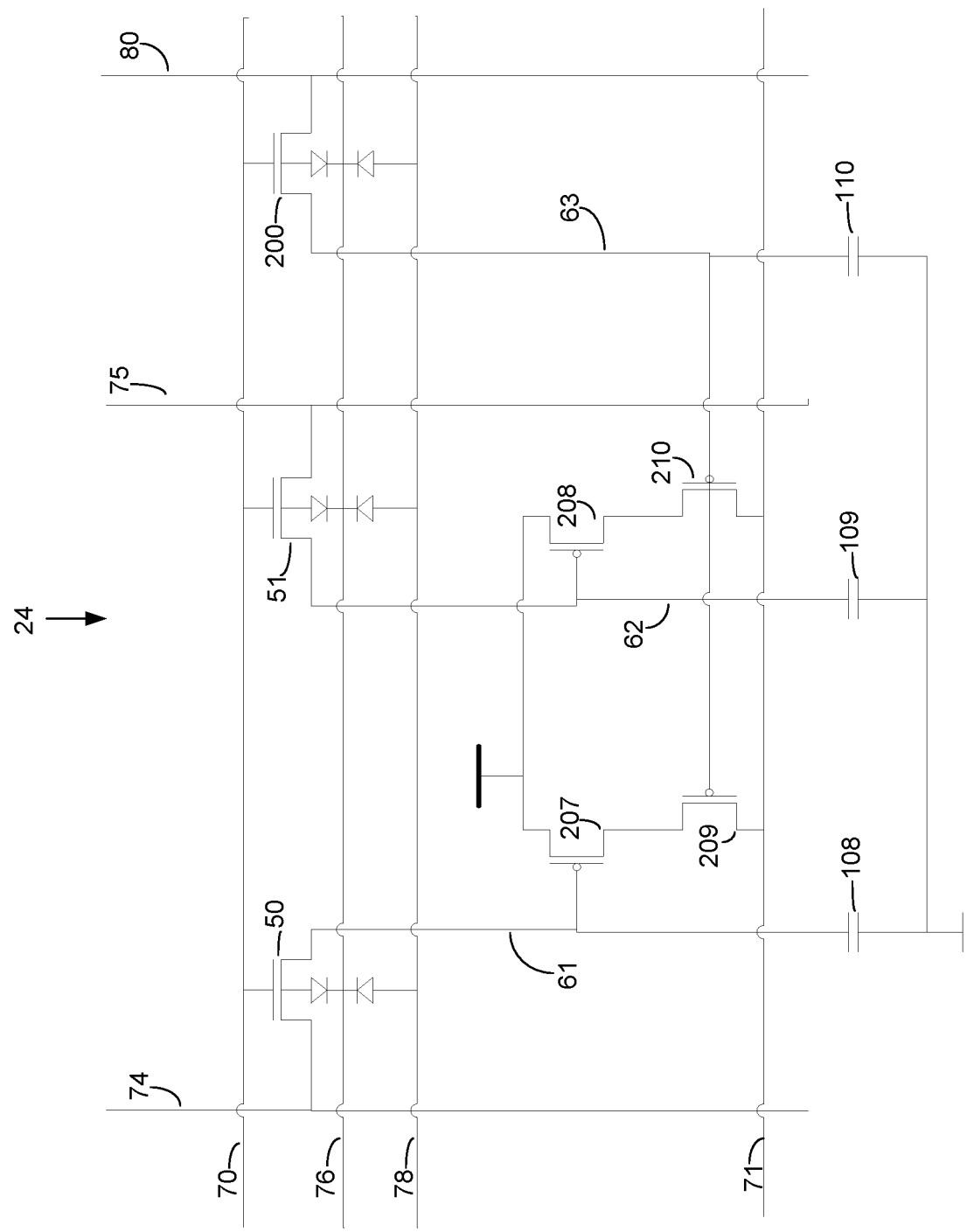
FIG. 50 is a schematic illustration of a floating body ternary content addressable memory cell with split match nodes, a wide fan OR match string and capacitors attached to each match node as well as the don't care node, according to another embodiment of the present invention.

FIG. 48 illustrates a TCAM cell 23 according to another embodiment of the present invention. TCAM cell 23 includes a split match node 61, 62 and a PMOS OR match string 71. During a search operation, the match nodes 61 and 62 are pre-charged to a high voltage such as 1.2V while the "don't care" node 63 is pre-charged to a low voltage such as 0V. Otherwise the TCAM cell 23 behaves in a similar manner to the memory cell 10 described in FIG. 31 with the addition of the "don't care" bit added as shown in FIG. 37. FIG. 49 illustrates a possible set of bias conditions that can be used to bias the TCAM cell 23. FIG. 50 shows a TCAM cell 24 according to another embodiment of the present invention, which combines the features of TCAM cell 22 and 23 with split match nodes 61, 62, OR Match line 71 and capacitors 108, 109, and 110 to store all potentially floating nodes. Preconditioning transistors can be used for nodes 61, 62 and 63 to improve preconditioning performance or to avoid disturbance of memory cells having floating body transistors, but are not shown.

Figure 51:
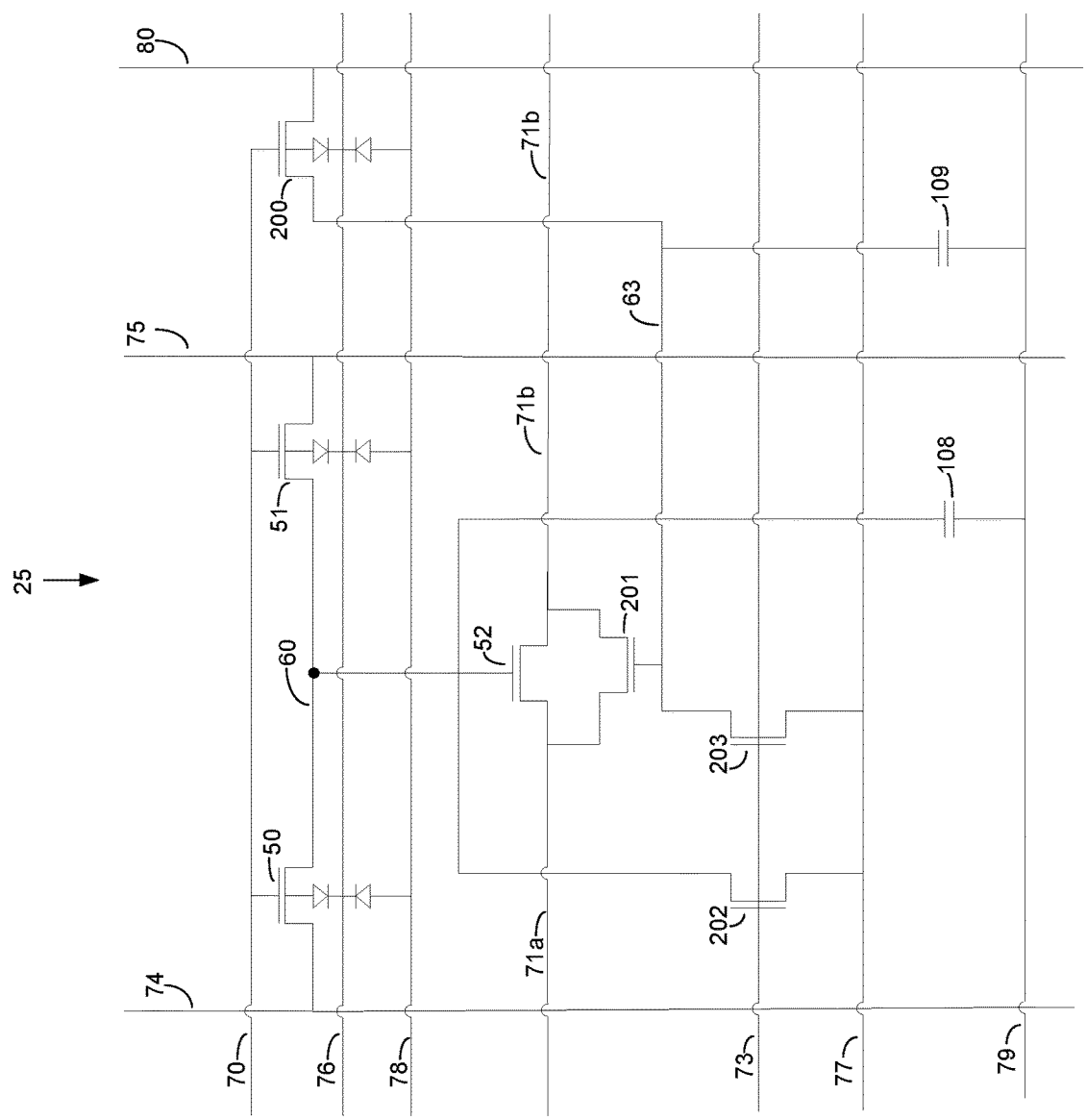
FIG. 51 is a schematic illustration of a floating body ternary content addressable memory cell with boost capacitors attached to the match and don't care nodes, according to another embodiment of the present invention. Precondition transistors are also attached to both match and don't care nodes.
Figure 52:
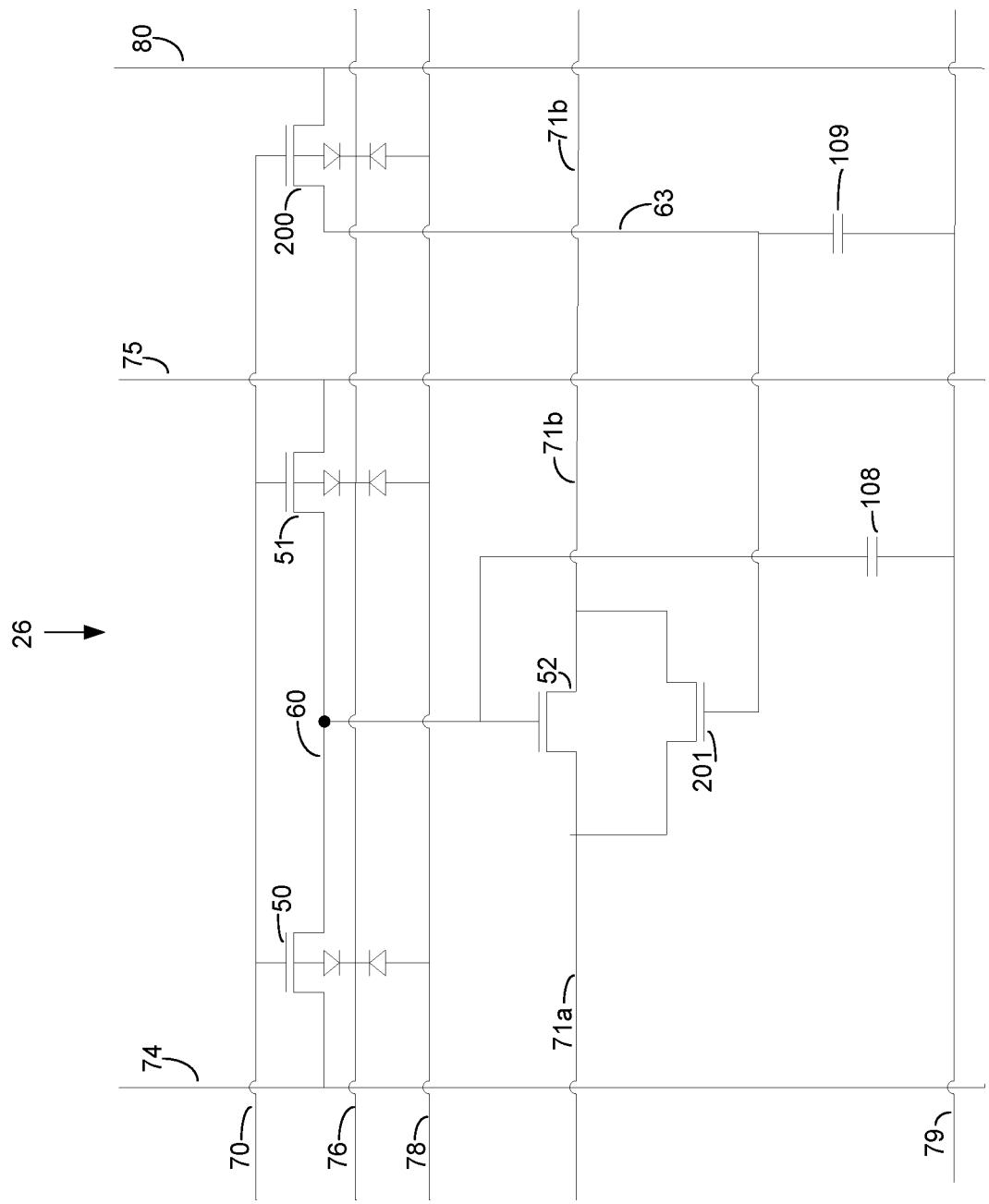
FIG. 52 is a schematic illustration of a floating body ternary content addressable memory cell with boost capacitors attached to the match and don't care nodes, according to another embodiment of the present invention.

FIG. 51 exemplifies how a TCAM cell can be used with the boost capacitor scheme explained in FIG. 34. Since match node 60 and "don't care" node 63 are independent nodes, each will require their own boost capacitors (108 and 109) to help improve the signal transmission from the search lines when their respective memory cells 50, 51 and 200 are in state "1". Preconditioning transistors 202 and 203 are also provided in case additional performance is required or memory cell disturb is a concern. These preconditioning transistors but can be removed if desired as shown in FIG. 52.

Figure 53:
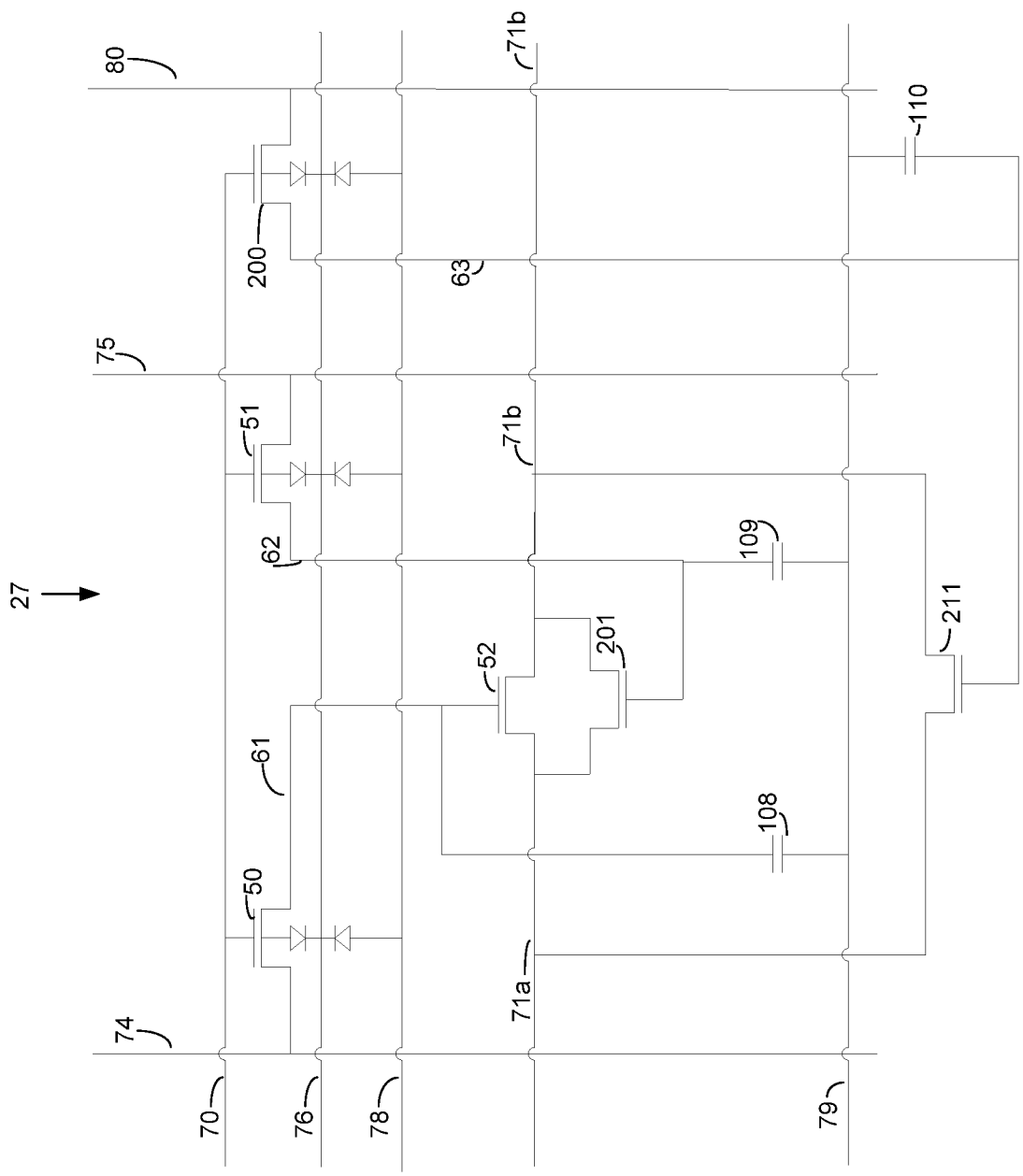
FIG. 53 is a schematic illustration of a floating body ternary content addressable memory cell with split matched nodes and boost capacitors attached to each match node as well as the don't care storage node, according to another embodiment of the present invention.

FIG. 53 illustrates a TCAM cell 27 according to another embodiment of the present invention, where the boost capacitor method is applied to a TCAM with a split match node. Boost capacitors 108 and 109 have been added. A single terminal 79 has been shown to drive these boost capacitors, however these could also be independent nodes. The behavior of the TCAM cell 27 is identical to the TCAM cell 20 described in FIG. 44 with the addition of the boost capacitors. Preconditioning transistors could also be added for nodes 61, 62 and 63 but are not shown here.

Figure 54:
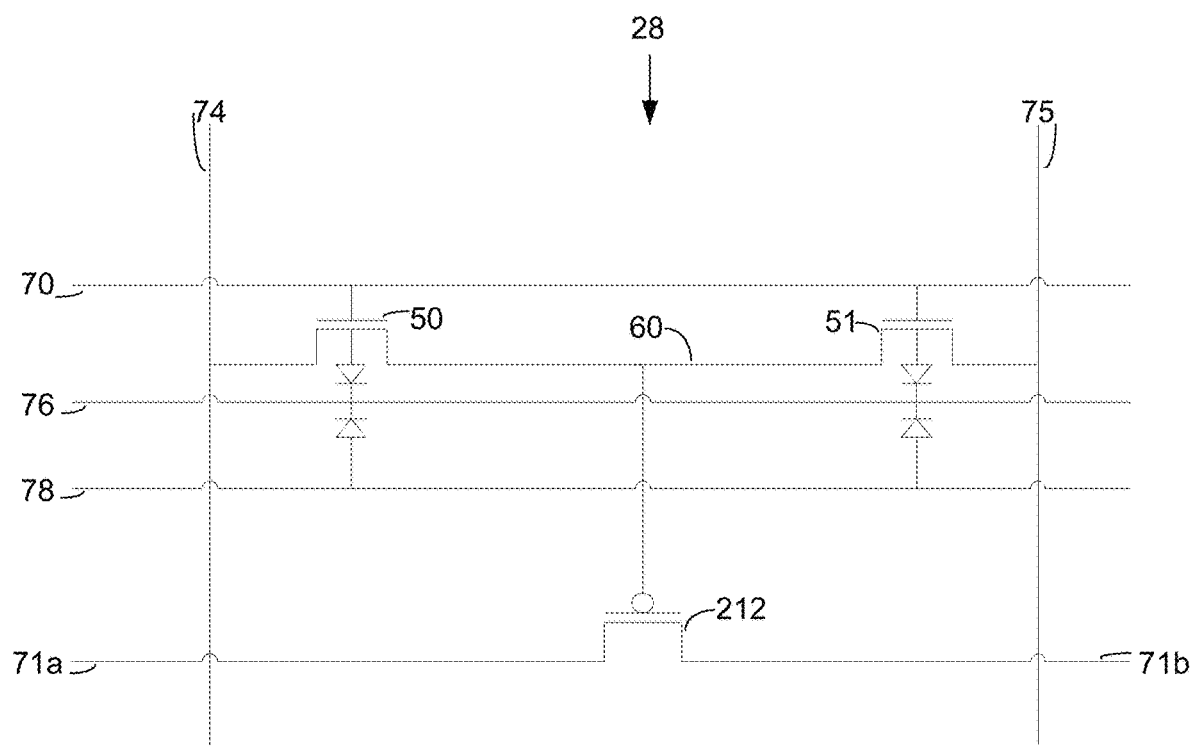
FIG. 54 is a schematic illustration of a floating body content addressable memory cell with a PMOS (p-type metal-oxide semiconductor) match string gate, according to another embodiment of the present invention.

FIG. 54 shows a CAM cell 28 according to another embodiment of the present invention, where a PMOS device 212 is used for the NAND match string. The behavior of the FB (floating body) CAM 28 requires an inversion of data in order to output the correct match status. For example, if the user or system would like to write a data "1" into this CAM bit (cell 28), logic will be provided to invert the data during writing so that the memory cell 50 will be at state "0" and memory cell 51 will be at state "1". By inverting the data being written, proper operation is assured due to the PMOS match transistor 212 being used. Now when the user or system applies search data of "1" to the CAM bit, a high potential such as 1.2V is received on SL terminal 74 and a low potential such as 0V is received on /SL terminal 75. Since memory cell 51 is at state "1", this cell will conduct and pass 0V to match node 60. This will cause PMOS match transistor 212 to correctly turn on, allowing node 71a to correctly pass to node 71b thereby indicating a match condition. If the user or system had applied data of "0" instead of "1" in the above example, a proper mismatch situation would result, since memory cell 51 which is at state "1" will allow /SL terminal 75 at 1.2V to pass onto match node 60. PMOS match transistor 212 will correctly turn off indicating a mismatch condition in the CAM comparison (match operation). Note that the resulting output on node 71b does not incur a threshold drop since the device being used is a PMOS device. FIG. 55 provides an exemplary set of possible bias conditions for the CAM cell 28.

Alternatively, instead of inverting the data being written to the CAM cell 28, the data applied during the search/comparison operation could be inverted instead. For example, if data "1" is written into CAM cell 28 and the data is not inverted during writing, the memory cell 50 is at state "1" and memory cell 51 is at state "0". When the user or system applies search data to the CAM bit, additional logic can be provided to invert the data being supplied by the user or system. For example, if the user or system applies a search data of "1", data can be inverted so that SL terminal 74 will be at 0V and /SL terminal 75 would be at 1.2V. Since memory cell 51 is at state "1" it will allow the potential at SL terminal 74 (0V) to pass onto match node 60 thereby correctly turning on PMOS match transistor 212. This will indicate a match condition allowing node 71a to properly conduct to node 71b. FIG. 56 summarizes the use of inverting the data input with the use of the CAM cell 28.

Those skilled in the art will appreciate that a precondition transistor and/or a holding capacitor may be used in conjunction with the embodiment illustrated in FIG. 54 but are not pictured here. The added capacitor or preconditioning transistor would be connected to node 60 similar to the embodiments shown in FIGS. 21-23.

Figure 57:
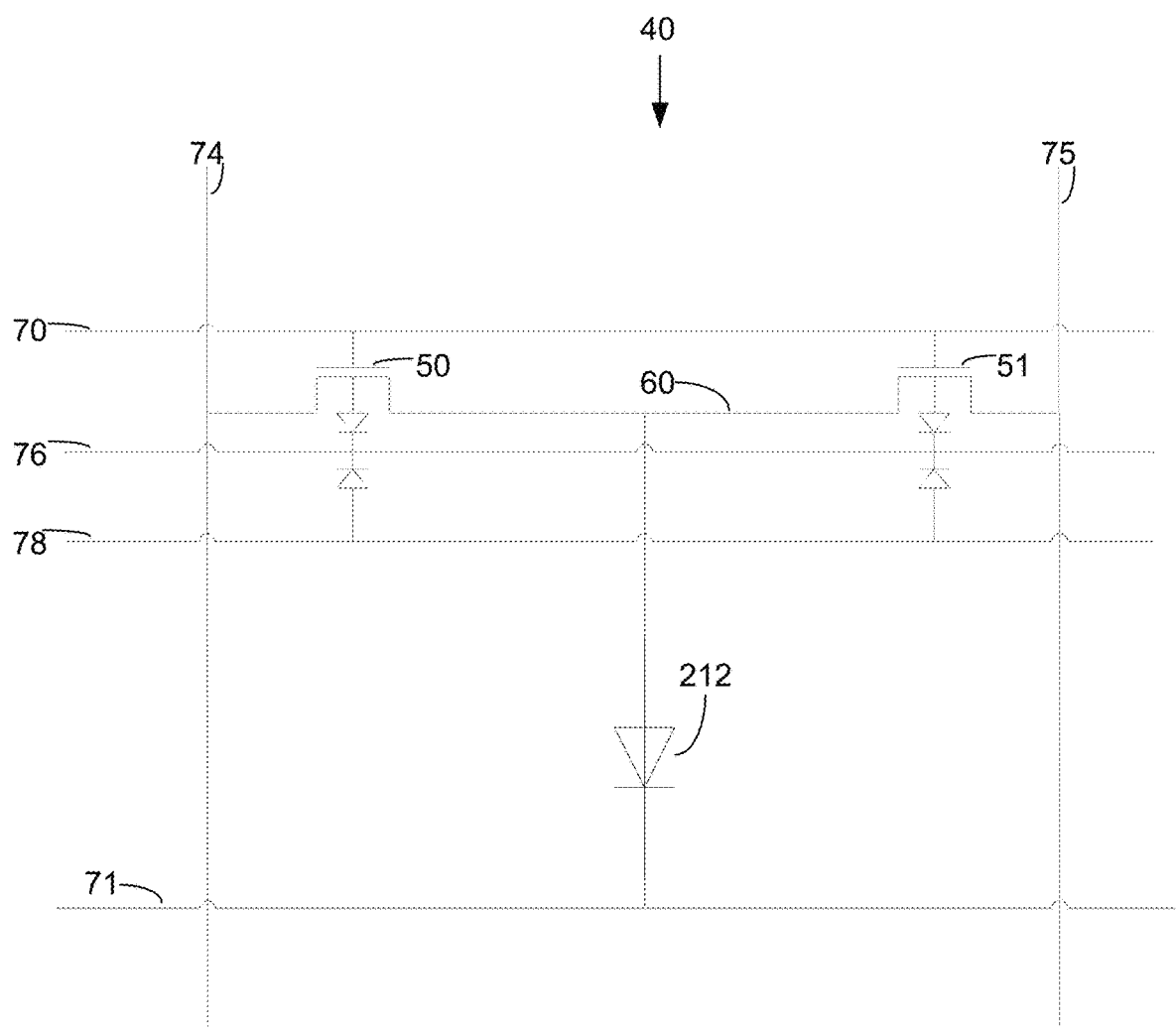
FIG. 57 is a schematic illustration of a floating body content addressable memory cell with a diode connected to the match node, according to another embodiment of the present invention.

FIG. 57 shows CAM cell 40 according to another embodiment of the present invention which utilizes an alternative method to determine the match status. A diode 212 is connected between the match node 60 and the match line 71. Match line 71 is initially held at ground. In a match condition the search line will be at a high state and the memory cell 50 or 51 connected to the search line at high potential will be previously set to state "1". In this case, the match node will be high and the diode will forward bias and conduct current. At the end of line 71, a current or voltage sensing block may be employed to measure the match status on line 71 and compare it against a reference current or voltage which should be proportional to the number of cells within a row. Because the current or voltage measured is proportional to the number of passing or failing bits/cells, it is possible with this embodiment to accurately determine the number of passing or failing bits/cells within this embodiment. For example, if current is measured at node 71 and 2 out of 8 bits are not matching, the current will be ⅖ or ¼ less than a match condition since 6 of the 8 bits/cells will be conducting normally. FIG. 58 provides a set of proposed bias conditions for this embodiment. These bias conditions are for exemplary purposes only are not in any way meant to limit the scope of this invention.

Figure 59:
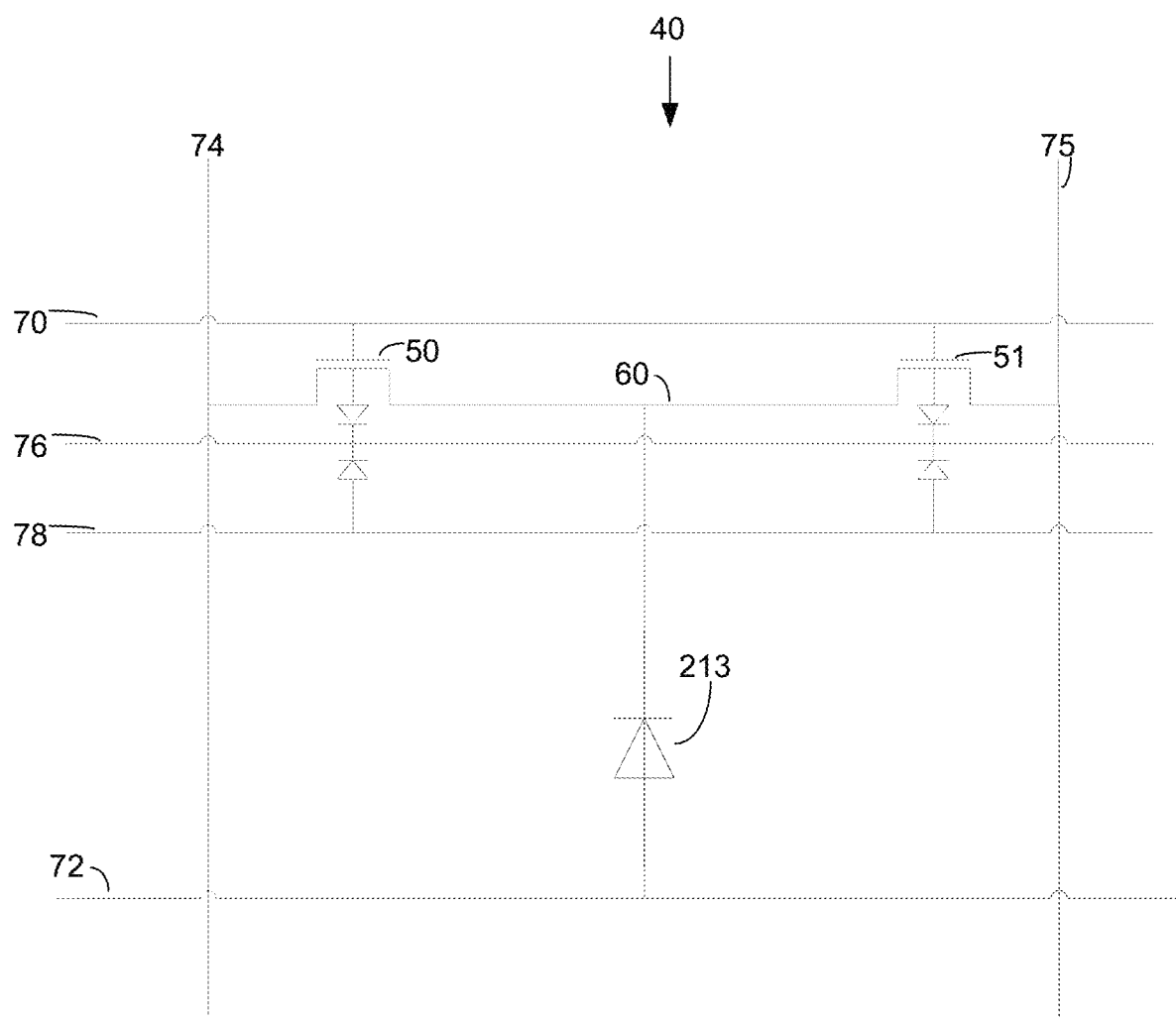
FIG. 59 is a schematic illustration of a floating body content addressable memory cell with a diode connected to the match node, according to another embodiment of the present invention.

Alternately the scheme can be changed by reversing the polarity of the diode 213 as shown in FIG. 59. In this case we would initially keep match line 72 to a high voltage such as 1.2V. In a match condition, node 60 will still go high, which will cut off current from node 72 to node 60. However in a mismatch situation, one of the search lines connected to memory cell 50 and previously set to state "1" is at low potential. This device would actively try to drive ground onto the match node 60. This would forward bias the diode from node 72 to 60 providing a current. A current sensing device placed on line 72 can thus detect when a mismatch has occurred (i.e., when current is detected from line 72) FIG. 60 provides a set of proposed bias conditions for this embodiment. These bias conditions are for exemplary purposes only are not in any way meant to limit the scope of this invention.

Figure 61:
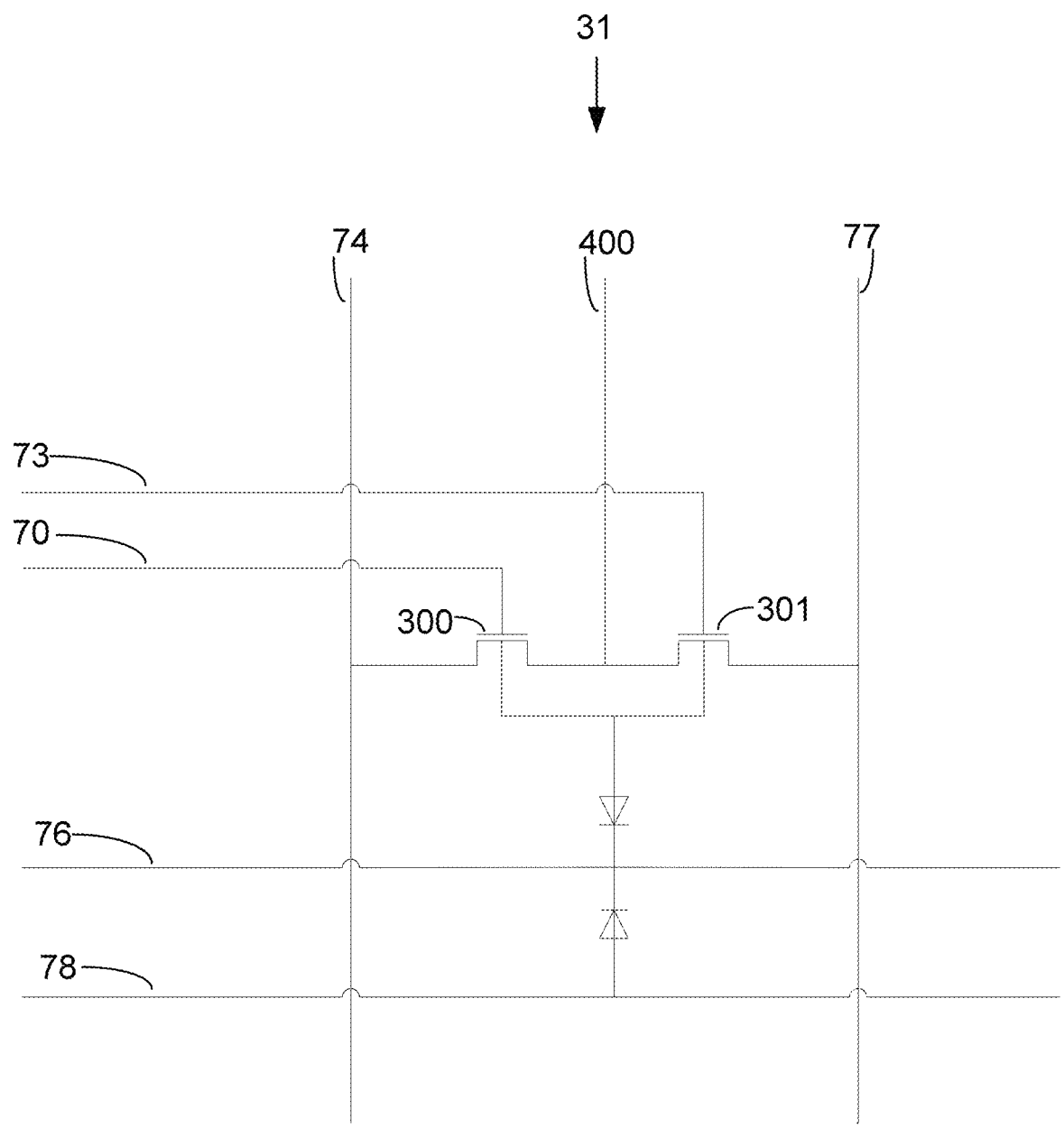
FIG. 61 is a schematic representation of a dual port floating body memory.

A dual port memory having electrically floating body transistor may be used in place of the memory cells 50 in the previous CAM cells described above. A dual port memory having electrically floating body has been described for example by Widjaja in U.S. Pat. No. 8,582,359, which is hereby incorporated herein, in its entirety, by reference thereto. A schematic representation of a dual port memory having electrically floating body is provided in FIG. 61. Word lines 70 and 73 are the gates of the dual port memory cell and enable devices 300 and 301 respectively. Devices 300 and 301 share the same floating node between them and have a shared output node 400. Search line 74 is coupled to output node 400 through device 300 which is enabled by terminal 70. Search line 77 is coupled to output node 400 through device 301 which is enabled by terminal 73. The operation of this memory cell is similar to that of the CAM or TCAM cells previously described using memory cells 50 having electrically floating body, however device 300 and 301 will share the same floating body and thus act as select gates for the dual port cell. Both 300 and 301 can access the floating body. Either device can write or read to the floating body which provides the dual port nature of this cell. For example, if we write state "1" through device 300, a read operation through device 301 will show us that it is also set to state "1". Conversely if we write a state "0" through device 301, a read through device 300 would show it set to state "0" as well. This dual ported cell differs from a conventional dual port SRAM cell in that there is a shared output node 400 which is unique to the dual port memory having electrically floating body. Typical dual port cells will have 4 bit lines. The dual port memory having electrically floating body has 3 bit lines due to node 400 being shared.

Figure 62:
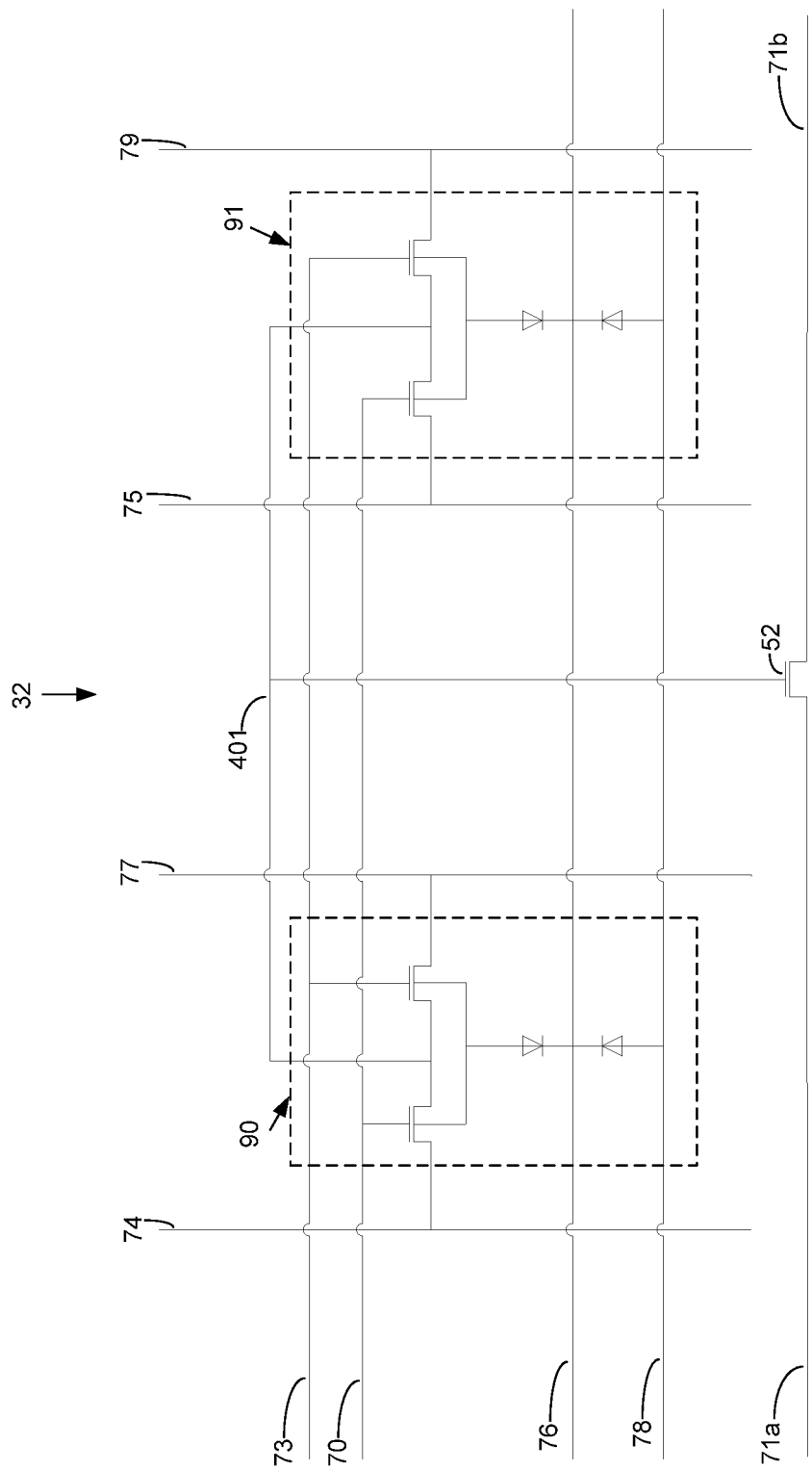
FIG. 62 is a schematic illustration showing how a dual port floating body memory cell can be used in a floating body content addressable memory.

The dual port memory cell having electrically floating body may be substituted into any of the previously mentioned CAM or TCAM cells as a replacement for the memory cell having a floating body. An example of its usage is illustrated in FIG. 62. Here the dual port memory cells 90 and 91 are connected in the same configuration as the CAM cell illustrated in FIG. 1. The dual port memory cells 90 and 91 have been substituted for the memory cells 50 and 51. Node 400 of each dual port memory cells are shorted together and attached to the gate of transistor 52 to create the match node 401. The user can now access the dual port memory cell 90 by either accessing gate 73 and search line 77 or gate 70 and search line 74, thus providing two port access for dual port memory cell 90. Conversely the user/system can also access the dual port memory cell 91 by either using word line 70 and search line 75 or using word line 73 and search line 79.

Figure 63:
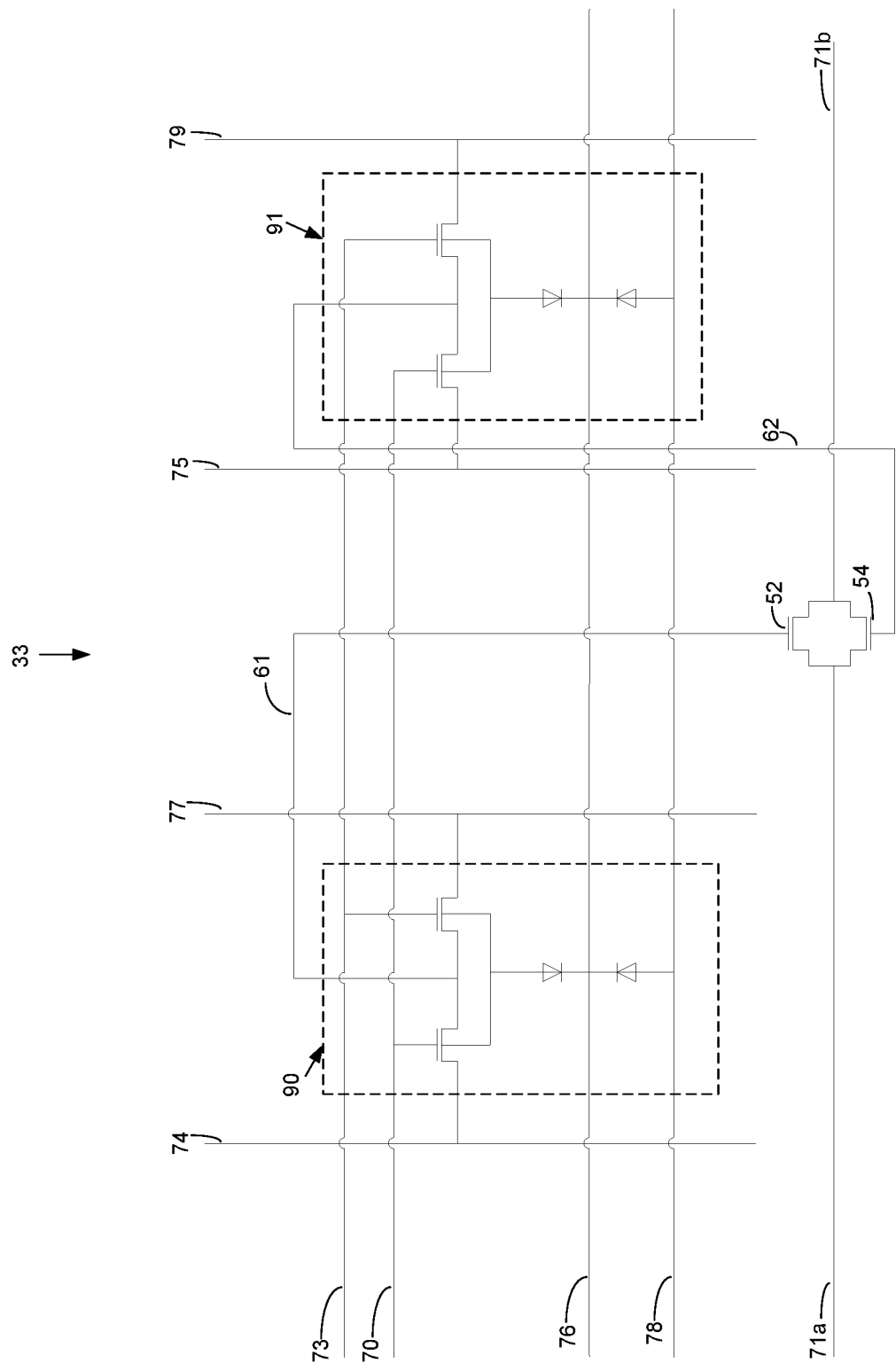
FIG. 63 is a schematic illustration of a dual ported floating body memory used in the split gate content addressable memory configuration according to an embodiment of the present invention. Note this can also be used as a ternary content addressable memory.

FIG. 63 further illustrates how the dual port memory cells 90 and 91 may be substituted for the memory cells 50 and 51 having electrically floating bodies. FIG. 63 illustrates a dual port CAM cell 33 having a split node. The operation of CAM cell 33 is similar to that of the CAM cell 6 previously shown in FIG. 24, but with two-port access. The CAM memory cell 33 may also be used as a Ternary Content Addressable Memory. Search lines 74 and 77 are connected to the dual port floating body memory cell 90 and both can be used to read or write to cell 91 in conjunction with their associated word lines 70 and 73. Search lines 75 and 79 are connected with the dual port floating memory cell 91 and both can be used to read or write to cell 91 in conjunction with their associated word lines 70 and 73. The output terminals 61, 62 of each of the dual port floating body memory cells are each connected to one of the match line NMOS devices 52 and 54 which are connected in a NAND type configuration. Other match string configurations can be used such as the previously mentioned OR type mentioned above, for example as shown in FIG. 28.

Figure 64:
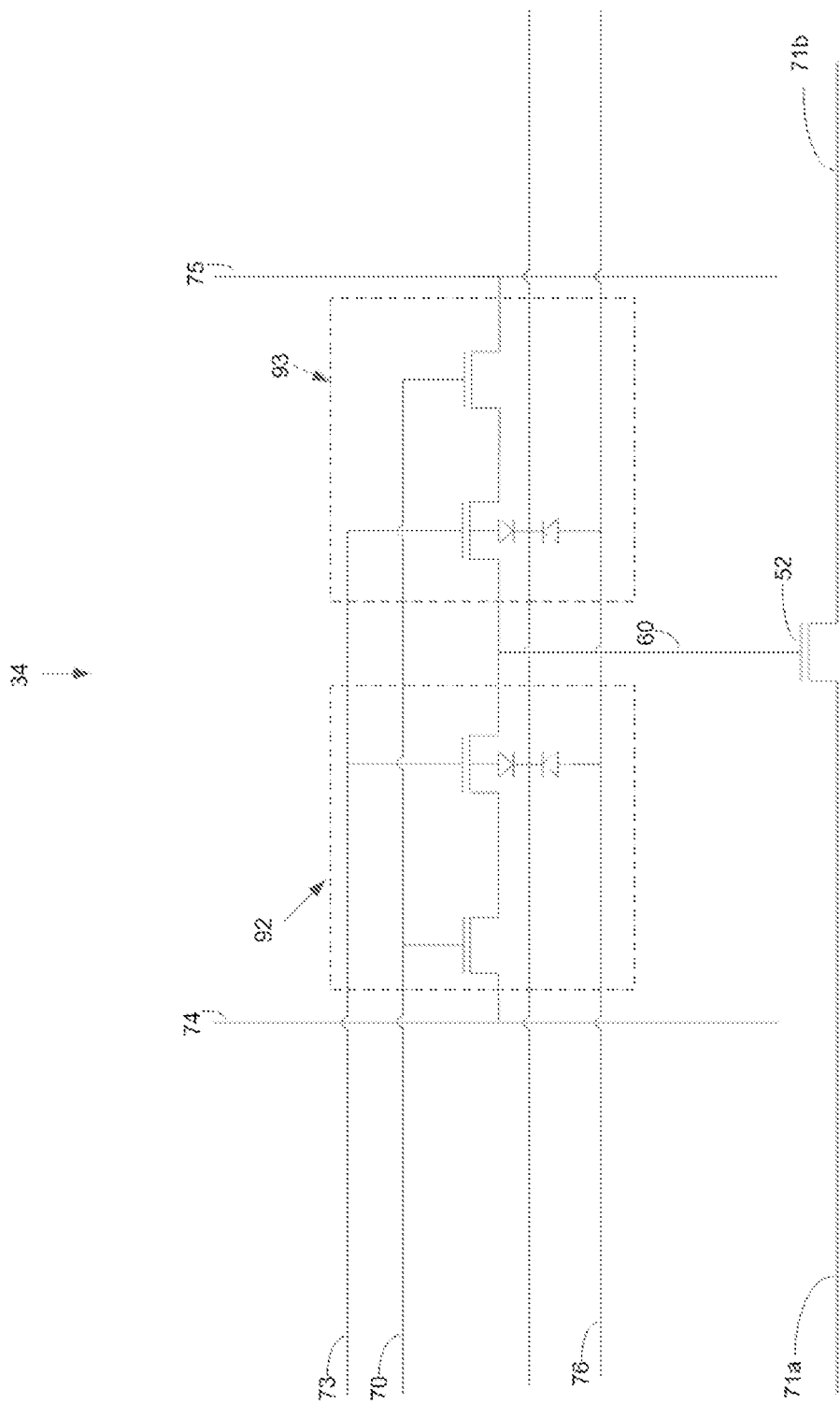
FIG. 64 is a schematic illustration showing the use of a two transistor floating body memory device configured as a floating body content addressable memory.

FIG. 64 further illustrates how multiple types of memory cells can be used in the invention described here and its many embodiments. A memory cell having electrically floating body comprising two transistors 92 and 93, for example as described by Widjaja et. al, in PCT/US13/26466, "Memory Cell Comprising First and Second Transistors and Methods of Operating", which is hereby incorporated herein, in its entirety, by reference thereto, is used in place of memory cells 50 and 51.

A memory cell having an electrically floating body in conjunction with other non-volatile memory such as Flash, Split Gate Flash, NOR Flash, RRAM, MRAM, for example as described in U.S. Pat. No. 7,760,548, Widjaja, "Semiconductor Memory Having Both Volatile and Non-Volatile Functionality and Method of Operating", US Patent Application Publication No. 2010/0034041, "Method of Operating Semiconductor Memory Device with Floating Body Transistor Using Silicon Controlled Rectifier Principle", U.S. Pat. No. 8,159,868, "Semiconductor Memory Having Both Volatile and Non-Volatile Functionality Including Resistance Change Material and Method of Operating", all of which are hereby incorporated herein, in their entireties, by reference thereto, may also be used in the embodiments mentioned above in order to add the ability to capture and recall memory states in a non-volatile manner.

Figure 65A:
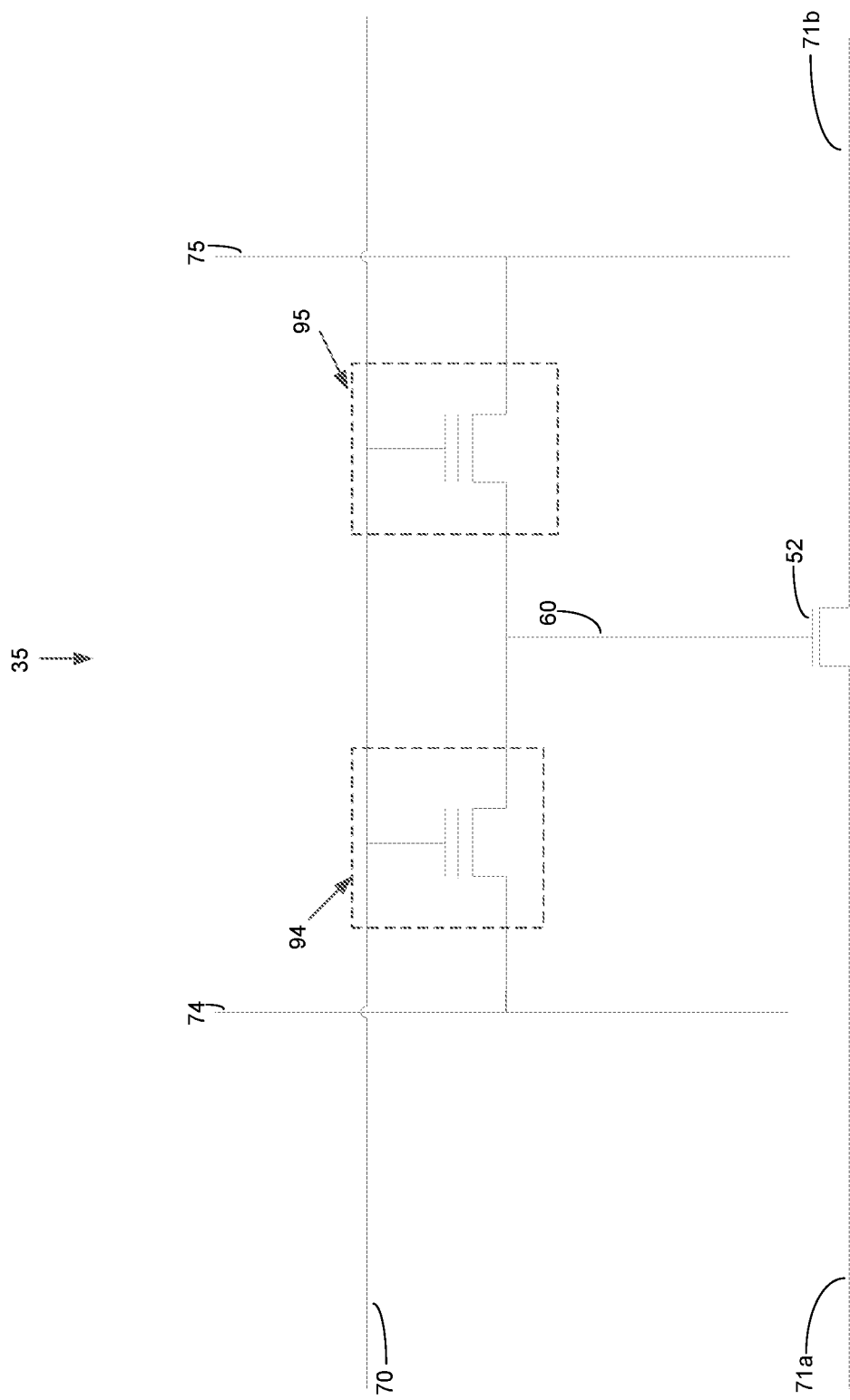
FIG. 65A is a schematic illustration showing an example of how a flash memory may be used in substitution of the floating body memory cells through all the embodiments of the present invention.
Figure 65B:
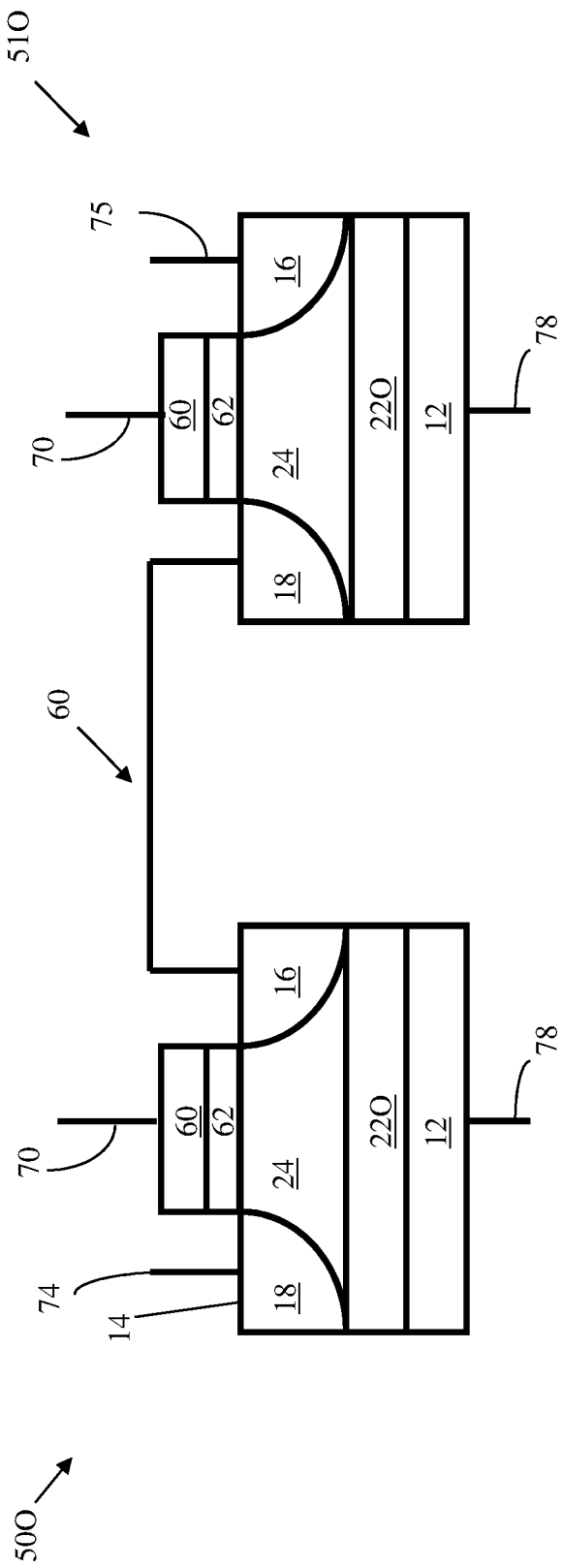
FIG. 65B is a schematic cross-sectional view showing an example of how an electrically floating body DRAM may be used in substitution of the floating body memory cells through all the embodiments of the present invention.

This invention and the embodiments within extend beyond the use of Floating Body Memory Cells, Floating Body Memory Cells in conjunction with Non-Volatile Memory Cells, and Dual Port Floating Body Memory cells. Memory cells such as SOI Floating Body RAM (ZRAM), Floating Gate, NAND Flash, RRAM, CBRAM, EPROM, EEPROM, SONOS, etc. can also be used to substitute for the memory cells described in the previous embodiments. FIG. 65A illustrates how Flash memory cells 94, 95 may be used in to substitute for the memory cells 50 and 51 in the FIG. 15, while FIG. 65B illustrates a cross-sectional view of a CAM cell comprising electrically floating body DRAM in silicon-on-insulator (SOI) cells 500 and 510 connected in series to each other to a common node 60, fabricated on a SOI substrate 12, comprising a buried insulator layer 220 (see for example "The Multistable Charge-Controlled Memory Effect in SOI Transistors at Low Temperatures", Tack et al., pp. 1373-1382, IEEE Transactions on Electron Devices, vol. 37, May 1990 ("Tack"), "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002, all of which are hereby incorporated herein, in their entireties, by reference thereto).

Figure 66:
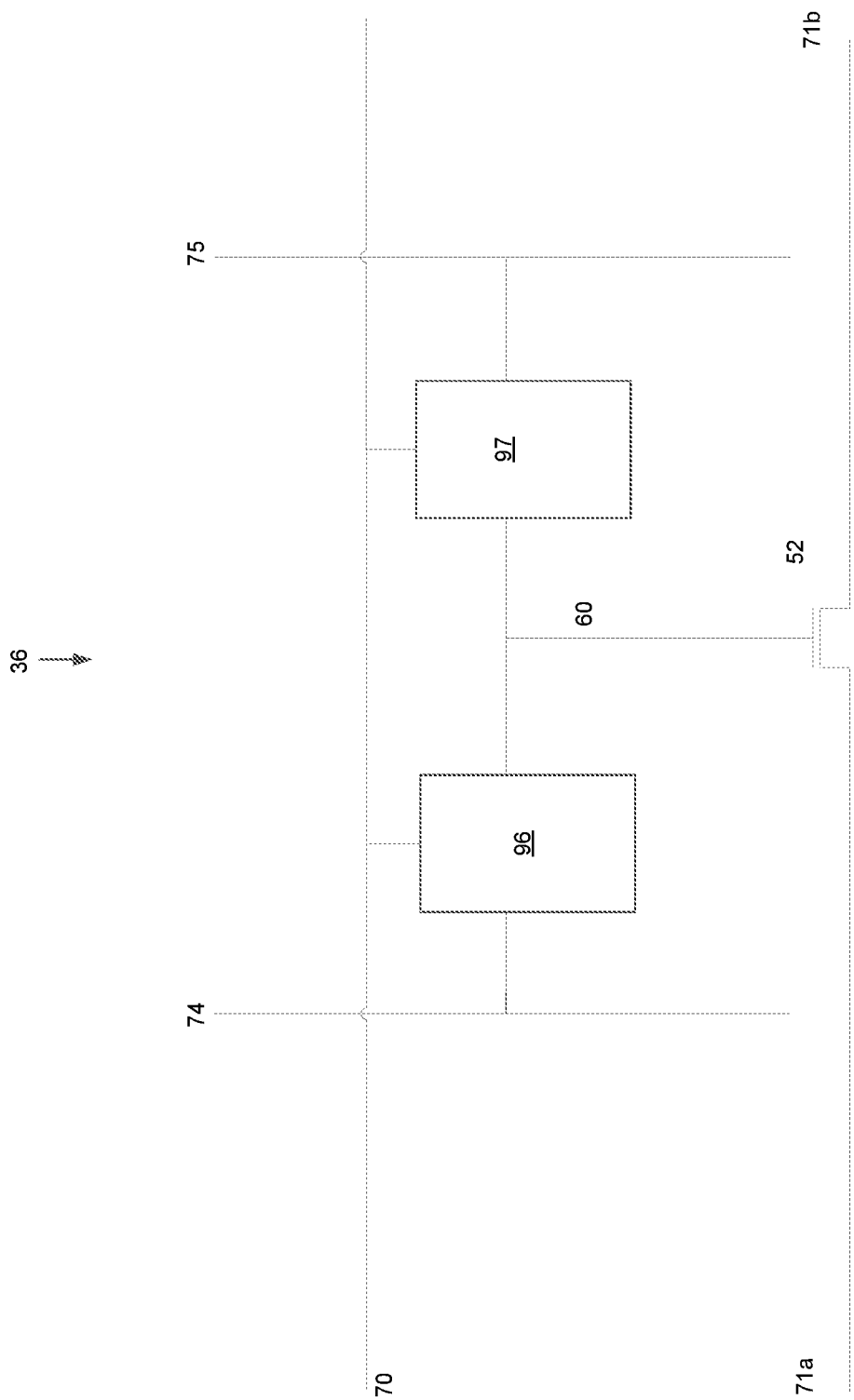
FIG. 66 is a block diagram showing an example of how other various memory cells can be used in replacement of the floating body memory cell for the embodiments of the present invention.

FIG. 66 provides an exemplary generalization for how other non-volatile memory cell technologies may be employed in the embodiments described in this invention. Memory cells having electrically floating body may be replaced by any non-volatile memory cells 96 and 97 in all of the embodiments provided throughout this invention. As illustrated in FIG. 66, the figures shown throughout this invention are meant to serve in an exemplary manner for how this invention is to be applied and in no way meant to imply a limitation in the scope of this invention.

Figure 67A:
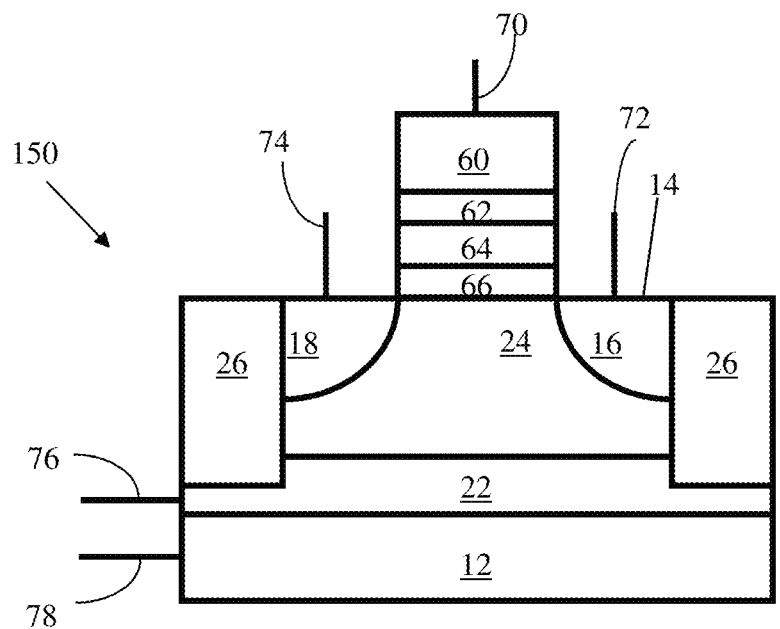
FIG. 67A is a schematic, cross-sectional illustration of a memory cell according to an embodiment of the present invention.

FIG. 67A is a schematic illustration of a content addressable memory cell ("CAM" cell) 150 according to an embodiment of the present invention. The CAM cell 150 is a non-volatile floating gate transistor or a non-volatile charge trapping flash memory transistor. The CAM cell 150 includes a substrate 12 of a first conductivity type such as p-type, for example. Substrate 12 is typically made of silicon, but may comprise, for example, germanium, silicon germanium, gallium arsenide, carbon nanotubes, and/or other semiconductor materials. In some embodiments of the invention, substrate 12 can be the bulk material of the semiconductor wafer. In another embodiment shown in FIG. 67B, substrate 12A of a first conductivity type (for example, p-type) can be a well of the first conductivity type embedded in a well 29 of the second conductivity type, such as n-type. The well 29 in turn could be another well inside substrate 12B of the first conductivity type (for example, p-type). In another embodiment, well 12A can be embedded inside the bulk of the semiconductor wafer of the second conductivity type (for example, n-type). These arrangements allow for segmentation of the substrate terminal, which is connected to region 12A. To simplify the description, the substrate 12 will usually be drawn as the semiconductor bulk material as it is in FIG. 67A.

CAM cell 150 also comprises a buried layer region 22 of a second conductivity type, such as n-type, for example; a floating body region 24 of the first conductivity type, such as p-type, for example; and source/drain regions 16 and 18 of the second conductivity type, such as n-type, for example.

Buried layer 22 may be formed by an ion implantation process on the material of substrate 12. Alternatively, buried layer 22 can be grown epitaxially on top of substrate 12 or formed through a solid state diffusion process.

The floating body region 24 of the first conductivity type is bounded on top by surface 14, source line region 16, drain region 18, and insulating layer(s) 62, on the sides by insulating layer 26, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

A source line region 16 having a second conductivity type, such as n-type, for example, is provided in floating body region 24, so as to bound a portion of the top of the floating body region in a manner discussed above, and is exposed at surface 14. Source line region 16 may be formed by an implantation process on the material making up substrate 12, according to any implantation process known and typically used in the art. Alternatively, a solid state diffusion or a selective epitaxial growth process could be used to form source line region 16.

A bit line region 18, also referred to as drain region 18, having a second conductivity type, such as n-type, for example, is also provided in floating body region 24, so as to bound a portion of the top of the floating body region in a manner discussed above, and is exposed at cell surface 14. Bit line region 18 may be formed by an implantation process on the material making up substrate 12, according to any implantation process known and typically used in the art. Alternatively, a solid state diffusion or a selective epitaxial growth process could be used to form bit line region 18.

A gate stack is positioned in between the source line region 16 and the drain region 18, above the floating body region 24. The control gate 60 is positioned above floating gate or charge trapping layer 64 and insulated therefrom by insulating layer 62 such that floating gate 64 is positioned between insulating layer 62 and insulating layer 66. Control gate 60 is capacitively coupled to floating gate 64. Control gate 60 is typically made of polysilicon material or metal gate electrode, such as tungsten, tantalum, titanium and/or their nitrides. Insulating layer 62 and insulating layer 66 may be made of silicon oxide and/or other dielectric materials, including high-K dielectric materials, such as, but not limited to, tantalum peroxide, titanium oxide, zirconium oxide, hafnium oxide, and/or aluminum oxide. The relationship between the floating gate layer 64 and control gate 60 is similar to that of a non-volatile stacked gate floating gate/trapping layer memory cell. The floating gate 64 functions to store non-volatile memory data. The floating gate 64 can be replaced with a charge trapping layer such as silicon nitride, quantum dots, and/or nanocrystals. The control gate 60 is used for memory cell selection.

Figure 67B:
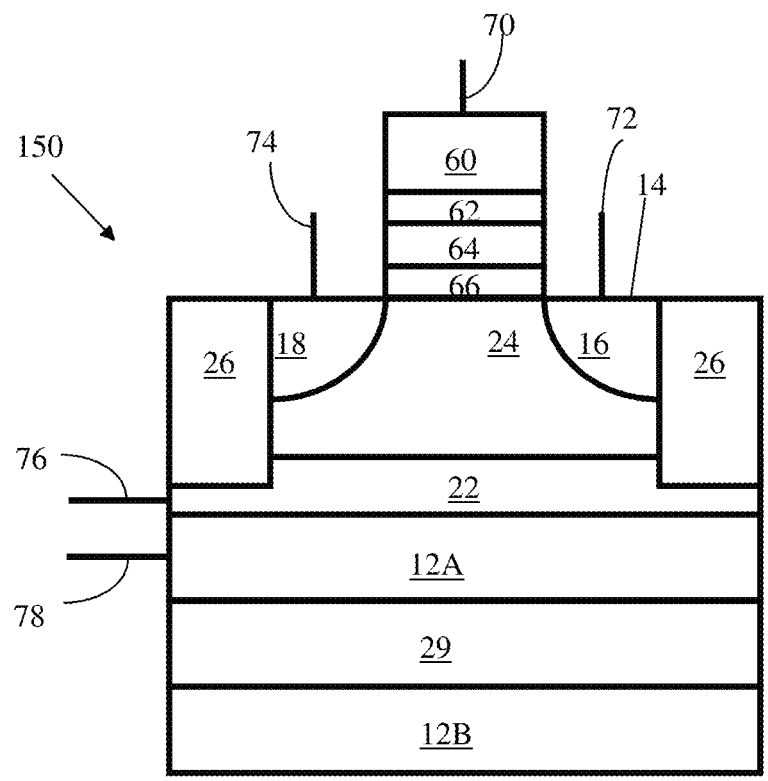
FIG. 67B is a schematic, cross-sectional illustration of a memory cell according to another embodiment of the present invention.
Figure 67C:
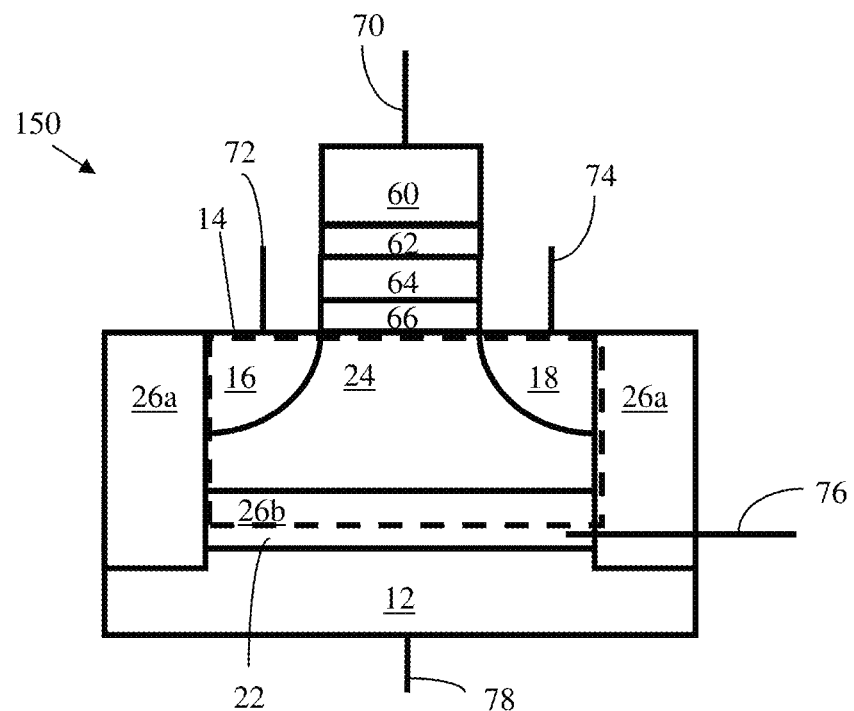
FIG. 67C is a schematic, cross-sectional illustration of a memory cell according to another embodiment of the present invention.
Figure 67D:
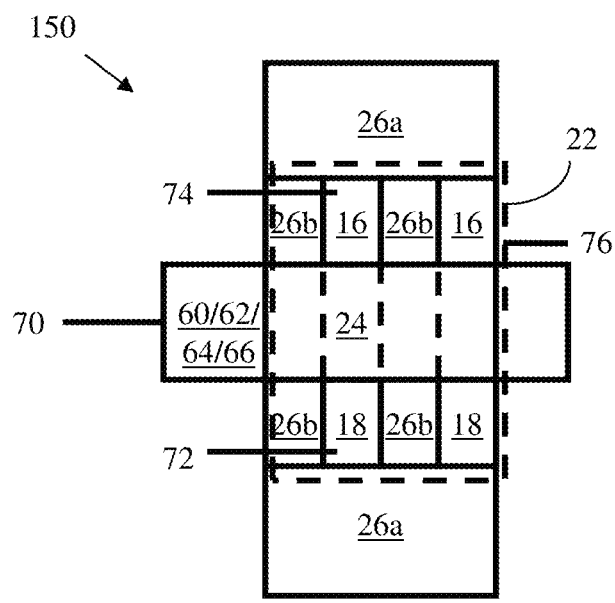
FIG. 67D is a schematic, top-view illustration of the memory cell shown in FIG. 67C.

Insulating layers 26 (like, for example, shallow trench isolation (STI)), may be made of silicon oxide, for example, though other insulating materials may be used. Insulating layers 26 insulate CAM cell 150 from adjacent CAM cells 150. The bottom of insulating layer 26 may reside inside the buried layer 22 allowing buried layer 22 to be continuous as shown in FIGS. 67A and 67B. Alternatively, the bottom of insulating layer 26a may reside below the buried layer 22 as shown in both FIGS. 67C and 67D. This requires a shallower insulating layer 26b, which isolates the floating body region 24, but allows the buried layer 22 to be continuous in the perpendicular direction of the cross-sectional view shown in FIG. 67C. For simplicity, only memory cell 150 with continuous buried layer 22 in all directions will be shown from hereon. These variations are attributed to the different architecture of CAM cell arrays, and the details of embodiments shall be explained later on.

CAM Cell 150 includes several terminals: word line (WL) terminal 70 electrically connected to control gate 60, bit line (BL) terminal 74 electrically connected to bit line region 18, source line (SL) terminal 72 electrically connected to source line region 16, buried well (BW) terminal 76 electrically connected to buried layer 22, and substrate terminal 78 electrically connected to the substrate 12. Alternatively, the SL terminal 72 may be electrically connected to region 18 and BL terminal 74 may be electrically connected to region 16.

Figure 68A:
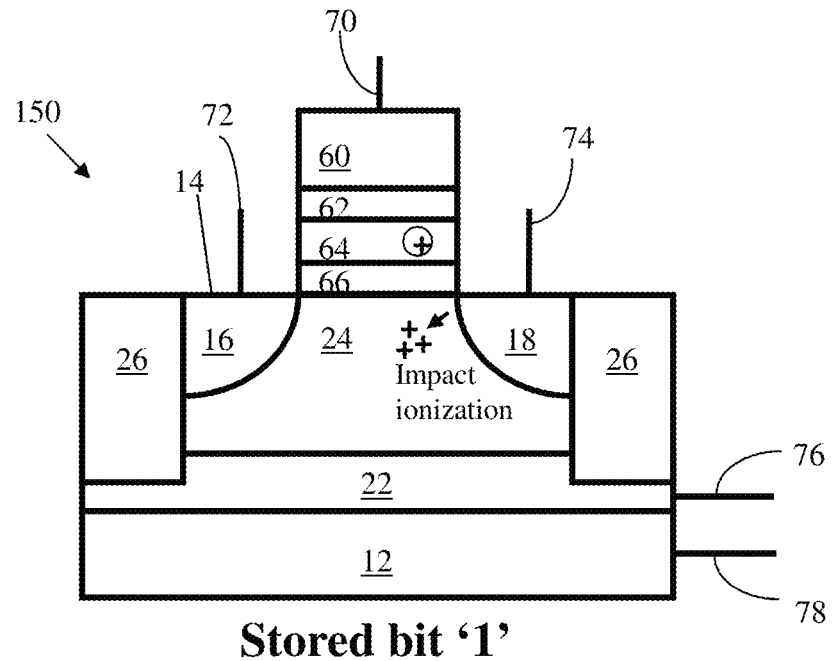
FIGS. 68A and 68B illustrate stored charges of floating gate transistor for stored bit '1' and '0', respectively, according to an embodiment of the present invention.
Figure 68B:
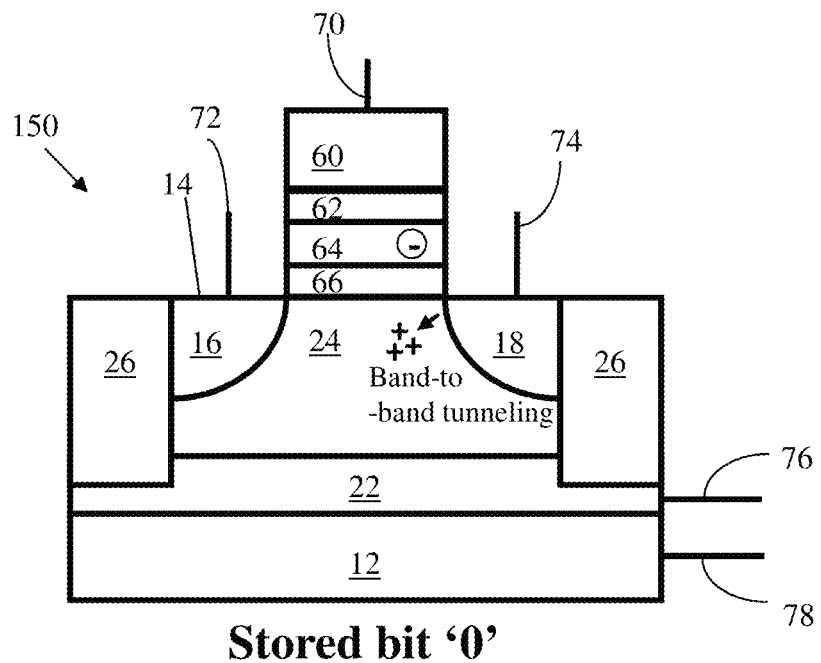
Figure 69A:
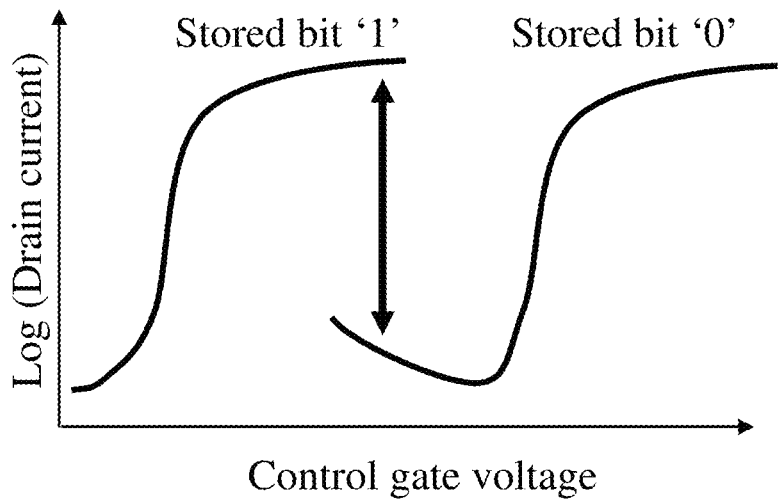
FIG. 69A and FIG. 69B illustrate resultant current-voltage characteristics of the floating gate transistor of FIGS. 68A-68B for stored bit '1' and '0'.
Figure 69B:
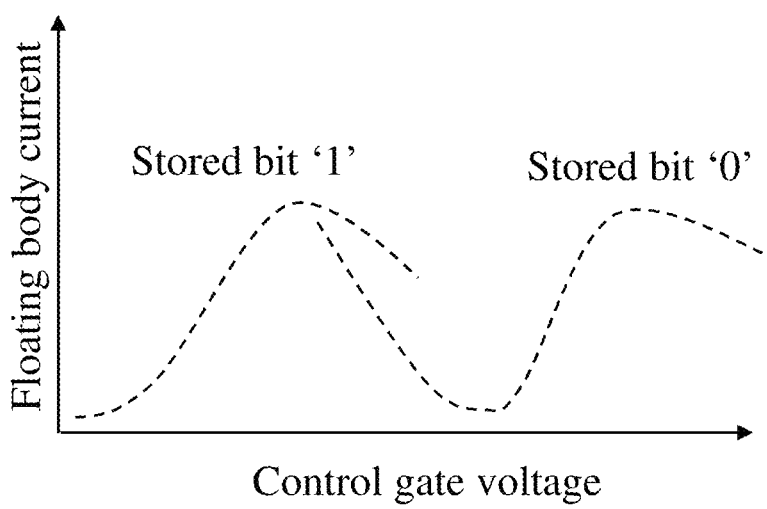

The data storage operation of the CAM cell follows that of a floating gate memory cell. FIGS. 68A and 68B illustrate stored charges of floating gate transistor for stored bit '1' and '0', respectively. FIGS. 69A and 69B illustrate the resultant current-voltage characteristics of floating gate transistor for stored bit '1' and '0', where FIG. 69A illustrates the drain current-control gate voltage characteristics and FIG. 69B illustrates the floating body current-control gate voltage characteristics. For an n-channel floating gate transistor, positive charges are stored in the floating gate at stored bit '1', resulting in low threshold voltage. Conversely, negative charges are stored in the floating gate at stored bit '0', resulting in high threshold voltage. To identify the stored bits, zero voltage is applied to the source 16, the bit line read voltage is applied to the drain 18, and the word line read voltage is applied to the control gate 60. The word line read voltage is selected in between the threshold voltage of stored bit '0' and the threshold voltage of stored bit '1'. Therefore, the drain current does not flow at the stored bit '0' and the drain current flow at the stored bit '1' as shown in FIG. 69A. In a floating gate memory cell operation, the drain current (flowing from the drain region 18 to the source line region 16) is used to determine the state of the memory cell, i.e. the stored charge in the floating gate 66. For the CAM data search/match/comparison operation, the floating body current (or in another embodiment, the buried n-well current, which is an amplified floating body current) will be used instead. When the bit line read voltage is high enough to trigger impact ionization or band-to-band tunneling, the hole current in the floating body 24 can be monitored at both the stored bit '0' and the stored bit '1', as shown in FIG. 69B. For CAM cell 150 with stored bit '1', the carrier under a high electric field causes impact ionization near the drain junction, and generates electron-hole pairs. The generated electrons are collected as drain current, but the generated holes are swept toward the floating body 24, which is often referred as substrate current in a non-floating body transistor. At the stored bit '0', although no inverted channel is formed due to a negative energy band bending of the drain 18 and floating body 24 in the gate-to-drain overlap region, the band-to-band tunneling generates holes in the floating body 24. The CAM data searching presented in this invention relies on the aforementioned mechanisms.

Figure 70:
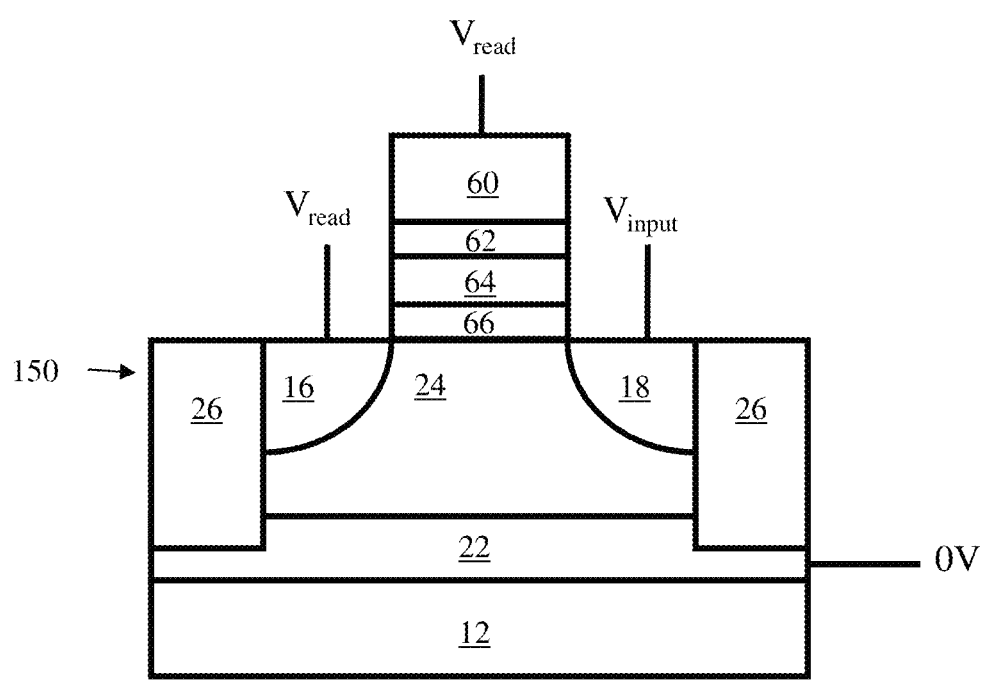
FIG. 70 schematically illustrates a read or search operation performed on a memory array according to an embodiment of the present invention.

FIG. 70 illustrates a comparison operation of CAM cell 150. The buried layer 22 is grounded, the same read voltage $V_{read}$ is applied to the source 16 and the control gate 60, and the input voltage $V_{input}$ is applied to the drain, where $V_{input}$ represents the input/search data to be compared with the data stored in the CAM cell 150. As mentioned earlier, the read voltage $V_{read}$ is in between the threshold voltage of stored bit '0' and the threshold voltage of stored bit '1'. The input voltage $V_{input}$ is zero for search bit '0', and the input voltage $V_{input}$ is the same or higher than the read voltage $V_{read}$.

In at least one embodiment for the cell having symmetric source/drain design, the search input voltage $V_{input}$ should be higher than the read voltage $V_{read}$. In at least one embodiment, the bias conditions for data comparison for CAM cell are: +1.2V is applied to control gate 60, +1.2V is applied to the source 16, 0V is applied to the buried layer, and 0V for search bit '0' or +1.8V for search bit '1' is applied to the drain. In other embodiments, different voltages may be applied to the various terminals of memory cell 150 and the exemplary voltages described are not limiting. FIGS. 71A-71D illustrate the set of possible stored bits and search bits, which are also summarized in FIG. 71E.

Figure 71A:
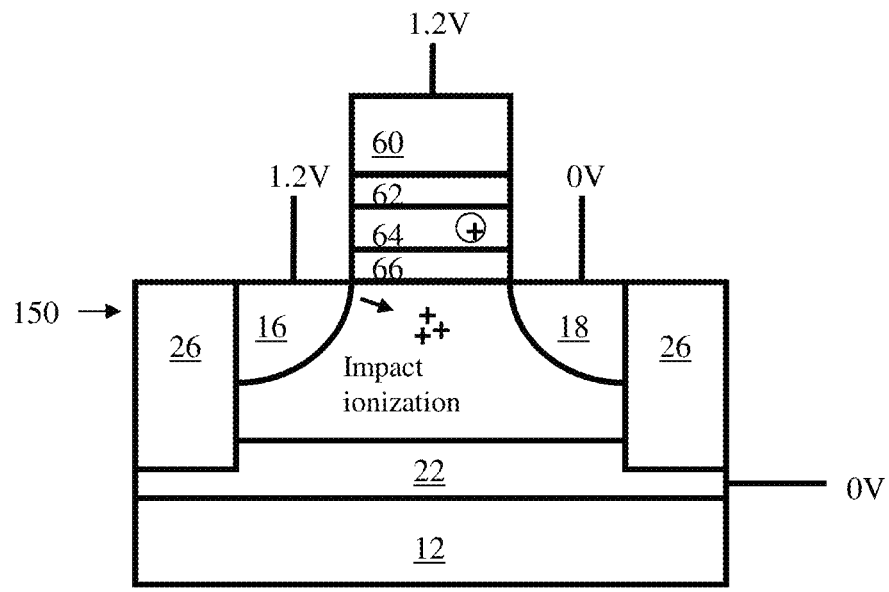
FIG. 71A schematically illustrates a mismatch condition, where the stored data is '1' and the input data is '0', according to an embodiment of the present invention.

At stored bit '1' and input bit '0' shown in FIG. 71A, an inversion channel is formed and the electrons flow from the drain 18 to the source 16. As a result of the electron flow and the high electric field due to source-to-drain voltage of +1.2V, impact ionization occurs, resulting in floating body 24 hole current.

Figure 71B:
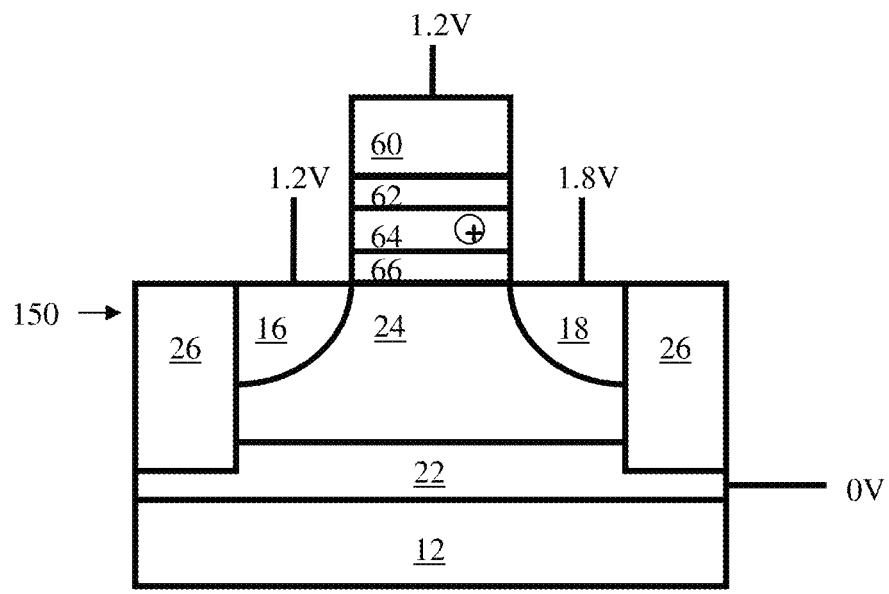
FIG. 71B schematically illustrates a matching condition, where the stored data is '1' and the input data is '1', according to an embodiment of the present invention.

At stored bit '1' and input bit '1' shown in FIG. 71B, an inversion channel is formed and electrons flow from the source 16 to the drain 18, but the drain-to-source voltage of 0.6V is insufficient to result in impact ionization.

Figure 71C:
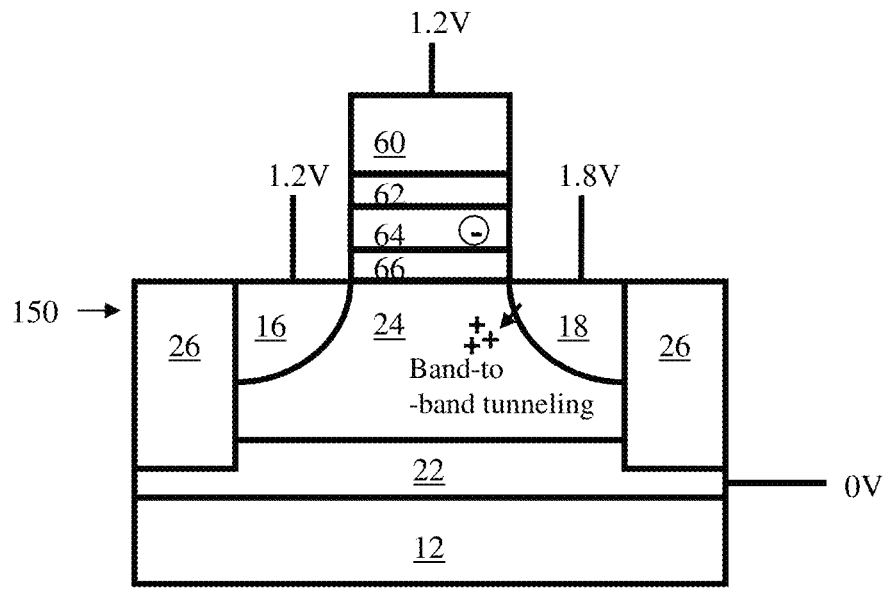
FIG. 71C schematically illustrates a mismatch condition, where the stored data is '0' and the input data is '1', according to an embodiment of the present invention.

At stored bit '0' and input bit '1' shown in FIG. 71C, an inversion channel is not formed and no drain current flows. However, band-to-band tunneling results in hole current to the floating body 24, due to the high drain voltage of +1.8 V.

Figure 71D:
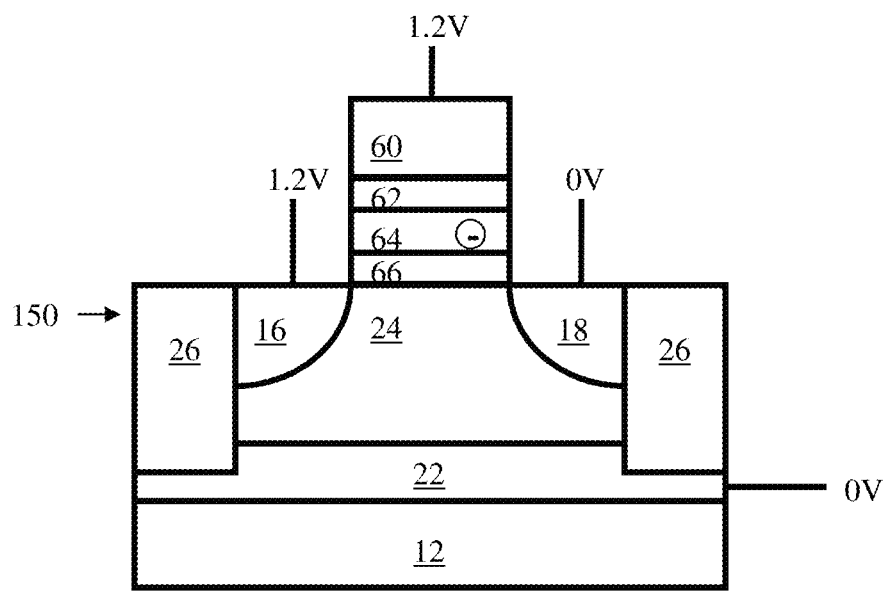
FIG. 71D schematically illustrates a matching condition, where the stored data is '0' and the input data is '0', according to an embodiment of the present invention.

At stored bit '0' and input bit '0' shown in FIG. 71D, an inversion channel is not formed and no current flows. Also, band-to-band tunneling does not occur because the source voltage of +1.2V is not sufficient to cause it to occur.

In at least one embodiment for a cell having asymmetric source/drain design, the input voltage $V_{input}$ can be the same as the read voltage $V_{read}$. In at least one embodiment, the gate-to-drain overlap is greater than the gate-to-source overlap. As the band-to-band tunneling current is proportional to the overlap area, the band-to-band tunneling near the drain junction is preferred. An example of bias conditions for data comparison for the CAM cell 150 are: +1.2V is applied to control gate 60, +1.2V is applied to the source 16, 0V is applied to the buried layer 22, and 0V for search bit '0' or 1.2V for search bit '1' is applied to the drain. In other embodiments, different voltages may be applied to the various terminals of memory cell 150 and the exemplary voltages described are not limiting.

Figure 72A:
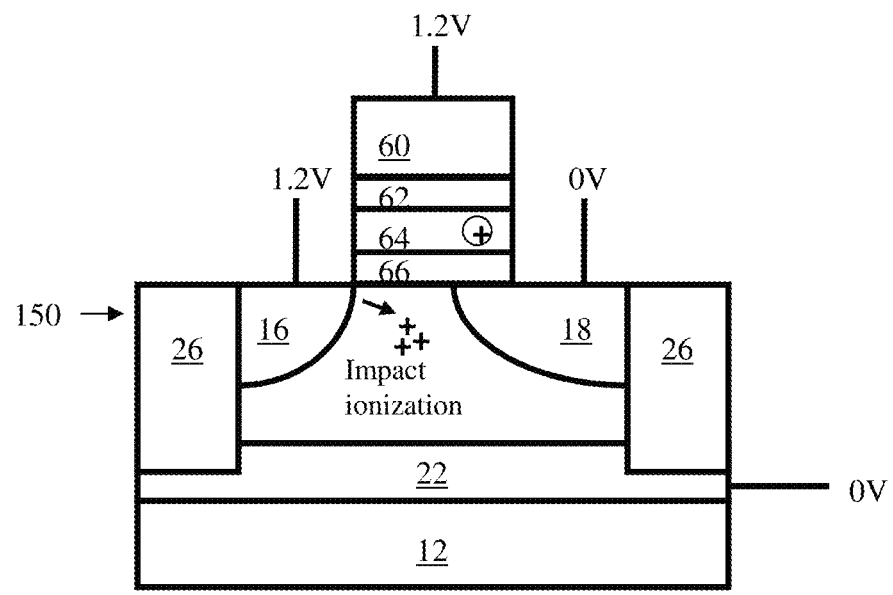
FIG. 72A schematically illustrates a mismatch condition, where the stored data is '1' and the input data is '0', according to an embodiment of the present invention.

FIGS. 72A-72D illustrate the set of possible stored bits and search bits of a cell having asymmetric source/drain design, according to an embodiment of the present invention, which are also summarized in FIG. 72E.

At stored bit '1' and input bit '0' shown in FIG. 72A, an inversion channel is formed and the electrons flow from the drain 18 to the source 16. The flow of electrons and the source-to-drain voltage of 1.2V cause impact ionization to occur, resulting in hole current to the floating body 24.

Figure 72B:
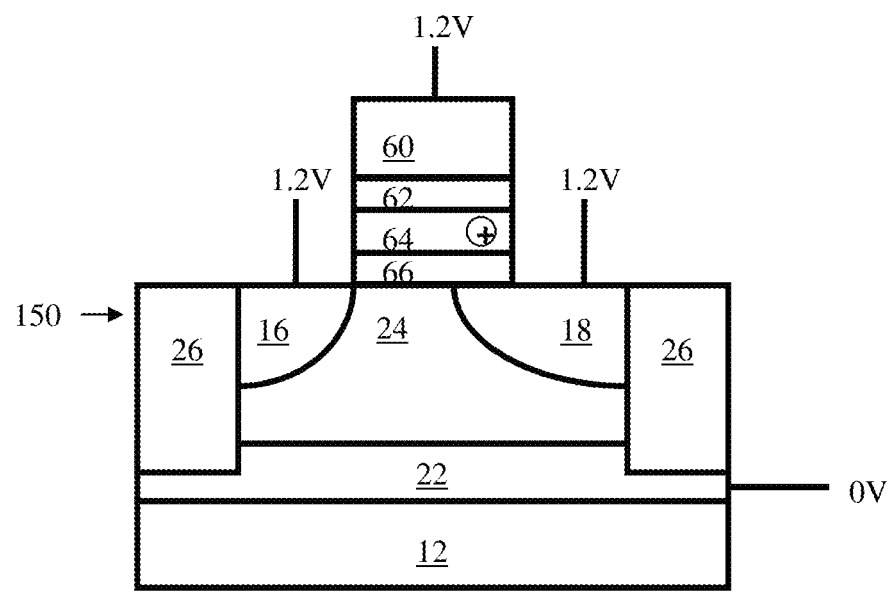
FIG. 72B schematically illustrates a matching condition, where the stored data is '1' and the input data is '1', according to an embodiment of the present invention.

At stored bit '1' and input bit '1' shown in FIG. 72B, an inversion channel is formed, but the current does not flow due to the drain-to-source voltage of 0V.

Figure 72C:
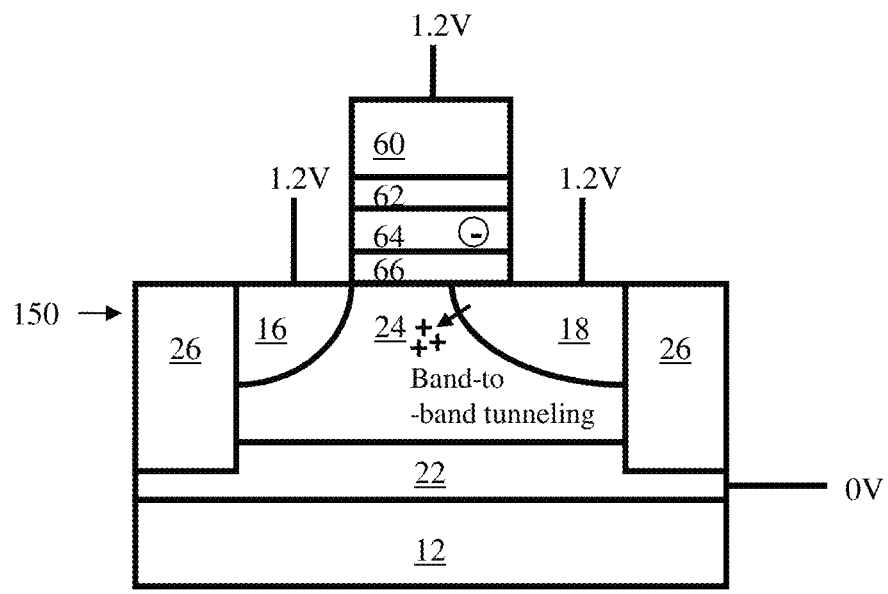
FIG. 72C schematically illustrates a mismatch condition, where the stored data is '0' and the input data is '1', according to an embodiment of the present invention.

At stored bit '0' and input bit '1' shown in FIG. 72C, an inversion channel is not formed and no drain current flows. However, band-to-band tunneling results in hole current to the floating body 24, due to large gate-to-drain overlap in conjunction with the high drain voltage of +1.2 V.

Figure 72D:
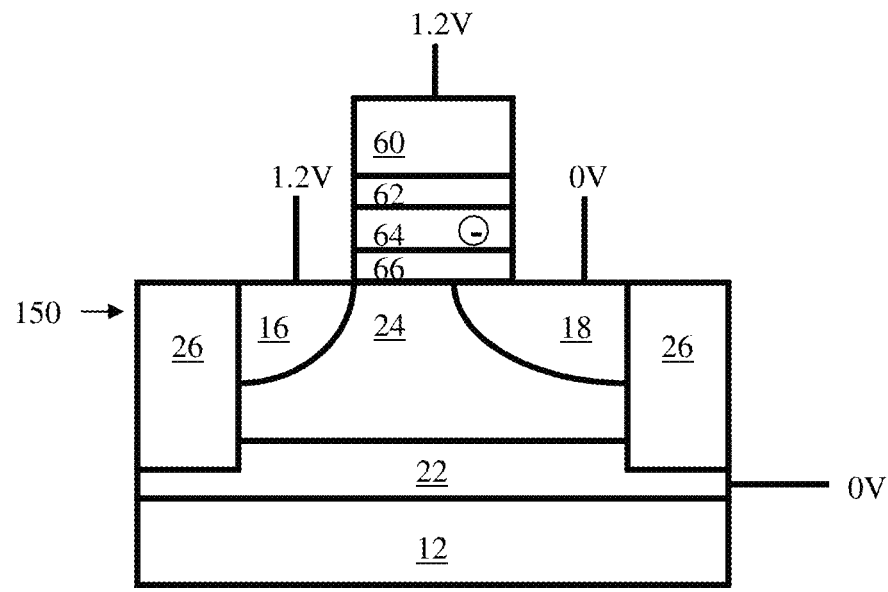
FIG. 72D schematically illustrates a matching condition, where the stored data is '0' and the input data is '0', according to an embodiment of the present invention.

At stored bit '0' and input bit '0' shown in FIG. 72D, an inversion channel is not formed and no drain current flows. Also, band-to-band tunneling does not occur because the small or no gate-to-source overlap present is insufficient to cause band-to-band tunneling to occur.

As explained in FIG. 71 and FIG. 72, when the stored bits and input bits are matched, no hole current is generated in the floating body 24. When the stored bits and input bits are mismatched, hole current is generated in the floating body 24. Based on this mechanism, the CAM cell array or CAM cell memory block will be described hereafter. To simplify the description, the CAM cell structure will usually be drawn as it is in FIG. 71.

Figure 73:
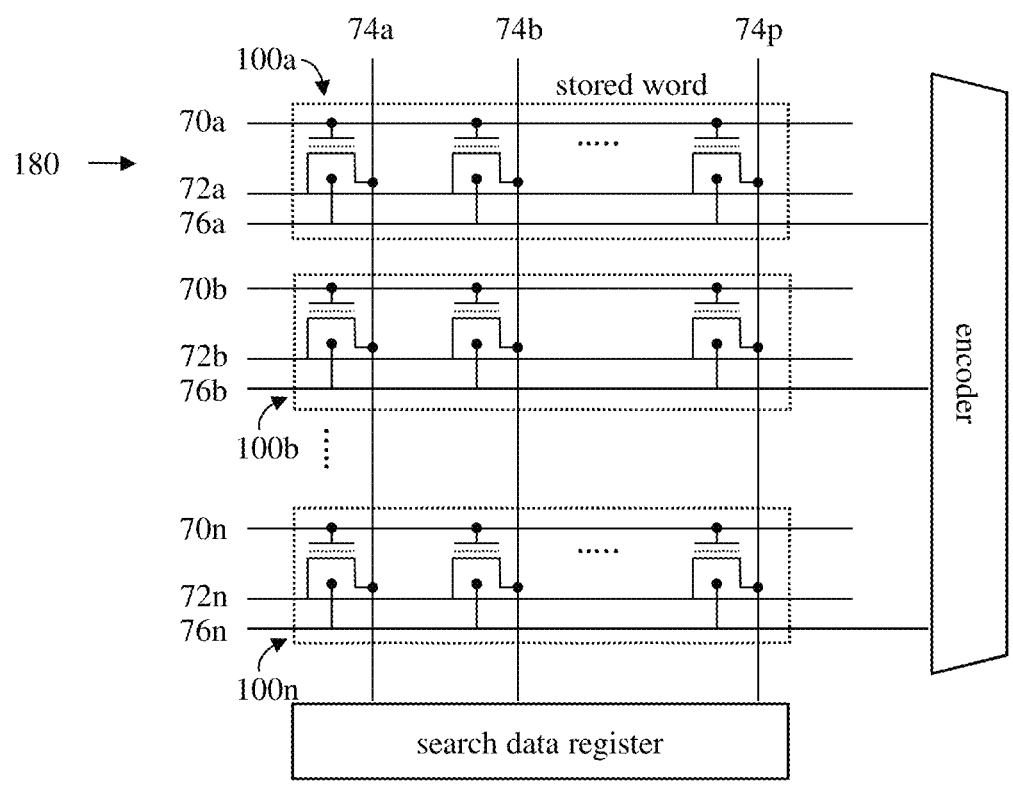
FIG. 73 schematically illustrates an exemplary embodiment of a CAM memory array comprising of CAM memory cells arranged in rows and columns, according to an embodiment of the present invention.

FIG. 73 schematically illustrates an exemplary embodiment of a CAM array 180 comprising CAM memory cells 150 arranged in rows and columns, according to an embodiment of the present invention. A word is arranged horizontally. A CAM array 180 consists of n words, with each word 100 (100a, 100b . . . and 100n) containing p bits arranged horizontally. There are word lines 70 (70a, 70b . . . 70n) connecting each word. There are match lines 76 (76a, 76b . . . 76n) corresponding to each word connected to match line sense amplifiers, and there are search lines 74 (74a, 74b . . . 74p) corresponding to each bit of the search word. The word lines 70 are electrically connected to the control gate 60 of CAM unit cell 150, the match lines 76 are electrically connected to either the floating body 24 or buried layer 22 of CAM cell 150, and the search lines 74 are electrically connected to the drain of CAM cell 150. A search operation begins with loading the search-data word into the search lines 74. Each CAM cell compares its stored bit against the bit on its corresponding search lines 74. If a match between all search/input bits and the stored bits is found, no current will flow on match lines 76. If there is at least one mismatch between the search/input bit and the stored bits, a current flow will be observed on the corresponding match lines 76. The match line sense amplifier detects whether its match line 76 has a matching or mismatching condition.

Figure 74A:
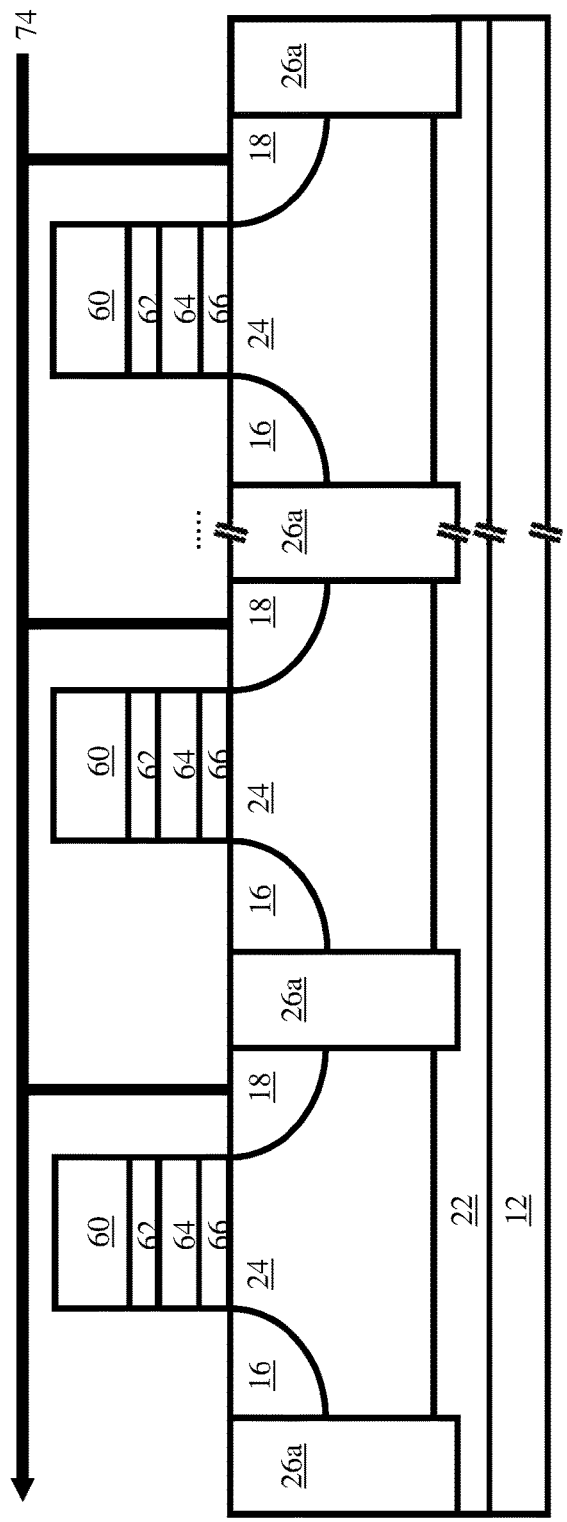
FIGS. 74A and 74B schematically illustrate cross-sectional views of memory cells joined to make a memory array, according to an embodiment of the present invention.
Figure 74B:
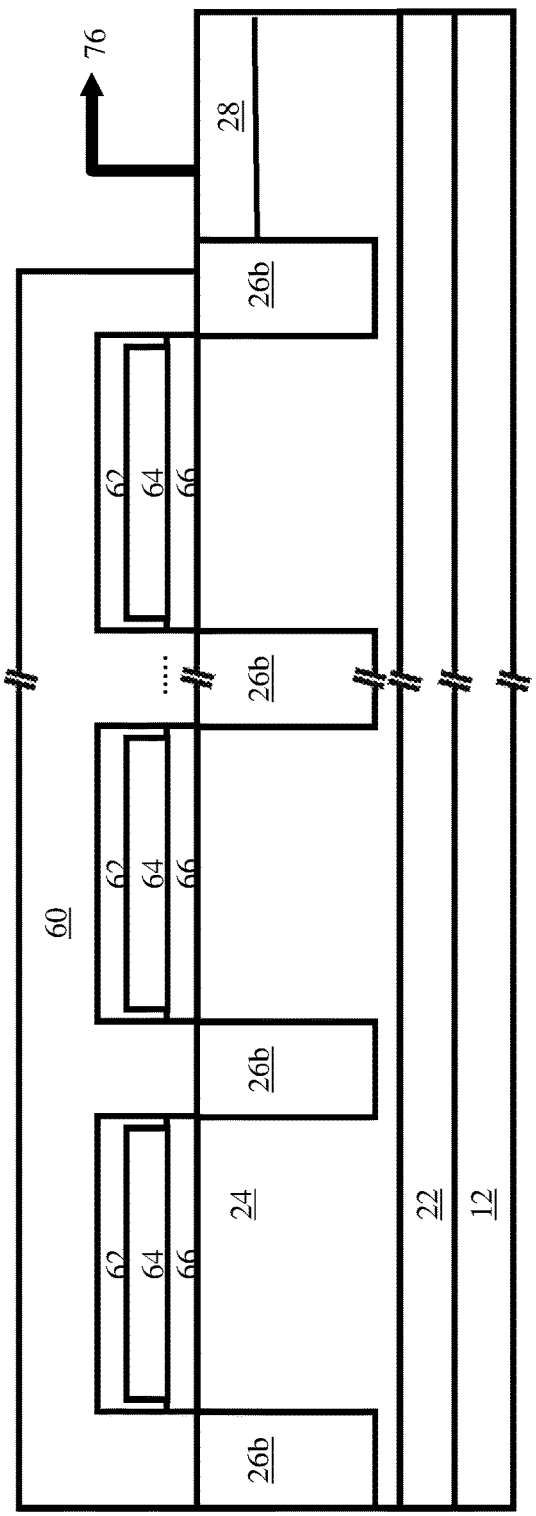

FIGS. 74A and 74B schematically illustrate an exemplary physical structure that may be employed in making the CAM array 180 of FIG. 73, according to an embodiment of the present invention. FIG. 74A is the cross sectional view cut on the center of CAM unit cell 150 along the search line 74 direction. FIG. 74B is the cross sectional view cut on the centers of CAM cells 150 along the word line 70 direction. Insulating layers 26a and 26b having two different depths are applied. The bottom of insulating layer 26a resides inside the buried layer 22 to disconnect the floating body 24 from adjacent words 100 as shown in FIG. 74A. However, the bottom of insulating layer 26b resides above the buried layer 22 allowing the floating body 24 to be continuous within each word 100 as shown in FIG. 74B. The ohmic contact layer 28 of the same conductivity type as that of the floating body 24 is given for each word 100. The floating body 24 in the given word 100 is connected to the match line 76 via ohmic contact layer 28.

As explained with regard to FIGS. 71 and 72, when the stored bits and input bits are matched, no hole current is generated in the floating body 24. When the stored bits and input bits are mismatched, hole current is generated in the floating body 24. Because the floating body 24 is continuous at a given word 100 while the floating body 24 is isolated from adjacent words 100, when a search operation begins with loading the search-data word into search lines 74, the match line 76 on a matched word does not cause floating body 24 hole current, but a match line 76 that has at least one mismatch bit causes floating body 24 hole current to flow. Therefore, the matching or mismatching condition can be detected.

Figure 75A:
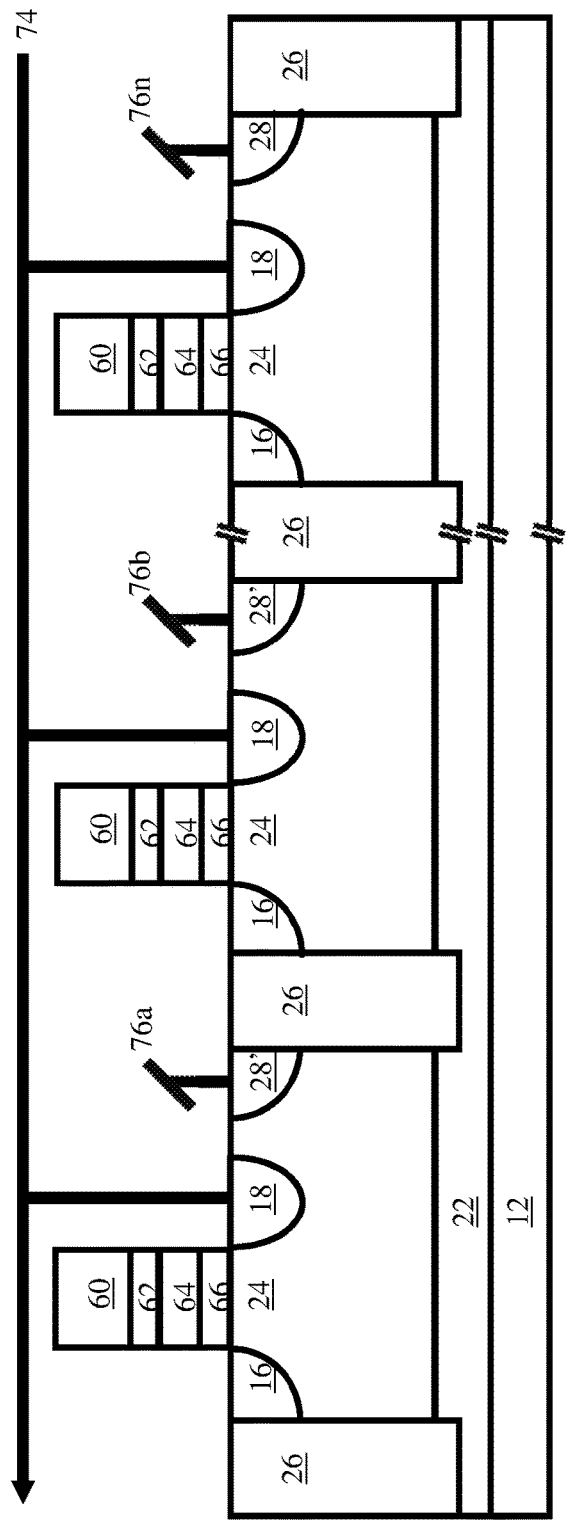
FIGS. 75A and 75B schematically illustrate cross-sectional views of memory cells joined to make a memory array according to another embodiment of the present invention.
Figure 75B:
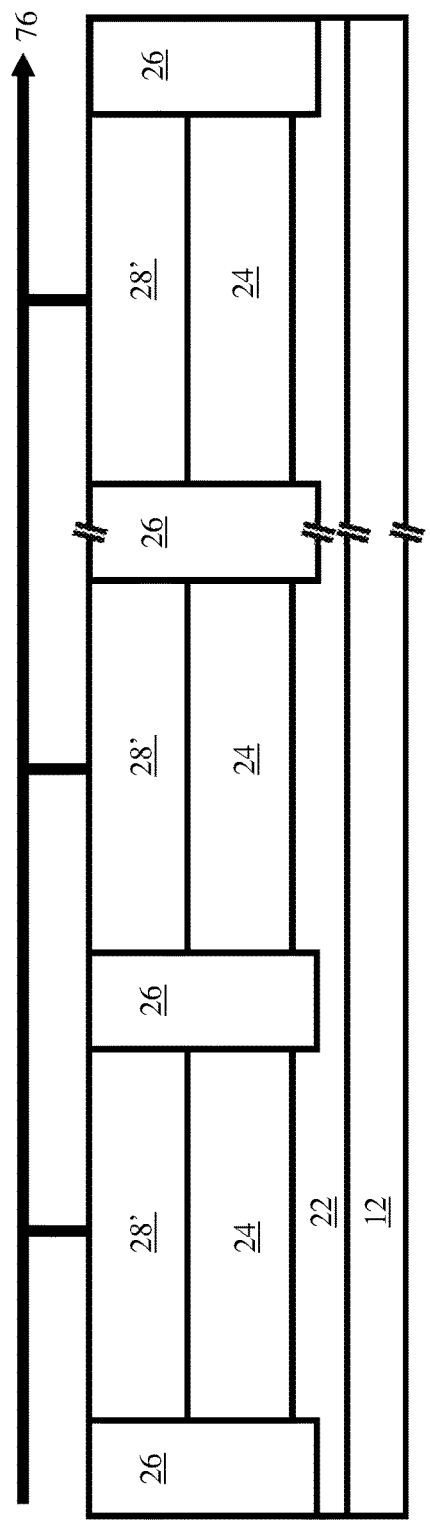

FIGS. 75A-75B schematically illustrate another exemplary physical structure of a CAM array 180 according to an embodiment of the present invention. FIG. 75A is a cross sectional view cut on the centers of CAM cells 150 along the direction of search line 74. FIG. 75B is a cross sectional view cut on the centers of CAM cells 150 along the direction of word line 70. Insulating layer 26 with single depth is applied throughout. The bottom of insulating layer 26 resides inside the buried layer 22 to disconnect the floating body 24 from adjacent words 100 as shown in FIG. 75A. Also, the insulating layer 26 disconnects the floating body 24 from adjacent search bit cells within the word 100 as shown in FIG. 75B. The ohmic contact layer 28' of the same conductivity type as that of the floating body 24 is given for every CAM cell 150. The floating body 24 of every CAM cell 150 within the given word 100 is connected to the match line 76 via ohmic contact layer 28' as shown in FIG. 75B.

As explained with regard to FIG. 71 and FIG. 72, when the stored bits and input bits are matched, no hole current is generated in the floating body 24. When the stored bits and input bits are mismatched, hole current is generated in the floating body 24. Because the floating body 24 is continuous at given word 100 while the floating body 24 is isolated from adjacent words 100, when a search operation begins with loading the search-data word into search lines 74, the match line 76 on matched word does not cause floating body 24 hole current to flow, but the match line 76 that has at least one mismatch bit causes floating body 24 hole current to flow. Therefore, the matching or mismatching condition can be detected.

In one exemplary matching line sensing scheme, the match line is first pre-charged to ground at the beginning of the matching operation. If all the search bits match all the stored bits, then the match line will remain at ground. If there is at least one mismatch between the search bits and the stored bits, the potential of the corresponding match line will increase, resulting in a higher potential than the pre-charged ground potential.

Figure 76:
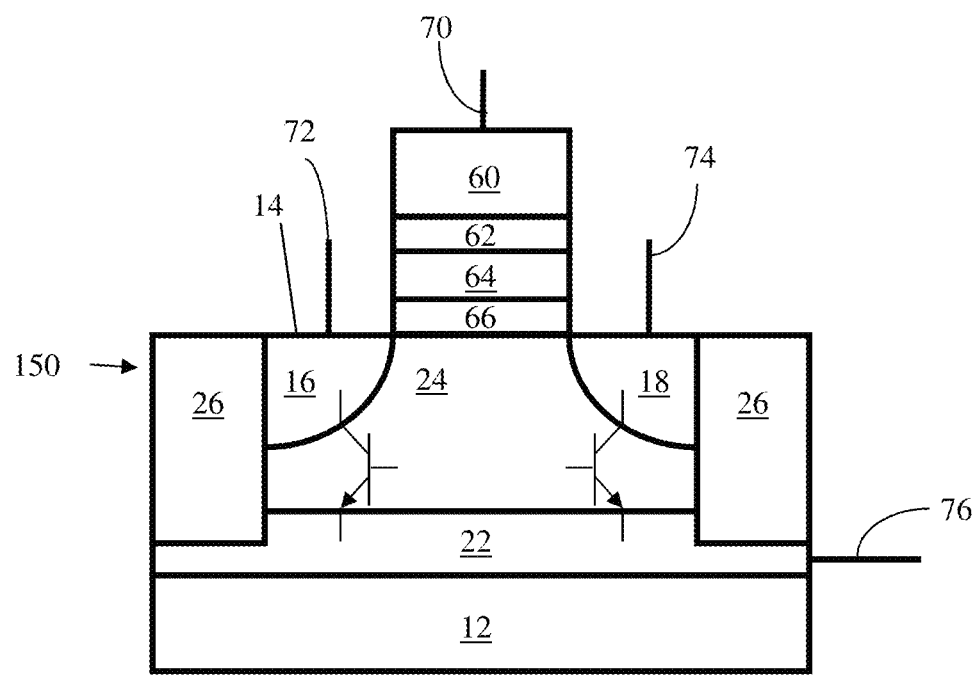
FIG. 76 schematically illustrates a illustrates a CAM memory cell according to an embodiment of the present invention.

FIG. 76 illustrates a CAM unit cell 150 for explaining another embodiment of a search method. Vertical bipolar devices are inherently formed in the unit CAM cell 150 by buried layer 22, floating body region 24, and source 16 or drain 18, respectively. The buried layer 22, floating body region 24, and source 16 can be considered as emitter, base, and collector of a bipolar transistor, respectively. Likewise, the buried layer 22, floating body region 24, and drain 18 can be considered as emitter, base, and collector of a bipolar transistor, respectively.

Figure 77A:
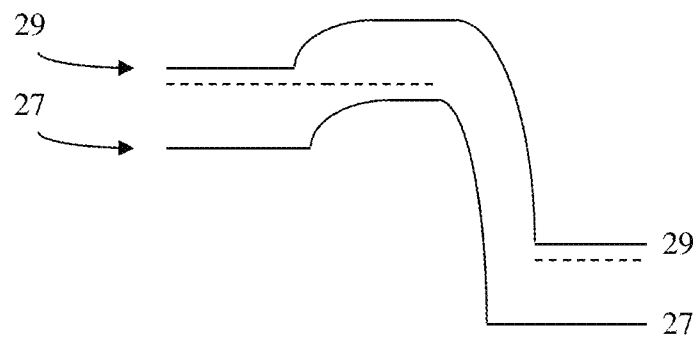
FIG. 77A shows an energy band diagram characterizing an intrinsic bipolar device when a floating body region is positively charged and a positive bias is applied to a buried well region of a memory cell according to an embodiment of the present invention.
Figure 77B:
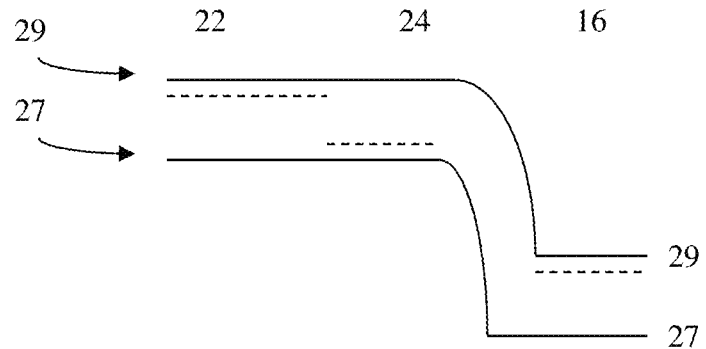
FIG. 77B shows an energy band diagram of an intrinsic bipolar device when a floating body region is neutrally charged and a positive bias is applied to a buried well region of a memory cell according to an embodiment of the present invention.

FIG. 77A shows an energy band diagram characterizing an inherent n-p-n vertical bipolar transistor along the buried layer 22, floating body 24, and source 16 for grounded buried layer 22, neutrally charged floating body 24, and positive voltage applied to the source 16. FIG. 77B shows an energy band diagram characterizing an n-p-n bipolar transistor along the buried layer 22, floating body 24, and source 16 for grounded buried layer 22, positively charged floating body 24, and positive voltage applied to the source 16. The horizontal dashed lines indicate the Fermi levels in the various regions of the n-p-n transistor. The Fermi level is located in the band gap between the solid line 27 indicating the top of the valence band (the bottom of the band gap) and the solid line 29 indicating the bottom of the conduction band (the top of the band gap) as is well known in the art. The positive source 16 voltage and the grounded buried layer 22 correspond to the bias conditions for search operations. As explained with regard to FIG. 71 and FIG. 72, when the stored bits and input bits are matched, no hole current is generated in the floating body 24. When the stored bits and input bits are miss-matched, hole current is generated in the floating body 24. When the hole current is generated in the floating body 24, the vertical bipolar transistor will be turned on as the positive charge in the floating body 24 lowers the energy barrier of electron flow from the buried layer 22 into the floating body 24. Once injected into the floating body region 24, the electrons will be swept into the source 16. In other words, when the stored bits and input bits are miss-matched, the buried layer 22 flows current, which can be utilized as another searching mechanism of a CAM cell array.

FIGS. 78A and 78B schematically illustrate an exemplary physical structure of a CAM array 180 according to an embodiment of the present invention. FIG. 78A is a cross sectional view cut on centers of CAM cells 150 along the search line 74 direction. FIG. 78B is a cross sectional view cut on centers of CAM cells 150 along the word line 70 direction. Insulating layers 26 having two different depths are applied. The bottom of insulating layer 26a resides below the buried layer 22 to disconnect the floating body 24 and the buried layer 22 from adjacent words 100 as shown in FIG. 78A. However, the bottom of insulating layer 26b resides inside the buried layer 22 allowing the buried layer 22 to be continuous within each word 100 as shown in FIG. 78B. An ohmic contact layer 29 of the same conductivity type as that of the buried layer 22 is provided for each word 100. The buried layers 22 of cells 150 in a word 100 are all connected to the match line 76 via ohmic contact layer 28.

As explained with regard to FIG. 76 and FIGS. 77A-77B, when the stored bits and input bits are matched, no current in the buried layer 22 is generated. When the stored bits and input bits are mismatched, current is generated in the buried layer 22. Because the buried layer 22 is continuous at a given word 100 while the buried layer 22 is isolated from adjacent words 100, when a search operation begins with loading the search-data word into search lines 74, no current flow is observed on the buried layer 22 (connected to the match line 76). Correspondingly, if there is at least one mismatch, current flow in the buried layer 22 (connected to the match line 76) will be observed. Therefore, the matching or mismatching condition can be detected.

Figure 79A:
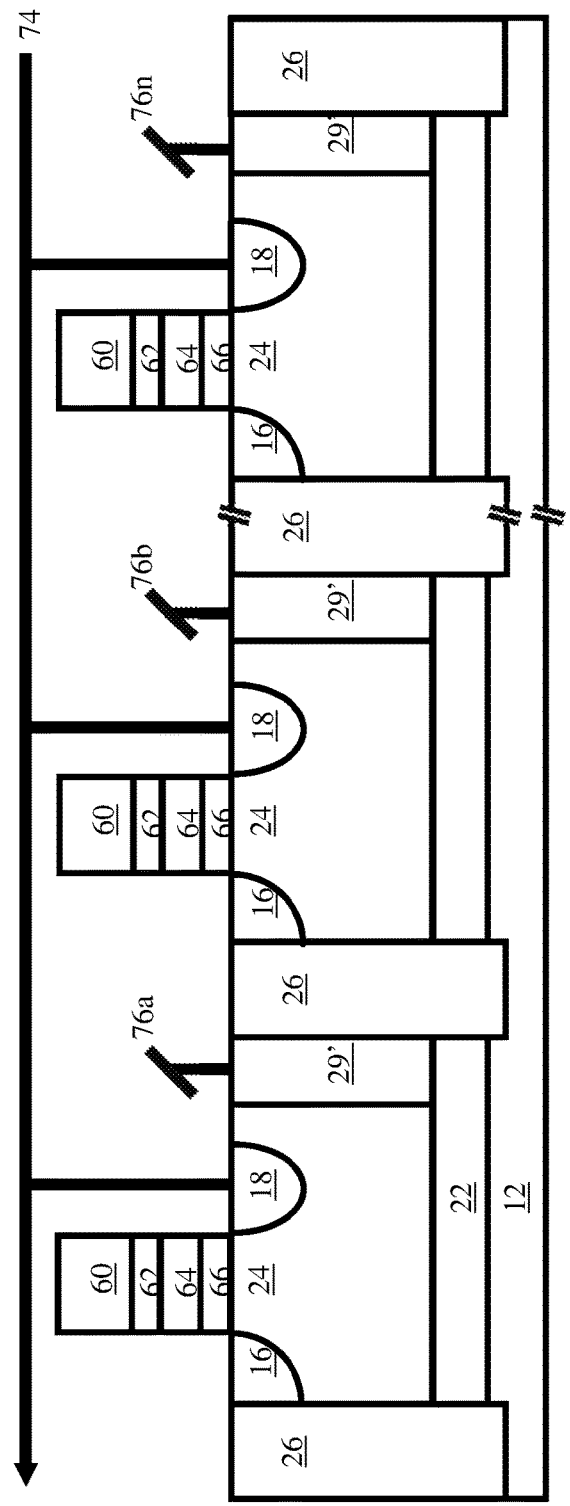
FIGS. 79A and 79B schematically illustrate cross-sectional views of memory cells joined to make a memory array according to another embodiment of the present invention.
Figure 79B:
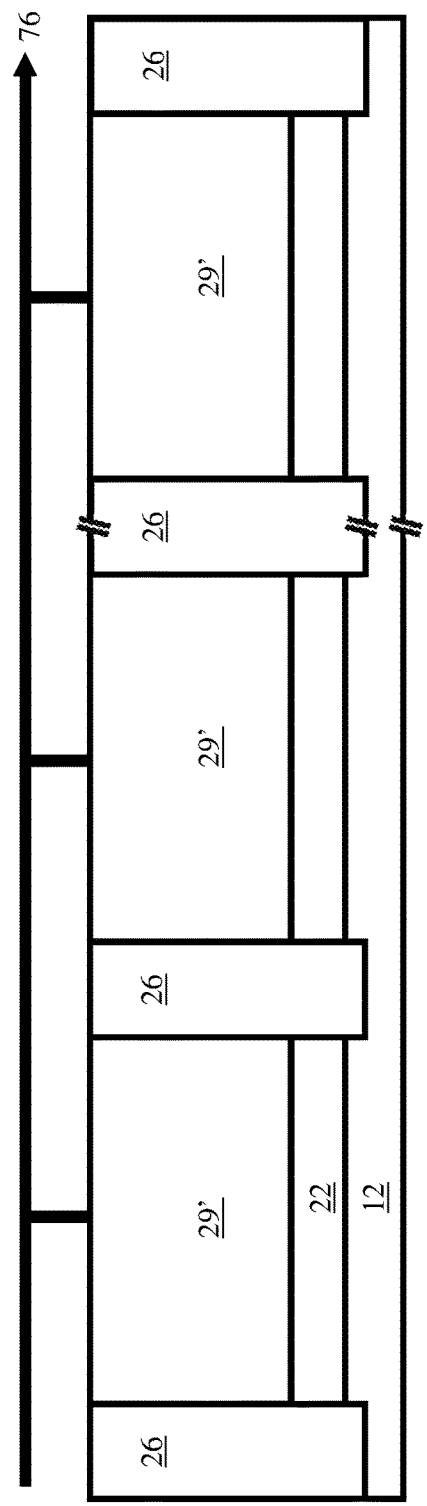

FIGS. 79A-79B schematically illustrate another exemplary physical structure that may be employed in making CAM array 180, according to another embodiment of the present invention. FIG. 79A is a cross sectional view cut on centers of CAM cells 150 along the search line 74 direction. FIG. 79B is a cross sectional view cut on centers of CAM cells 150 along the word line 70 direction. Insulating layer 26 with single depth is applied throughout. The bottom of insulating layer 26 resides below the buried layer 22 to disconnect the floating body 24 and the buried layer 22 from adjacent words 100 as shown in FIG. 79A. Also, the insulating layer 26 disconnects the floating body 24 and the buried layer 22 from adjacent search bit cells within the word 100 as shown in FIG. 79B. The ohmic contact layer 29' of the same conductivity type as that of the buried layer 22 is provided with all CAM cells 150. The buried layer 22 of every CAM cell 150 within a given word 100 is connected to the match line 76 via ohmic contact layer 29' as shown in FIG. 79B.

As explained with regard to FIG. 76 and FIGS. 77A-77B, when the stored bits and input bits are matched, no current in the buried layer 22 is generated. When the stored bits and input bits are mismatched, current is generated in the buried layer 22. Because the buried layer 22 is continuous at a given word 100 while the buried layer 22 is isolated from adjacent words 100, when a search operation begins with loading the search-data word into search lines 74, no current flow is observed on the buried layer 22 (connected to the match line 76). Correspondingly, if there is at least one mismatch, current flow in the buried layer 22 (connected to the match line 76) will be observed. Therefore, the matching or mismatching condition can be detected.

Figure 80:
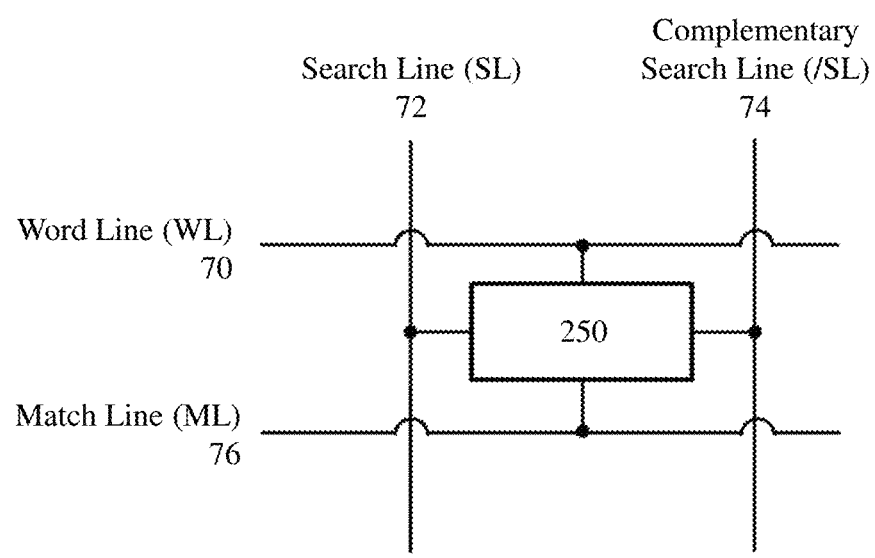
FIG. 80 is a schematic, cross-sectional illustration of a differential content addressable memory cell according to an embodiment of the present invention.

FIG. 80 schematically illustrates a differential CAM cell 250 comprising one non-volatile memory transistor, according to an embodiment of the present invention. The non-volatile memory transistor 250 has four terminals. A first terminal connects to a search line (SL) terminal 72, a second terminal connects to a complementary search line (/SL) terminal 74, a third terminal connects to a word line (WL) terminal 70, and a fourth terminal connects to a match line (ML) terminal 76. The first terminal may be connected to the source region of the memory transistor 250, the second terminal may be connected to the drain region of the memory transistor 250, the third terminal may be connected to a control gate of the memory transistor 250, and the fourth terminal may be electrically connected to either a floating body region or buried well region of the memory transistor 250. The WL terminal 70 controls the flow of the current between the first terminal and the second terminal, i.e. between the SL terminal 72 and the /SL terminal 74. As will be described, during searching/comparison operation, no current flow is observed at the ML terminal 76 under matching conditions between the stored data in the CAM cell 250 and the input/search data and under "masking" or "don't care" conditions, and current flow is only observed under mismatch conditions between the stored data and the input/search data.

Figure 81:
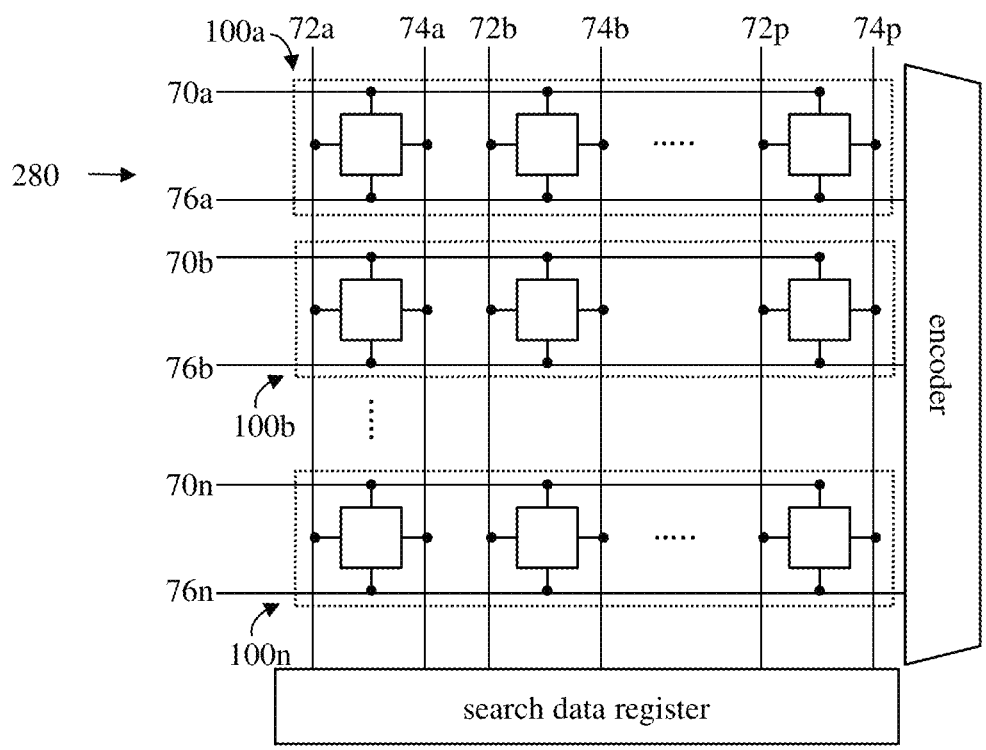
FIG. 81 is a schematic illustration of a plurality of differential content addressable memory cells connected to form a memory array, according to an embodiment of the present invention.

FIG. 81 schematically illustrates a differential CAM array 280 comprising CAM memory cells 250 arranged in rows and columns, according to an embodiment of the present invention. A word is arranged horizontally. CAM array 280 has n words, with each word 100 (100a, 100b . . . and 100n) containing p bits arranged horizontally. There are word lines 70 (70a, 70b . . . 70n) connecting each word. There are match lines 76 (76a, 76b . . . 76n) corresponding to each word connected to match line sense amplifiers, and there are pairs of differential search lines 72 (72a, 72b . . . 72p) and complementary search lines 74 (74a, 74b . . . 74p) corresponding to each bit of the search word. A search operation begins with loading the search-data word into the pairs of search lines 72 and complementary search line 74. Each CAM cell 250 compares its stored bit against the bit on its corresponding pair of differential search lines 72 and 74. In at least one embodiment, if there is at least one mismatch between the search/input bit and the stored bit in a given word 100, current flow will be observed on the corresponding match lines 76. If a match between all search/input bits and the stored bits is found in a given word 100 (more specifically, if a match condition is observed on all search/input bits and stored bits that are not in "don't care" data state and do not receive "masking" search/input conditions), no current will flow on match lines 76. The match line sense amplifier detects whether its match line 76 has a matching or mismatching condition.

In at least one embodiment, the search input conditions for a searching operation are: logic low is applied to the SL terminal 72 and logic high is applied to the /SL terminal 74 for search logic-0 state, logic high is applied to the SL terminal 72 and logic low is applied to the /SL terminal 74 for search logic-1 state, logic lows are applied to the SL terminal 72 and /SL terminal 74 for search masking conditions or search logic-M state. In one exemplary embodiment, logic low corresponds to 0V and logic high corresponds to +1.2V. Different voltages may be applied and the exemplary voltages described are not limiting.

To implement a ternary CAM operation in a single memory transistor, the CAM unit cell 250 should have at least three memory states or at least two bits. Therefore, the CAM unit cell 250 adopts a two-bit per cell architecture. Examples of two-bit per cell architectures are shown in FIGS. 82A-82E.

A ternary CAM unit cell 250 comprises a gate stack (including a control gate 60, insulating layer 62, charge storage region 64, and an insulating layer 66) positioned between the source region 16 and the drain region 18, and above the floating body region 24. The control gate 60 is positioned above charge storage region 64 and insulated therefrom by insulating layer 62 such that the charge storage region 64 is positioned between insulating layer 62 and insulating layer 66. Control gate 60 is capacitively coupled to charge storage region 64. Charge storage region 64 is typically made of floating gate such as polysilicon or metal or charge trapping layer such as silicon nitride, quantum dots, and/or nanocrystals. The charge storage region 64 functions to store non-volatile memory data. The floating body region 24 is isolated by the insulating layer 26 (like, for example, shallow trench isolation (STI)), and the built-in potential barrier of source/drain region 16 and 18 in horizontal direction, and by the insulating layer 66 and the built-in potential barrier of buried well layer 22 in vertical direction.

The word line 70 is electrically connected to the control gate 60 of CAM cell 250, the match line 76 is electrically connected to either the floating body 24 or buried well layer 22 of CAM cell 250 (FIGS. 82A-82E illustrate examples of CAM cell 250 where the match lines 76 are electrically connected to the buried well layer 22), the search lines 72 are electrically connected to the source 16 of CAM cell 250, and the complementary search lines 74 are electrically connected to the drain 18 of CAM cell 250. In at least one embodiment of CAM cell 250, the substrate 12 is p-type, the source/drain region 16 and 18 are n-type, the buried well layer 22 is n-type, and the floating body region 24 is p-type. Such embodiments shall be hereafter used to explain the details of the invention, but another embodiment of CAM cell 250 can be understood by complementary analogy.

Figure 82D:
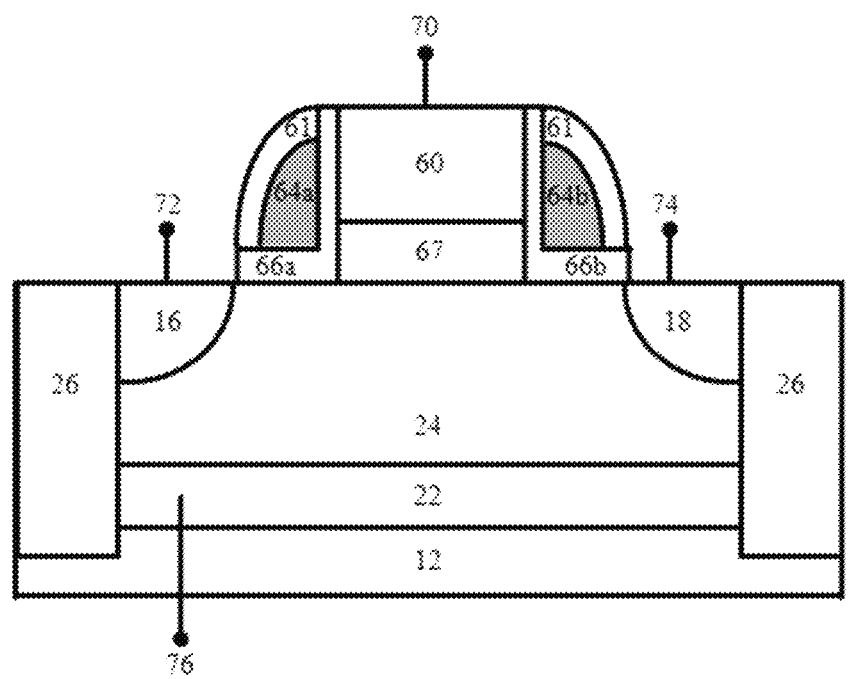
Figure 82E:
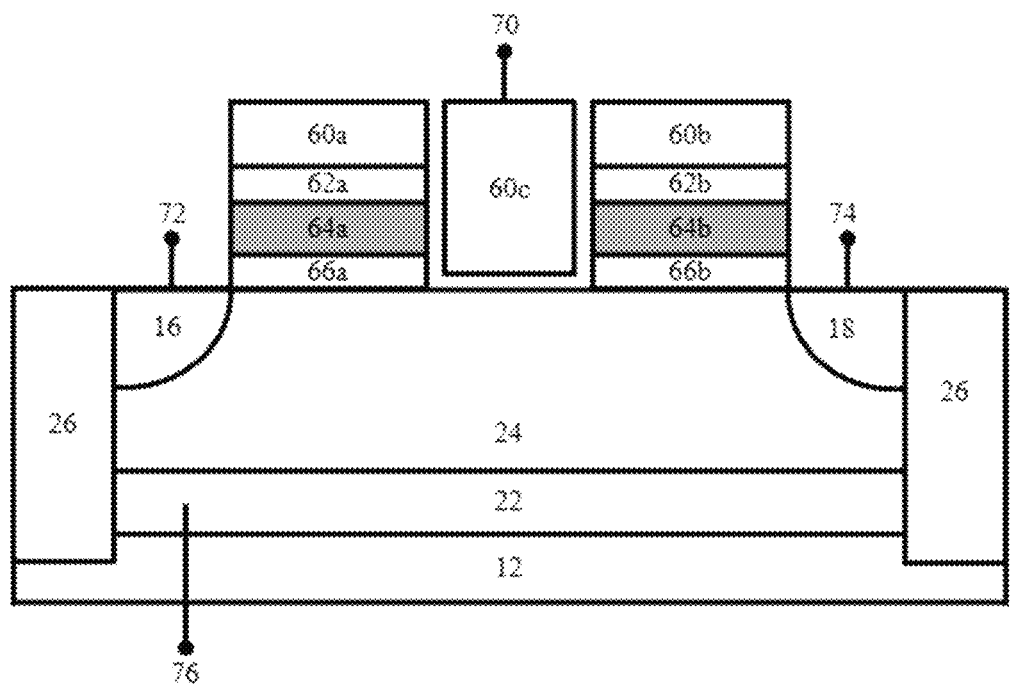

In FIG. 82A, the charge storage region 64 is made of a charge trapping layer such as silicon nitride, quantum dots, and/or nanocrystals. As the charge trapping sites are physically fixed due to the insulating nature of the charge trapping layer 64 illustrated in FIG. 82A, the stored charges are localized. Therefore, the charge storage region 64 can be spatially separated into the charge storage region 64a near the source region 16 and the charge storage region 64b near the drain region 18. Consequently, two bits can be stored in one transistor. If the transistor is miniaturized and thus the separation distance between charge storage regions 64a and 64b becomes smaller, isolating the two charge storage regions 64a and 64b becomes more difficult. To overcome the interference, two charge storage regions 64a and 64b are physically isolated as illustrated in FIGS. 82B to 82D. In FIGS. 82B-82D, CAM cell 250 comprises physically isolated charge storage regions 64a and 64b, and therefore the charge storage region 64 may comprise both floating gate and charge trapping layer. In FIG. 82B, an insulating region 63 is used to isolate the charge storage regions 64a and 64b. In FIGS. 82C and 82D, the charge storage regions 64a and 64b are formed within the spacer regions 61, and thus isolated by the gate stack. In FIG. 82E, the gate stack and thus the charge storage regions 64a and 64b are separated, which is often referred to as the split-gate structure.

In the programmed state, electrons are stored in the charge storage region 64 and a conduction channel is not formed when a read voltage is applied to control gate 60 through WL terminal 70, and is denoted as logic-0 state. In the erased state, the excess electrons are removed from the charge storage region and the conduction channel is formed when a read voltage is applied to the control gate 60, and this is denoted as logic-1 state. As shown in FIG. 83A, four different stored states are available in the CAM cell 250: D(0, 0) state, where the charge storage region 64a near the source 16 and the charge storage region 64b near the drain 18 are both in the programmed state. This data state will also be referred to as the "don't care" state, which is represented by logic-X data in FIG. 83A. D(0,1) state, where the charge storage region 64a near the source 16 is in the programmed state and the charge storage region 64b near the drain 18 is in the erased state. This data state will also be referred to as state "0", which is represented by logic-0 data in FIG. 83A. D(1,0) state, where the charge storage region 64a near the source 16 is in the erased state and the charge storage region 64b near the drain 18 is in the programmed state. This data state will also be referred to as state "1", which is represented by logic-1 data in FIG. 83A. D(1,1) state, where the charge storage region 64a near the source 16 and the charge storage region 64b near the drain 18 are both in the erased state. This data state is not allowed in the CAM cell storage and indicated as "don't allow" in FIG. 83A.

The definitions of the data states illustrated in FIG. 83A follow the convention where the first index signifies the logic state of the charge storage region 64a and the second index signifies the logic state of the charge storage region 64b. The opposite convention, where the first index signifies the logic state of the charge storage region 64b and the second index signifies the logic state of the charge storage region 64a may alternatively be adopted.

Figure 83C:
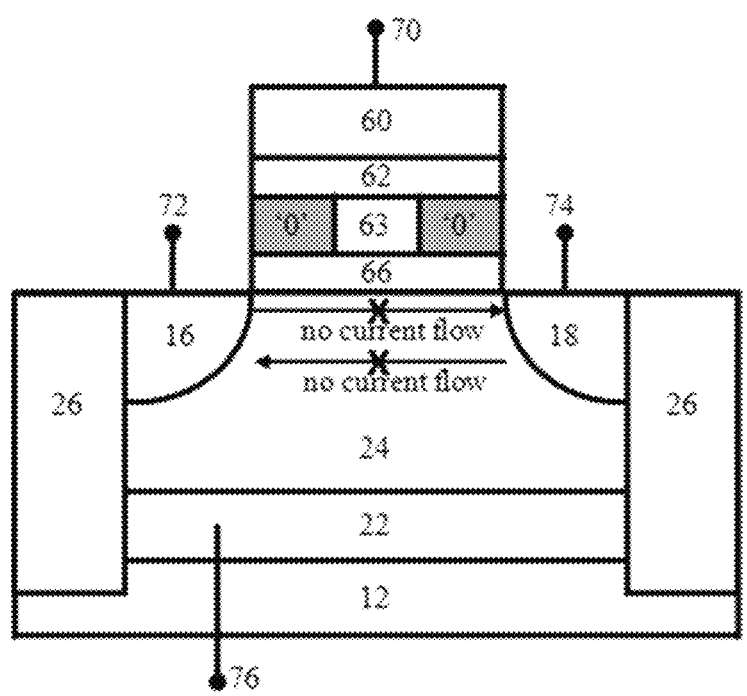
FIGS. 83C-83F illustrate forward and reverse current flows for different data states of a content addressable memory cell according to an embodiment of the present invention.
Figure 83D:
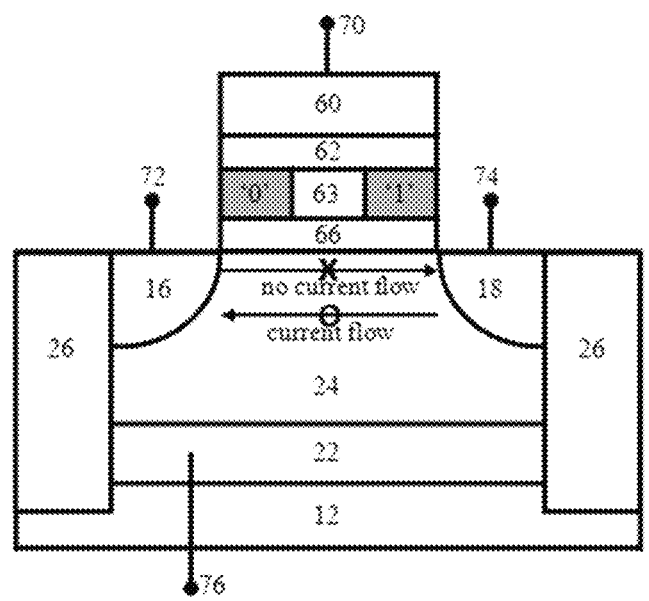
Figure 83E:
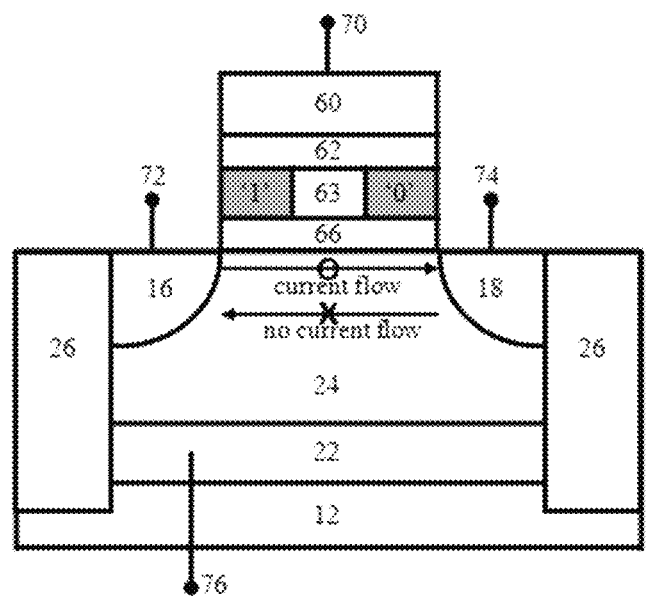
Figure 83F:
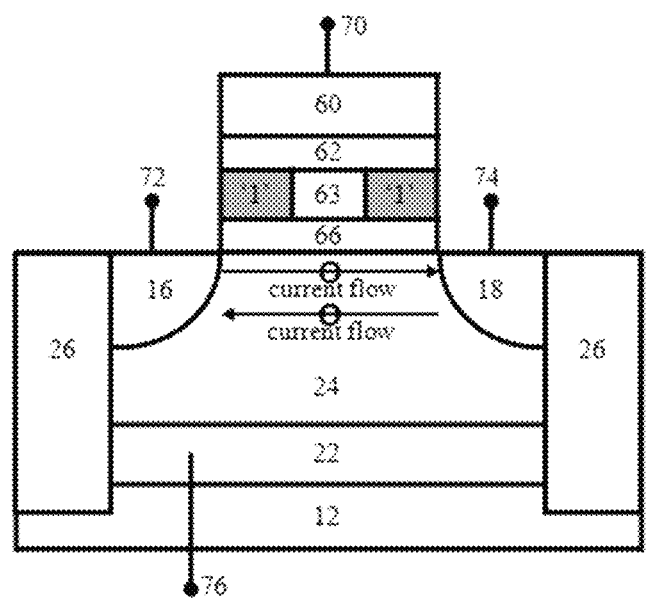

The stored data states can be identified by a two-step reading: forward and reverse reading. The forward reading implies that the source 16 is grounded and the drain 18 is biased to a positive read voltage. The reverse reading implies that the drain 18 is grounded and the source 16 is biased to a positive voltage. As shown in FIG. 83C, for D(0,0), no channel currents flow under both forward read and reverse read conditions. As shown in FIG. 83D, for D(0,1), no channel current flows under forward read conditions, but channel current flows under reverse read conditions. As shown in FIG. 83E, for D(1,0), channel current flows under forward read conditions, but no channel current flows under reverse read conditions. As shown in FIG. 83F, for D(1,1), channel currents flow under both forward read and reverse read conditions.

In CAM cell 250, four different search inputs are available: S(0,0) state, where the SL and the /SL are both low. This search input will also be referred to as the masking or "don't care" state, which is represented by logic-X data in FIG. 83B; S(0,1) state, where the SL is low and the /SL is high. This search input will also be referred to as state '0', which is represented by logic-0 input in FIG. 83B; S(1,0) state, where the SL is high and the /SL is low. This search input will also be referred to as state '1', which is represented by logic-1 input in FIG. 83B; and S(1,1) state, where the SL and the /SL are both high. This search input is not allowed in the search operation and indicated as "don't allow" in FIG. 83B.

All possible stored states and search inputs values are summarized and their respective logic values are defined in FIGS. 83A-83B. The 'X' entry in FIG. 83A indicates a "don't care" logic value. The 'M' entry in FIG. 83B indicates a "masking" logic value.

FIGS. 84A-84H show searching operation conditions for the different possible data states and the search inputs.

Figure 84A:
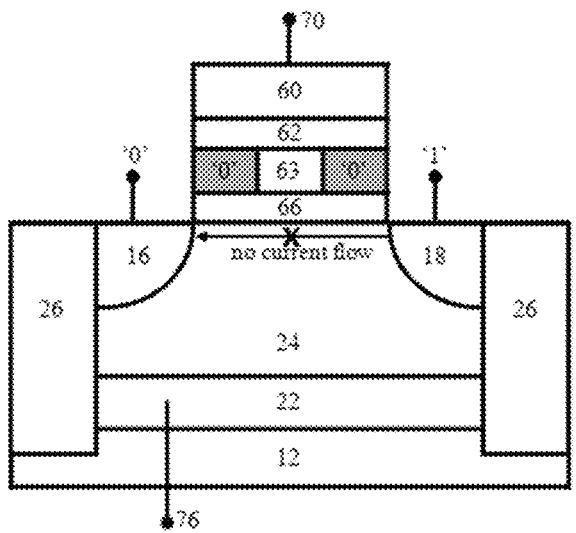
FIGS. 84A-84H illustrate search/matching operation conditions for different possible data states and the search inputs, according to an embodiment of the present invention.
Figure 84B:
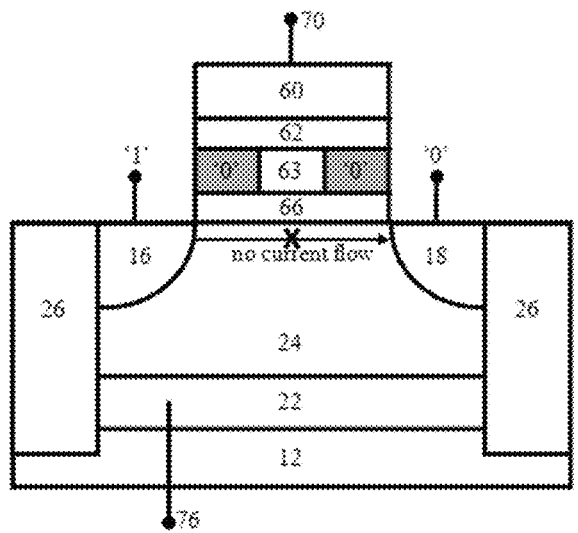

As shown in FIG. 84A-84B, when the cell stores an 'X', no channel current flows for any search bits. This is because both charge storage regions 64a and 64b are programmed, thus no current flow is observed under both forward and reverse read conditions, which corresponds to search bit '1' (where the source region 16 is grounded and a positive voltage, for example, +1.2V, is applied to the drain region 18), and the search bit '0' (where a positive voltage, for example, +1.2V, is applied to the source region 16 and the drain region 18 is grounded, as shown in FIG. 84B), respectively.

Figure 84C:
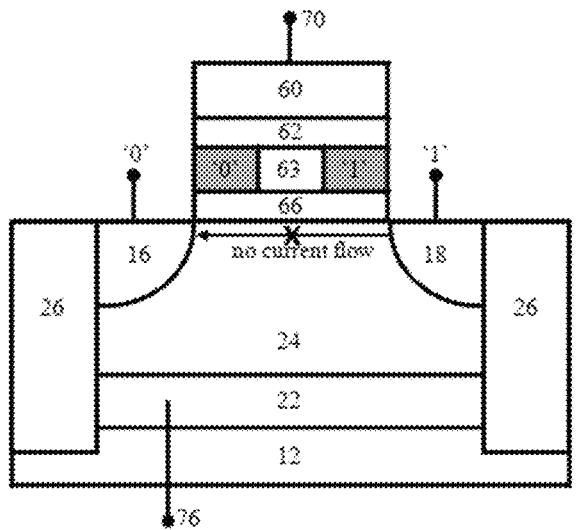
Figure 84D:
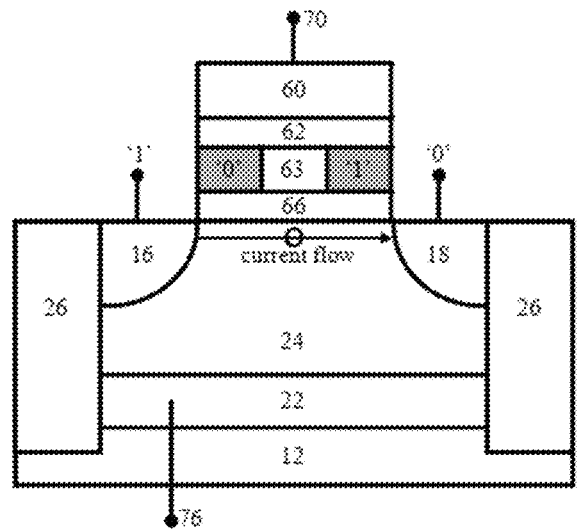

As shown in FIGS. 84C-84D, when the cell stores a '0', no channel current flows for any search bits except search bit '1'. As described, the search bit '1' corresponds to applying a positive voltage, for example +1.2V, to the source region 16 and 0V to the drain region 18, resulting in a reverse read condition. Under the reverse read condition, the depletion region formed due to the application of a positive voltage to the source region 16 will shield the negative charge stored in the charge storage region 64a. Therefore, current will flow from the source region 16 to the drain region 18, when the cell stores data '0' and the search bit is '1', as shown in FIG. 84D. However, no current flows when the cell stores '0' and the search bit is '0' as shown in FIG. 84C.

Figure 84E:
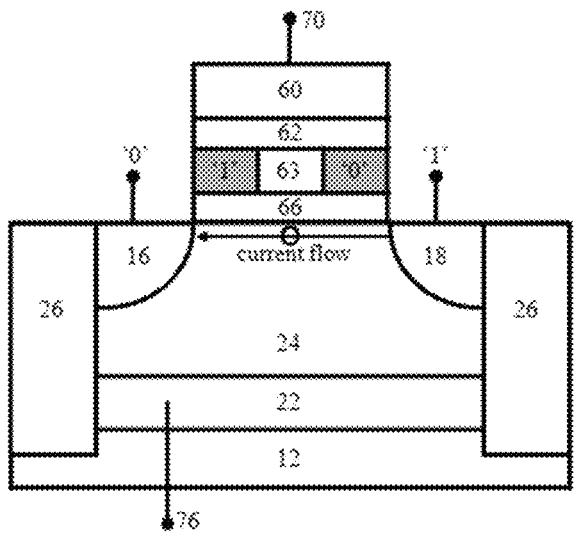
Figure 84F:
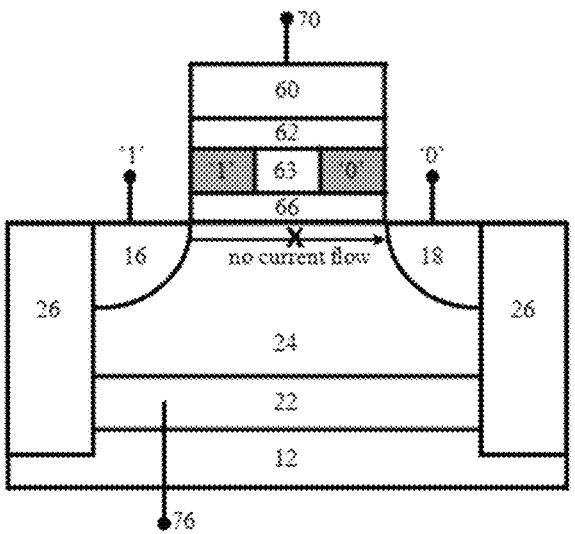

As shown in FIGS. 84E-84F, when the cell stores '1', no channel current flows for any search bits except search bit '0'. As described, the search bit '0' corresponds to applying 0V to the source region 16 and a positive voltage, for example +1.2V, to the drain region 18, resulting in a forward read condition, as shown in FIG. 84E. Under the forward read condition, the depletion region formed due to the application of a positive voltage to the drain region 18 will shield the negative charge stored in the charge storage region 64b. Therefore, current will flow from the drain region 18 to the source region 16, when the cell stores data '1' and the search bit is '0'. However, no current flows when the cell stores '1' and the search bit is '1', as shown in FIG. 84F.

Figure 84G:
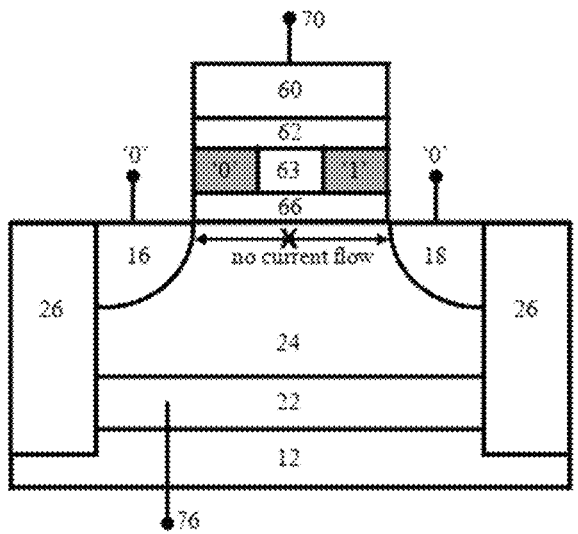
Figure 84H:
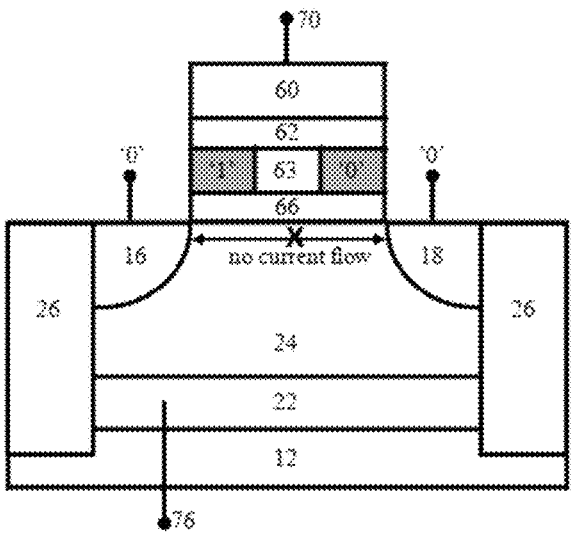

As shown in FIGS. 84G-84H, if it is desired to force a match on a particular search line (regardless of the data states of the CAM unit cell 250), a search bit 'M' (referred to as external 'don't care' or 'don't care' input or masking input) is applied. No channel current flow results regardless of the cell storage states because the source 16 and the drain 18 are at the same potential.

As can be observed from the conditions illustrated in FIGS. 84A-84G, current flow in the channel region (either from the source region 16 to the drain region 18 corresponding to the forward read condition, or from the drain region 18 to the source region 16 corresponding to the reverse read condition) is only observed for mismatch conditions. In matching conditions (or under 'don't care' data states or 'don't care' input conditions), no (or significantly lower) current flow is observed compared to that of under mismatch conditions.

The presence of the channel current may be detected in order to detect the mismatch condition. In one sensing method which requires no additional redundant match transistors, the channel current may be detected by impact ionization current flowing to the match line 76. When the voltage applied to the SL 72 or /SL 74 is high enough to create impact ionization, electron-hole pairs are generated near the high electric field region. The generated electrons are swept out toward positive voltage terminal, but the generated holes will flow into the floating body region 24 and may be monitored as the floating body current. Note that impact ionization occurs (and thus the hole currents are generated in the floating body) regardless of whether it is forward read or reverse read conditions.

Figure 85A:
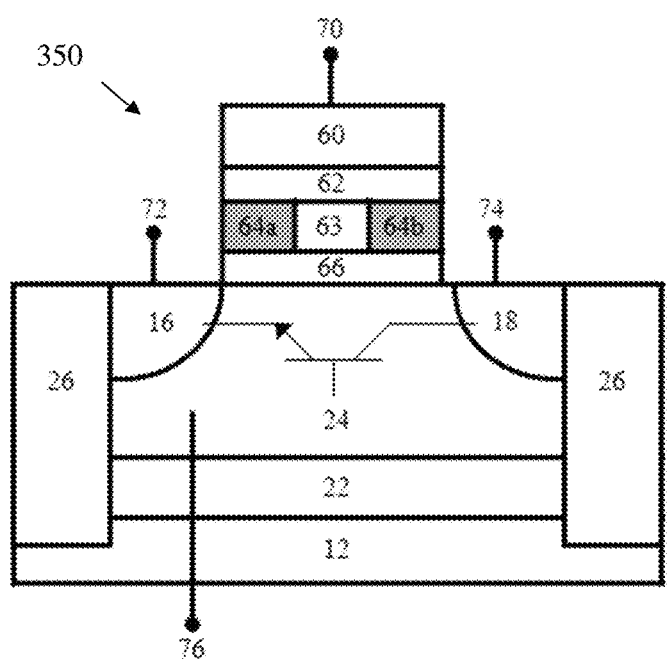
FIG. 85A schematically illustrates a content addressable memory cell according to an embodiment of the present invention.
Figure 85B:
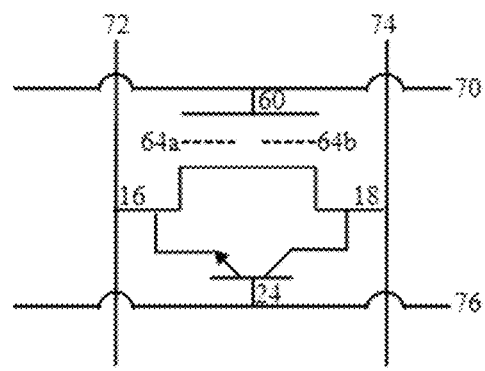
FIG. 85B illustrates an equivalent circuit representing the content addressable memory cell illustrated in FIG. 85A.

FIGS. 85A-85B are a schematic illustration of CAM cell 350 and an equivalent circuit representation of CAM cell 350, according to an embodiment of the present invention. In this embodiment, the match line 76 is connected to the floating body region 24 of CAM cell 350. It is important to note that the buried well layer 22 is arranged to cause the floating body region 24 to float and thus isolates the interference of the excess holes into the adjacent cells. If a match between all search bits and the stored bits is found, no current will flow on match line 76. If there is at least one mismatch between the search bit and the stored bits, a current flow will be observed on the corresponding match lines 76.

Figure 86A:
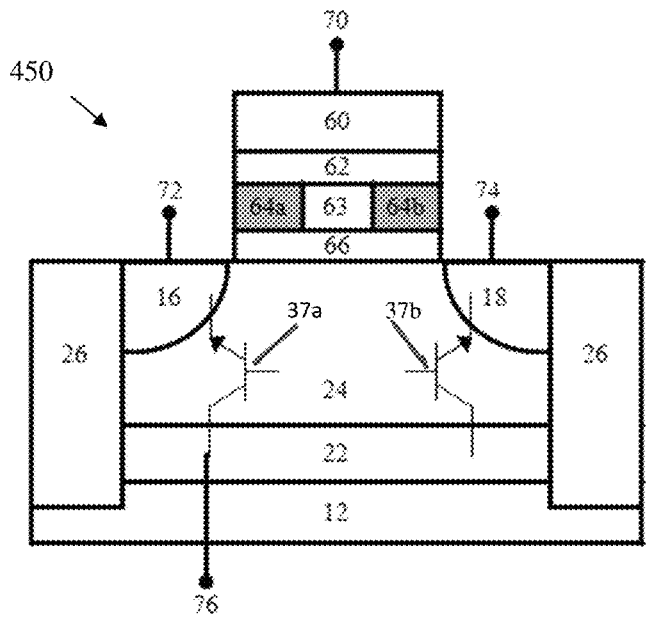
FIG. 86A schematically illustrates a content addressable memory cell according another embodiment of the present invention.
Figure 86B:
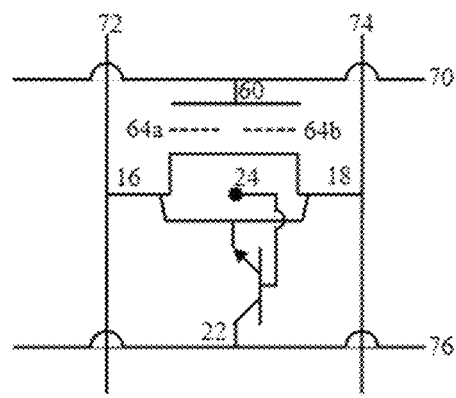
FIG. 86B shows an equivalent circuit representing the cell of FIG. 85A.

FIGS. 86A-86B illustrate a CAM cell 450 and schematic illustration thereof, according to another embodiment of the present invention, where the match line 76 is connected to the buried well layer 22 of CAM cell 450. Because at least one of the source 16 and the drain 18 is grounded during the search operations, if the buried layer 22 is positively biased or pre-charged to a positive potential, vertical bipolar junction transistors (BJT) 37a, 37b are inherently formed in the CAM cell 450. The buried layer 22, floating body region 24, and source 16 may be considered as collector, base, and emitter of BJT 37a, respectively. Likewise, the buried layer 22, floating body region 24, and drain 18 may be considered as collector, base, and emitter of BJT 37b, respectively.

Figure 86C:
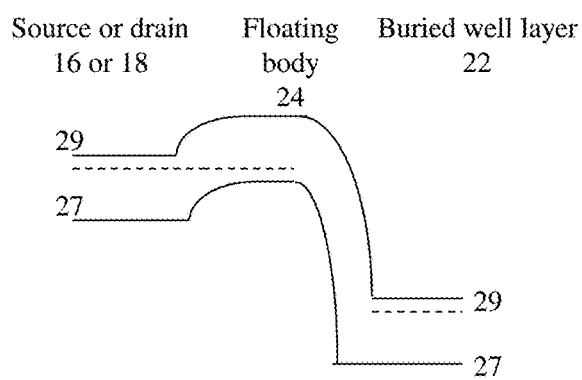
FIGS. 86C-86D illustrate energy band diagrams characterizing an intrinsic bipolar device when a positive bias is applied to a buried layer region of the content addressable memory cell of FIG. 86A, according to an embodiment of the present invention.
Figure 86D:
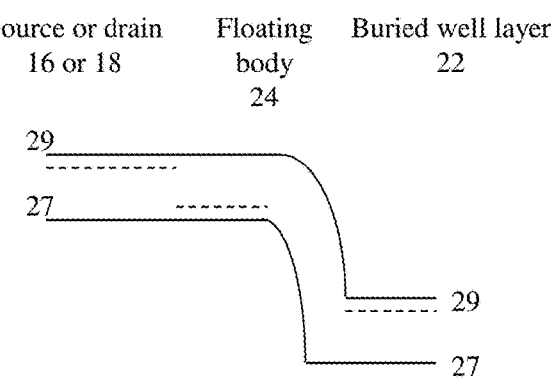

FIGS. 86C-86D show energy band diagrams characterizing the vertical n-p-n BJT along the buried layer 22, floating body 24, and source 16 or drain 18 for positively biased or pre-charged to a positive potential buried layer 22. FIG. 86A characterizes when no excess holes are in the floating body 24, and FIG. 86B characterizes when excess holes are in floating body 24. This vertical BJT may be considered an open-base BJT. Therefore, the current at the collector or the current at the buried layer 22 is solely controlled by the floating body current caused by the impact ionization. The horizontal dashed lines indicate the Fermi levels in the various regions of the vertical BJT. The Fermi level is located in the band gap between the solid line 27 indicating the top of the valence band (the bottom of the band gap) and the solid line 29 indicating the bottom of the conduction band (the top of the band gap) as is well known in the art. The grounded source 16 or the grounded drain 18 and the positively biased or pre-charged to a positive potential buried layer 22, correspond to the search operation condition. When the stored bits are in 'X' logic state or the input bits are in 'M' logic states, no (or low) channel current flows, and thus no hole current is generated in the floating body 24. When the stored bits and input bits are matched, no (or low) channel current flows, and thus no hole current is generated in the floating body 24. When the stored bits and input bits are mismatched, the channel current flows (or significantly higher current flow than under matching or don't care conditions) and triggers impact ionization. As a result, hole current is generated in the floating body 24. If a match between all search bits and the stored bits is found, no current will flow on MLs 76. If there is at least one mismatch between the search bit and the stored bits, a current flow (significantly higher than that observed under matching or don't care conditions) will be observed on the corresponding MLs 76.

Figure 87A:
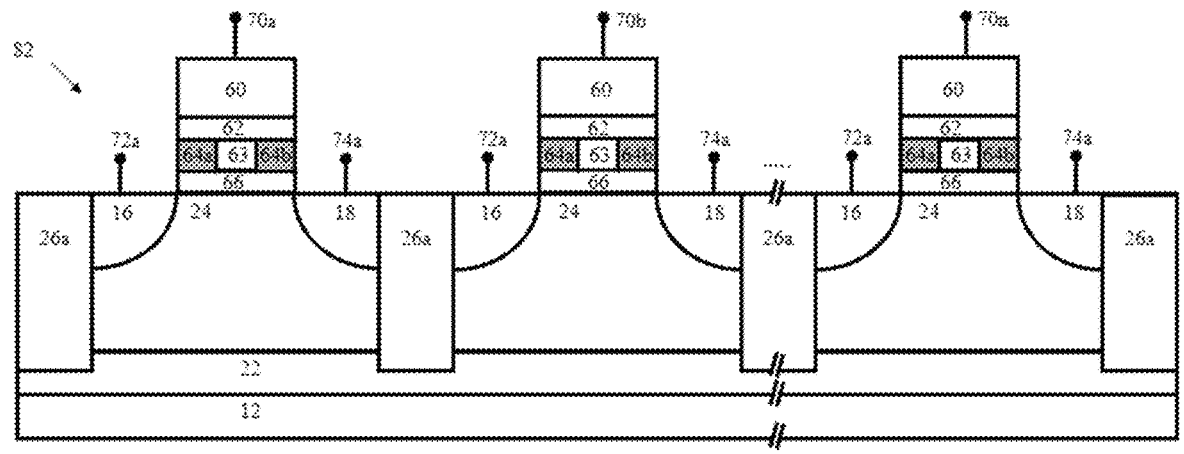
FIGS. 87A and 87B schematically illustrate cross-sectional views of a content addressable memory array according to an embodiment of the present invention.
Figure 87B:
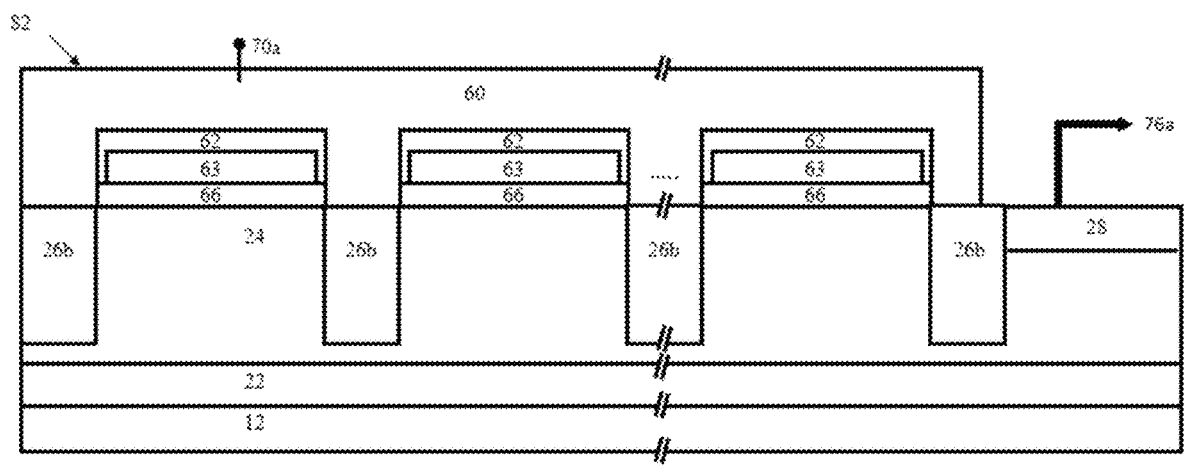

FIGS. 87A and 87B schematically illustrate an exemplary physical structure of a CAM array 82 according to an embodiment of the present invention. FIG. 87A is a cross sectional view cut on centers of CAM cells 350 along the SL 72 or /SL 74 direction. FIG. 87B is a cross sectional view cut on centers of CAM cells 350 along the WL 70 or ML 76 direction. Insulating layers 26a and 26b having two different depths are shown. The bottom of insulating layer 26a resides inside the buried layer 22 to disconnect the floating body 24 from adjacent words 100 as shown in FIG. 87A. However, the bottom of insulating layer 26b resides above the buried layer 22 allowing the floating body 24 to be continuous within each word 100 as shown in FIG. 87B. The ohmic contact layer 28 of the same conductivity type as that of the floating body 24 is provided for each word 100. The floating bodies 24 in a word 100 are connected to the match line 76 via ohmic contact layer 28.

Figure 88A:
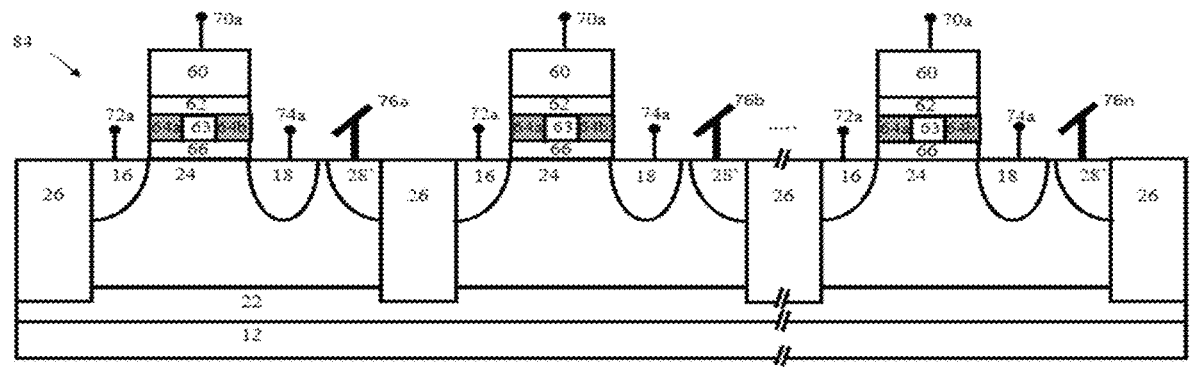
FIGS. 88A and 88B schematically illustrate cross-sectional views of a content addressable memory array according to another embodiment of the present invention.
Figure 88B:
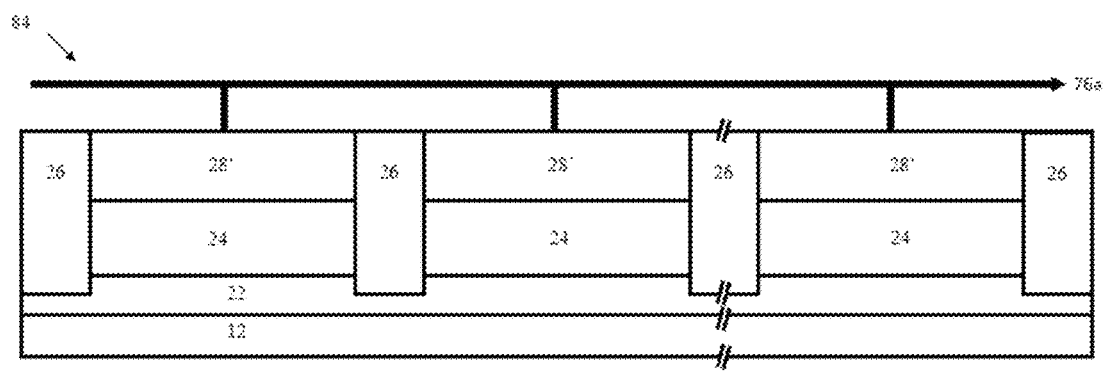

FIGS. 88A and 88B schematically illustrate another exemplary physical structure of a CAM array 84 according to another embodiment of the present invention. FIG. 88A is a cross sectional view cut on centers of CAM cells 350 along the SL 72 or /SL 74 direction. FIG. 88B is a cross sectional view cut on centers of CAM cells 350 along the WL 70 or ML 76 direction. Memory array 84 does not require insulating regions with different depths. FIGS. 88A and 88B show insulating layer 26 with the same depth. The bottom of insulating layer 26 resides inside the buried layer 22 to disconnect the floating body 24 from adjacent words 100 as shown in FIG. 88A. Also, the insulating layer 26 disconnects the floating body 24 from adjacent search bit cells within the word 100 as shown in FIG. 88B. An ohmic contact layer 28' of the same conductivity type as that of the floating body 24 is provided for every CAM cell 350. The floating body 24 of every CAM cell 350 within a given word 100 is connected to the match line 76 via ohmic contact layer 28' as shown in FIG. 88B.

As explained with regard to FIGS. 85A-856B, when the stored bits and input bits are matched, no hole current is generated in the floating body 24. When the stored bits and input bits are mismatched, hole current is generated in the floating body 24. Because the floating body 24 is continuous at a given word 100 while the floating body 24 is isolated with respect to adjacent words 100, when a search operation begins (by loading the search-data word into search lines 74), no (or low) floating body 24 hole current is observed on the match line 76 under matching conditions (more specifically, if a match condition is observed on all search/input bits and stored bits that are not in "don't care" data state or does not receive a "masking" search/input conditions). To the contrary, if at least one mismatch bit in the word 100 is observed, floating body 24 hole current flow is observed on the match line 76. Therefore, the matching or mismatching condition can be detected by measuring the floating body 24 hole current for each ML 74.

Figure 89A:
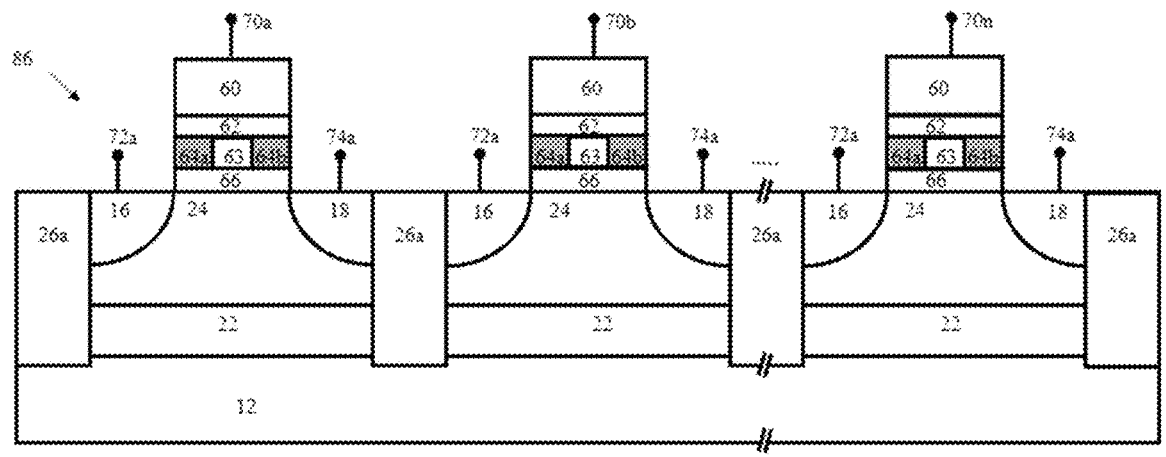
FIGS. 89A and 89B schematically illustrate cross-sectional views of a content addressable memory array according to another embodiment of the present invention.
Figure 89B:
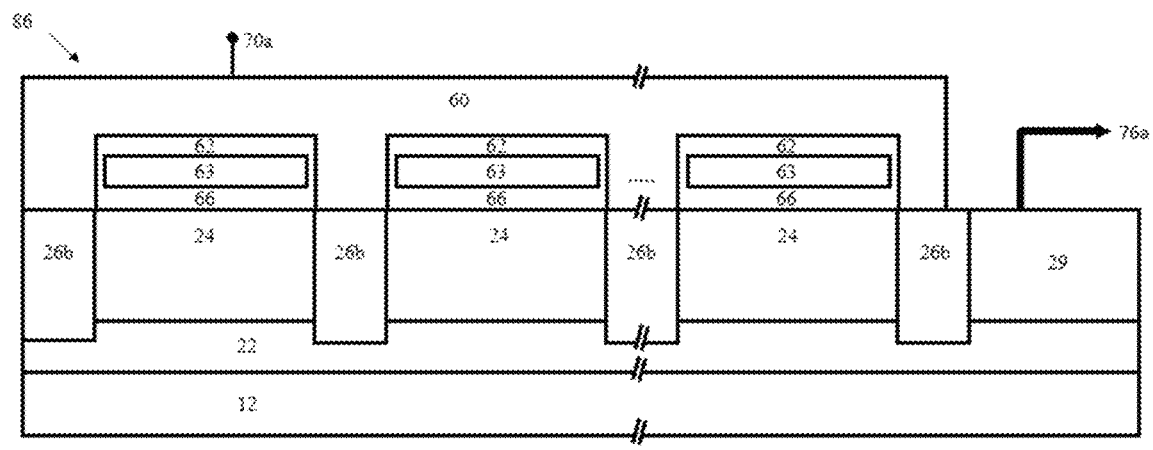

FIGS. 89A and 89B schematically illustrate an exemplary physical structure of a CAM array 86 according to another embodiment of the present invention. FIG. 89A is a cross sectional view cut on centers of CAM cells 450 along the SL 72 or /SL 74 direction. FIG. 89B is a cross sectional view cut on centers of CAM cells 450 along the WL 70 or ML 76 direction. Insulating layers 26 having two different depths are shown. The bottom of insulating layer 26a resides below the buried layer 22 to disconnect the floating body 24 and the buried layer 22 from adjacent words 100 as shown in FIG. 89A. However, the bottom of insulating layer 26b resides inside the buried layer 22 allowing the buried layer 22 to be continuous within each word 100 as shown in FIG. 89B. An ohmic contact layer 29 of the same conductivity type as that of the buried layer 22 is provided for each word 100. Each floating body 24 in a given word 100 is connected to the ML 76 via ohmic contact layer 28.

Figure 90A:
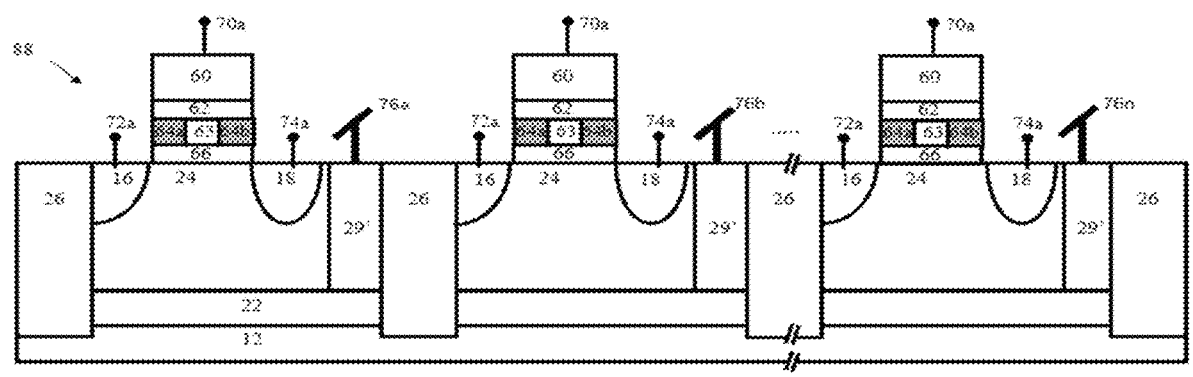
FIGS. 90A and 90B schematically illustrate cross-sectional views of a content addressable memory array according to another embodiment of the present invention.
Figure 90B:
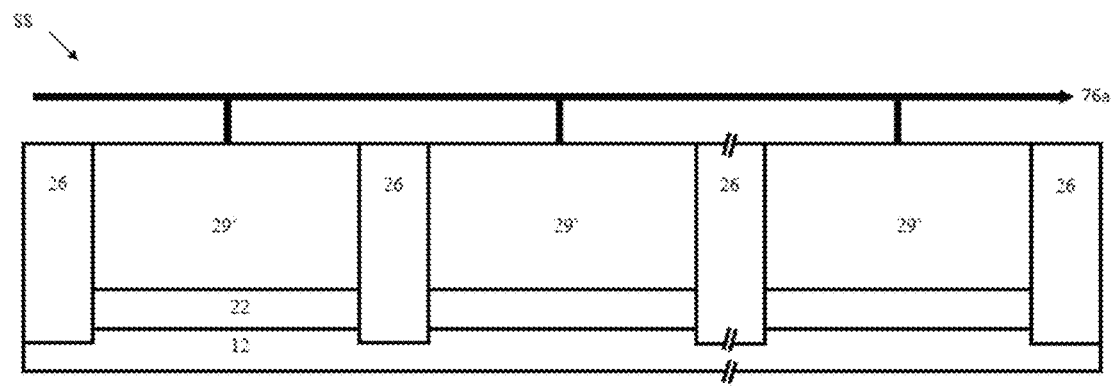

FIGS. 90A-90B schematically illustrate another exemplary physical structure of a CAM array 88 according to another embodiment of the present invention. FIG. 90A is a cross sectional view cut on centers of CAM cells 450 along the SL 72 or /SL 74 direction. FIG. 90B is a cross sectional view cut on centers of CAM cells 450 along the WL 70 or ML 26 direction. Memory array 88 does not require insulating regions with different depths. FIGS. 90A and 90B show insulating layer 26 with the same depth. The bottom of insulating layer 26 resides below the buried layer 22 to disconnect the floating body 24 and the buried layer 22 from adjacent words 100 as shown in FIG. 90A. Also, the insulating layer 26 disconnects the floating body 24 and the buried layer 22 from adjacent search bit cells within the word 100 as shown in FIG. 90B. An ohmic contact layer 29' of the same conductivity type as that of the buried layer 22 is provided for every CAM cell 450. The buried layer 22 of every CAM cell 450 within a given word 100 is connected to match line 76 via ohmic contact layer 29' as shown in FIG. 90B.

As explained in FIGS. 86A-86D, when the stored bits and input bits are matched, no current in the buried layer 22 is generated. When the stored bits and input bits are mismatched, the current is generated in the buried layer 22. Because the buried layer 22 is continuous at a given word 100 while the buried layer 22 is isolated from adjacent words 100, when a search operation begins with loading the search-data word into search lines 74, no current flow is observed on the buried layer 22 (connected to the match line 76) under matching conditions (more specifically, if a match condition is observed on all search/input bits and stored bits that are not in "don't care" data state or does not receive a "masking" search/input conditions). Correspondingly, if there is at least one mismatch, current flow (or significantly higher than the current flow under matching conditions) in the buried layer 22 (connected to the match line 76) will be observed. Therefore, the matching or mismatching condition can be detected by measuring the buried layer 22 current for each ML 76.

Figure 91:
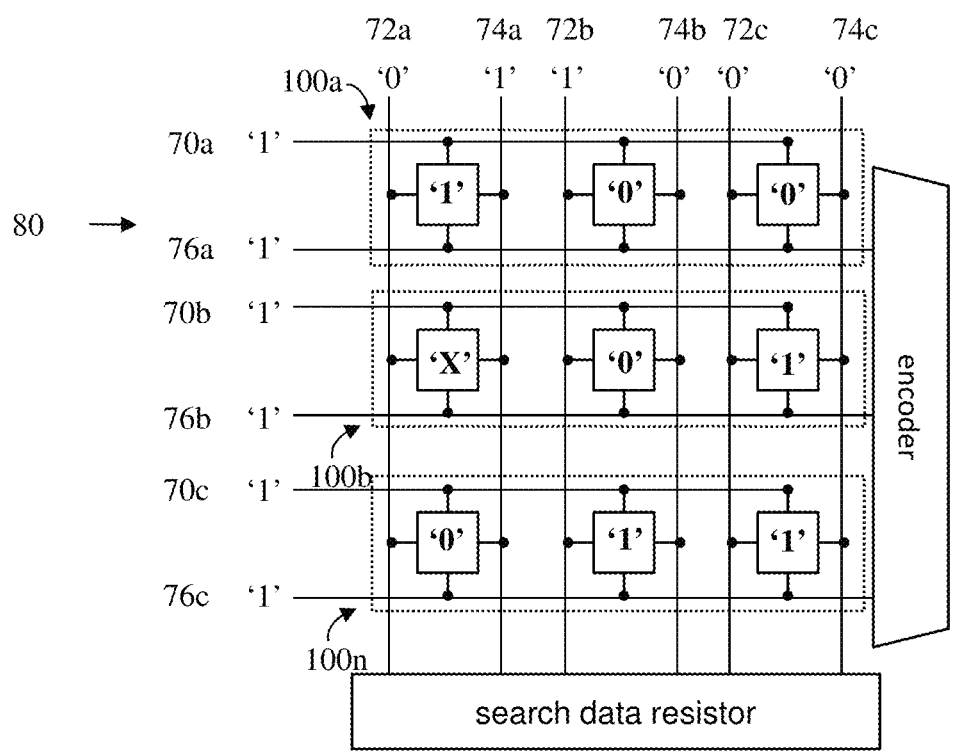
FIG. 91 schematically illustrates an exemplary search/matching operation performed on a content addressable memory array according to an embodiment of the present invention.

An example of a search operation in a CAM array 80 comprising three rows and three columns of CAM memory cells 250, 350 or 450, according to an embodiment of the present invention, is shown in FIG. 91. A read voltage that may be the same as the logic high is applied to the WLs 70*a*, 70*b*, 70*c*, a positive voltage that may be the same as the logic high is pre-charged to the MLs 76*a*, 76*b*, 76*c*. As an example, the search word is assumed to be '01M', which corresponds to the following input conditions: logic low is applied to the SL 72*a* and logic high is applied to the /SL 74*a*, logic high is applied to the SL 72*b* and logic low is applied to the /SL 74*b*, logic low is applied to the SL 72*c* and logic low is applied to the /SL 74*c*. An example of the stored data is shown in FIG. 91, where the word 100*a* stores '100', the word 100*b* stores 'X01', and the word 100*c* stores '011'.

Figure 92:
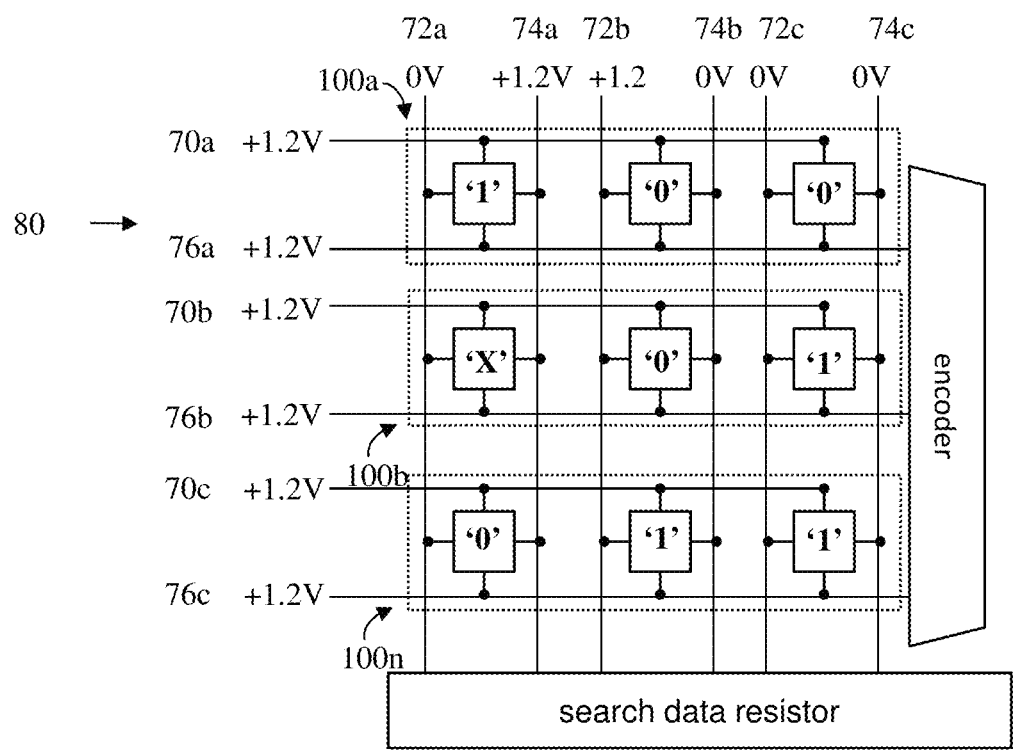
FIG. 92 schematically illustrates bias conditions during an exemplary search/matching operation performed on a content addressable memory array according to an embodiment of the present invention.

FIG. 92 illustrates an example of search input bias conditions for a searching operation as: +1.2 volts is applied to the WL terminal 70, zero voltage is applied to the SL terminal 72, +1.2 volts is applied to the /SL terminal 74 for search logic-0 state, +1.2 volts is applied to the WL terminal 70, +1.2 volts is applied to the SL terminal 72, zero voltage is applied to the /SL terminal 74 for search logic-1 state, and +1.2 volts is applied to the WL terminal 70, zero voltage is applied to the SL terminal 72, zero voltage is applied to the /SL terminal 74 for search logic-M state.

When the search operation begins, the current flows to the ML 76*a* because the search word '01M' and the stored word '100' of word 100*a* are mismatched at the first and the second bits, the current flows to the ML 76*b* because the search word '01M' and the stored word 'X01' of word 100*b* are mismatched at the second bit, and no current flows to the ML 76*c* because the search word '01M' and the stored word '011' are matched.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A content addressable memory array comprising a plurality of content addressable memory cells arranged in a plurality of rows and columns, wherein each said content addressable memory cell comprises:
 a first floating body transistor;
 a second floating body transistor;
 a third transistor; and
 a fourth transistor;
 wherein said first floating body transistor is connected to a gate of said third transistor; and
 wherein said second floating body transistor is connected to a gate of said fourth transistor.

2. The content addressable memory array of claim 1, wherein said first floating body transistor and said second floating body transistor store complementary data.

3. The content addressable memory array of claim 1, wherein said first floating body transistor and said second floating body transistor store the same data.

4. The content addressable memory array of claim 1, wherein said third and fourth transistors are connected in parallel.

5. The content addressable memory array of claim 1, wherein said third and fourth transistors are connected in series.

6. The content addressable memory array of claim 1, wherein said first floating body transistor and said second floating body transistor comprise a buried well region.

7. The content addressable memory array of claim 1, wherein said first floating body transistor and said second floating body transistor comprise a buried insulator region.

8. The content addressable memory array of claim 1, further comprising a third floating body transistor.

9. The content addressable memory array of claim 1, wherein said content addressable memory cell may function as a binary content addressable memory cell or a ternary content addressable memory cell.

10. A content addressable memory array comprising a plurality of content addressable memory cells arranged in a plurality of rows and columns, wherein each said content addressable memory cell comprises:
 a first bipolar device having a first floating base region, a first collector, and a first emitter;
 a second bipolar device having a second floating base region, a second collector, and a second emitter;
 a third transistor; and
 a fourth transistor;
 wherein said first bipolar device is connected to a gate of said third transistor; and
 wherein said second bipolar device is connected to a gate of said fourth transistor.

11. The content addressable memory array of claim 10, wherein said first bipolar device and said second bipolar device store complementary data.

12. The content addressable memory array of claim 10, wherein said first bipolar device and said second bipolar device store the same data.

13. The content addressable memory array of claim 10, wherein said third and fourth transistors are connected in parallel.

14. The content addressable memory array of claim 10, wherein said third and fourth transistors are connected in series.

15. The content addressable memory array of claim 10, wherein said content addressable memory cell may function as a binary content addressable memory cell or a ternary content addressable memory cell.

16. The content addressable memory array of claim 10, wherein said first bipolar device and said second bipolar device comprise a buried well region.

17. The content addressable memory array of claim 10, wherein said first bipolar device and said second bipolar device comprise a buried insulator region.

18. The content addressable memory array of claim 10, further comprising a third bipolar device having a third floating base region, a third collector, and a third emitter.

\* \* \* \* \*